(12) United States Patent
Wang et al.

(10) Patent No.: US 12,094,903 B2
(45) Date of Patent: Sep. 17, 2024

(54) MICROSTRUCTURE ENHANCED ABSORPTION PHOTOSENSITIVE DEVICES

(71) Applicant: W&WSens Devices, Inc., Los Altos, CA (US)

(72) Inventors: Shih-Yuan Wang, Palo Alto, CA (US); Shih-Ping Wang, Los Altos, CA (US)

(73) Assignee: W&W SENS DEVICES, INC, Los Altos, CA (US)

( * ) Notice: Subject to any disclaimer, the term of this patent is extended or adjusted under 35 U.S.C. 154(b) by 471 days.

(21) Appl. No.: 17/434,382

(22) PCT Filed: Sep. 21, 2020

(86) PCT No.: PCT/US2020/051733
§ 371 (c)(1),
(2) Date: Aug. 26, 2021

(87) PCT Pub. No.: WO2021/061543
PCT Pub. Date: Apr. 1, 2021

(65) Prior Publication Data
US 2022/0149098 A1   May 12, 2022

(51) Int. Cl.
*H01L 27/146* (2006.01)
*H01L 31/107* (2006.01)

(52) U.S. Cl.
CPC .. *H01L 27/14627* (2013.01); *H01L 27/14621* (2013.01); *H01L 27/1463* (2013.01); *H01L 27/14649* (2013.01); *H01L 31/107* (2013.01)

(58) Field of Classification Search
None
See application file for complete search history.

(56) References Cited

U.S. PATENT DOCUMENTS

| 8,022,390 B1 | 9/2011 | Kim et al. |
| 8,558,336 B2 * | 10/2013 | Su .................. H01L 31/105 257/432 |
| 8,680,591 B2 | 3/2014 | Haddad et al. |

(Continued)

FOREIGN PATENT DOCUMENTS

| CN | 103956403 | 2/2017 |
| EP | 09040854 | 9/1999 |

(Continued)

OTHER PUBLICATIONS

International Search Report and Written Opinion for PCT/US2021/050717 mailed Dec. 6, 2021.

(Continued)

*Primary Examiner* — Nduka E Ojeh
(74) *Attorney, Agent, or Firm* — Wissing Miller LLP

(57) ABSTRACT

Microstructure enhanced photodector arrangements uses a CMOS image sensor (CIS) wafer of crystalline Si and a CMOS Logic Processor (CLP) wafer stacked on each other for electrical interaction. The wafers can be fabricated separately and stacked or can be regions of the same monolithic chip. The image can be a time-of-flight image. Bayer arrays are enhanced with microstructure holes. Avalanche photodiodes, single photon avalanche photodiodes and phototransistors can be laterally and/or vertically doped. Photodetectors/photosensors can have slanted sidewalls for improved optical confinement and reduced crosstalk.

42 Claims, 122 Drawing Sheets

(56) References Cited

U.S. PATENT DOCUMENTS

| | | | |
|---|---|---|---|
| 9,000,492 | B2 | 4/2015 | Suzuki et al. |
| 9,209,320 | B1* | 12/2015 | Webster ............ H01L 31/02027 |
| 9,299,865 | B2 | 3/2016 | Marty et al. |
| 9,871,147 | B2 | 1/2018 | Kotani et al. |
| 10,411,053 | B2 | 9/2019 | Yokogawa |
| 10,522,582 | B2 | 12/2019 | Maruyama et al. |
| 10,600,930 | B2 | 3/2020 | Suzuki et al. |
| 11,309,444 | B1 | 4/2022 | Wang et al. |
| 2005/0145779 | A1 | 7/2005 | Mochizuki et al. |
| 2010/0102206 | A1* | 4/2010 | Cazaux ............ H01L 27/14603 |
| | | | 257/432 |
| 2010/0320444 | A1 | 12/2010 | Dutta |
| 2011/0156195 | A1 | 6/2011 | Tivarus et al. |
| 2011/0309331 | A1 | 12/2011 | Yu et al. |
| 2012/0012741 | A1 | 1/2012 | Vasylyev |
| 2012/0153127 | A1 | 6/2012 | Hirigoyen et al. |
| 2012/0153416 | A1 | 6/2012 | Tanaka et al. |
| 2012/0313204 | A1 | 12/2012 | Haddad et al. |
| 2013/0167915 | A1 | 7/2013 | Moslehi et al. |
| 2015/0084144 | A1* | 3/2015 | Suzuki ............ H01L 27/14647 |
| | | | 438/70 |
| 2016/0240579 | A1 | 8/2016 | Sun et al. |
| 2017/0141153 | A1 | 5/2017 | Lee et al. |
| 2017/0141243 | A1 | 5/2017 | Kotani et al. |
| 2017/0263798 | A1 | 9/2017 | Suzuki et al. |
| 2018/0012918 | A1 | 1/2018 | Na et al. |
| 2018/0102442 | A1 | 4/2018 | Wang et al. |
| 2018/0182806 | A1 | 6/2018 | Jin et al. |
| 2019/0166317 | A1 | 5/2019 | Tanaka et al. |
| 2019/0288132 | A1* | 9/2019 | Wang .................. H01L 31/1804 |
| 2020/0006407 | A1 | 1/2020 | Yokogawa |
| 2020/0006416 | A1 | 1/2020 | Baba et al. |
| 2020/0075656 | A1 | 3/2020 | Lee et al. |
| 2020/0083389 | A1 | 3/2020 | Wu et al. |
| 2020/0083390 | A1 | 3/2020 | Wu et al. |
| 2020/0266231 | A1 | 8/2020 | Cheng et al. |
| 2020/0266232 | A1 | 8/2020 | Cheng et al. |
| 2022/0020790 | A1* | 1/2022 | Zang ................. H01L 27/14603 |

FOREIGN PATENT DOCUMENTS

| | | |
|---|---|---|
| JP | 2002314116 | 10/2002 |
| JP | 2007013065 | 1/2007 |
| KR | 20080101301 | 11/2008 |
| WO | 0103255 | 1/2001 |
| WO | 2019018846 | 1/2019 |

OTHER PUBLICATIONS

B. F. Levin et al., 1 GB/s Si High Quantum Efficiency Monolithically Integrable, Applied Physics Letters, AIP Publishing LLC, vol. 66, No. 22, May 29, 1995, pp. 2984-2986.

Gao Yang et al., Photon-trapping Microstructures Enable High-speed High-efficiency Silicon Photodiodes, Nature Photonics, vol. 11, No. 5, Apr. 3, 2017, pp. 301-308.

International Search Report and Written Opinion for PCT/US2020/051733 mailed Dec. 17, 2020.

Written Opinion of International Search Report for PCT/US2020/051733 dated Dec. 17, 2020.

E. Ponizovskaya Devine et al., Single Microhole per Pixel in CMOS Image Sensors with Enhanced Optical Sensitivity in Near-Infrared, IEEE Sensors Journal, 2021, pp. 1-7.

Chang-Fu Han et al., Deep Trench Isolation and Inverted Pyramid Array Structures Used to Enhance Optical Eciency of Photodiode in CMOS Image Sensor via Simulations, Department of Mechanical Engineering, National Cheng Kung University, Tainan 701, Taiwan, May 28, 2020, pp. 1-14.

Jonghoon Park et al., Pixel Technology for Improving IR Quantum Efficiency of Backside-illuminated CMOS Image Sensor, 1System LSI Division, Samsung Electronics Co., Ltd, 2Foundry Division, Samsung Electronics Co., Ltd. Yongin-city, Gyeonggi-do, Korea, 4 pages.

Sozo Yokogawa, Nanophotonics Contributions to State-of-the-art CMOS Image Sensors, Sony Semiconductor Solutions Corporation, Kanagawa, Japan, 2019, 4 pages.

Sozo Yokogawa et al., IR Sensitivity Enhancement of CMOS Image Sensor with Diffractive Light Trapping Pixels, Scientific Reports, Sony Semiconductor Solutions Corporation, Atsugi Tec., 4-14-1 Asahi-cho, Atsugi, Kanagawa, 243-0014, Japan, Jun. 19, 2017, 9 page.

International Search Report for PCT Application No. PCT/US20/51733, mailed Dec. 17, 2020.

Beausoleil, Nanoelectronic and Nanophotonic Interconnect, The emerging integrated circuit interconnection bottleneck may be overcome if tiny, efficient photon-transport waveguides and small transceivers for photon-electron information exchange can be developed, 18 pages, Jan. 29, 2007; revised Sep. 25, 2007.

* cited by examiner

Data Bandwidth Of Cylindrical Holes With P And N Doping In A Square Lattice
50 Ohm, Average Electron Hole Velocity Approximately $8 \times 10^6$ cm / sec

| PD Area um x um | Hole depth um | Diameter / Period nm | Capacitance ff | RC time psec | Transit time psec | F (-3dB) GHz | Gb/s |
|---|---|---|---|---|---|---|---|
| 30 x 30 | 0.1 | 800 / 1100 | 33 | 1.6 | 4.7 | 63 | 90 |
| 50 x 50 | 0.1 | 800 / 1100 | 93 | 4.6 | 4.7 | 32 | 46 |
| 30 x 30 | 0.2 | 800 / 1100 | 66 | 3.3 | 4.7 | 42 | 59 |
| 50 x 50 | 0.2 | 800 / 1100 | 186 | 9.3 | 4.7 | 17 | 24 |
| 10 x 10 | 1 | 800 / 1100 | 16.5 | 0.8 | 4.7 | 75 | 107 |
| 10 x 10 | 1 | 800 / 1000 | 24.8 | 1.2 | 3.7 | 82 | 116 |
| 20 x 20 | 1 | 800 / 1100 | 144 | 7.2 | 4.7 | 21 | 30 |
| 50 x 50 | 1 | 800 / 1100 | 330 | 17 | 4.7 | 9 | 13 |
| 5 x 5 | 3 | 800 / 1100 | 22 | 1.1 | 4.7 | 71 | 101 |
| 10 x 10 | 3 | 800 / 1100 | 110 | 5.5 | 4.7 | 27 | 38 |

FIG. 10

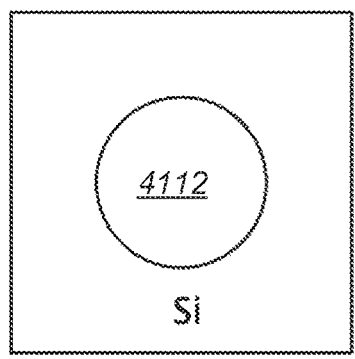
FIG. 41A
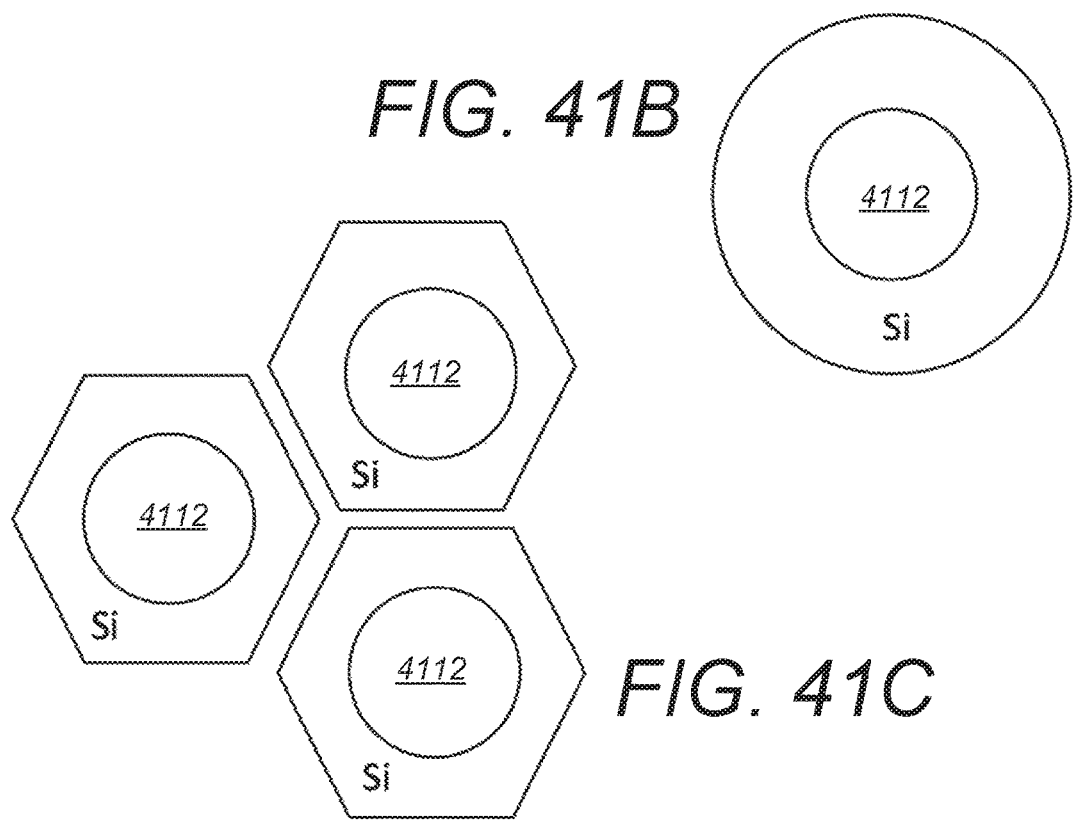
FIG. 41B
FIG. 41C
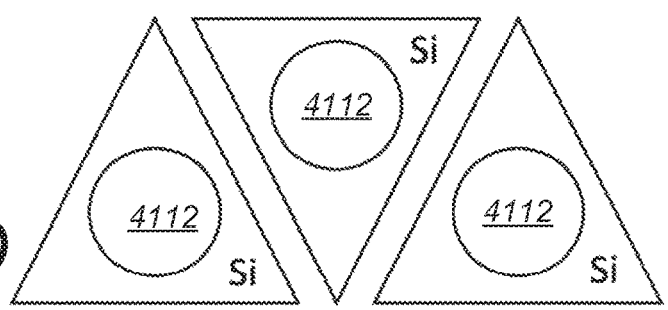
FIG. 41D

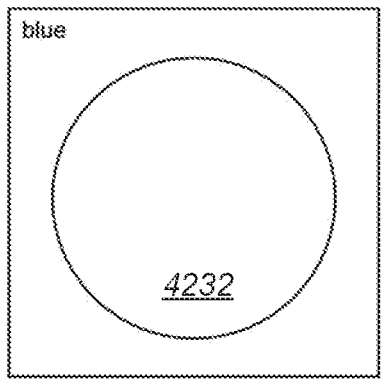
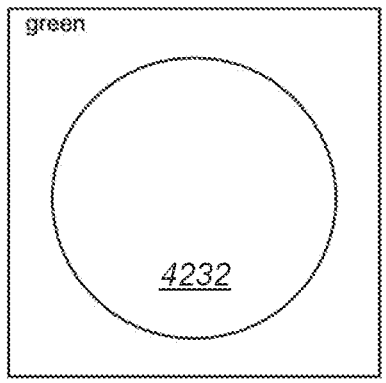
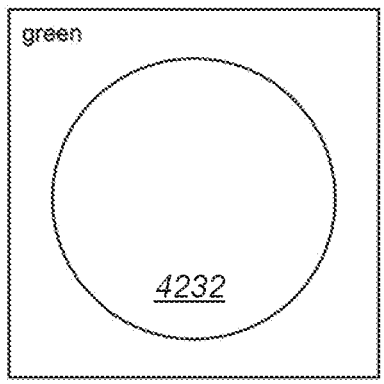
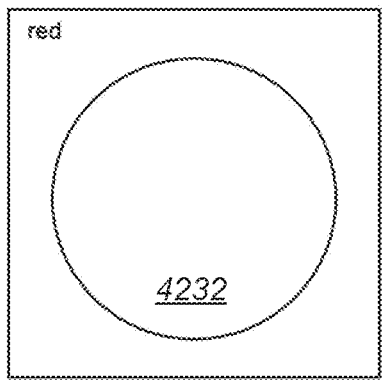
FIG. 42E
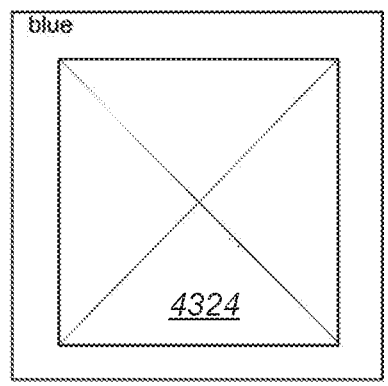
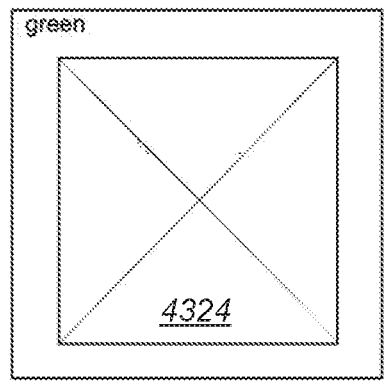
FIG. 42F
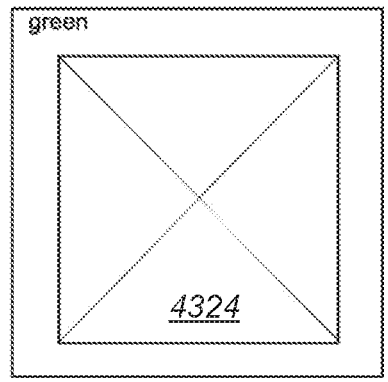
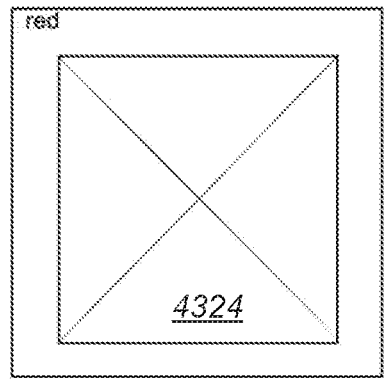

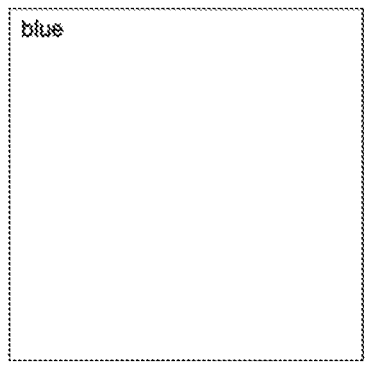
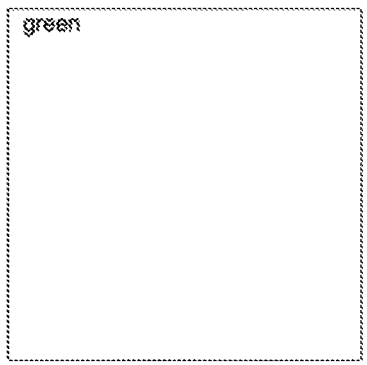
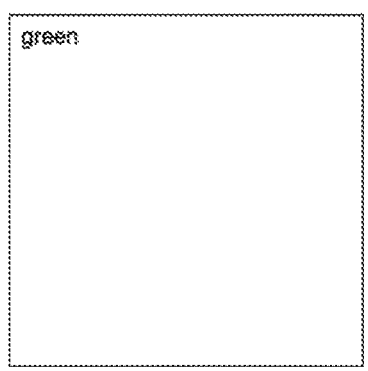
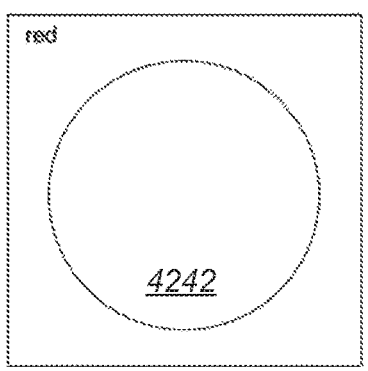
FIG. 42G
FIG. 42H
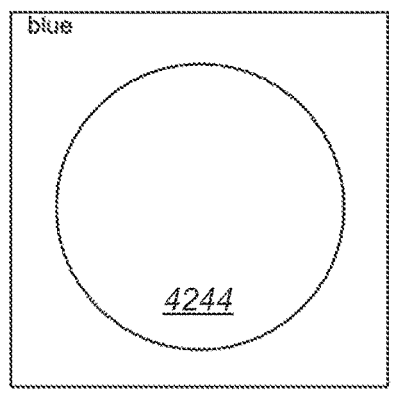
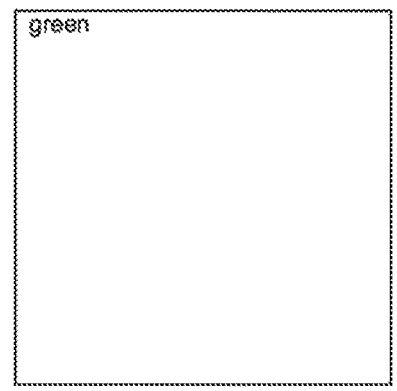
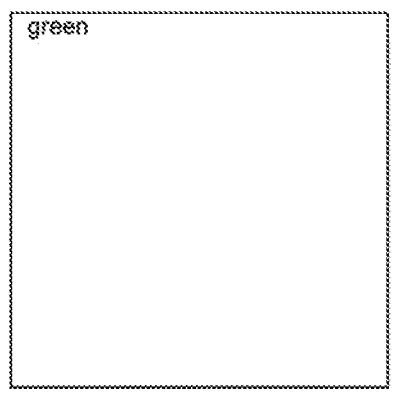
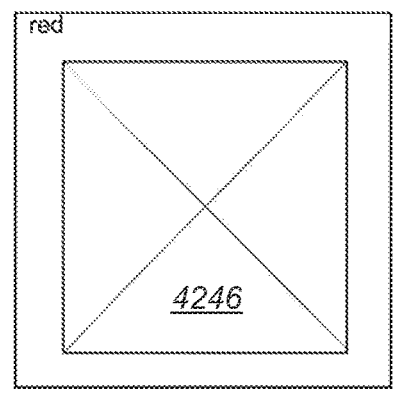

MICROSTRUCTURE ENHANCED ABSORPTION PHOTOSENSITIVE DEVICES

REFERENCE TO RELATED APPLICATIONS

This application is a continuation-in-part of each of: U.S. patent application Ser. No. 16/528,958 filed Aug. 1, 2019, International Patent Appl. No. PCT/US18/43289 filed Jul. 23, 2018; and International Patent Appl. No. PCT/US18/57963 filed Oct. 29, 2019.

This application incorporates by reference the entirety of the foregoing patent applications and claims the benefit of the filing date of each of the above-identified patent applications, as well as of the applications that they incorporate by reference, directly or indirectly, and the benefit of which they claim, including U.S. provisional applications, U.S. non-provisional applications, and International applications.

This patent application claims the benefit of and incorporates by reference each of the following provisional applications:

U.S. Prov. Ser. No. 62/893,036 filed Aug. 28, 2019;
U.S. Prov. Ser. No. 62/896,498 filed Sep. 5, 2019;
U.S. Prov. Ser. No. 62/900,361 filed Sep. 15, 2019;
U.S. Prov. Ser. No. 62/905,065 filed Sep. 24, 2019;
U.S. Prov. Ser. No. 62/914,028 filed Oct. 11, 2019;
U.S. Prov. Ser. No. 62/925,183 filed Oct. 23, 2019;
U.S. Prov. Ser. No. 62/937,813 filed Nov. 20, 2019;
U.S. Prov. Ser. No. 62/943,146 filed Dec. 3, 2019;
U.S. Prov. Ser. No. 62/950,888 filed Dec. 19, 2019;
U.S. Prov. Ser. No. 62/957,779 filed Jan. 6, 2020;
U.S. Prov. Ser. No. 62/964,094 filed Jan. 21, 2020;
U.S. Prov. Ser. No. 62/968,093 filed Jan. 30, 2020;
U.S. Prov. Ser. No. 62/969,624 filed Feb. 3, 2020;
U.S. Prov. Ser. No. 62/975,726 filed Feb. 12, 2020;
U.S. Prov. Ser. No. 62/978,736 filed Feb. 19, 2020;
U.S. Prov. Ser. No. 62/981,979 filed Feb. 26, 2020;
U.S. Prov. Ser. No. 62/985,171 filed Mar. 4, 2020;
U.S. Prov. Ser. No. 62/993,414 filed Mar. 23, 2020;
U.S. Prov. Ser. No. 62/994,758 filed Mar. 25, 2020;
U.S. Prov. Ser. No. 63/005,152 filed Apr. 3, 2020;
U.S. Prov. Ser. No. 63/009,928 filed Apr. 14, 2020;
U.S. Prov. Ser. No. 63/011,217 filed Apr. 16, 2020;
U.S. Prov. Ser. No. 63/016,160 filed Apr. 27, 2020;
U.S. Prov. Ser. No. 63/019,208 filed May 1, 2020;
U.S. Prov. Ser. No. 63/026,591 filed May 18, 2020;
U.S. Prov. Ser. No. 63/033,153 filed Jun. 1, 2020;
U.S. Prov. Ser. No. 63/034,961 filed Jun. 4, 2020;
U.S. Prov. Ser. No. 63/034,964 filed Jun. 4, 2020;
U.S. Prov. Ser. No. 63/038,079 filed Jun. 11, 2020;
U.S. Prov. Ser. No. 63/039,941 filed Jun. 16, 2020;
U.S. Prov. Ser. No. 63/039,945 filed Jun. 16, 2020;
U.S. Prov. Ser. No. 63/041,997 filed Jun. 21, 2020;
U.S. Prov. Ser. No. 63/043,709 filed Jun. 24, 2020;
U.S. Prov. Ser. No. 63/048,641 filed Jul. 6, 2020;
U.S. Prov. Ser. No. 63/050,044 filed Jul. 9, 2020;
U.S. Prov. Ser. No. 63/051,896 filed Jul. 15, 2020;
U.S. Prov. Ser. No. 63/054,192 filed Jul. 20, 2020.

All of the above-referenced provisional and non-provisional patent applications are collectively referenced herein as "the commonly assigned incorporated applications."

FIELD

This patent specification relates mainly to photosensitive devices. More particularly, some embodiments relate to photosensitive devices having microstructure enhanced absorption characteristics and photosensitive devices being bonded or stacked with CMOS circuits.

BACKGROUND AND SUMMARY OF THE DISCLOSURE

Complementary metal oxide semiconductor (CMOS) image sensors (CIS) are used in many products including cameras for smartphones, tablets, laptops, smart television, interactive devices such as Amazon Alexa, gaming, virtual reality, augmented reality, home and business security, automotive products such as advanced driver assist systems (ADAS), and in medical imaging such as in endoscopy. Higher spatial resolution and extended range of wavelength responses are desired for such products, to the near infrared (NIR) region of 850 nm, 905 nm, 940 nm in silicon (Si) and 1350-1550 nm with germanium (Ge) on Si.

Other applications include three dimensional (3D) imaging using two or more cameras such as in human or insect vision, or time of flight (ToF) or light distance and ranging (LiDAR), using a light source in constant wave mode (CW) for indirect ToF or a pulse of light mode for direct ToF measurement of distance and topology of objects. Applications include facial recognition, LiDAR for ADAS, virtual and augmented reality, gaming, robotics, machine vision, medical imaging, drones.

To satisfy higher spatial resolutions and low jitter (for ToF), pixels dimensions are in the microns and sub-micron range where each pixel is a square in most cases and the thickness of Si ranges from 1 to 6 microns and some cases is sub-micron. The thin silicon allows for a fast rise time and therefore a low jitter time and can be in the range of tens of picosecond and in some cases 10 picosecond or less. Depths of millimeters and in some cases sub millimeter can be resolved. However, with thin silicon the external quantum efficiency is degraded and technology such as photon or light or lightwave trapping can be used to enhance photon absorption and therefore increase the external quantum efficiency (EQE) when EQE is directly proportional to photon absorption. This is particularly important at NIR wavelengths where the Si absorption coefficient is low; for example at 800 nm the absorption coefficient is 850/cm and at 980 nm the absorption coefficient is 96/cm as compared to blue 400 nm at 95000/cm, green 530 nm at 7800/cm and red 700 nm at 1900/cm. As the pixels size approaches one micron or less, a single microstructure hole can significantly enhance absorption and therefor EQE as disclosed in this patent specification, compared to the use of multiple inverted pyramids, see reference. Yokogawa1, IR sensitivity enhancement of CMOS Image Sensor with diffractive light trapping pixels, or multiple rectangular holes or trenches; see also reference Park et el, Pixel Technology for Improving IR Quantum Efficiency of Backside-illuminated CMOS Image Sensor. In some cases, a composite microhole can be used where the composite microhole consists of multiple smaller holes.

CIS can be monolithically integrated; however, for high density pixels stacking technologies are often used such that connecting electrodes from the CMOS application specific integrated circuits (ASIC) electronics would not interfere with packing density of the pixels nor partially block incident light. The photosensors or pixels are fabricated on one wafer and the CMOS ASICs on another wafer and matching bonding electrodes are formed on each wafer and bonded together, as discussed in reference Kagawa et al, Novel Stacked CMOS Image Sensor with Advanced Cu2Cu Hybrid Bonding; Haruta et al, A 1/2.3 inch 20 Mpixel 3-Layer Stacked CMOS Image Sensor with DRAM.

With a single microstructure hole per pixel, the red green blue (RGB) pixel EQE can be enhanced in addition to NIR wavelengths in a standard Bayer pattern, see reference Yokogawa1 for example. In this patent specification a modified Bayer pattern is described in which RGB and NIR have their own filters and NIR can be seen in bright light for example. In addition, the microhole can have different shapes and or dimensions for different ranges of wavelengths for each RGB and NIR pixels.

Stacking technologies used for CIS can be applied to very high speed optical receivers for data center optical interconnect, 5G optical links, enterprise optical interconnects where arrays of 56 Gb/s photodetectors are fabricated on one wafer and 112 Gb/s CMOS or BiCMOS ASICs are another wafer with matching bonding electrodes and bonded together. Different Si layer thicknesses can be used for high speed photodetectors and for CMOS ASICs. The 112 Gb/s CMOS ASICs can use a 20 nm thick Si on SOI (Si on insulator) wafer and photodetectors can use 100-3000 nm thick Si on oxide. Using multiple bits in each clock cycle such as pulse amplitude modulation (PAM), for 2 bits per clock cycle, or PAM4, 112 Gb/s can be transmitted and received with a 56 Gb/s photodetector array. A 2×5 array of 56 Gb/s photodetectors can have an aggregated data bandwidth of 1120 Gb/s. At these millimeter wavelengths parasitic circuit elements such a capacitance, inductance and resistance can degrade the optical receiver performance, for example see reference. Shi, Ultrahigh Speed Transceiver Package with Stacked Silicon Integration Technology. By using Stack technology together with microstructure holes and with photodetector (PD) arrays ranging in size from 5 micron by 5 micron to 30 micron by 30 micron and Si layer thickness from 100 nm to 3000 nm, 56 Gb/s can be achieved with optical absorption ranging from 30 to 85% or more at certain wavelengths in the range 800-950 nm. In this particular example the microholes are doped in the sidewalls and adjacent holes are doped in opposite polarity. With Ge on Si, the wavelength range can be extended to 1350 nm and 1550 nm for medium and long reach optical interconnects.

Photosensors with a single or plural microstructure hole to enhance sensitivity, EQE, photon absorption can improve products in three major multi-billion USD business sectors. Market size for CIS imaging/3D/ToF is a multi-billion USD market growing at CAGR of 44%; see reference 3D Imaging & Sensing—Market and Technology www.yole.fr 2018. Market size for LiDAR for ADAS is also multi-billion USD; The Automotive LiDAR Market April 2018, Yole. Optical interconnect for Data Center is also a multi-billion USD market; reference Light Counting April 2018.

SUMMARY OF INITIALLY CLAIMED SUBJECT MATTER

According to some embodiments, a photosensor wafer of crystalline Si and a CMOS Logic Processor (CLP) wafer are stacked on each other for electrical interaction and form a structure comprising: an array of laterally spaced pixels formed in said photosensor wafer; respective lenses over said pixels; wherein said pixels comprise photosensors each including one or more microstructure holes extending into said photosensor wafer and further including plural N-doped and/or P-doped regions of the photosensor wafer configured to interact with light photons impinging on said pixels, including on said holes, through said lenses; one or more active CMOS circuits formed in said CLP wafer; and electrical interconnects between said pixels and said one or more active CMOS circuits, wherein said interconnects are configured to convey electrical signals between said pixels and said one or more active CMOS circuits; wherein said CLP wafer is at a side of said photosensor wafer that is opposite said lenses (see claim 5)

The structure can further include one or more of the following features: (1) respective color filters between said lenses and pixels configured to select respective wavelength ranges; (2) the pixels can be configured in a Bayer array that includes at least one Near InfraRed (NIR) pixel and an NIR optical filter over said NIR pixel to select specific NIR wavelength ranges and each of at least several pixels in the Bayer array encompasses only a single hole in said photosensor wafer; (3) the pixels include one or more Bayer arrays at least one of which comprises a Near InfraRed (NIR) pixel, and wherein the at least one NIR pixel in at least one of said one or more Bayer arrays is larger than other pixels therein; (4) each of said at least some of said pixels can have only a single one of said holes; (5) at least some of said holes in the photosensor wafer can be generally cylindrical; (6) at least some of said holes in the photosensor wafer can be inverted pyramids; (7) at least some of said holes in the photosensor wafer can be funnel shaped; (8) said hole of each of at least some of said pixels can comprise a cluster of nanoholes into said photosensor wafer; (9) there can be light blockers between adjacent pixels to reduce crosstalk; (10) light reflectors can be included under said pixels; (11) at least some of said pixels can have only a single hole each and said single hole can be an off-center hole at least some of said holes differ in shape from one another; (12) each of said pixels can comprise laterally spaced doped regions; (13) each of said pixels can comprise vertically spaced doped regions: (14) the pixels can include Ge regions in said photosensor wafer, configured to extend a response of said pixels to light in a 2 micrometers wavelength range; (15) the pixels can have slanted sidewalls configured to reduce crosstalk between adjacent pixels and improve optical confinement; (16) the holes can be conformally lined with doped Si, and at least some adjacent holes can be doped to opposite polarities; (17) at least some of said holes can be conformally lined with graphene; doped Si can conformally line at least some of said holes and hyperdoping over said doped Si lining can be included; (18) the pixels can be in an array in which centrally located pixels are smaller in size that other pixels; (19) the structure can further include a first layer of electrically insulating material under said pixels and a second layer of an electrically insulating material over said active CMOS circuits; (20) the first and second layers of electrically insulating material can be selected from a group consisting of Si Oxide and Si Nitride; and (21) one or more additional layers of electrically insulating material can be formed on said first and/or second layers of electrically insulating material.

According to some embodiments, a high-speed photodetector array (HSPA) wafer of crystalline Si and a CMOS Logic Processor (CLP) wafer are stacked on each other for electrical interaction and form a structure comprising: an array of laterally spaced photodetectors formed in said HSPA wafer; wherein each of said photodetectors includes at least one microstructure hole extending into said HSPA wafer and further includes plural N-doped and/or P-doped regions of the HSPA wafer configured to interact with light photons impinging on said photodetector from a first side of the HSPA wafer; one or more active CMOS circuits formed in said CLP wafer; and electrical interconnects between said high speed photodetector array and said one or more active CMOS circuits, wherein said interconnects are configured to convey electrical signals between said HSPA and said one or more active CMOS circuits; and wherein said CLP wafer is at a side of said HSPA wafer that is opposite said first side.

The HSPA wafer can further include one or more of the following features: (1) an array of lenses formed over said photodetectors on said first side of the HSPA wafer; (2) each of said lenses can overlie plural holes in said HSPA wafer and said photodetectors and said active CMOS circuits can be configured to operate at 56 Gb/s or greater data rates that include 112 Gb/s; (3) at least some of said holes in the HSPA wafer can be generally cylindrical; (4) at least some of said holes in the HSPA wafer can be inverted pyramids; (5) at least some of said holes in the HSPA wafer can be funnel shaped; (6) there can be an array of optical filters formed at said first side of the HSPA wafer over said photodetectors; (7) said array of optical filters can include Near InfraRed (NIR) filters to select specific NIR wavelength ranges; (8) said array of photodetectors can include some that are larger than others, and said larger photodetectors can be under said NIR filters; (9) said photodetectors can include Ge regions in said HSPA wafer, configured to enhance a response of said photodetectors to light in a wavelength range that includes 1350 nm and/or in a wavelength range that includes 1550 nm; (10) each at least some of said lenses can overlie a plurality of said holes and said photodetector array and said CMOS active circuits can be configured to operate at data rates of 56 Gb/s or higher; (11) said holes can be conformally lined with doped Si, and adjacent holes can be doped to opposite polarities; (12) doped Si can conformally line said holes and hyperdoping over said doped Si lining the holes can be included; (13) said holes can be conformally lined with graphene; and (14) said CLP wafer includes clock recovery circuits and transimpedance amplifiers, and wherein said HSPA and CLP wafers are configured to operate at aggregated data rates of 400-1000 Gb/s or more.

According to some embodiments, a monolithic wafer of crystalline Si having a first side and a second side comprises: an array of laterally spaced photosensor or photodetector pixels formed at said first side of the wafer; wherein each of said pixels includes at least one hole formed into said first side of the wafer and further includes plural N-doped and/or P-doped regions of the wafer configured to interact with light photons impinging on said pixels, including on said holes; respective optical lenses over said pixels configured to direct to said pixels and said holes light impinging on said first side of the wafer; CMOS logic processors formed at said second side of the wafer; and electrical interconnects in said wafer configured to convey electrical signals between said pixels and said one or more active CMOS circuits.

Said monolithic wafer can further include one or more of the following features: (1) each of at least some of said lenses can overlies a plurality of said holes in the wafer; and (2) said holes can be lined with doped regions of said wafer, and adjacent holes can be lined with doped regions of opposite polarity.

The term "hole" refers in this patent specification to a deliberately formed volume of material shaped and dimensions as specified, that differs from surrounding material in specified electrical and/or optical properties. The material of a hole can be solid, such as a semiconductor with such different electrical/optical properties, or a dielectric, or a gas such as air, or even vacuum. A hole can be into a top surface of a layer, or into a bottom surface, or can be an internal volume that is between a top layer and a bottom layer of a device. Numerous examples of such holes are described in detail infra, and some are interchangeably called protrusions, for example when a hole in the underside of an I-layer is an indentation filled with material protruding from a layer below.

The term "electrode" refers in this specification to material that serves to create desired electrical fields in the disclosed devices and to extract desired electrical signals that the devices produce in response to light illumination. Numerous examples of electrodes are described in detail infra, for example electrodes that comprise electrically conductive material in ohmic contact with doped regions of a device, or electrically conductive material that makes other types of contact such as Schottky junctions.

The terms "top" and "bottom" and similar terms refer to a specified orientation of a device so that, for example, the top of a device being described below becomes its bottom when the device is flipped over or becomes its left or right side when the device is turned 90 degrees.

The term "inverted pyramid" refers to a hole that is pyramid-shaped and has a square top from which it tapers downwardly to a point or a smaller area. Anisotropic wet etch of crystalline silicon (100) surface along (111) crystal facets forms an angle of 54.7 degrees with respect to the (100) crystal plane and can result in an inverted pyramid hole. An inverted pyramid often has a square base (top area) but in some cases can have a rectangular base, for example when several inverted pyramids are in contact or very close proximity. See for example reference. Yokogawa1.

As used herein, the terms "BOX" and "buried oxide" can refer in this patent specification to a buried silicon dioxide material, as in silicon-on-insulator (SOI) structures where the BOX layer is between the Si device layer and the Si handle substrate, but also can encompass any insulating and/or dielectric material. Examples of such insulating materials include, without limitation, silicon oxide, silicon nitride, hafnium oxide, aluminum oxide, molybdenum oxide, titanium oxide, aluminum nitride, and also amorphous semiconductor material and combinations of said materials. Furthermore, the terms "BOX" and "buried oxide" can refer to material that is not yet buried, or never buried, such as material that is deposited or formed on a surface.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIG. 10 is a table of cylindrical microstructure holes with opposite doping such as in FIGS. 9A-9D in a square lattice;

FIGS. 41A to 41H are simple partial schematic top views of single hole pixels with different shape pixels, according to some embodiments;

FIGS. 42E, 42F, 42G and 42H are partial simple top view schematics of Bayer Red, Green, Blue (RGB) pixel arrays, according to some embodiments;

DETAILED DESCRIPTION

Figure 1:
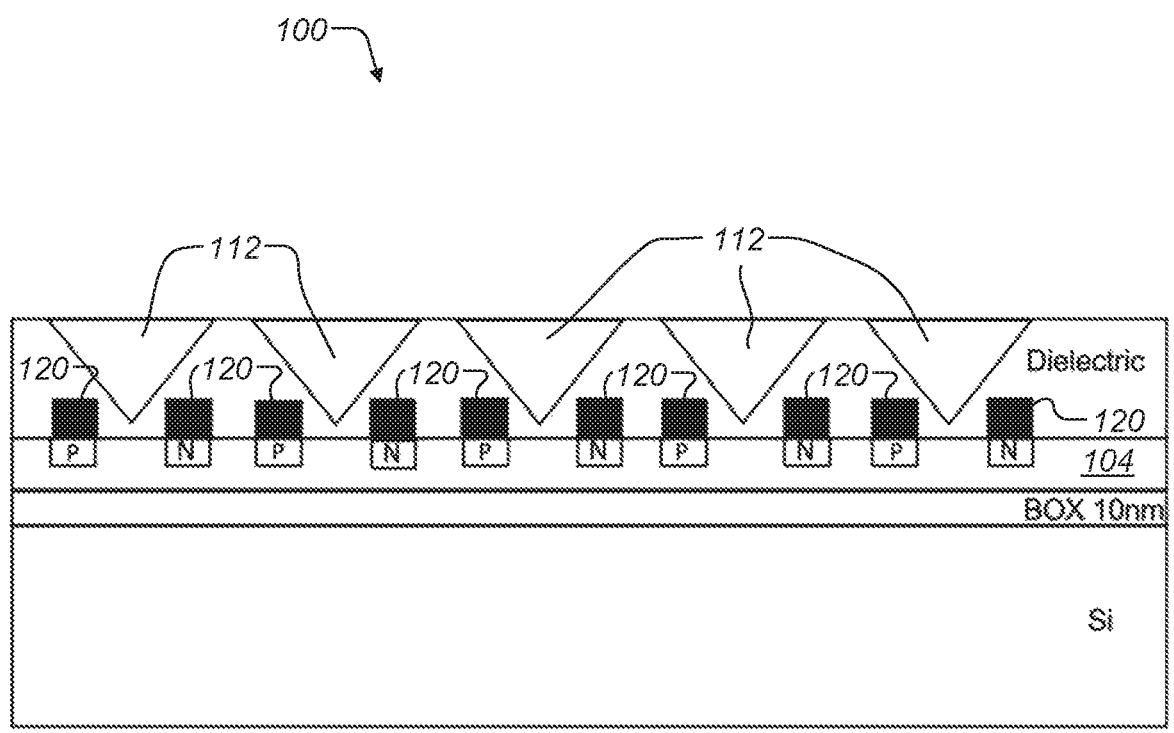
FIG. 1 is a simple partial cross section schematic of a lateral interdigitated PN or PIN photodiode (PD), avalanche photodiode (APD) or single photon avalanche photodiode (SPAD) that can be monolithically integrated with CMOS application specific integrated circuits (ASICs), according to some embodiments (by "simple" schematic, this patent specification means a "simplified" schematic that for clarity omits elements that would be present in a more complete illustration)

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

All publications cited in this patent specification are hereby incorporated by reference. Some of the figures described herein are simplified in that for clarity they may omit elements of structures that skilled persons would understand need not be shown expressly and the figures may show only a portion of a structure that comprises repeated patterns of the shown portions. For example, a figure may show a device with a single pair of laterally spaced electrodes where the actual device being described includes a collection of two or more such regions on or in the same substrate. The Greek letters ν (nu) and π (pi) denote in this specification semiconductor material that is low doped to N and P doping, respectively, e.g., to no more that about $10^{12}$ per $cm^3$ doping. The semiconductor material regions described in this patent specification are material that is single-crystal or essentially single-crystal except for the deliberately formed "holes" described below, unless otherwise specified. The terms "partial" or "partially" regarding the depth of holes or of etching refer in this specification to holes that extend partway into a region rather than through the entire region.

The photodetectors described herein can be pixels/photosensors for CMOS imaging, and for 3D Time-of-Flight imaging and for high speed photodetectors for optical data communication. These photodetectors can operate as a photodiode (PD), avalanche photodiode (APD), and/or single photon avalanche photodiode (SPAD) with a reverse external bias voltage. In some cases, the photodetectors can operate in a photo transistor mode where forward source drain voltage can be applied with or without a gate voltage which normally is reverse bias. In some cases the photodetectors can operate in a photoconductor mode where it can be biased either in the forward or reverse direction. In addition to external bias used for the operation of these photodetectors, a time constant is normally associated with each application. For example, for CMOS image sensors, the time constant can range from seconds to milliseconds, for 3D imaging or Time-of-Flight applications the time constant can range from 10's of nano seconds to pico seconds, and for optical data communication applications the time constant can range from nanoseconds to picoseconds, or from 1 Gb/s to 100 Gb/s or more. In addition, each application can be associated with a 2D array size for example for 3D imaging the array can range from 1 million to 100 million pixels or more. For Time-of-Flight the array size can range from 1000 to 10 million or more, and for optical data communication the array can be 1D or 2D, and can range in size from 4 to 100 or more. For high spatial resolution CMOS imaging and 3D imaging the pixel size can range from 0.5 microns to 5 microns, and in some cases for lower spatial resolution the pixel size can range from 10 microns-100 microns or more, and for optical data center applications the photodetector can have a lateral dimension ranging from 2 microns to 100 microns, and in some cases 5 microns to 30 microns. In most cases pixels are in a square configuration, however other configurations are possible, and the dimensions given represent a typical lateral dimension of the pixels for example a pixel can be triangular or polygonal in which the lateral dimension can be the height of the triangle or a diagonal of the polygonal shape. For optical data communications the photodetectors are typically circular, and the dimensions represent the diameter, and in some cases can be polygonal in which case the lateral dimension can represent the largest diagonal for example.

Throughout this description, it is understood that P and/or N type doped regions can be formed in the photodetector such as PN, PIPN, PIP, NIN, PNP, NPN, to name a few to operate in a PD/APD/SPAD/photoconductor/phototransistor modes for example. A voltage bias range can be 0.1-3.3 volts for photodiodes, 3 volts-35 volts for APD, SPAD, and 1 volt-15 volts for phototransistors. The bias voltages can be applied to P and N regions, and in some cases to P and P, N and N.

Throughout this description, it is understood that the photodetectors can be front side illuminated or back side illuminated, and in some cases front side and back side illuminated. These photodetectors can be monolithically integrated with CMOS (complementary metal oxide semiconductor) ASICs (application specific integrated circuits) where the ASICs can be designed for specific applications such as image sensors, Time-of-Flight, or optical data communication. In some cases, the photodetector array can be stacked with CMOS ASICs where the photodetector array are fabricated on a separate wafer from the CMOS ASICs wafer, and then the wafers are bonded together and interconnect metal electrodes and/or silicide electrodes are formed between the detector array and CMOS ASICs.

In some cases, multiple P and N regions can be formed in or on a photodetector which can be a pixel photosensor, photodiode, photoconductor, phototransistor, photogating, APD, SPAD, silicon photomultiplier to name a few and is some cases there can be multiple pn junctions. In some cases, metal oxide semiconductor (MOS) junctions and or Schottky junctions can be formed. In some cases, the photodetector can have an i or intrinsic or low doped region.

Photodetectors such as pixel-photosensors, photodiodes, APDs, SPADs, photoconductors, phototransistors with a microstructure hole or holes or with composite micro hole or holes can have a higher external quantum efficiency than a comparable photodetectors without microstructure hole or holes or composite micro hole or holes at certain wavelength ranges. Some small photodetectors with lateral dimensions of approximately equal to or less than 3 microns and in some cases approximately equal to or less than 5 microns with only a single microstructure hole or single composite microstructure hole can have an external quantum efficiency greater than a comparable photodetector without microstructure hole or composite microstructure hole at certain wavelength ranges.

FIG. 1 is a simple partial cross section schematic of a lateral interdigitated PN or PIN photodiode (PD), avalanche photodiode (APD) or single photon avalanche photodiode (SPAD) that can be monolithically integrated with CMOS application specific integrated circuits (ASICs), according to some embodiments. The CMOS ASICs are not shown in FIG. 1 for simplicity. The PD/APD/SPAD 100 can be a single device or an array of photodetectors. The photodetector sizes can range from 1 micron lateral dimension to 100 microns lateral dimensions for CMOS image sensor applications and/or time-of-flight applications. Other applications can include data centers, to detect high data rate optical signal with data rate in the range of 10-100 Gb/s, and in some cases 25-50 Gb/s, and in some cases 50-100 Gb/s. The wavelength range can span 800-1000 nm. In the case of time-of-flight applications the jitter can range from a few pico seconds (psec) to 10 psec, and in some cases 1-15 psec.

The silicon on insulator structure (SOI) shown in FIG. 1 has a buried oxide layer (BOX) of 10 nm, and silicon device layer of 20-30 nm thickness, and in some cases 10-20 nm, where the silicon layer is crystalline. An interdigitated structure with electrodes 120 (M1 and M2) can be formed on P and N wells as shown. The P and N wells can extend partially into the device layer 104, or entirely into the device layer 104. In addition the width of the P and N wells can be greater than the width of the M1 and M2 electrodes 120, and in some cases the P and N wells can have an I or low dope region between the wells, and in some cases the P and N regions can be in contact and/or overlap. The width of the electrode can range from 7 nm to 90 nm and the electrode can be metal forming an Ohmic contact with the P and N wells, and in some cases the electrode can be a metal silicide. The spacing between the electrodes can range from 50 nm to 1000 nm. The electrodes can be uniformly spaced, and in some cases can be non-uniformly spaced, and in some cases can be a combination of uniformly spaced and non-uniformly spaced. A dielectric material such as silicone dioxide, or hafnium oxide can be deposited on top of the interdigitated structure with microstructure holes 112 formed in the dielectric, with lateral hole dimensions at the surface greater than the spacing between the interdigitated electrodes. The thickness of the dielectric can range from 100 nm to 250 nm. The microstructure holes 112 can be cylindrical in cross section, inverted pyramids, triangular, trapezoidal to name a few. The microstructure holes 112 can be square, rectangle, circular, oval, amoebic to name a few, and can be in a periodic and/or aperiodic arrangement. The microstructure holes' lateral dimension can range from 500 nm to 1000 nm, and in some cases 700 nm-900 nm, and in some cases less than 500 nm. The spacing between the microstructure holes 112 can range from 0 (touching) to 300 nm, and in some cases 100 nm-400 nm.

In some cases, an amorphous semiconductor can be deposited on the interdigitated photodetector where the amorphous semiconductor can be GaN, Al oxide, GaAs, Si to name a few. The device layer 104 can be partially or fully depleted and can be I or low dope P or N type Si. Light that can be an optical signal or optical image impinges on the top surface where the microstructure holes 112 are formed.

The device 100 operates with a reverse bias between the P and the N region, and can operate as a photodiode or an avalanche photodiode, or a single photon avalanche photodiode. The voltage can range from 0.6 to 30 volts, and in some cases 0.6-10 volts, and the device can operate in photodiode or avalanche photodiode mode.

Data rates can range from 25 Gb/s to 100 Gb/s and in some cases from 50 Gb/s to 200 Gb/s, and in some cases 25 Gb/s to 50 Gb/s. The wavelength for the interdigitated lateral PN photodetector 100 can range from 600 to 1000 nm. The Si device layer 104 and handle layer in a SOI wafer are crystalline Si. CMOS/BiCMOS ASICs can be fabricated on or in the crystalline CMOS device layer. Photodetector 100, for example, a photodiode (PD), avalanche photodiode (APD), or single photon avalanche photodiode (SPAD) in either single or array, can be fabricated either in a device layer 104 of the handle layer of a SOI wafer.

The P and N regions can form PN junctions and in some cases PIN junctions, and in some cases P low dope N or P N junctions, and in some cases PIPN junctions for the device to operate in a photodiode and/or avalanche photodiode (APD) and/or single photon avalanche photodiode (SPAD) with a reverse bias applied to the anode and cathode. In some cases, the reverse bias voltage can be anywhere in the range of 0.1 volt-3.3 volts, and in some cases anywhere in the range of 1 volt-10 volts, and in some cases anywhere in the range of 10 volts-35 volts for example. Reference Li et al, A 112 Gb/s PAM4 Linear TIA with 0.96 pJ/bit Energy Efficiency in 28 nm CMOS, 2018 IEEE, shows high data rate CMOS transimpedance amplifier that can be monolithically integrated with thin silicon photodetectors with microstructure hole/holes to enhance optical absorption in the wavelength range of 800-1000 nm, and in some cases to 1060 nm. The data rate of the photodetector can range from 25-56 Gb/s, and in some cases greater than 56 Gb/s. See reference Cansizoglu et al, Dramatically Enhanced Efficiency in Ultra-fast Silicon MSM Photodiodes with Photon-trapping Structures, IEEE Photonics Technology Letters, 2019 shows an example of an interdigitated photodiode with microstructure holes for enhancing 850 nm wavelength.

Figure 2:
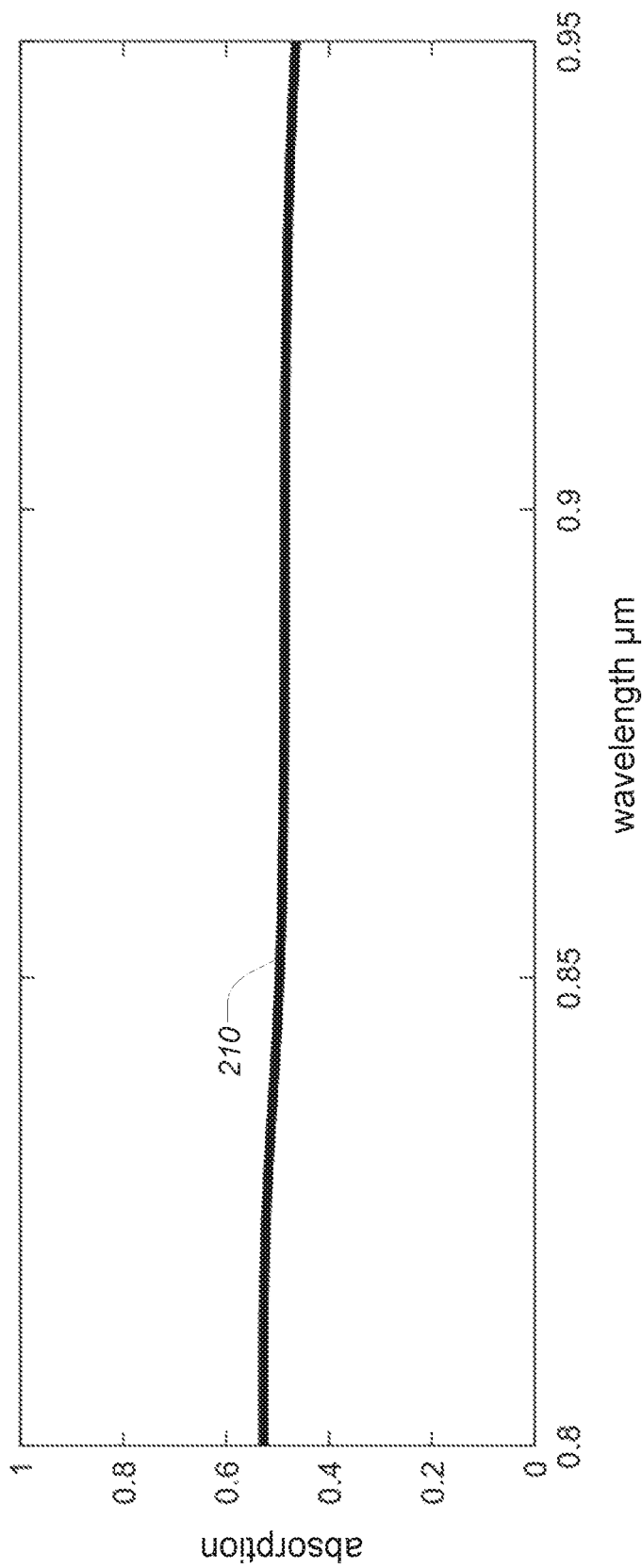
FIG. 2 is a plot showing a finite difference time domain (FDTD) calculation of the absorption for a structure shown in FIG. 1, according to some embodiments.

FIG. 2 is a plot showing a finite difference time domain (FDTD) calculation of the absorption for a structure shown in FIG. 1, according to some embodiments. The absorption is directly proportional to external quantum efficiency (EQE) as a function of wavelength from 800 to 950 nm. The solid curve 210 is for a structure shown in FIG. 1 with Hf oxide of 120 nm thickness, and with triangular inverted pyramid with a surface lateral dimension of 800 nm, and a period of 1000 nm in a square lattice, the Si device layer is 30 nm. The absorption, and therefore the EQE if all the photo generated carriers are collected can be greater than 40% over the wavelength range of 850-950 nm. This is greater than a comparable photodetector without microstructure holes.

Figure 3:
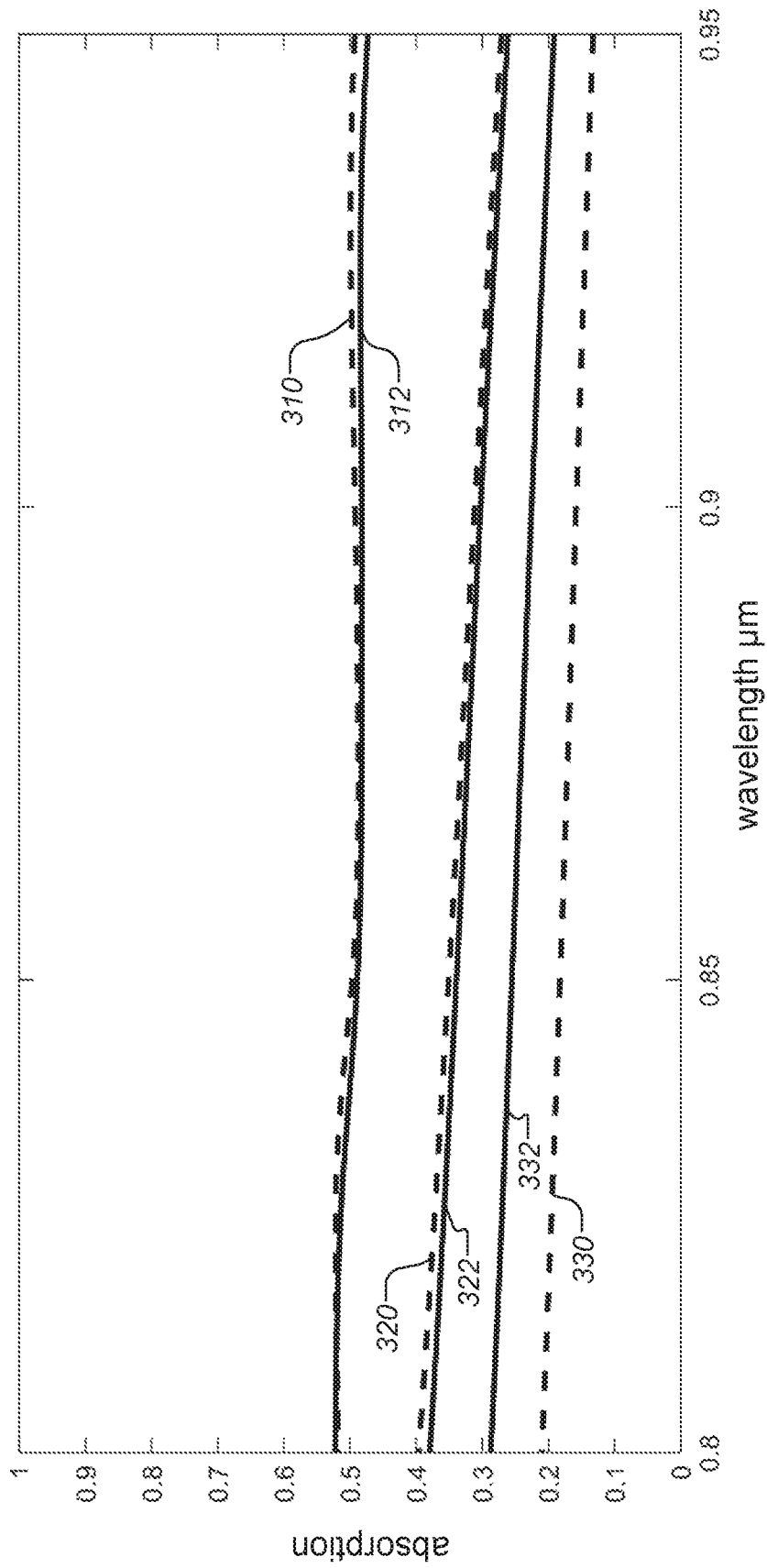
FIG. 3 is a plot showing a FDTD simulation of the optical absorption vs wavelength for a structure shown in FIG. 1, according to some embodiments.

FIG. 3 is a plot showing a FDTD simulation of the optical absorption vs wavelength for a structure shown in FIG. 1, according to some embodiments. The device layer (104 in FIG. 1) is 20 nm (solid curves 312, 322 and 332) and 30 nm (dashed curves 310, 320 and 330). The family of curves show the absorption for two types of holes; cylindrical (320, 322, 332 and 330) and inverted triangular pyramid (310 and 312). The dielectric layer is Hf oxide of 120 nm thickness, the inverted pyramid and the cylindrical holes both have 800 nm lateral dimension and a period of 1000 nm in a square lattice. In some cases, the microstructure holes are etched through the dielectric and into the silicon to the BOX layer (curves 320 and 322). In other cases (curves 310, 312, 330 and 332) the holes are etched only into the Hf oxide. As can be seen depending on the type of hole, and whether it is etched into the silicon (curves 320 and 322) the absorption and therefore the EQE can range from approximately 20%-50% in the wavelength range of 800-950 nm. As can be seen the best results are for the inverted triangular pyramid with approximately 50% absorption in the wavelength range.

Figure 4:
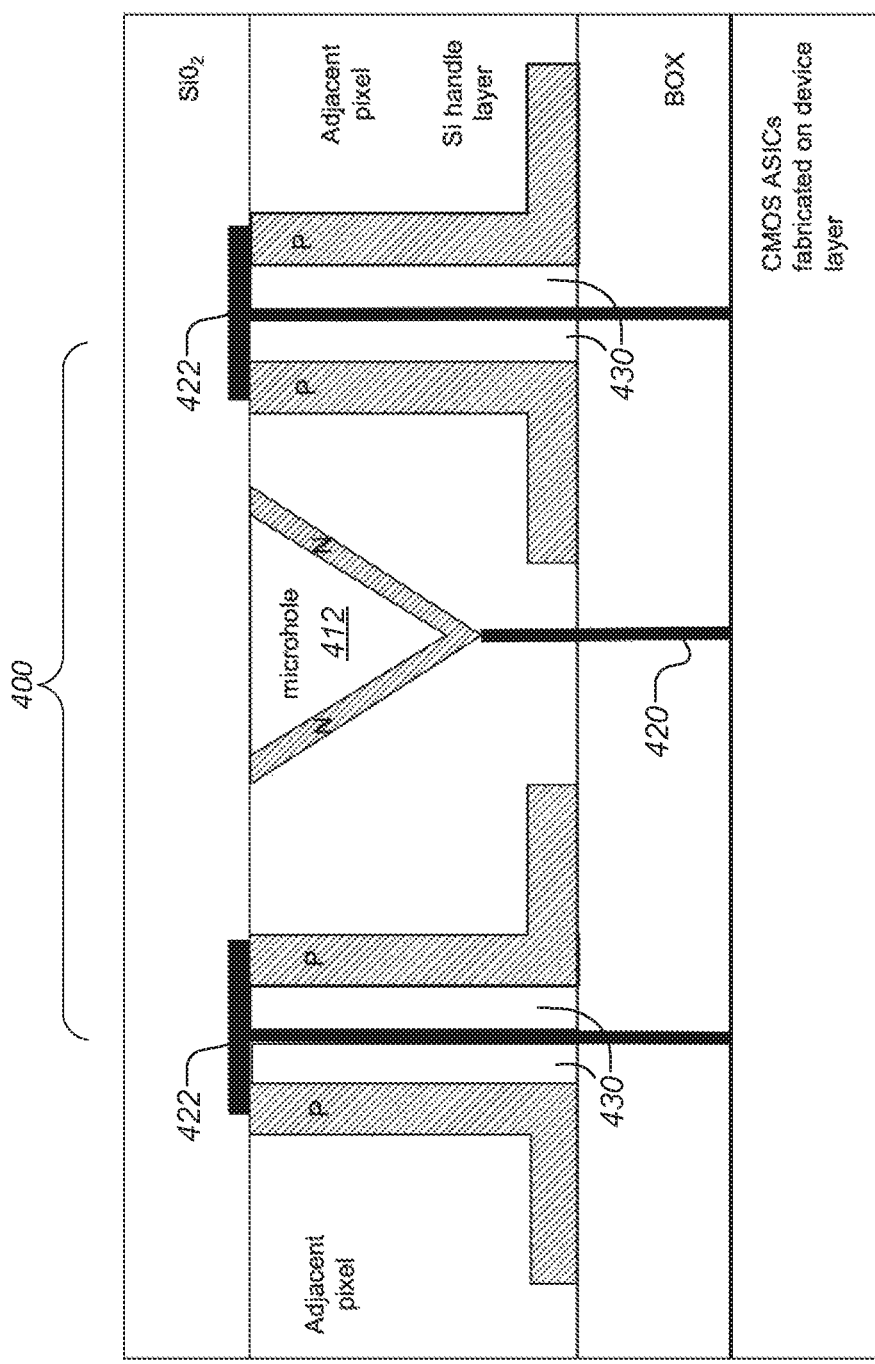
FIG. 4 is a back illuminated CMOS sensor where the pixel has a single inverted pyramid hole that can be filled with a dielectric, according to some embodiments.

FIG. 4 is a back illuminated CMOS sensor where the pixel has a single inverted pyramid hole that can be filled with a dielectric, according to some embodiments. The inverted pyramid 412 can have a lateral dimension ranging from 500 to 800 nm, and the pixel 400 can have a dimension of approximately 1200 nm by 1200 nm, and in some cases can be 1000 nm by 1000 nm. N doping can be formed on the wall of the inverted pyramid 412, and can be ion implanted or diffused into regions in proximity to the walls of the inverted pyramid. A P dopant can be implanted around the boundary of the pixel, and in some cases to the bottom of the pixel. All exposed surfaces are doped with N or P dopant as shown in FIG. 4. The N and P dopant can be interchanged. A reverse bias can be applied between the N and P dopant to create a reverse bias between the N and P dopant. In some cases, the P and N dopant can form a PN junction or a PIN junction for PD/APD/SPAD operations. The thickness of the silicon handle layer where the image sensors are formed can range from 500 nm to 5000 nm, and in some cases 1000-3000 nm. Each pixel can be isolated with an isolation trench 430 that can extend to the BOX layer, and in some cases partially in the silicon handle layer. Each pixel can be individually addressable with electrodes from the N region (electrode 420) and P regions (electrodes 422) connecting to the CMOS ASICs. The photodetector signal can be processed into an image, and in some cases with time-of-flight applications, and in some cases optical data communication applications. In FIG. 4 the P regions can form a common region such that all the P regions can be connected together electrically, and in some cases the P regions need not form a common region. Optical wavelength can range from 600 to 1100 nm. The enhancement of a pixel 400 with a microstructure hole 412 can have an EQE greater than comparable photo sensor without microstructure holes, and in some cases the single microstructure hole can have a higher EQE than a pixel with multiple smaller lateral dimension microstructure holes. See, e.g.: Zang et al, Silicon single-photon avalanche diodes with nano-structured light trapping, Nature Communications, DOI: 10.1038/s41467-017-00733-y, discussing an example of silicon SPAD with photon absorption enhancement structures; and Ma et al, High-efficiency and low-jitter Silicon single photon avalanche diodes based on nanophotonic absorption enhancement, arXiv.org>physics>arXiv:1505.01296, May 6, 2015.

As discussed herein infra, back side illuminated CMOS image sensors can either be monolithically integrated where the CMOS image sensor is fabricated on the Si handle layer of a SOI wafer in which the CMOS ASICS are fabricated, and in some cases the CMOS image sensor can be fabricated on a separate wafer, and the CMOS ASICs can be fabricated also on a separate SOI wafer and the two wafers are then stacked or bonded together at their oxide layers. This is further illustrated in FIGS. 58 to 62.

Figure 5A:
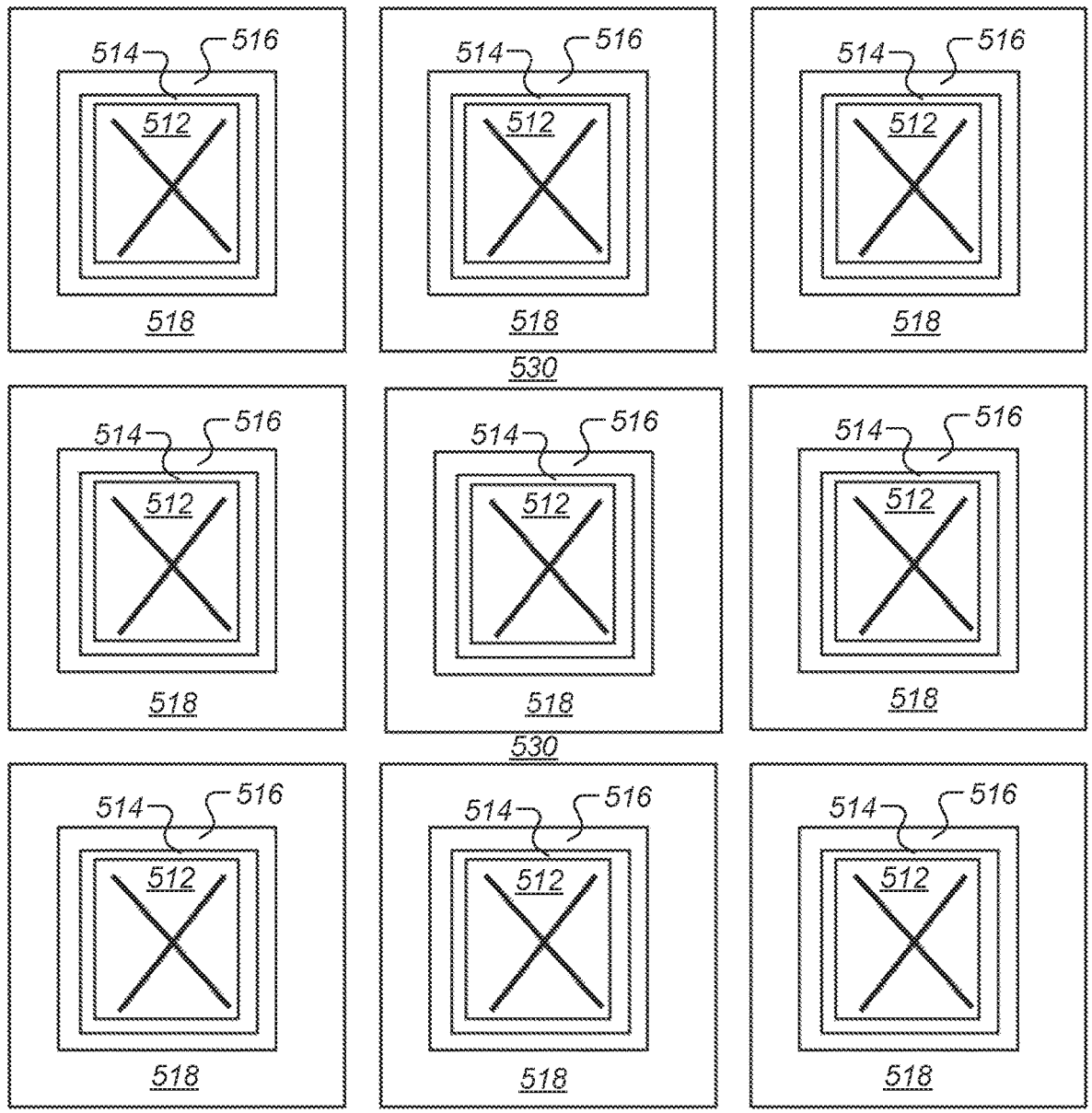
FIG. 5A is a simple partial schematic top view of an array of pixels, according to some embodiments.

FIG. 5A is a simple partial schematic top view of an array of pixels, according to some embodiments. Each of the pixels has single microstructure hole 512 with P doping region 518 and N doping region 514. The pixels are separated with isolation trenches 530. The P regions 518 are connected from a common electrode (not shown). The P and N can be interchanged. The P regions 518 can be connected using transparent conducting metal oxide (TCMO) or conducting metal silicide or metal electrodes to form a common electrode (not shown) that connects all the P regions 518. Also not shown are additional passivation layers such as silicon dioxide that can be formed over the entire pixel array. The P and N regions can be separated by an I or low dope P or N silicon 516 forming a PIN structure and in some cases a P P$^-$ N$^+$ for example and in some cases the P and N regions can merge forming a PN junction. The silicon layers are all crystalline. A reverse bias voltage is applied to the P and N regions with reverse bias ranging from 0.1 volt to 10 volts, and in some cases to 35 volts. Not shown are the CMOS/BiCMOS ASICs that can be formed on the same surface as the pixels or on the opposing surface as shown in FIG. 4.

Each of the single microstructure hole pixels can have lateral dimensions ranging from 0.5 micron to 2 microns, and in some cases can be less than 0.5 microns, and in some cases can range from 0.5 microns to 3 microns. For the case of pixels with multiple microstructure holes, the pixel lateral dimension can range from 1 micron to 30 microns, and in some cases 1 micron-100 microns or more.

The pixels can have the same and/or different number of holes 512 where the number of holes can range from 1 to 100 and in some cases greater than 100. In some cases, the holes 512 are shaped as an inverted pyramid. In some cases, the size or lateral dimension of the hole or holes can be the same and/or different for different pixels. In some cases, the shape of the holes can be the same and/or different for different pixels and in some cases the cross section of the hole or holes can be the same and/or different for different pixels. Different lateral dimensions and/or shapes and/or numbers of holes can be used to optimize EQE at certain wavelengths for the same or different pixels. In some cases, all the pixels can be identical, and in some cases the pixels can have a variation in the number of holes, lateral dimension and/or shape of hole or holes.

Figure 5B:
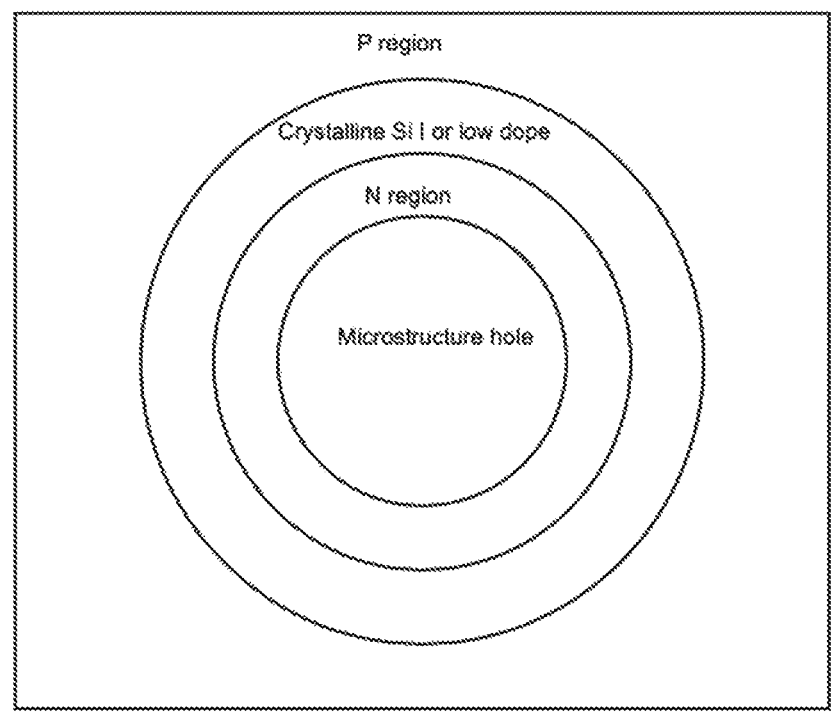
FIG. 5B is a diagram showing a single microstructure hole pixel that is similar to the pixels shown in FIG. 5A, except that it is circular, according to some embodiments.

FIG. 5B is a diagram showing a single microstructure hole pixel that is similar to the pixels shown in FIG. 5A, except that it is circular, according to some embodiments. The single pixel shown in FIG. 5B has concentric N and P regions separated by an I or low dope P or N region forming a PIN, PPN, or PN junction. Arrays of such pixel can be formed as in FIG. 5a with array sizes ranging from 10×10 to 10,000×10,000 or more.

The microstructure hole can be cylindrical or conical or funnel and the circular hole can be approximated with a polygon. The depth of the hole can be partially into the silicon or entirely to the BOX layer. The depth of the hole can range from 0.1 micron to 3 microns for example, and in some cases can be greater than 3 microns. The pixel size can range from 1 micron to 3 microns in lateral dimension, and the lateral dimension of the microstructure hole can range from 400 nm to 1000 nm. The microstructure hole can be partially or fully filled with dielectric such as silicon dioxide for passivation to reduce dark current and surface recombination, and the entire pixel array can be covered with silicon dioxide for example.

Figure 5C:
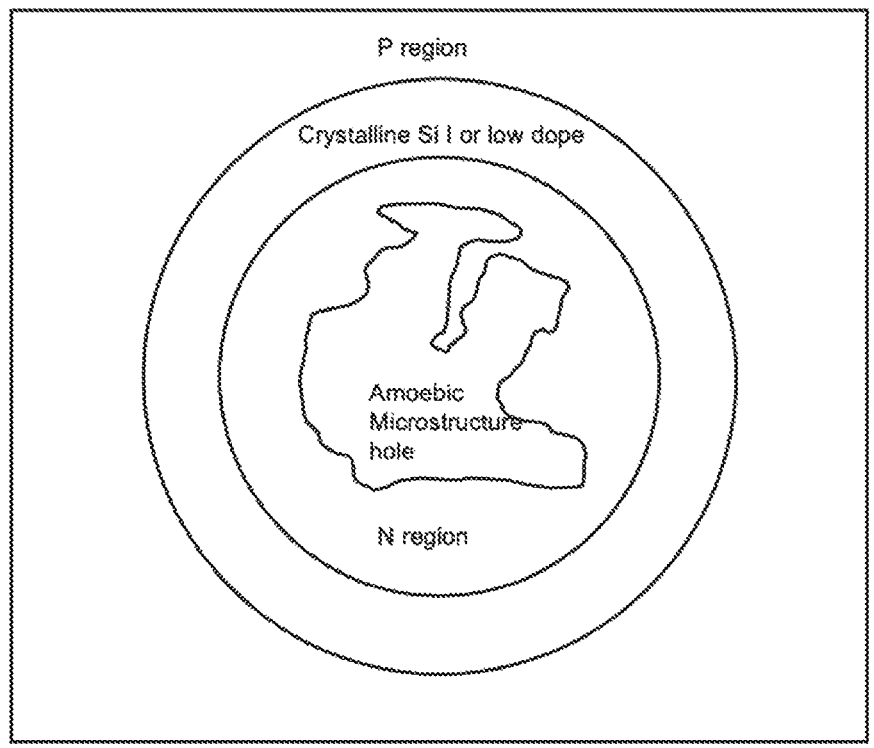
FIG. 5C is a diagram showing a pixel similar to that shown in FIG. 5B where the microstructure hole is amoebic in shape, according to some embodiments.

FIG. 5C is a diagram showing a pixel similar to that shown in FIG. 5B where the microstructure hole is amoebic in shape, according to some embodiments. The P and N regions can form PN junctions and in some cases PIN junctions, and in some cases P low dope N or P N junctions, and in some cases PIPN junctions for the device to operate in a photodiode and/or avalanche photodiode (APD) and/or single photon avalanche photodiode (SPAD) with a reverse bias applied to the anode and cathode. In some cases the reverse bias voltage can be anywhere in the range of 0.1 volt-3.3 volts, and in some cases anywhere in the range of 1 volt-10 volts, and in some cases anywhere in the range of 10 volts-35 volts for example.

Pixels with dimensions of less than 1.5 microns×1.5 microns for example 0.8 microns×0.8 microns-1.2 microns× 1.2 microns can have a single microstructure hole where the microstructure hole can be an inverted pyramid that can be wet etched using KOH or TMAH, and/or the microstructure hole can be dry etched in a funnel and/or cylindrical hole on each pixel, and where the microstructure hole can be centered on the pixel, and in some cases off centered. References, Yokogawa 1 et al, IR sensitivity enhancement of CMOS Image Sensor with diffractive light trapping pixels, Nature Scientific Reports, Jun. 19, 2017. Yokogawa 2, Nanophotonics contributions to state-of-the-art CMOS Image Sensors, IEEE February 2020, Yokogawa 3 USPTO 10,411,053 B2, Yokogawa 4 US 2020/0006407 A1; show the use of inverted pyramid arrays on a pixel with dimensions of 1.2 micron×1.2 micron to enhance the quantum efficiency. In this disclosure funnel or cylindrical holes arrays in periodic and/or aperiodic arrangements can be dry etched into the pixel with varying depth that is not limited by lattice plane anisotropic wet etch such as in the case of inverted pyramids. In some cases, deeper microstructure hole or holes can result in a higher quantum efficiency. In addition, the shape of the hole or holes can be circular, oval, rectangular, amoebic and/or any combination of shapes not limited to square, inverted pyramids as in the case of wet etching. According to some embodiments, each pixel can have a single microstructure hole with a shape being any shape or combination of shapes. For example, the shapes can be: two intersecting ovals, amoebic, star, intersecting rectangles, hexagonal to name a few, and/or any combination of shapes, sizes, depths, and cross sections.

Multiple lateral dimensions can be implemented in the microstructure hole to allow the low Q resonator to support multiple wavelengths of the incident photons such that the enhanced absorption and therefore the EQE can have a broader and flatter spectrum. In addition, the microstructure hole cross section can have sidewalls that are predominately 90 degrees to the surface, and in some cases can have conical or sloped sidewalls, and in some cases a combination of straight and sloped sidewalls with one or more slope.

Figure 6:
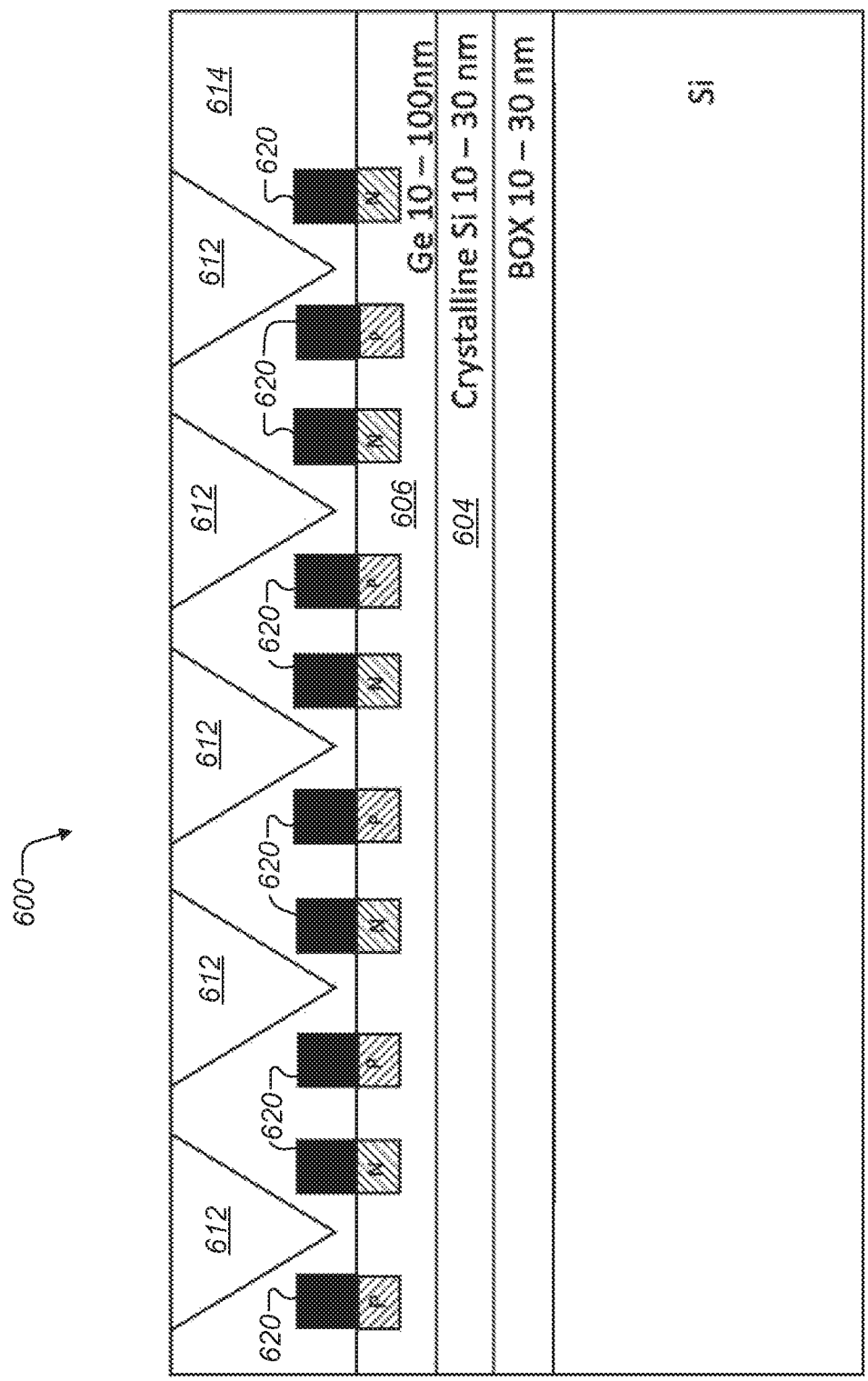
FIG. 6 is a simple partial cross section schematic of a lateral interdigitated PN or PIN photodiode (PD), avalanche photodiode (APD) or single photon avalanche photodiode (SPAD) that can be monolithically integrated with CMOS application specific integrated circuits (ASICs), according to some embodiments.

FIG. 6 is a simple partial cross section schematic of a lateral interdigitated PN or PIN photodiode (PD), avalanche photodiode (APD) or single photon avalanche photodiode (SPAD) that can be monolithically integrated with CMOS application specific integrated circuits (ASICs), according to some embodiments. The structure 600 shown is similar to that shown in FIG. 1 with the addition of a thin Ge or GeSi layer 606 on top of the Si device layer 604. The Ge/GeSi layer 606 can be epitaxially grown on the thin Si layer 604 forming crystalline Ge or GeSi layer. In some cases, the Ge/GeSi layer 606 can be selective area grown epitaxially to form a grid structure where microstructure holes can be formed. The thickness of the Ge/GeSi layer 606 can range from 10 to 100 nm, and in some cases 10-350 nm. The dielectric 614 deposited on the interdigitated lateral PIN with M1 and M2 electrodes 620 can be Hf oxide, Al oxide, Si nitride to name a few. In some cases dielectric layer 614 can be an amorphous semiconductor such as GaN, GaAs, Si that can be deposited by e-beam or plasma assisted deposition. The microstructure holes 612 can be triangular cross section and in some cases the cross section can be trapezoidal or cylindrical to name a few. The microstructure holes 612 are formed in the dielectric or amorphous semiconductor layer and can have a lateral dimension ranging from 400 nm to 1300 nm. The spacing between the microstructure holes 612 can range from 0 nm (overlapping) for holes that have triangular or trapezoidal shape to 1000 nm, and in some cases 100 nm-1000 nm, and in some cases 100 nm-500 nm in a periodic and/or aperiodic arrangement in either or both lateral dimensions.

The PN junction formed in the Ge/GeSi layer 606 can be a lateral PIN structure, and in some cases the P and N regions can overlap to form a PN junction. The device operates with a reverse bias between the P and the N region, and can operate as a photodiode or an avalanche photodiode, or a single photon avalanche photodiode. The reverse bias voltage can range from 0.6 volts to 35 volts, and in some cases 0.6 volts-10 volts.

The wavelength range for the interdigitated lateral PN photodetector 600 can range from 800 to 1650 nm, and in some cases 800-1350 nm, and in some cases 1000 nm-1450 nm. Data rate can range from 25 Gb/s to 100 Gb/s and in some cases 50 Gb/s-200 Gb/s, and in some cases 25 Gb/s-50 Gb/s.

The Full Width Half Max from an impulse response can range from 3 psec to 30 psec, and the rise time can range from 1 to 15 psec.

In some cases, microstructure holes 612 can also be formed in the Ge and/or Si device layer by etching, and in some cases the holes can be formed in the Ge layer by selective area epitaxial growth in a grid pattern for example. The dielectric and/or amorphous semiconductor layer 614 are formed on a completed lateral PN photodetector with electrodes 620 which can be metal and/or silicide and where microstructure holes are formed on the dielectric and/or amorphous semiconductor. In some cases, the dialectic and/or amorphous semiconductor layer 614 with microstructure holes 612 can be further covered with another dielectric such as silicon dioxide which has a lower refractive index than the dielectric and/or amorphous semiconductor where the microstructure holes 612 are formed.

Figure 7:
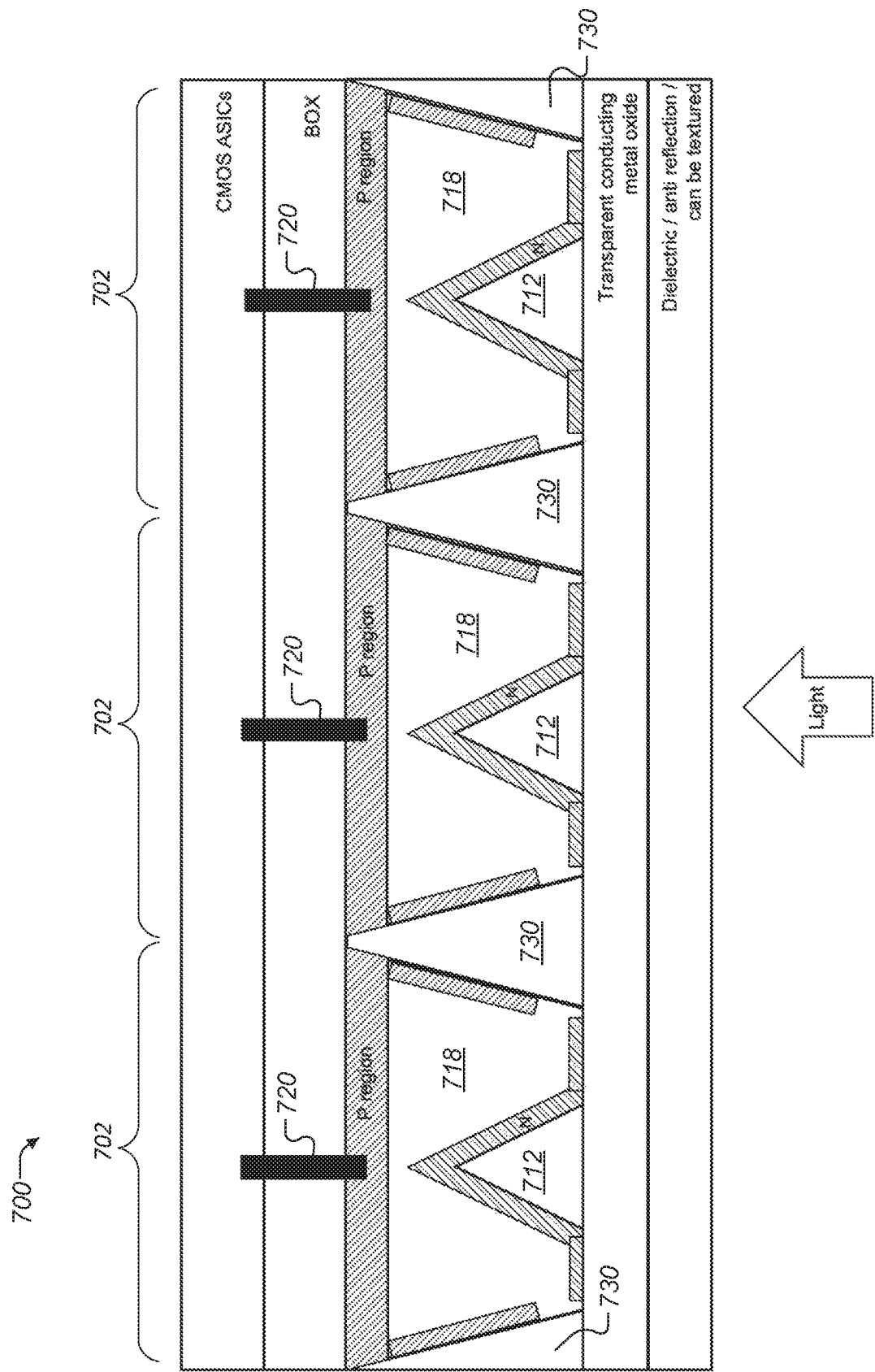
FIG. 7 is a simple partial cross section schematic diagram of a high density back illuminated CMOS image sensor, according to some embodiments.

FIG. 7 is a simple partial cross section schematic diagram of a high density back illuminated CMOS image sensor, according to some embodiments. The pixel lateral dimension can range from 0.6 um to 2 um, and in some cases 0.8 um-1.2 um where um is 1 micron. The pixels 702 of sensor 700 are often square and in some cases can be rectangular. In FIG. 7 the lateral dimension of each pixel 702 is approximately 1200 nm×1200 nm, and in some cases can be 800 nm×800 nm with a thickness of the Si layer ranging from 1 to 3 microns. Each pixel is isolated with dielectric filled isolation trenches 730 where the walls of the isolation trenches 730 can be vertical or have a slope that can be positive and/or negative. The side walls of the pixels can have a doped region of N or P and the microstructure holes 712 etched into the Si can be an inverted pyramid, conical, cylindrical, or a combination of conical and cylindrical. The side walls of the holes are doped in an opposite polarity to the side wall of the pixel. The P and N doping region can be separated by an I or low dope region 718 to form a PIN structure, and in some cases the P and N region can intersect and/or merge to form a PN junction. A reverse bias is applied between the P and N region to operate the device either as a photodiode or an avalanche photodiode and/or single photon avalanche photodiode. The reverse bias voltage can range from 0.3 volts to 10 volts, and in some cases 0.3 volts-35 volts. An electrode 720 can connect to the doped region of each pixel for example the P region to CMOS/BiCMOS ASICs electronics. Transparent conducting metal oxide such as Indium Tin Oxide for example can be formed or deposited connecting the N doped region for example as shown to from a common electrode that can be connected to the CMOS/BiCMOS ASICs (not shown). A dielectric layer or layers can be formed or deposited on the transparent conducting metal oxide as an anti-reflection and can be textured to reduce reflection from the surface. The microstructure holes 712 can be fully or partially filled with dielectric such as Si dioxide for example, and the trench can also be fully or partially filled with a dielectric, and in some cases amorphous semiconductor. In some cases, dielectric in the microstructure holes 712 can be an amorphous semiconductor. The lateral dimension of the hole can range from 500 nm to 900 nm, and in some cases the lateral dimension of the hole can range from 600 nm to 800 nm. The depth of the holes can range from 500 nm to 2000 nm, and in some cases the depth of the hole can range from 200 nm to 1000 nm.

The wavelengths can range from 600 nm to 1100 nm, and the enhancement of the external quantum efficiency can range from 80%-700% or more and in some cases 100%-500% over a comparable pixel without microstructure holes at certain wavelength ranges. The jitter can range from a few psec to 20 psec, and in some cases 1 psec-15 psec. The density of the pixels can range from 1,000×1,000 to 10,000×10,000, and in some cases more than 10,000×10,000. In some cases for large pixels greater than 800 nm lateral dimension more than 1 microstructure holes can be formed. For example, a 2×2 arrangement in a square lattice, or 3 microstructure holes in an aperiodic or random arrangement can be formed. See, Wakabayashi et al, A 1/2.3-inch 10.3 Mpixel 50 frame/s Back-Illuminated CMOS Image Sensor, IEEE International Solid-State Circuits Conference 2010; Reference Zang 2 et al, Surface textured silicon single-photon avalanche diode IEEE CLEO 2017, which discusses the use of surface texturing for a single photon avalanche diode.

Surface texturing which can be similar to Black Silicon can reduce reflection, however the use of microstructure holes can both reduce reflection and enhance the absorption due to its low Q resonator that results in light being re-radiated in the lateral direction. The Q factor can range from 5 to 50 for example. In the case of multiple microstructure holes the holes are in close proximity in some cases within a wavelength approximately from each other, and the low Q resonators can be coupled to each other. Since the Q is low, the spectral range is wide, and can be over 100 nm for example. Microstructure hole/holes that are dry etched are fully compatible with standard CMOS foundry processes and allow greater flexibility in design and optimization. For example a single microstructure hole within a pixel with dimensions approximately 1 micron×1 micron can enhance the near infrared sensitivities.

Figure 8A:
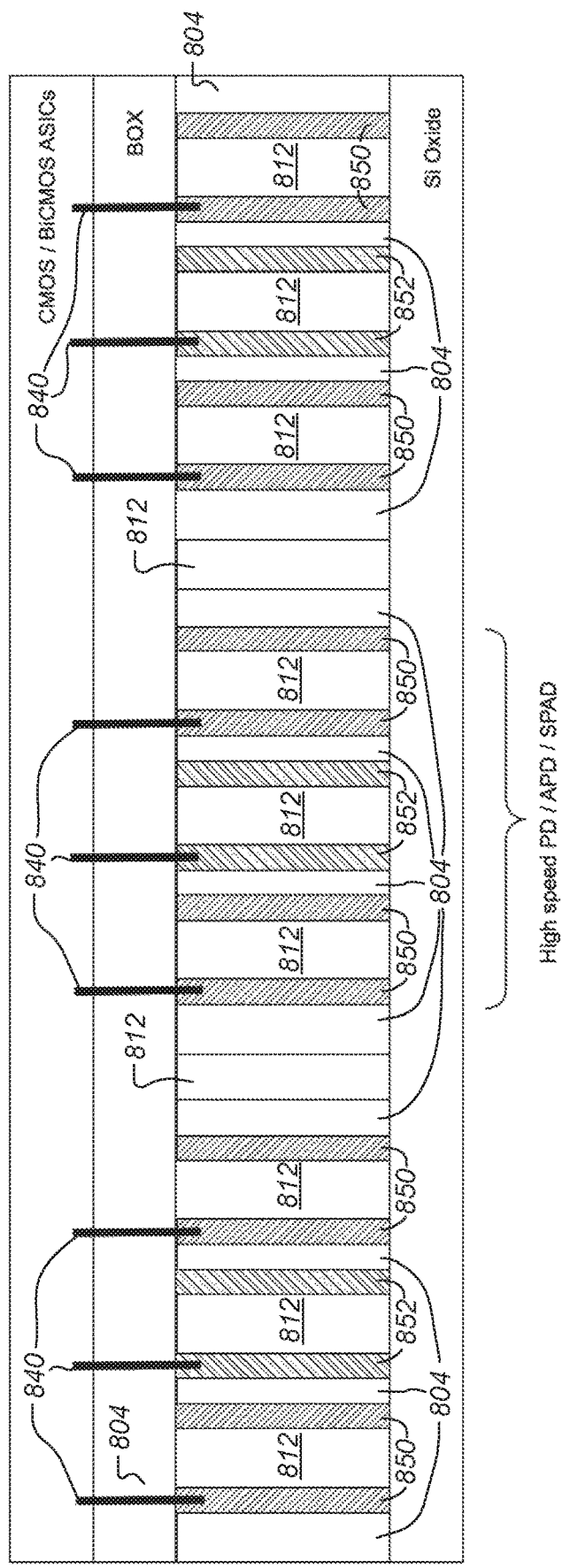
FIGS. 8A and 8B are simple partial cross section schematic diagrams of high speed back illuminated photodiodes (PDs)/avalanche photodiodes (APDs), according to some embodiments.
Figure 8B:
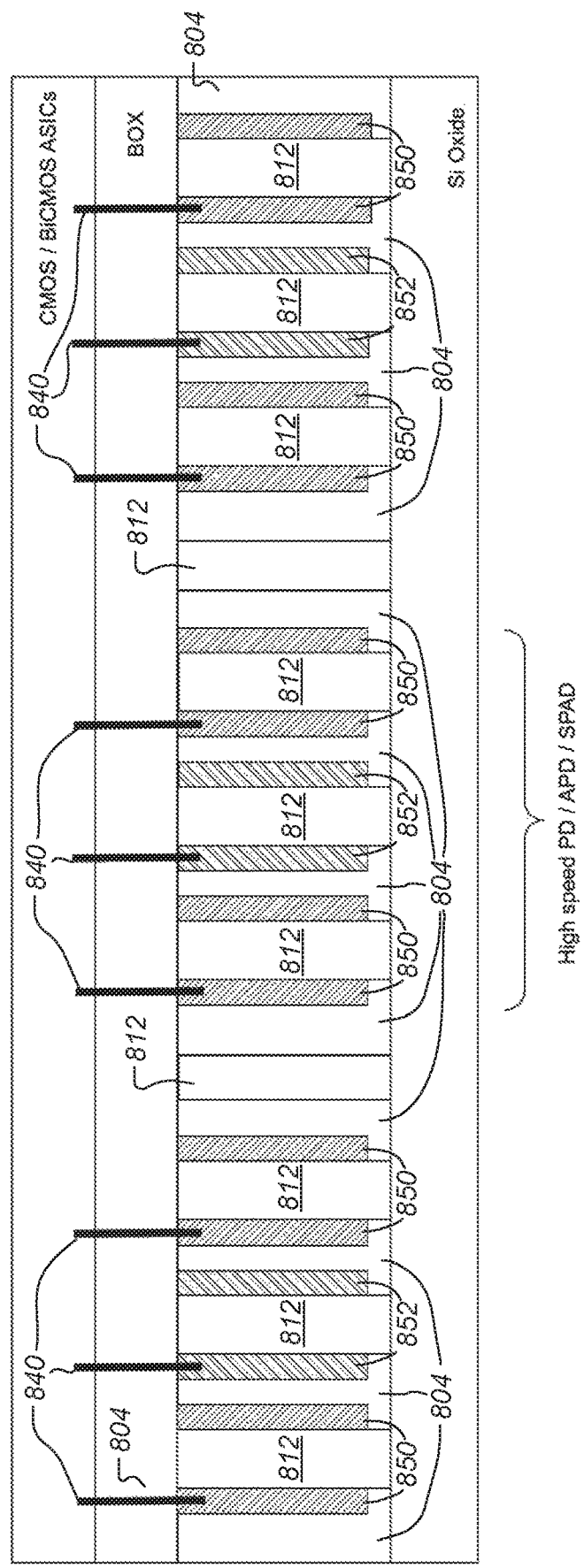

FIGS. 8A and 8B are simple partial cross section schematic diagrams of high speed back illuminated photodiodes (PDs)/avalanche photodiodes (APDs), according to some embodiments. In FIG. 8A, the BiCMOS or CMOS electronics are on one surface and the PD/APD are on the opposing surface. The data rate for this high-speed PD/APD can range from 25 Gb/s to 112 Gb/s, in some cases 56 Gbs, in some cases 112 Gb/s and in some cases greater than 112 Gb/s. The wavelength range can be from 800 nm to 1100 nm. The Si on insulator wafer where the CMOS/BiCMOS are formed on the device layer and the high-speed PD/APD are formed on a handle layer 804 where the handle Si is crystalline, and is I or low dope Si. The handle layer 804 can be thinned to 3 microns, and in some cases can have a thickness ranging from 1 to 5 microns. Microstructure holes 812 are formed into the thin Si handle layer and as shown cylindrical holes can be formed to the BOX layer. The side walls of the cylindrical holes 812 can be doped P type (850) or N type (852) and alternating holes or adjacent nearest neighbor holes can be doped in opposite polarity. Electrodes 840 can be formed to connect the doped region of N or P to the CMOS or BiCMOS ASICs. A reverse bias is applied between the N and P with a reverse bias voltage ranging from 0.6 to 3.3 volts and in some cases from avalanche operation the reverse bias voltage can range from 3.3 to 10 volts, and in some cases to 35 volts. The P and N regions can be separated by and I or low dope Si of layer 804 to form a PIN junction, and in some cases the P and N regions can intersect or merge to form a PN junction. The lateral dimension of the microstructure hole can range from 500 to 1000 nm, and in some cases 600-1200 nm, and the microstructure holes can be fully or partially filled with a dielectric, and in some cases an amorphous semiconductor. The microstructure holes 812 can be arranged in a periodic lattice such as a square or hexagonal lattice, and/or aperiodic and/or randomly arranged holes. Optical signals can impinge from the back where the microstructure holes 812 are formed. An array of PD/APDs can be formed with array sizes ranging from N×M where N and M are integers ranging from 1 to 100. Applications for such PD/APDs are for short range optical data centers using multimode fibers and in some cases single mode fibers. Each PD/APD is separated electrically and optically by an isolation trench (not shown) which can be filled or partially filled with a dielectric. The PD/APD can be covered with a dielectric such as Si dioxide, and can be textured to further reduce reflection. Reference Gao et al, Photon-trapping microstructures enable high-speed high-efficiency silicon photodiodes, Nature Photonics, 3 Apr. 2017, showing an example of using microstructure holes low Q resonators with broad spectral response to enhance the absorption and/or EQE of a Si high speed photodetector at the near infrared (NIR) wavelength.

FIG. 8B is similar to FIG. 8A with the exception that the N regions 852 and P regions 850 are recessed from the bottom surface of the microstructure holes 812 such that the P and N regions have gaps that can be low dope or intrinsic regions of silicon of layer 804.

Figure 9A:
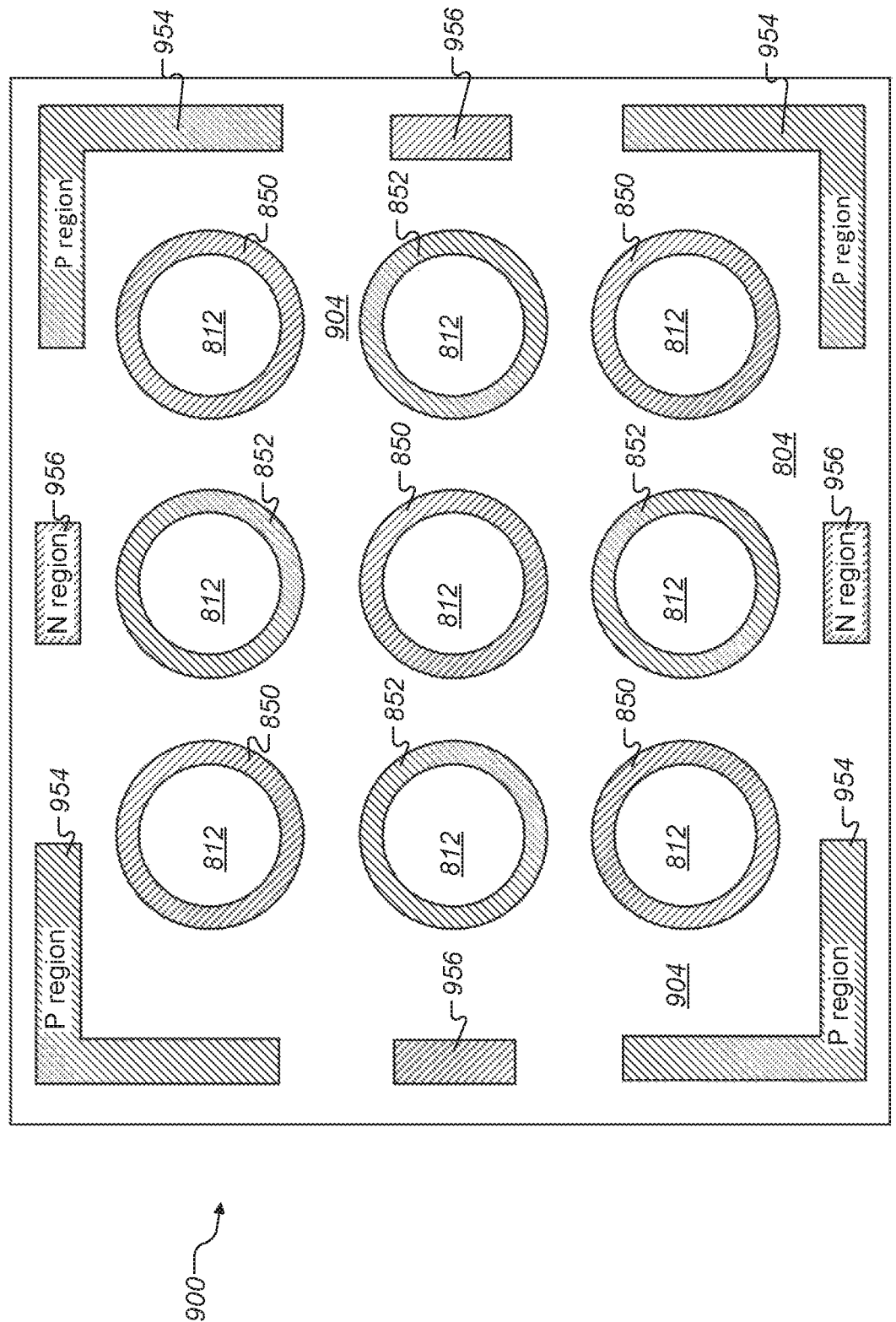
FIGS. 9A to 9D are simple partial schematic top views of a single PD/APD such as shown in FIGS. 8A and 8B, according to some embodiments.

FIGS. 9A to 9D are simple partial schematic top views of a single PD/APD such as shown in FIGS. 8A and 8B, according to some embodiments. In FIG. 9A, the microstructure holes 812 as shown are arranged in a square lattice and the hole edge to edge separation can range from 100 nm to 500 nm, and in some cases 200 nm-300 nm. Each hole 812 has doped regions 850, 852 that have an opposite polarity from its nearest neighbor as shown. The holes can be arranged in a periodic or aperiodic or random manner. The border defining the PD/APD 900 are also doped in N regions 956 and P regions 954 to minimize any dead space where photo generated carriers can be swept out rapidly with a high field for high speed operation. Not shown in FIGS. 8A-B and 9A-B are passivation layers, and the passivation layers can be Si dioxide grown thermally on the walls of the isolation trench, and in some cases in the side walls and/or surface of the microstructure holes. CMOS/BiCMOS processing can be used to ensure a reliable low leakage PD/APD using standard CMOS/BiCMOS processing techniques that are standard in the industry. The doped regions 954 and 956 on the boundary of the PD/APD 900 are electrically connected to the doped region of the microstructure holes and the electrodes are not shown for simplicity. In some cases, the electrodes can be transparent conducting metal oxide, metal silicide, and/or metal electrodes.

The lateral dimension of the PD, APD, SPAD 900 can range from 3×3, 5×5, 10×10, 15×15, to 20×20 micron squared. In some cases, the dimension of the photodetector can be n×m where n and m can have values ranging from 1 to 50 microns. Reference Zheng et al, Electrical and optical 3D modeling of light-trapping single-photon avalanche diode, SPIE OPTO 2018.

The microstructure holes 812 can be circular, oval, square, polygonal amoebic, and/or any combination thereof. And, in addition, the lateral dimension of microstructure holes 812 can vary. For example, some microstructure holes can be larger, and some microstructure holes can be smaller. The microstructure holes can be arranged in a square or hexagonal lattice, and the lattice spacing can vary. For example, some microstructure holes can be closer to their nearest neighbor, and some microstructure holes can be further away from their nearest neighbor. The variation can be regular or irregular and/or random in both the size of the microstructure hole and the spacing of the microstructure holes.

Microstructure holes can be in even or odd number of holes, for example 3, 4, 9, 16, 36 holes for example. The lateral dimension of the photosensor/pixel can range from 1 micron to 30 microns, and in some cases 1 micron-60 microns for example.

Figure 9B:
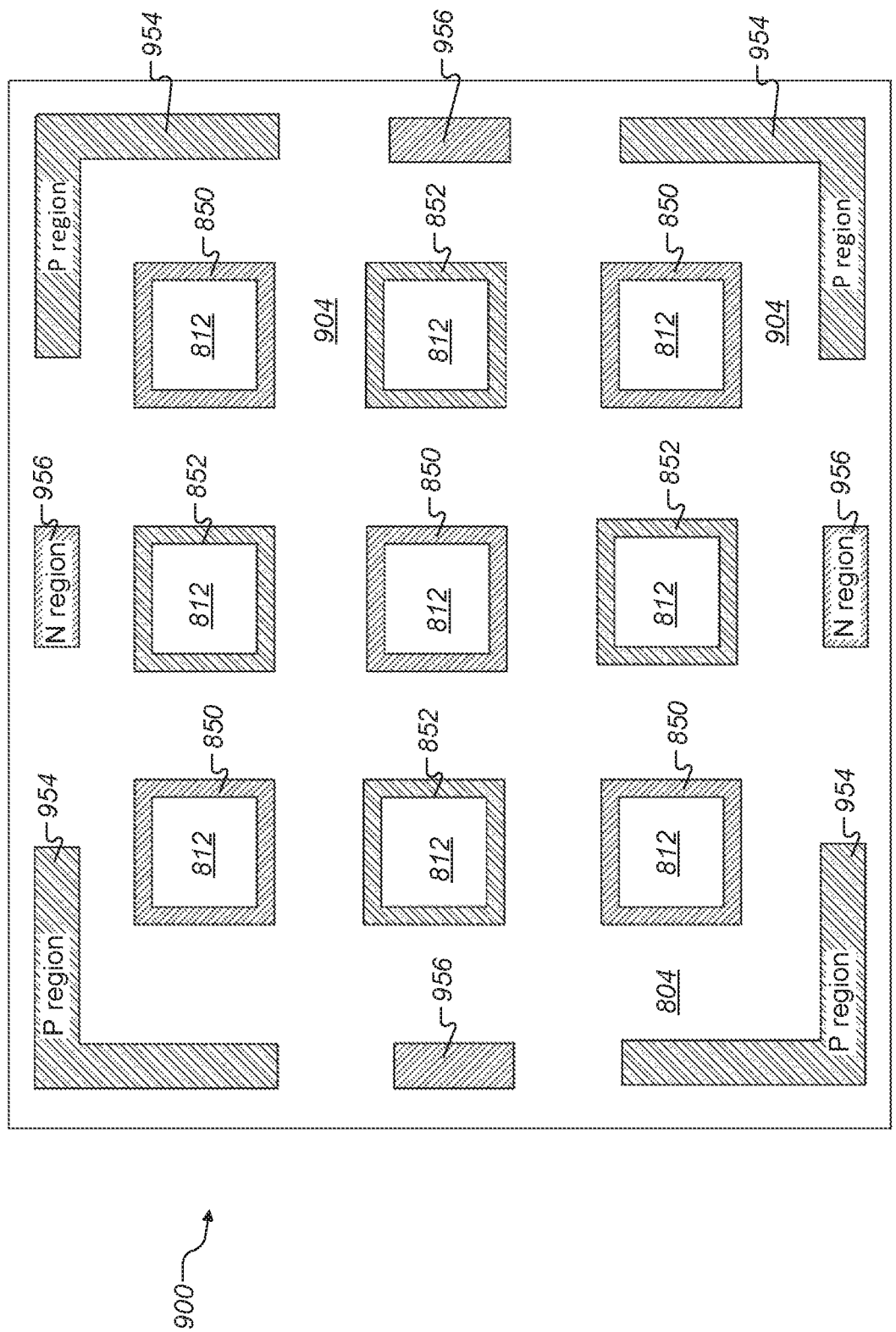

FIG. 9B is a simple partial schematic of a top view similar to FIG. 9A where the microstructure holes 812 are square with lateral dimensions ranging from 400 nm-900 nm, and in some cases 450 nm-850 nm, and where the spacing between the holes can range from 100 nm-500 nm, and in some cases 200 nm-400 nm. Electron hole pairs generated in the center vicinity of 4-sided holes have a shorter distance to travel to the edge of the hole as compared with circular holes for example. In addition the field strength at the vertex of the holes can be stronger and can facilitate the transit time of the electron hole pairs.

Figure 9C:
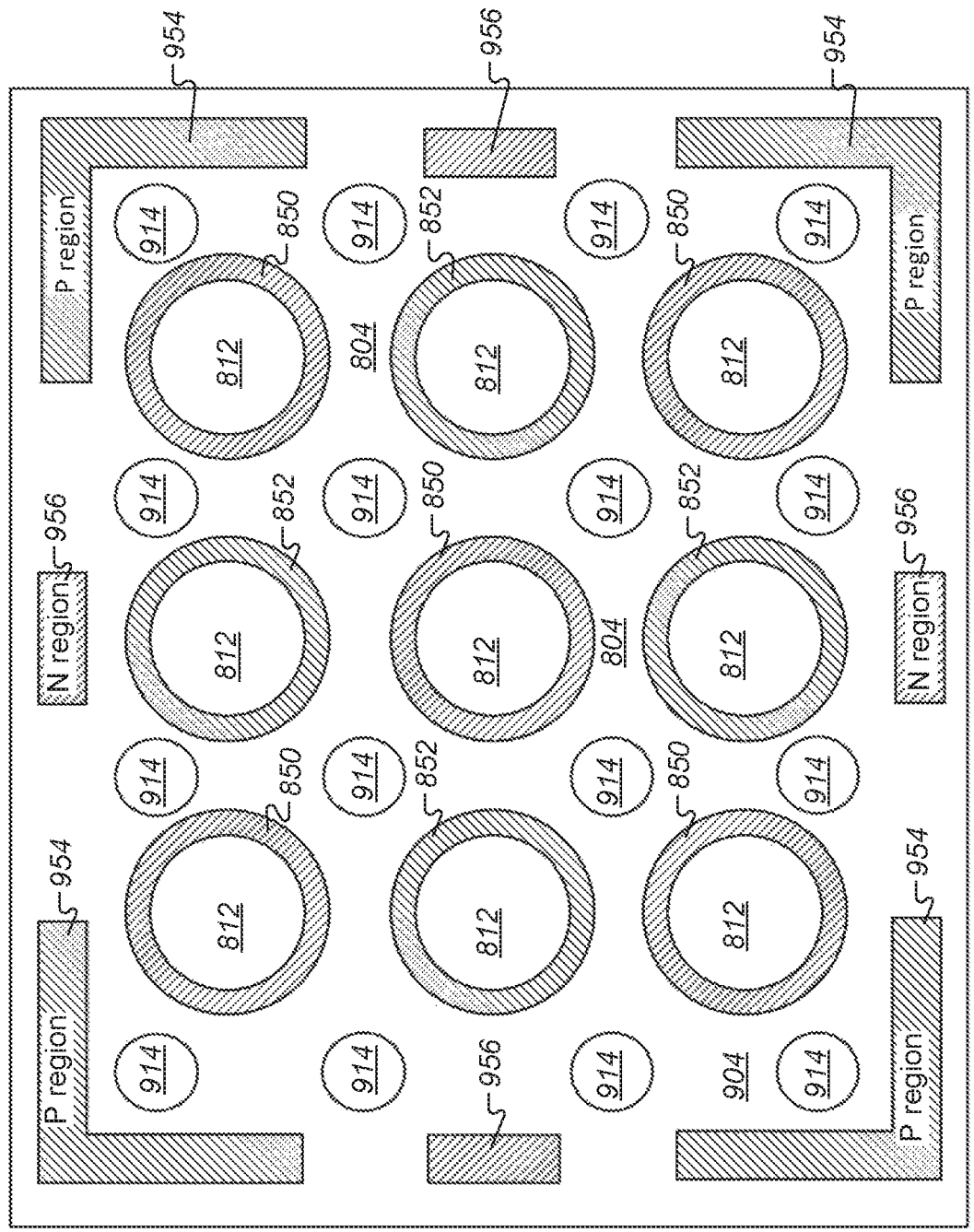

FIG. 9C is a simple partial top view schematic similar to FIG. 9A with the addition of microstructure holes 914 that are not intentionally doped in the side walls. The additional microstructure holes 914 can have a lateral dimension ranging from 50 nm to 400 nm. These microstructure holes 914 are placed in regions that are diagonal to two N doped holes and the diagonal to two doped P holes as shown. The purpose of the additional microstructure holes 914 in addition to trapping photons can be viewed as a region devoid of photon absorbing material. In this situation electron hole pairs are generated in regions of high electric field and reduced transit time as compared a structure shown in FIG. 9A for example. The microstructure holes doped or undoped side walls can be fully or partially etched in the Si handle layer 804 and can be periodic, aperiodic or randomly arranged. In addition, the holes 812 and 914 can be of different lateral dimension and can have any shape such as circular, polygonal, amoebic to name a few, and any combination of shapes of lateral dimensions within each photosensor/pixel/cell. In the case where the P and N dopants merge to form a PN junction the additional microstructure holes can be formed in these doped regions.

The extra micro/nano holes among the doped microstructure holes can add to photon trapping, and in some cases the micro/nano holes are positioned in areas between the doped holes to minimize transit time of photogenerated carriers.

Micro/nano holes that are not doped can also act as photon trapping; however, the voids in the micro/nano holes are there mainly to avoid the generation of photocarriers in those regions. This is to speed up the transit time of the photodetector.

Figure 9D:
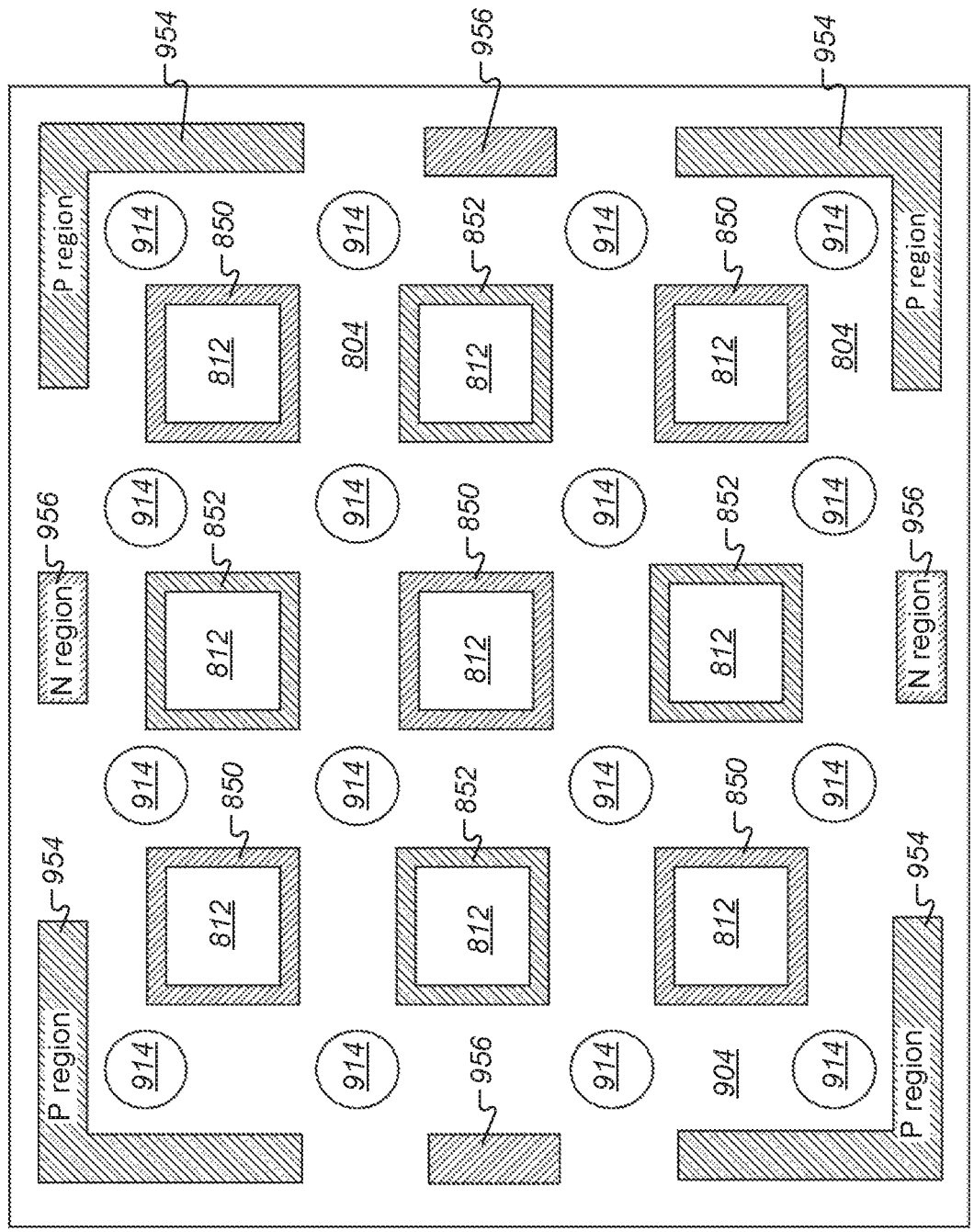

FIG. 9D is a simple partial top view schematic similar to FIG. 9B with the addition of microstructure holes similar to FIG. 9C. The P and N microstructure holes can be in a square lattice and in some cases a hexagonal lattice, and in some cases an aperiodic arrangement. The P and N regions can be in rows, and in some cases can be in columns.

FIG. 10 is a table of cylindrical microstructure holes with opposite doping such as in FIGS. 9A-9D in a square lattice. The photodetector data rate bandwidth is shown in Gb/s as a function of photodetector area, depth of the microstructure holes and microstructure hole diameter and period. The microstructure hole depth varies from 0.1 micron to 3 microns, and in some cases the depth of the holes can coincide with the thickness of the silicon. Depending on the size of the photodetector and the depth of the hole, and the diameter/period the data rate can vary from 14 Gb/s to 140 Gb/s.

At higher and higher data rates for example 25 Gb/s-100 Gb/s or more monolithic integration of photodetector or photodetector arrays with CMOS or BiCMOS ASICs becomes more and more essential for reliability, reproducibility and high yield. As in the reference Takemoto et al, A 50-Gb/s High-Sensitivity (−92 dBm) Low-Power (7.9 pJ/bit) Optical Receiver Based on 0.18 um SiGe BiCMOS Technology, IEEE Journal of Solid State Circuits, Vol. 53, No. 5, May 2018, discusses wire bonding of photodetector (PD) with electronics resulting in degradation of performance, non-reproducibility and low yield. The necessity of testing each wire bonded PD or PD array with electronics can increase the cost of the optical receiver. The proposed solder bump solution of flip chip packaging requires further processing and can also increase cost due to potential yield problems and sophisticated assembly and packaging costs, whereas by monolithic integration of thin silicon PD or PD arrays with microstructure holes to enhance absorption and therefore the external quantum efficiency that can result in high sensitivity and high data rate with high speed ASICs can vastly improve performance with high yield and low cost. The uniformity of the performance of such monolithic integrated PD or PD arrays with ASICs will not require testing and characterization of each chip which can be time consuming and costly.

Figure 11:
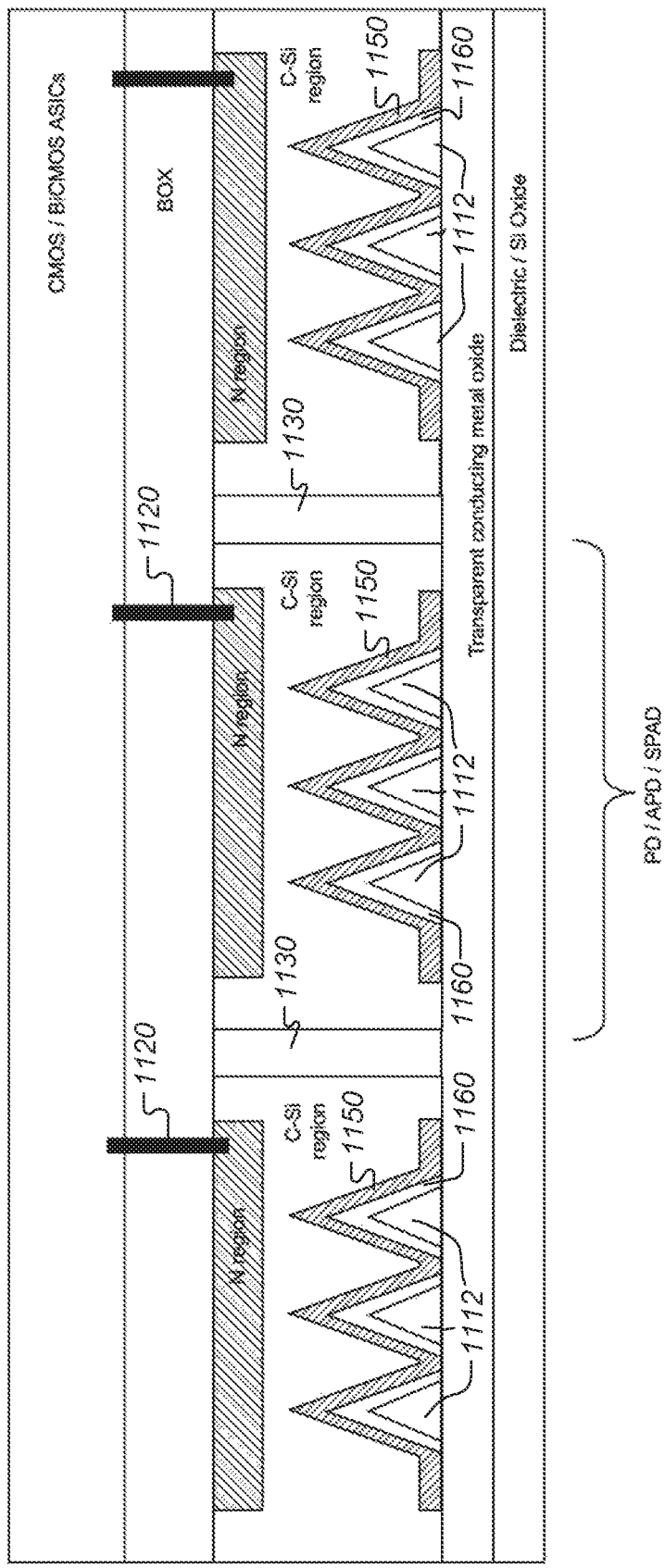
FIG. 11 is a partial simple schematic cross section of a back illuminated PD/APD/SPAD array, according to some embodiments.

FIG. 11 is a partial simple schematic cross section of a back illuminated PD/APD/SPAD array, according to some embodiments. Each photo-sensor can have a lateral dimension ranging from 1 micron-50 microns, and can be square, circular, hexagonal, polygonal. In some cases, the photo-sensor can have a lateral dimension greater than 50 microns and the array of photo-sensors can have a variety of lateral dimensions and in addition each photo-sensor can operate in one or more of the PD/APD/SPAD mode. The back illuminated high speed, high sensitivity photo-sensor is fabricated on the backside of an SOI wafer where the device layer can have the CMOS or BiCMOS ASICs electronics and each photo-sensor can be connected to the CMOS/BiCMOS ASICs, for example the N region can be connected separately to the CMOS/BiCMOS ASICs (via electrodes 1120), and the P region 1150 can be a common electrode that can be connected the CMOS/BiCMOS ASICs (not shown for simplicity). The back illuminated photo-sensor is fabricated on the handle layer which can be I or low dope N or P and thinner, to 1-3 micron thickness and in some cases to 5 micron thickness. Microstructure holes 1112 can be etched either dry or wet or a combination of dry and wet etch into the I or low dope layer to a depth ranging from 100 nm to 1000 nm or more. The N region is formed in the I or low dope Si close to the BOX layer, and the N layer can have a varying doping profile. The P layer 1150 can be formed along the contour or sidewalls of the microstructure holes 1112. The N and P regions can be formed by ion implantation and/or diffusion of P and N type dopants. The microstructure holes 1112 can have a lateral dimension ranging from 500 nm to 1000 nm, and can be conical shaped, inverted pyramid, cylindrical, funnel to name a few, and the spacing between the microstructure holes for the case of a triangular shaped hole can range from 0 to 300 nm, and in the case of cylindrical holes can range from 100 to-300 nm, and in some cases 100-500 nm. The depth of the holes can range from $1/10^{th}$ to $3/4$ or more the thickness of the C—Si region handle layer. A transparent conducting metal oxide (TCMO) 1160 such as Indium Tin oxide can be deposited on the surface, and along the contours or side walls of the microstructure holes 1112 which can be filled with a dielectric such as Si dioxide. Isolation trenches 1130 can be formed on the periphery of each photo-sensor for optical and electrical isolation, and in some cases isolation trenches 1130 can be formed partially into the handle layer, and in some cases isolation trenches may not be necessary. The isolation trenches 1130 can be filled with a dielectric such as Si dioxide. A TOMO layer can be formed connecting all the P regions as a common electrode and a reverse bias is applied between the P and N with voltages ranging from 0.1 to 10 volts, and in some cases 1 volt-35 volts depending on the operation of the photo-sensor as a PD or APD or SPAD. The wavelength can range from 600 to 1100 nm, and in some cases 800-1100 nm. The optical signal can consist of binary information, and in some cases can be images, and in some cases can be time-of-flight. In some cases, as an image sensor, the wavelength can range from 400 to 1100 nm. In the wavelength range of 600-1100 nm the microstructure hole photo-sensor can have a higher external quantum efficiency than a comparable photo-sensor without microstructure holes or a flat surface for example at certain wavelengths. The enhancement in the absorption which is directly proportional to external quantum efficiency can be 2-times or more. With microstructure holes as compared with the bulk absorption coefficient of Si at a certain wavelength. The enhancement in the external quantum efficiency can range from 50 to 750%, and in some cases 100-700% or more or a microstructure photo-sensor as compared to a similar photo-sensor without microstructure holes for example a flat surface at certain wavelengths.

In the case of optical data communication, the data rate can range from Gb/s to 112 Gb/s or more, and in some cases 56 Gb/s, and in some cases 112 Gb/s, and in some cases more than 112 Gb/s. For time-of-flight applications the jitter or the rise time impulse response can range from 1 psec to 30 psec and in some cases 1 psec-15 psec.

The array sizes can consist of large photo-sensors and small array size for example photo-sensor with 30 microns lateral dimension and array sizes of 100×100 pixels for example, and in some cases the array size can be 10×10 or less, and for photo-sensors for 3D imaging applications or for imaging applications the array size can be 1000×1000, 8,000×8,000 or 10,000×10,000 pixels or more, and the photo-sensor can have lateral dimensions of approximately 1 micron.

Additional dielectric layer or layers can be formed on the back surface of the photo-sensor, and the layers can be textured and/or can be multiple layers of dielectric with different optical indexes to further reduce back surface reflection. Not shown are passivation connecting electrodes metallization to reduce series resistance, silicide layers and other typical layers in CMOS/BiCMOS fabrication to name a few. In some cases, the photo-sensor can have a single microstructure hole, and in some cases can have an odd number of microstructure holes, for example 3 microstructure holes arranged in a triangular fashion, and the photo-sensor can have a triangular shape for example. See, Reference 3D Imaging & Sensing, Yole 2018, showing applications for 3D imaging and market size.

Figure 12:
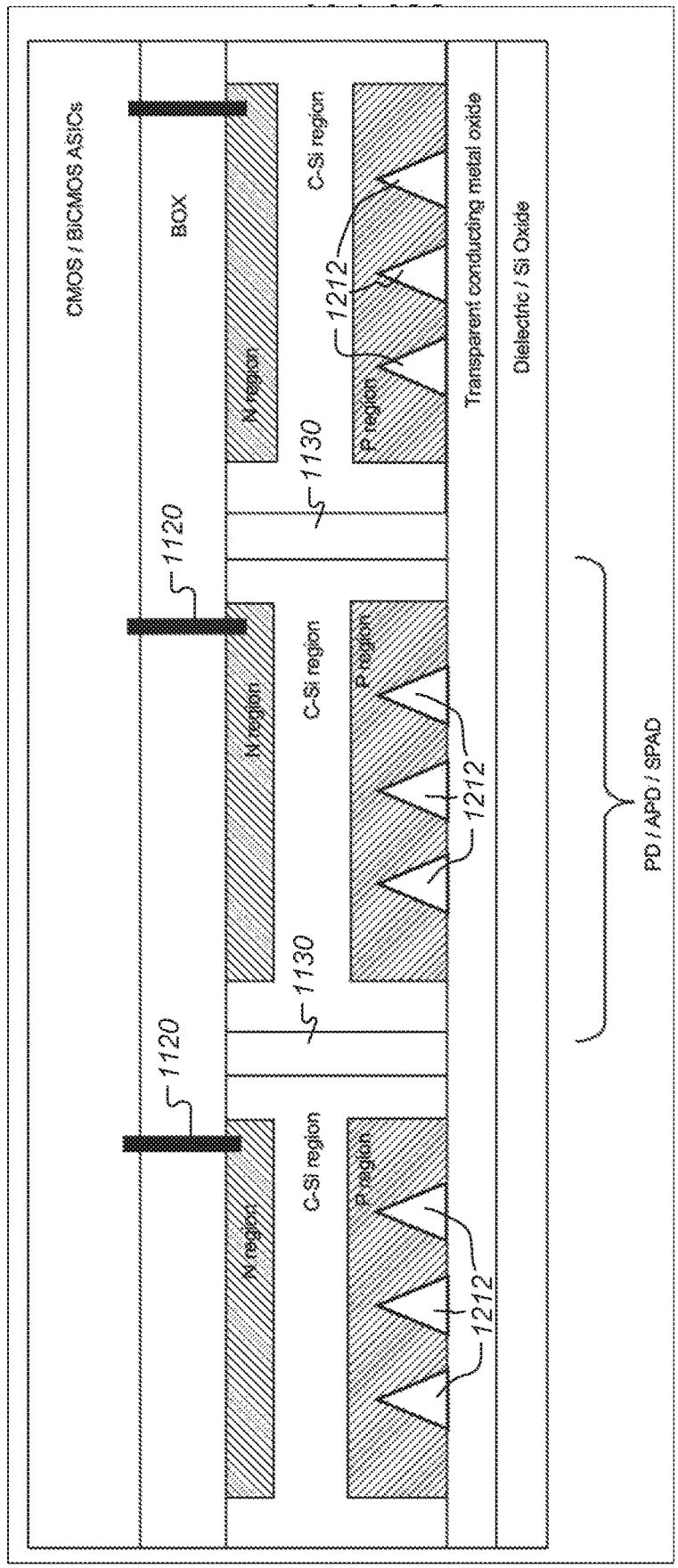
FIG. 12 is a simple partial schematic cross section similar to FIG. 11 with the exception of the microstructure holes 1212 are entirely in the P region.

FIG. 12 is a simple partial schematic cross section similar to FIG. 11 with the exception that the microstructure holes 1212 are entirely in the P region. The P and N regions can be interchanged in both FIGS. 11 and 12 and in some cases the P and N regions can be separated by I or low dope layer to form a PIN structure, and in some cases the P and N regions can intersect or merge to form a PN junction.

The P and N regions can form PN junctions and in some cases PIN junctions, and in some cases P low dope N or P N junctions, and in some cases PIPN junctions for the device to operate in a photodiode and/or avalanche photodiode (APD) and/or single photon avalanche photodiode (SPAD) with a reverse bias applied to the anode and cathode. In some cases the reverse bias voltage can be anywhere in the range of 0.1 volt-3.3 volts, and in some cases anywhere in the range of 1 volt-10 volts, and in some cases anywhere in the range of 10 volts-35 volts for example.

Figure 13A:
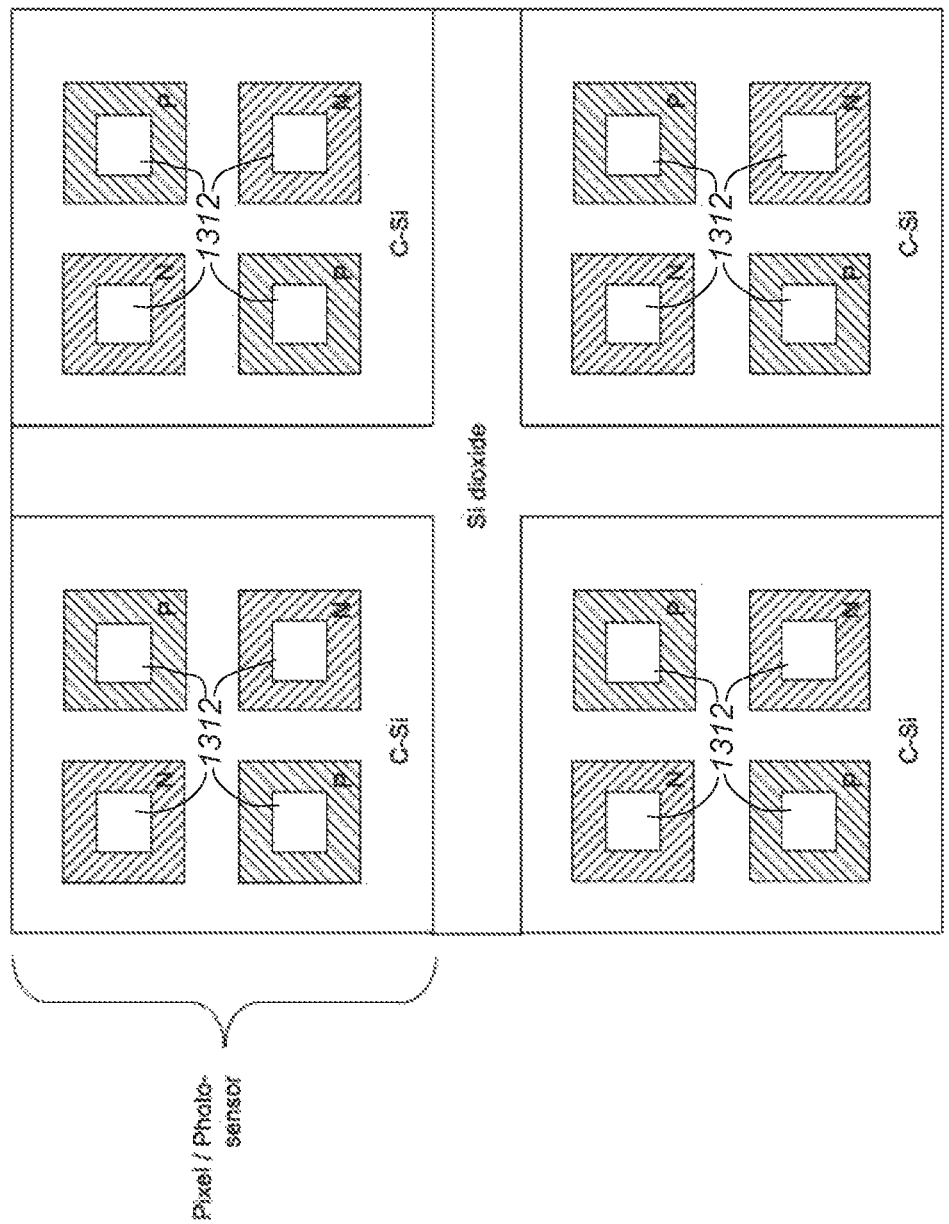
FIGS. 13A-13C are simple partial schematics of the top views of 4 pixels or photodetectors, according to some embodiments.
Figure 13B:
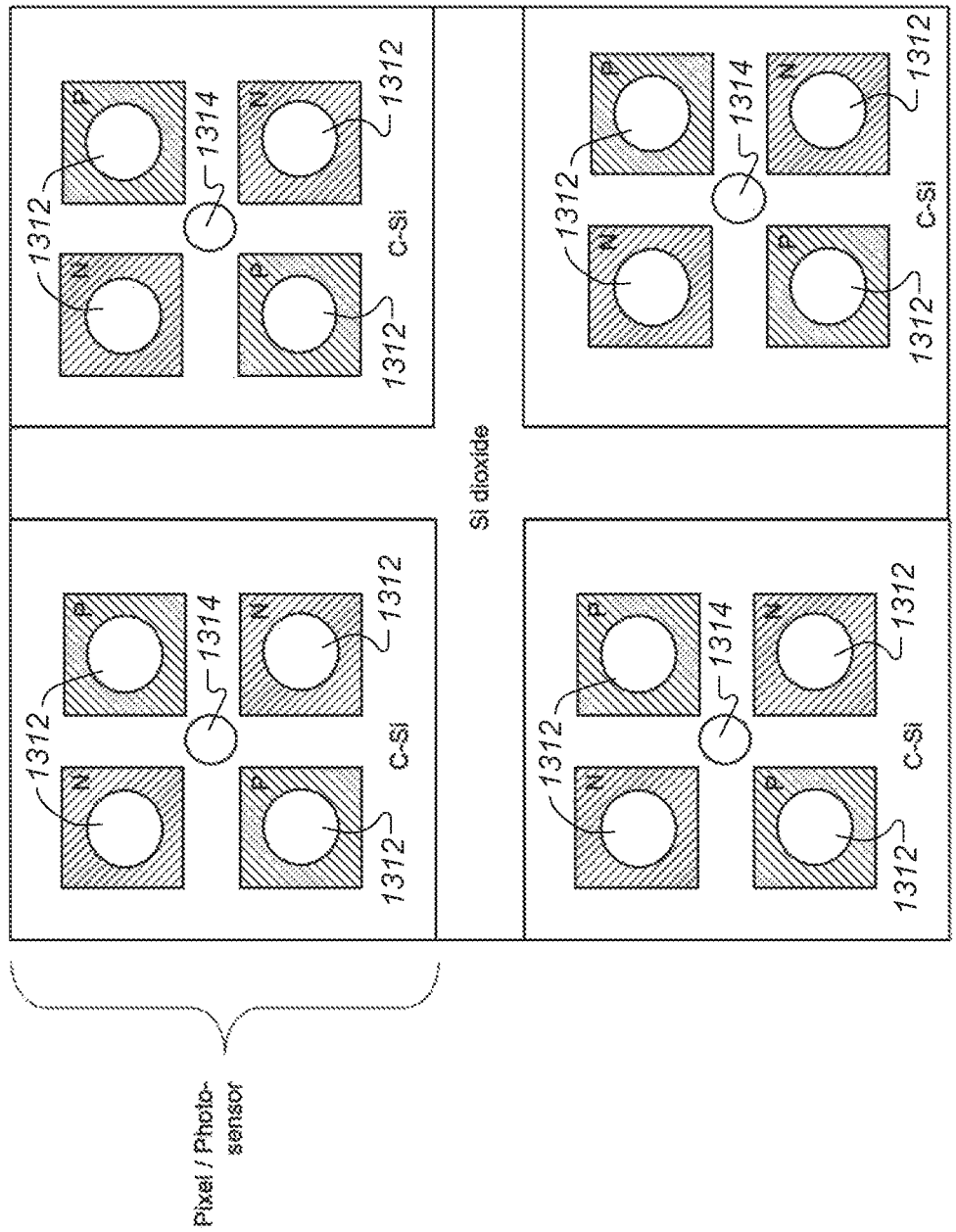
Figure 13C:
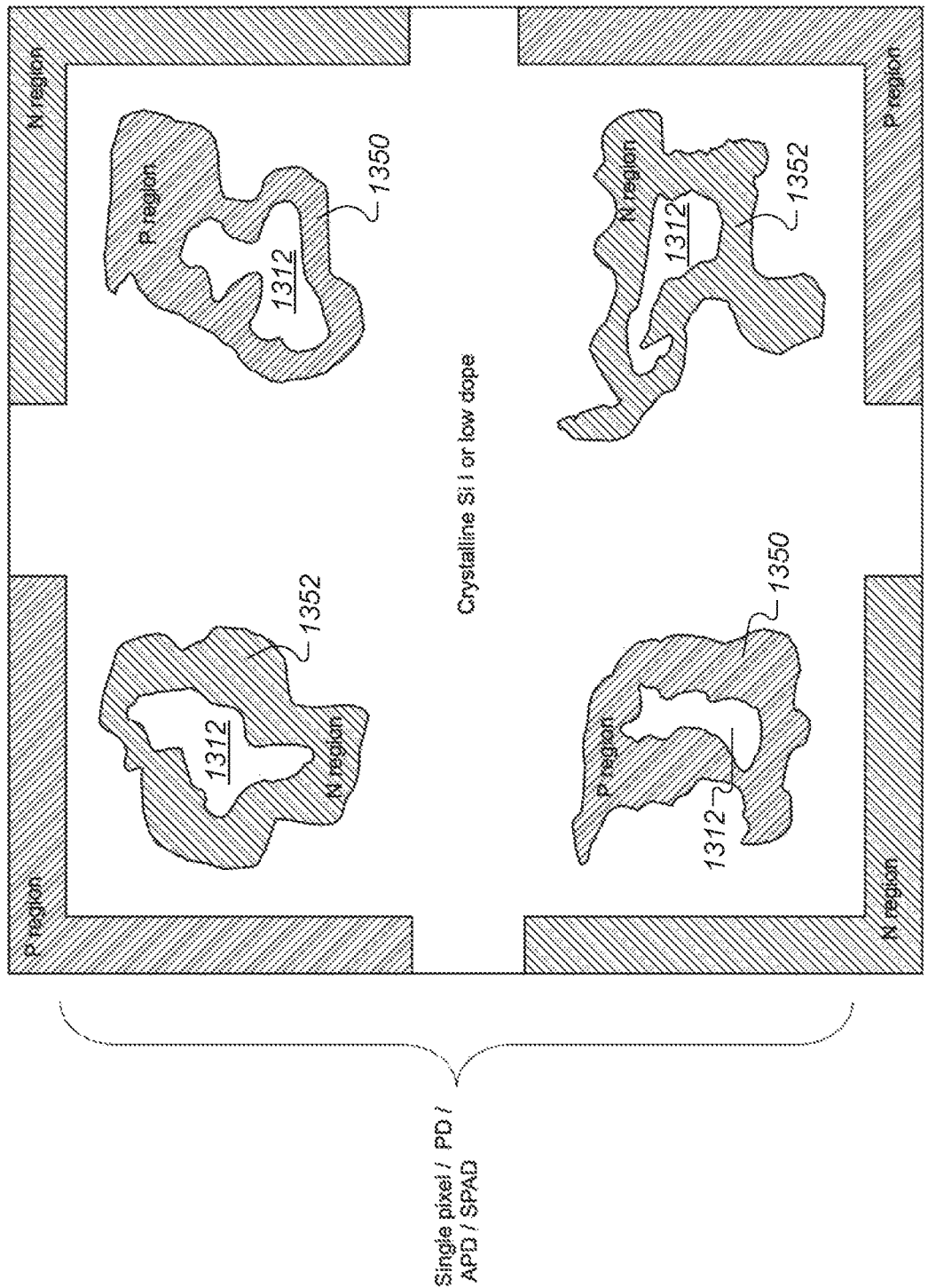
Figure 14A:
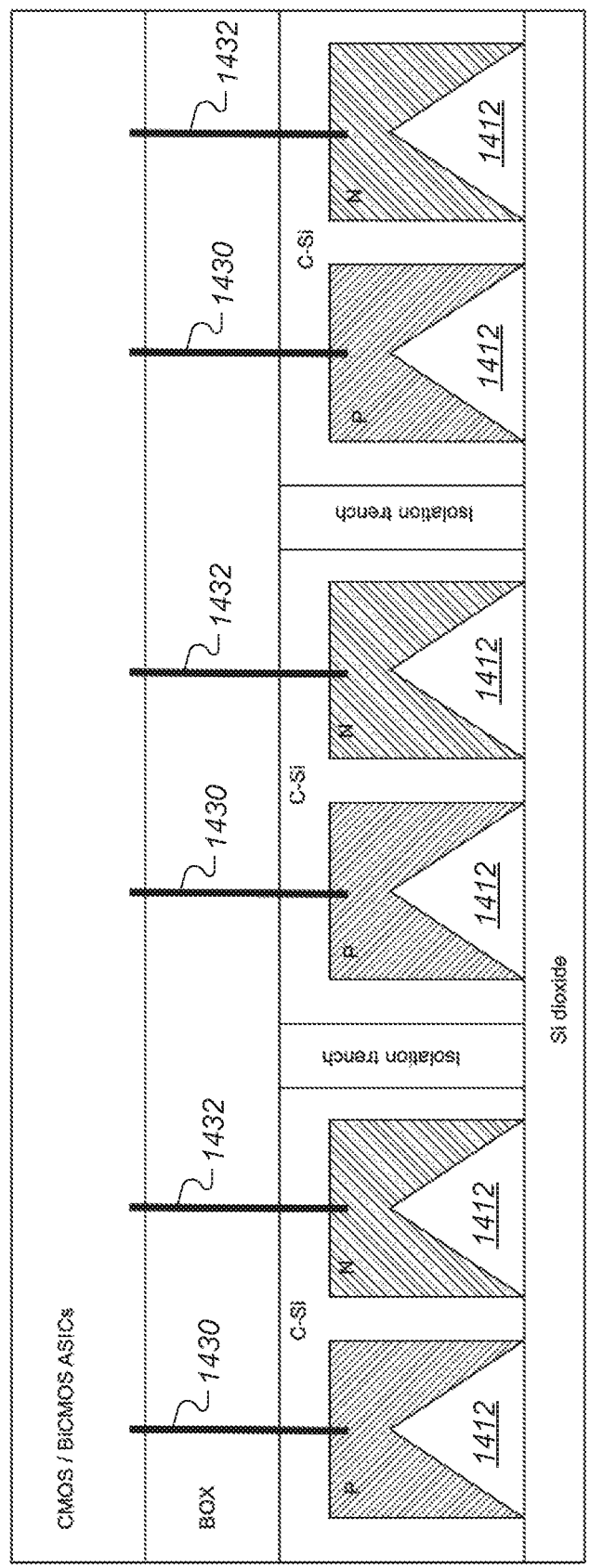
FIGS. 14A and 14B are partial simple cross section schematic diagrams of the structure shown in FIG. 13A, according to some embodiments.
Figure 14B:
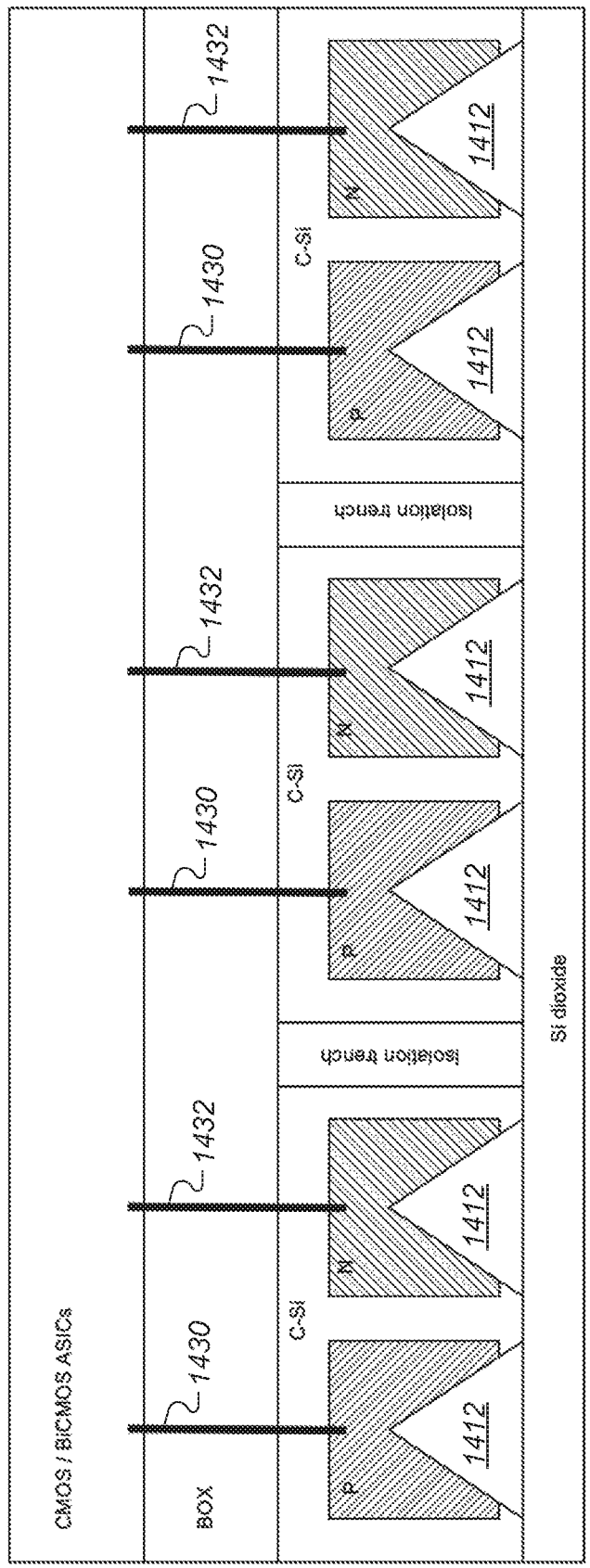

FIGS. 13A-13C are simple partial schematics of the top views of 4 pixels or photodetectors, according to some embodiments. The photodetectors can be photodiodes, avalanche photodiodes and/or single photon avalanche photodiodes. The photodetectors can be separated by an isolation trench (as in FIGS. 13A and 13B) that can be filled partially or fully with a dielectric such and Si dioxide. The 4 pixels/photodetectors can be representative of a small section of a much larger array such as 100×100 to over 1000×1000, and in some cases 10,000×10,000 or more. Within each pixel/PD there can be several doped regions. For example, in FIGS. 13A and 13B there are 4 doped regions, in some cases there can be two doped regions, and in some cases there can be more than 4 doped regions. The doped regions have opposite doping polarity such as P and N as shown. Not shown are connecting electrodes, any transparent conducting metal oxide, passivation, and anti-reelection layers that may be used to complete the integration of the pixels/PD arrays with CMOS and/or BiCMOS ASICs for imaging or 3D imaging or optical communications for data centers. The 3D imaging can be time-of-flight for facial recognition, or object recognition, robotic vision, gesturing, virtual reality (VR), augmented reality (AR) to name a few. In addition for time-of-flight applications it can be used for flash LiDAR for example. A cross section of the pixel/PD is shown in FIGS. 14A and 14B. The doped regions can be arranged in a symmetric or asymmetric manner and the doped regions can have the same lateral dimension or different lateral dimensions and the doped regions can have any shape such as square, polygonal, circular, amoebic to name a few, and/or any combinations thereof.

Microstructure holes 1312 are formed in the P and N regions with lateral dimensions ranging from 400-1000 nm.

Not shown are passivation layers within the holes and on the surface of the photosensor arrays.

FIG. 13B is similar to FIG. 13A with the exception that microholes 1314 are formed at the crossroad between the P and N regions as shown to minimize electron holes formed in this region due to the optical signal. The microholes 1314 can be optional and are used to increase the speed of the photosensor or reduce the jitter time of the APD/SPAD. The micro/nano holes 1314 placed at the crossroads of the doped region and in certain cases can be placed at regions to minimize transit time of photogenerated carriers.

FIG. 13C is similar to FIG. 13A with the addition of P and N borders, and the P and N regions can be amoebic and the microstructure holes can also be amoebic. The P and N borders can be added to FIG. 13A and FIG. 13B to minimize photo generated carrier transit time to the P and N regions.

FIGS. 14A and 14B are partial simple cross section schematic diagrams of the structure shown in FIG. 13A, according to some embodiments. In FIG. 14A the microstructure holes 1412 are formed in the doped regions. The microstructure holes 1412 can be inverted pyramids, cylindrical, conical, funnel, and/or any combination thereof and can be formed partially into the doped region, and in some cases can be formed to the BOX layer. The doped region can be separated by an I or low dope crystalline Si forming a PIN junction and, in some cases, the doped region can merge forming a PN junction. The microstructure holes 1412 can have a lateral dimension ranging from 500 nm to 1000 nm and in some cases more than 1000 nm, and the microstructure holes can have spacing between adjacent holes ranging from 100 to 500 nm, and in some cases 200-400 nm. The thickness of the crystalline Si where the doped regions are formed and where the microstructure holes are formed can have a thickness ranging from 5 microns to 1 micron, and in some cases 3 microns-1 micron, and in some cases less than 1 micron. The doped regions are connected to the CMOS/BiCMOS ASICs by electrodes 1430 and 1432 that traverse the BOX region and contact the doped region. The pixels/PDs can be separated by isolation trenches as shown and the isolation trench can be etched partially into the Si or can be etched to the BOX layer. A reverse bias is applied between the P and N region with a reverse bias voltage ranging from 0.1 to 3.3 volts, and in some cases 3.3 volts-10 volts, and in some cases 10-35 volts depending on if the photodetectors are operated in the APD or SPAD mode. Light which can consist of images or LiDAR information or time-of-flight depth imaging or high speed optical data communication for data centers impinges on the back surface where the photodetectors are formed or the handle layer of a SOI wafer and where the CMOS/BiCMOS are formed on the device layer, and where both device and handle layers are crystalline Si. The microstructure holes 1412 can be filled with a dielectric such as Si dioxide and the entire detector structure can be covered with a dielectric for passivation and where the dialectic such as Si dioxide can be textured to further reduce reflection of the air dielectric interface. The microstructure hole lateral dimension can be reduced correspondingly by the refractive index of the dielectric, for example the lateral dimension of the microstructure hole in air can be divided by the refractive index that fills the microstructure hole. For example, 800 nm hole in air filled with Si dioxide with a refractive index of approximately 1.6 can have a lateral dimension of 500 nm. The wavelength can range from 600 nm to 1100 nm and the pixel can have an external quantum efficiency greater than a comparable pixel/PD without microstructure holes at certain wavelengths. The enhancement in the external quantum efficiency (EQE) of pixel/PD with microstructure holes over that of a comparable pixel/PD without microstructure holes can range from 50 to 500% and in some cases more than 500%.

The data rate for such a structure can range from 10 to 100 Gb/s and in some cases more than 100 Gb/s, and the rise time for time-of-flight applications can range from 1 psec to 15 psec, and in some cases less than 1 psec, and in some cases from 1 psec to 30 psec. The rise time is equivalent to the jitter, and the shorter the rise time, the smaller the jitter.

FIG. 14B is similar to FIG. 14A with the exception that the P and N regions are recessed from the bottom surface as shown to minimize dark/leakage current.

Figure 15A:
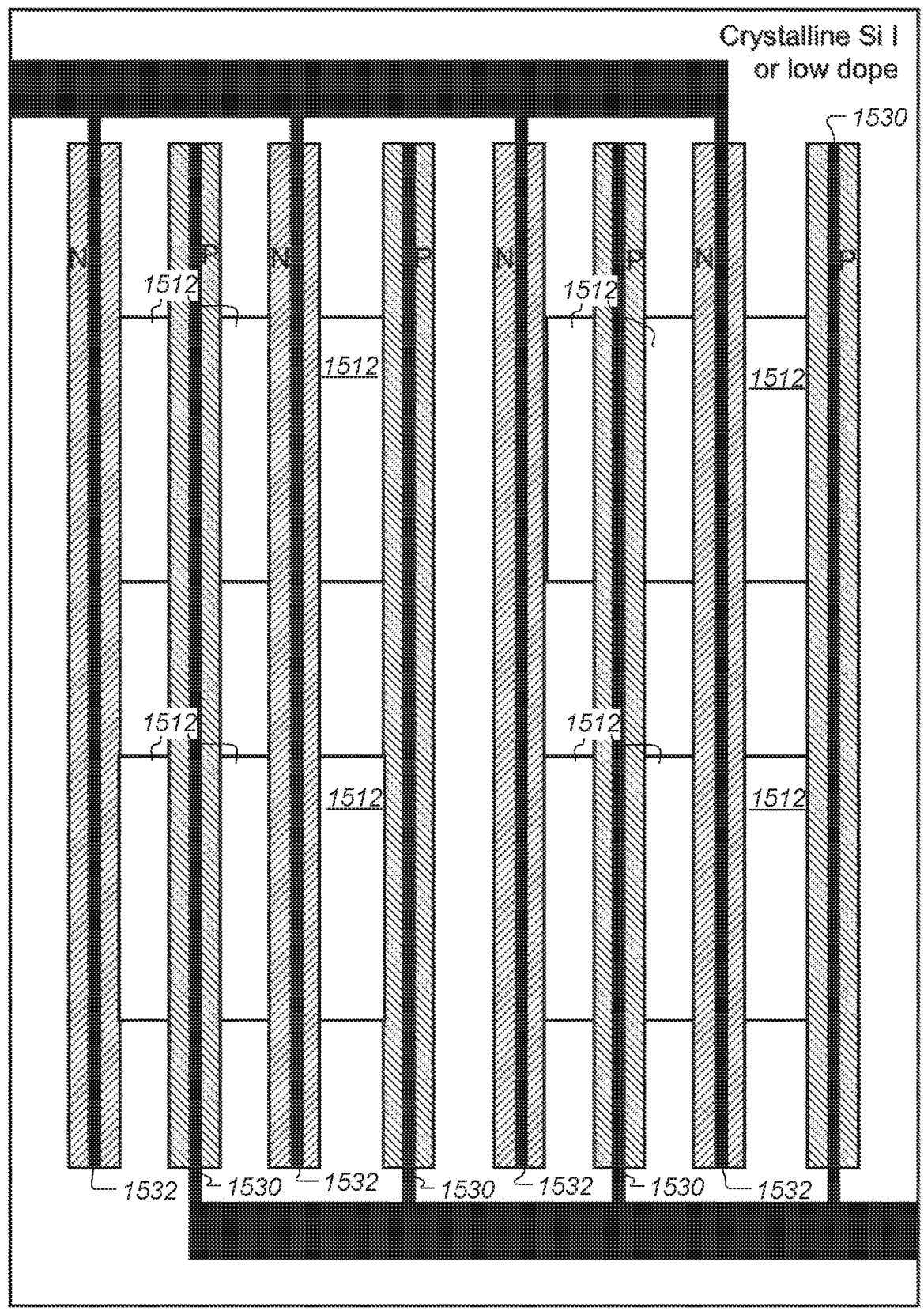
FIG. 15A is a partial simple top view schematic of an interdigitated photodetector that can be a photodiode, or APD, or SPAD, according to some embodiments.

FIG. 15A is a partial simple top view schematic of an interdigitated photodetector that can be a photodiode, or APD, or SPAD, according to some embodiments. The photodiode, or APD, or SPAD can be formed on Si with microstructure holes 1512 that are filled with Si dioxide for example, and planarized using chemical mechanical polishing for example. In some cases the interdigitated PD/APD/SPADs can be formed on Ge or GeSi layers with microstructure holes 1512, and the Ge/GeSi can be grown selectively using selective area epitaxial growth techniques that are discussed in related patent specifications identified above. P and N interdigitated wells are formed on the surface that can cross over the microstructure holes. The depth of the P and N wells can range from 10 nm to 300 nm, and in some cases more than 300 nm. The lateral dimension of the PD/APD/SPAD can range from 5 micron×5 micron to 50 micron×50 micron, and in some cases more than 50 micron× 50 micron for example 100 micron×100 micron or more. Arrays of interdigitated PD/APD/SPADs can be formed on the device layer of an SOI (Silicon on insulator) wafer integrated with CMOS/BiCMOS electronics for a front illuminated CMOS sensor or a front illuminated array of high speed photodetectors for optical data communication or for Time-of-Flight 3D imaging. In some cases the interdigitated PD/APD/SPADs can be formed on the back surface of the handle layer of an SOI where the handle layer can be thinned to a thickness ranging from 3 microns to 0.1 micron for a back illuminated CMOS image sensor, or a back illuminated high speed PD array for optical data communication or Time-of-Flight 3D imaging applications.

The microstructure holes 1512 have a lateral dimension ranging from 500 to 1000 nm, and in some cases 600-1500 nm, and can have a spacing between adjacent holes ranging from 100 nm-500 nm. The microstructure holes 1512 can be inverted pyramids formed by wet etching using TMAH for example, or can be cylindrical, or funnel shaped holes, or conical formed by dry etching. The holes are filled with dielectric such as Si dioxide and planarized such that interdigits can cross over the holes, and the interdigits can have a spacing less than the dimension of the microstructure holes. This way with spacing between the interdigits ranging from 100 nm to 1000 nm, and in some cases 100 nm-500 nm, and in some cases 100 nm-300 nm, data rates of 56 Gb/s can be achieved, and in some cases greater than 56 Gb/s for example 112 Gb/s can be achieved with the short transit times between the P and N junction of electron hole pairs generated by optical signals. A reverse bias is applied to the P and N region with reverse bias voltage ranges of 0.1-10 volts, and in some cases to 30 volts for certain gain applications. Metal electrodes 1530 and 1532 can be formed on the P wells and N wells, respectively, as shown. The metal electrodes 1530 and 1532 can have a width ranging from 7 nm to 130 nm, and the P and N well width can range from 10 nm to 150 nm.

Not shown are the CMOS/BiCMOS circuits formed on the Si device layer and the electrodes from the PD/APD/SPAD arrays connected to the electronics.

The P and N regions can form PN junctions and in some cases PIN junctions, and in some cases P low dope N or P N junctions, and in some cases PIPN junctions for the device to operate in a photodiode and/or avalanche photodiode (APD) and/or single photon avalanche photodiode (SPAD) with a reverse bias applied to the anode and cathode. In some cases, the reverse bias voltage can be anywhere in the range of 0.1 volt-3.3 volts, and in some cases anywhere in the range of 1 volt-10 volts, and in some cases anywhere in the range of 10 volts-35 volts for example.

Figure 15B:
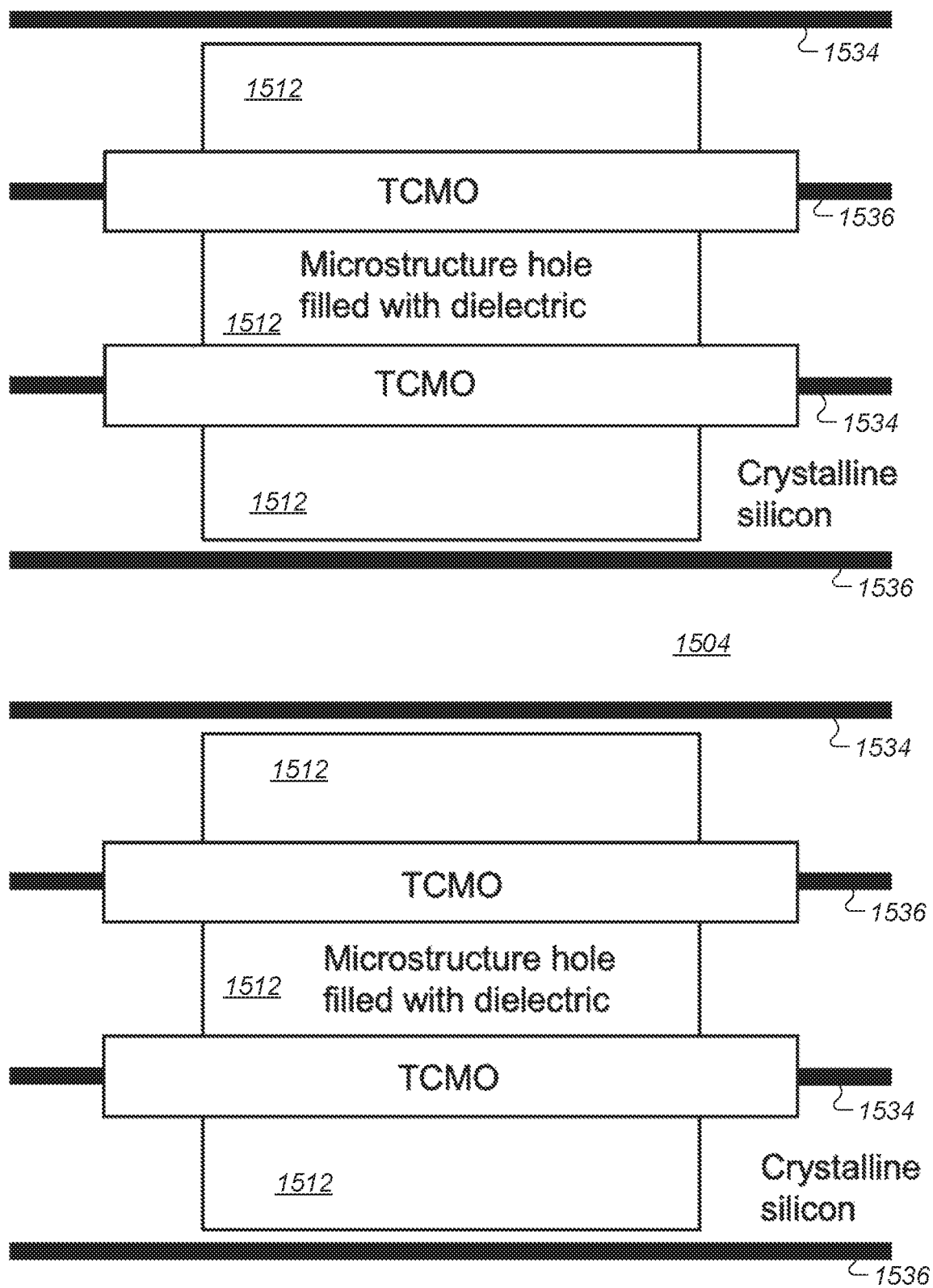
FIG. 15B is a simple partial top view schematic for the case where M1 and M2 interdigitated electrodes cross over planarized microstructure holes, according to some embodiments.

FIG. 15B is a simple partial top view schematic for the case where M1 and M2 interdigitated electrodes cross over planarized microstructure holes, according to some embodiments. The microstructure holes 1512 can filled with dielectric such as silicon dioxide, for example, for passivation. In FIG. 15B the crossover electrodes 1534 and 1536 can be transparent conducting metal oxide (TCMO). In some cases the optical field may be affected by the M1 and M2 metal electrodes crossing a microstructure hole 1512. In this example, the cross over electrodes can be transparent to the optical field in the case where the electrodes are fabricated from Indium Tin oxide or other TOMO material, and in some cases silicide for wavelength greater than 1100 nm. In some cases, the surface can be Ge/GeSi grown on Si epitaxially with thicknesses ranging from 50 nm-500 nm. The epitaxial growth of crystalline Ge/GeSi can also be by selective area epitaxial growth.

Figure 15C:
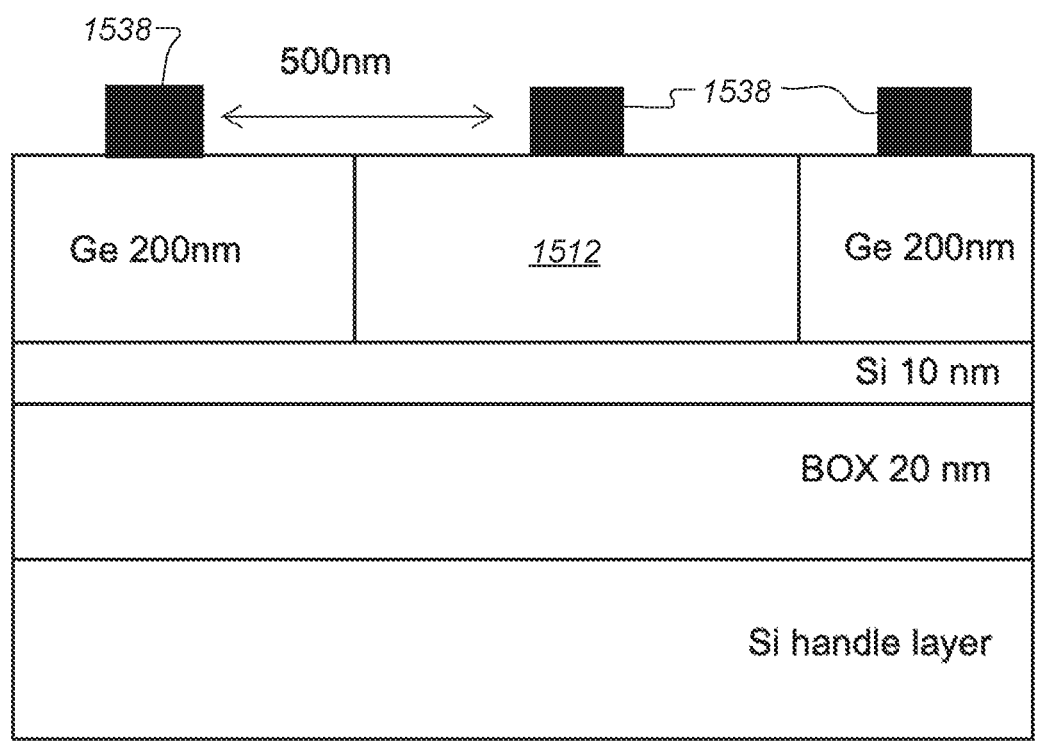
FIG. 15C is a simple partial cross section schematic of a photosensor, according to some embodiments.

FIG. 15C is a simple partial cross section schematic of a photosensor, according to some embodiments. In this case, the photosensor is a Ge on SOI interdigitated photosensor where the I or low dope Ge is 200 nm, the Si device layer is 10 nm and a BOX layer is 20 nm on a Si handle layer. Microstructure holes 1512 are etched with a cylindrical cross section to a depth of 200 nm with a diameter of 1150 nm, a period of 1500 nm in a square lattice and the microstructure holes 1512 are filled with Si dioxide, and the surface planarized. Al electrodes 1538 with a width of 60 nm and a spacing of 500 nm are formed and the electrode can cross over a microstructure hole 1512. The electrodes can form Schottky contacts and in some cases P and N wells can be formed such that the interdigits form a lateral PIN structure. Optical signal can impinge from the top surface where the holes are formed and, in some cases, can impinge from the bottom surface where in some cases the handle layer can be etched off.

Not shown are the CMOS/BiCMOS ASICs that can be integrated with an interdigitated Photosensor, and in some cases an array of Photosensors can be formed with array sizes of n×m where n and m are digits ranging from 0 to 10, and in some cases greater than 10. In some cases, and n and m digits can range from 0 to 100.

Figure 15D:
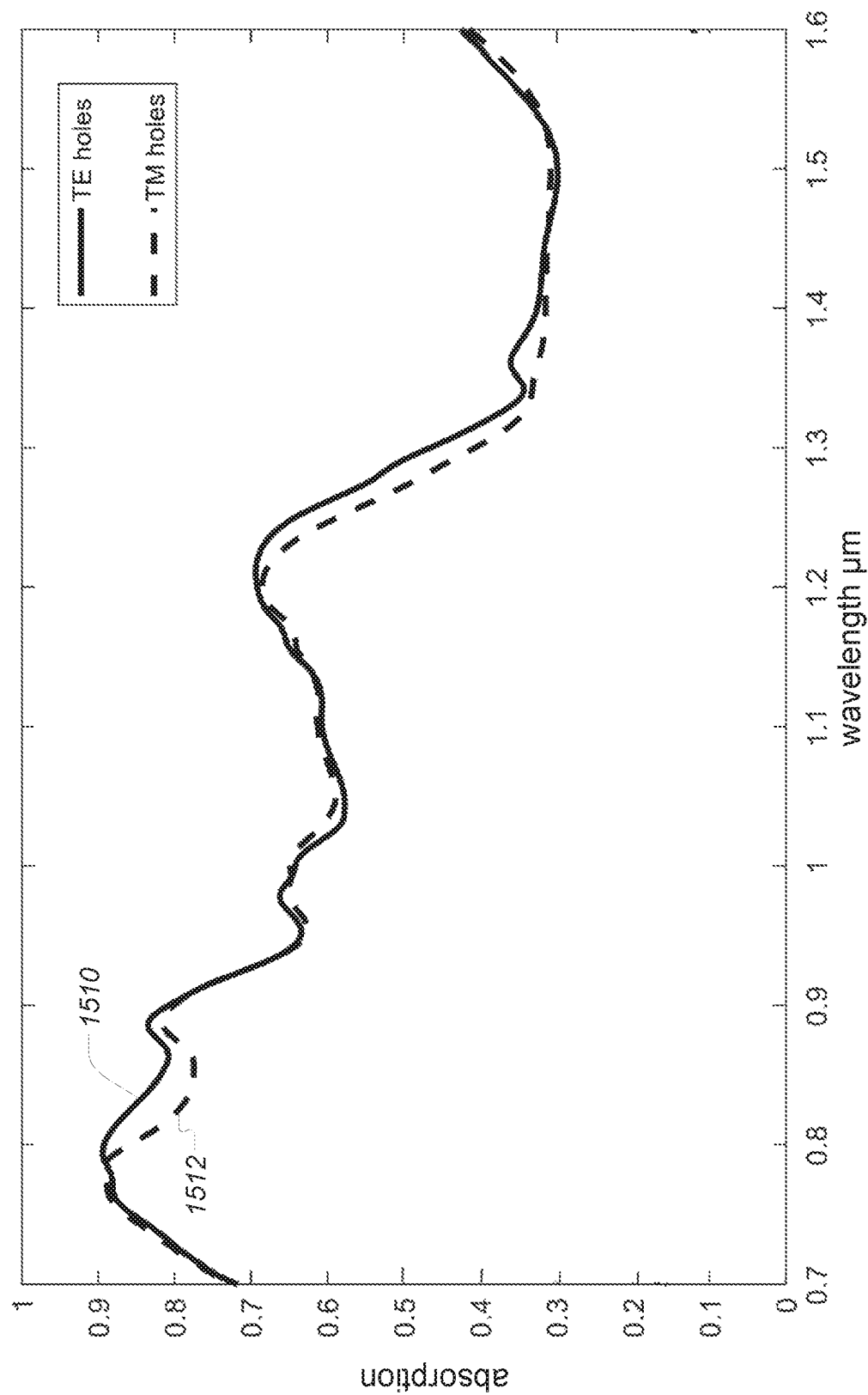
FIG. 15D is a plot of an FDTD simulation of the optical absorption vs wavelength, according to some embodiments.

FIG. 15D is a plot of an FDTD simulation of the optical absorption vs wavelength, according to some embodiments. The EQE is directly proportional to absorption and in some cases equal to absorption when all the photogenerated carriers are collected. The simulation shows two orthogonal polarizations of the optical field (transverse electric—TE (curve 1510), and transverse magnetic—TM (curve 1512)) of the optical field impinging on the top surface of the interdigitated Ge on SOI photodetector. As can be seen there is very little difference between the two orthogonal modes in absorption which indicates the interdigitated metal electrodes can have minimal effect on polarization sensitivity. As can be seen in FIG. 15D the absorption or EQE can be 30% or greater in a wavelength range 700 nm-1600 nm and in some cases can be greater than 50% EQE or absorption at certain wavelengths. The data rate can range from 25 to 112 Gb/s, and in some cases can be 100 GHz or greater in 3 dB bandwidth.

The microstructure holes in some cases can be aperiodic and/or randomly arranged and the microstructure holes can be non-circular such as polygonal, oval, amoebic, clover to name a few, see reference Liu et al, Enhanced Optical Absorption of Dual-Diameter Structured Silicon Nanoholes Array, Trans Tech Publications Ltd, 2020. Photosensors with microstructure holes can have a higher EQE than a comparable Photosensor without microstructure holes at certain wavelength ranges.

Figure 16:
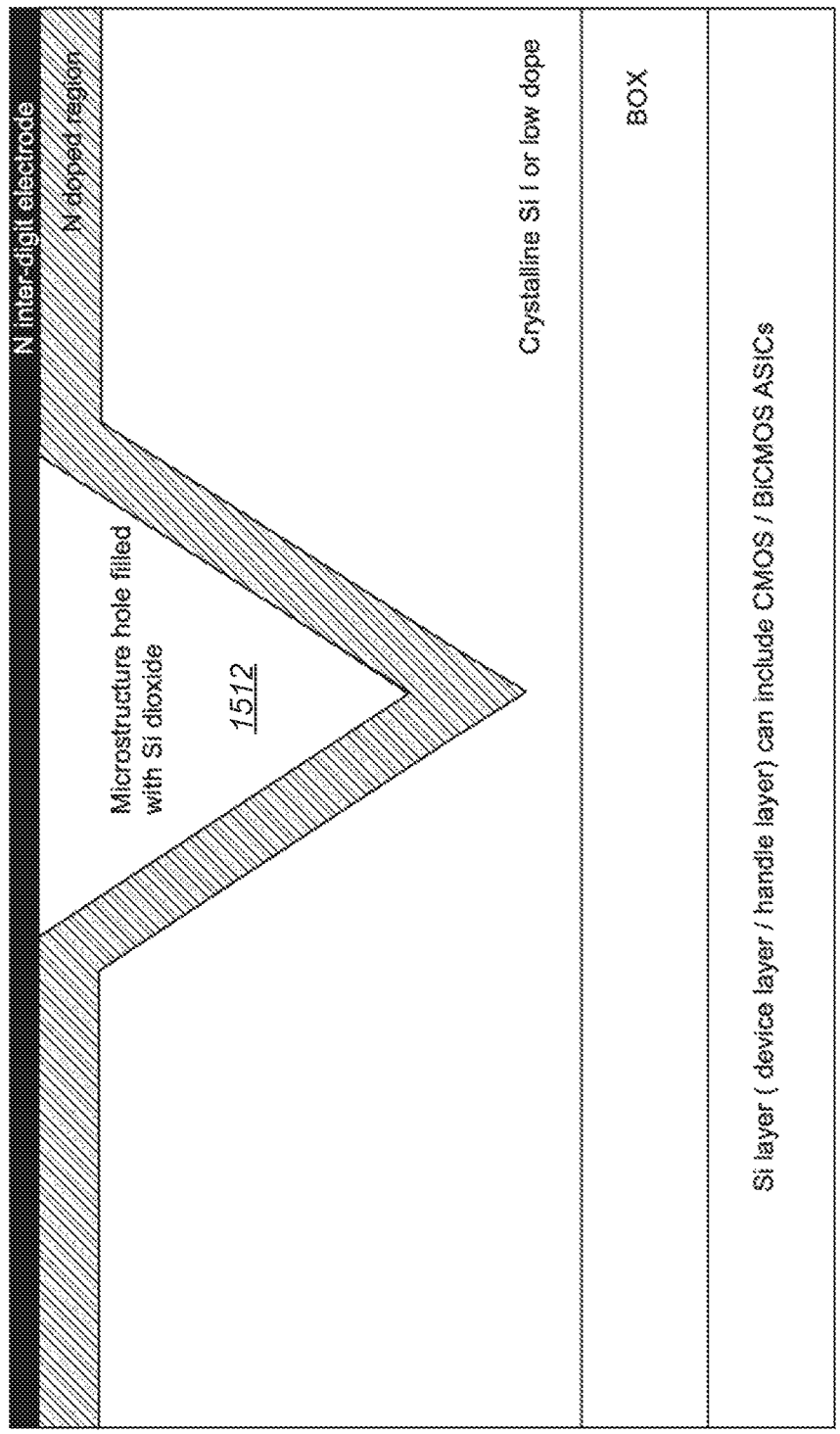
FIG. 16 is a simple partial cross section schematic of a hole of the structure shown in FIG. 15A, according to some embodiments.

FIG. 16 is a simple partial cross section schematic of a hole of the structure shown in FIG. 15A, according to some embodiments. In FIG. 16, the hole 1512 can be an inverted pyramid. The dopant N or P well follows the contours of the hole 1512. The hole 1512 is then filled with a dielectric such as Si dioxide and the surface is then planarized using chemical mechanical polishing for example. Metal interdigit electrode is formed in contact with the N or P doped well where the electrode is interdigit and forms the N or P ohmic contact.

Figure 17:
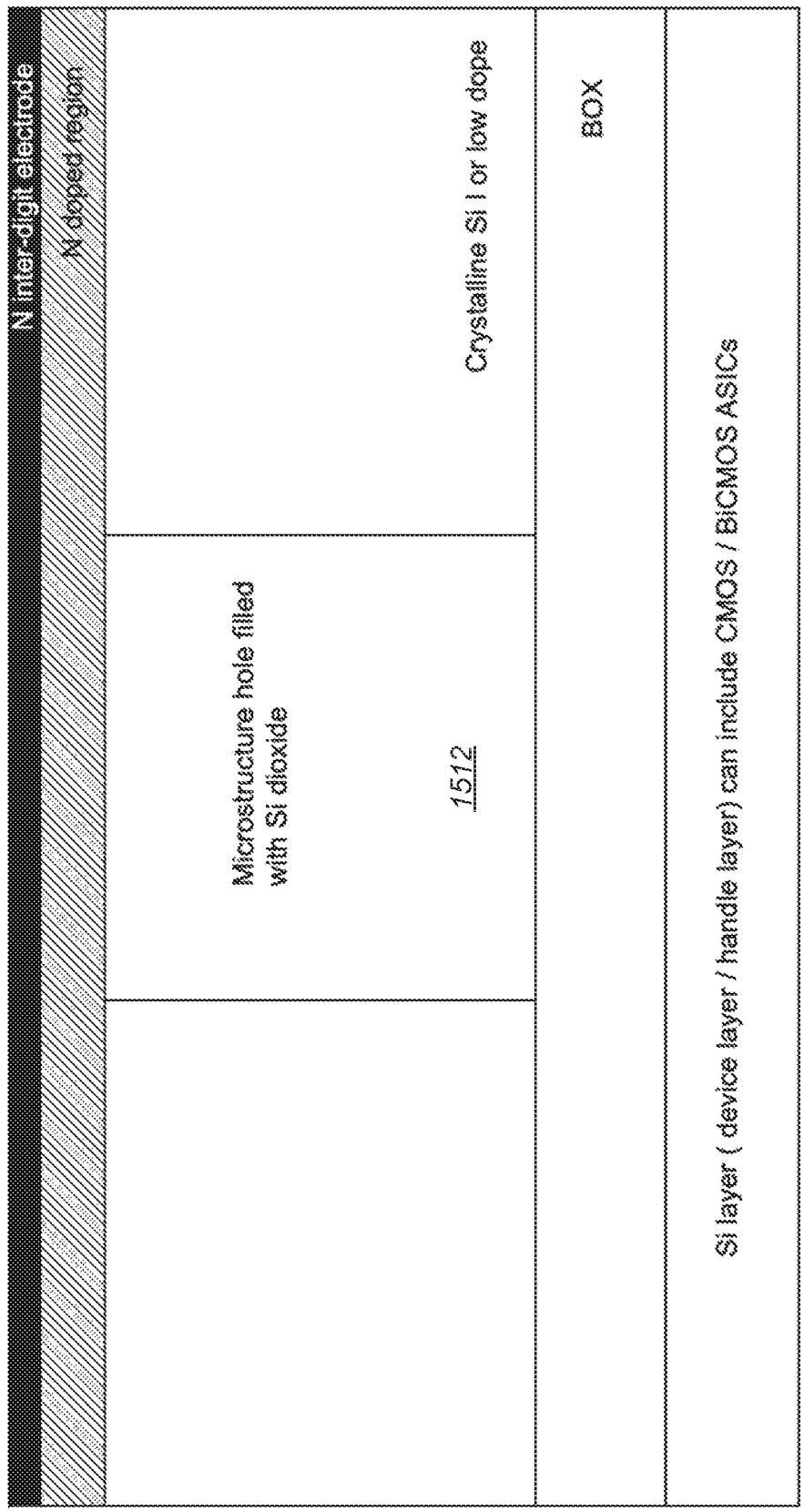
FIG. 17 is a simple partial cross section schematic of a hole of the structure shown in FIG. 15A, according to some other embodiments.

FIG. 17 is a simple partial cross section schematic of a hole of the structure shown in FIG. 15A, according to some other embodiments. In FIG. 17, the hole 1512 can be etched to the BOX layer and filled with a dielectric such as Si dioxide. P or N wells are formed on the surface across the hole and the interdigitated electrodes are formed on the P or N interdigitated wells.

Figure 18:
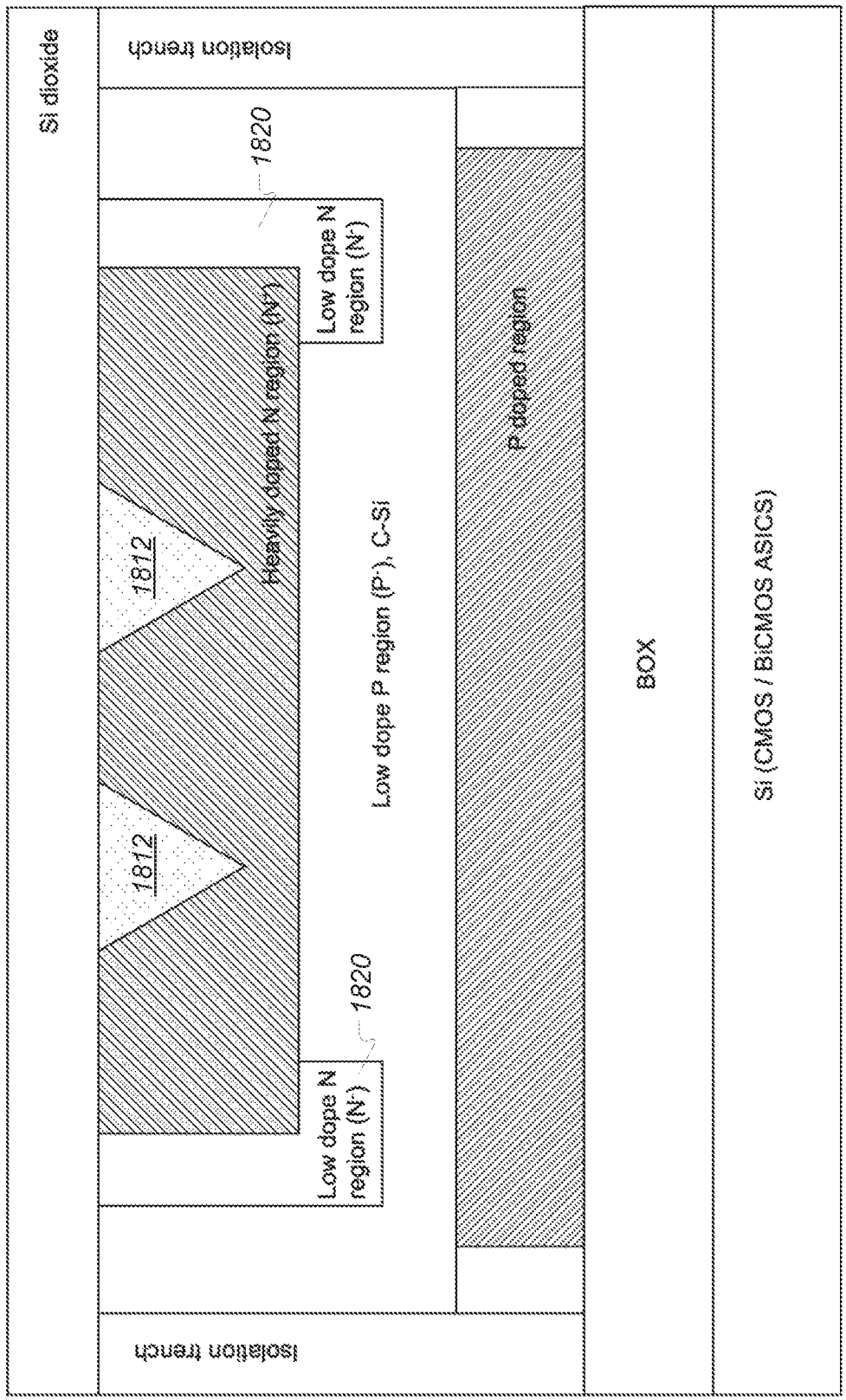
FIGS. 18, 19, 20A to 20D, 21 and 22 are simple partial cross sections of an APD/SPAD with P, P⁻, N⁺, N⁻ regions and where the N⁻ regions are configured as guard rings, according to some embodiments.

FIGS. 18, 19, 20A to 20D, 21 and 22 are simple partial cross sections of an APD/SPAD with P, P⁻, N⁺, N⁻ regions where the N⁻ regions are configured as guard rings, according to some embodiments. The guard ring 1820 can be similar to that discussed and shown in FIG. 1 and FIG. 5 of Pellion et al, Single-Photon Avalanche Diodes (SPAD) in CMOS 0.35 micron technology, Nuclear Instruments and Methods in Physics Research A, 7 Feb. 2015, (hereinafter the "Pellion reference"). In FIG. 18, the microstructure holes 1812 can be formed in the N⁺ region microstructure hole that can be a single hole, or multiple holes, and can be an inverted pyramid, cylindrical, funnel cross sections. The lateral dimension of the microstructure hole can range from 400 nm to 1000 nm. The microstructure holes 1812 can be fully or partially filled with a passivation layer such as silicon dioxide, and/or other dielectrics. The APD/SPAD can be a single sensor and/or an array of sensors and can be used for time-of-flight applications such as LiDAR or 3D imaging, and in some cases enhanced IR imaging. The dimension of the APD/SPAD can be different from the Pellion reference, the thickness of the silicon can range from 0.1 micron to 5 microns, and in some cases 1 micron-3 microns. The APD/SPAD can be formed on the same surface as the CMOS/BiCMOS electronics/ASICs, and in some cases can be formed on the opposite surface (handle layer surface) of a SOI wafer for front illuminated or back illuminated CMOS image sensor/3D CMOS image sensor respectively. The lateral dimension of the APD/SPAD can range from 0.5 micron to 30 microns, and in some cases 0.5 microns-100 microns or more. Leakage/dark current can be sub nanoamp for structures without microstructure holes as shown in FIG. 6 of the Pellion reference. However, with microstructure hole/s formed in a doped region and passivated the leakage/dark current can be expected to be similar to a comparable APD/SPAD without microstructure holes. As shown in FIG. 18, the APD/SPAD is planar with guard rings and the high electric fields are confined mostly at the interface of the $N^+$ and $P^-$ regions. Isolation trenches can be added to electrically and/or optically isolate the APD/SPAD from neighboring APD/SPAD in an array. The wavelength range for the APD/SPAD for a crystalline silicon structure can be 600 nm-1100 nm. The rise time or jitter of the APD/SPAD can range from 1 pico sec to 50 pico sec, and in some cases 1 pico sec-20 pico sec. In some cases the rise time or jitter can be less than 1 pico sec.

APD/SPAD with microstructure hole/s can have higher external quantum efficiency than a comparable APD/SPAD without microstructure holes at certain wavelengths. The enhanced external quantum efficiency (EQE) with microstructure holes can be 30%, and in some cases 60%, and in some cases over 100% greater than a comparable APD/SPAD EQE without microstructure holes at certain wavelengths, in the wavelength range of 600 nm-1100 nm.

In the cases where the APD is used for optical data communication the data rate can range from 1 Gb/s to 100 Gb/s, and in some cases 10 Gb/s-56 Gb/s, and in some cases 25 Gb/s-56 Gb/s, and in some cases to 112 Gb/s or more.

A reverse bias is applied between the P and N regions with bias voltages ranging from 3 volts to 40 volts. Doping profiles and regions shown are just an example; other doping regions and profiles can also be implemented. See, e.g. Gulinatti et al, Improving the performance of silicon single-photon avalanche diodes, SPIE 2017.

Sun [2] et al, Improvement of SPAD Photon Detection Efficiency with Diffraction Window Layer, China Semiconductor Technology International Conference 2019; and Frey et al, Enhancing Near-Infrared Photodetection Efficiency in SPAD with Silicon Surface Nanostructuration, Journal of the Electron Devices Society, 2018, show examples of enhancing the absorption at near infrared wavelengths of SPAD using surface nanostructures, and in addition showing other doping regions configurations. In most cases the nanostructures shown in the references are periodic and of regular dimensions whereas in this patent specification the microstructures used for enhancing optical absorption can be aperiodic and have irregular dimensions or shapes. In some cases a single microstructure can be used in a pixel for enhancing optical absorption. See, Gao et al, High Speed Surface Illuminated Si Photodiode Using Microstructured Holes for Absorption Enhancements at 900-1000 nm Wavelength, ACS Photonics 2017, which includes an example of high speed microstructure hole Si photodiode with PIN or PN junctions that have an extended wavelength range to 1000 nm.

Figure 19:
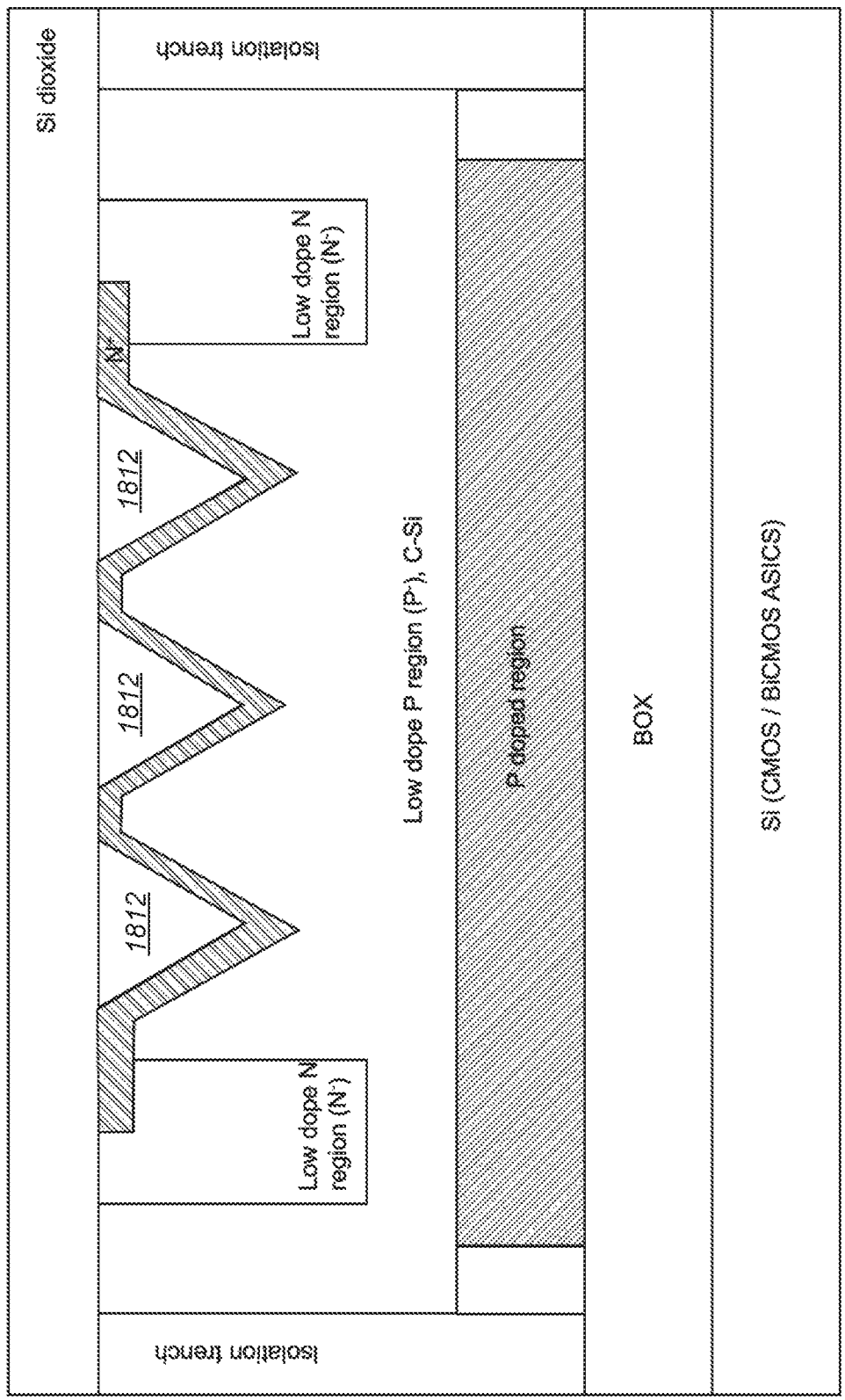

FIG. 19 is similar to FIG. 18 with the exception that the $N^+$ dopant follows the contour of the microstructure hole approximately. The microstructure holes 1812 can be fully or partially filled with passivation dielectrics that can either be thermally grown and/or deposited. And as in FIG. 18 the APD/SPAD can be formed on the device or the handle layer of an SOI wafer, and the CMOS/BiCMOS ASICs can be on the same surface as the APD/SPAD for a front illuminated CMOS image sensor. And in some cases, the APD/SPAD can be formed on the handle layer of the SOI and the CMOS/BiCMOS ASICs can be formed on the device layer for a back illuminated CMOS image sensor.

Figure 20A:
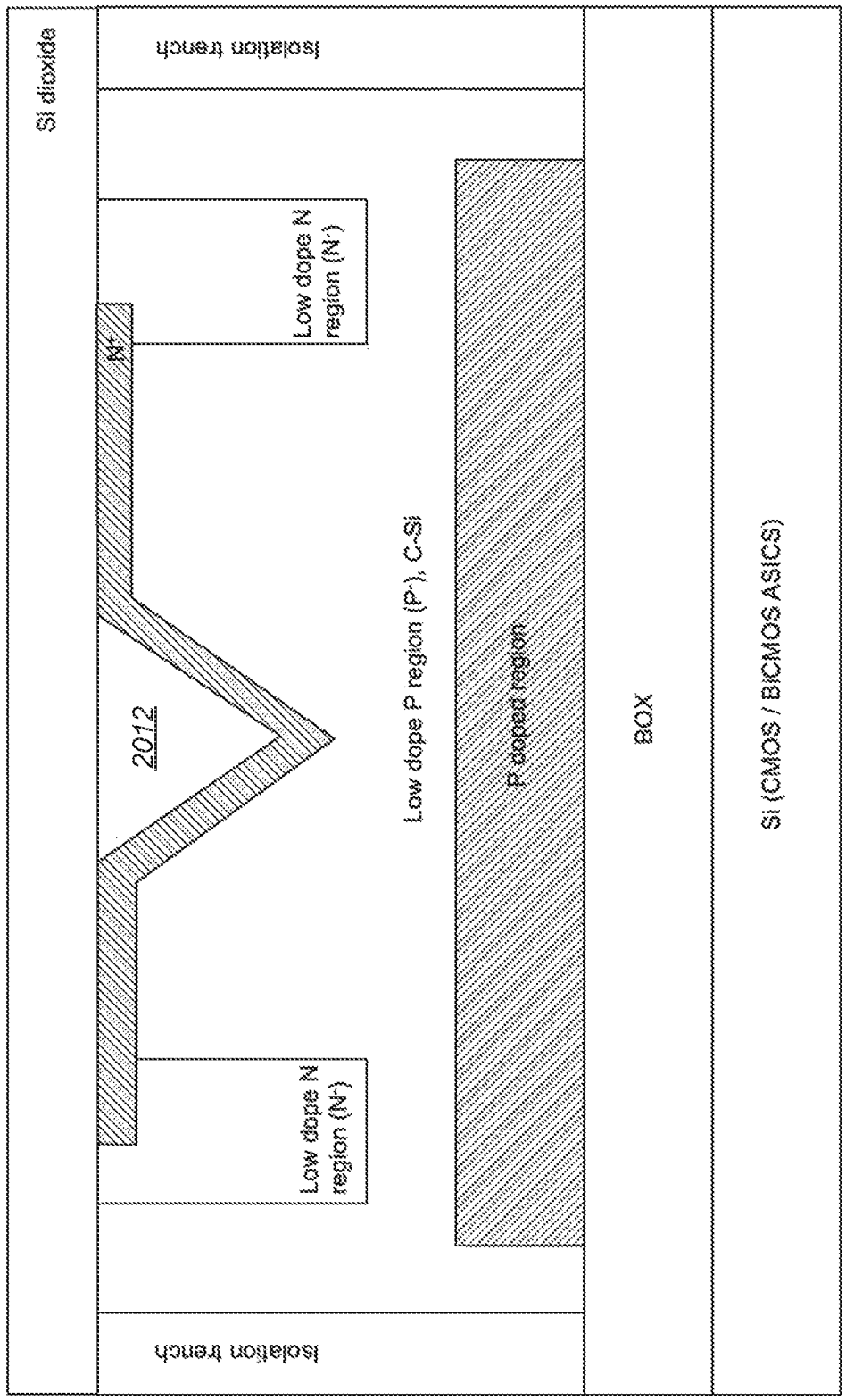

FIG. 20A shows a structure similar to that shown in FIG. 19 with the exception that in FIG. 20A the structure has a single microstructure hole 2012 in the APD/SPAD. The lateral dimension of the APD/SPAD can range from 0.5 microns to 3 microns for example. As in FIG. 18, this single hole APD/SPAD can be formed on the same surface as the CMOS/BiCMOS ASICs and/or it can be formed on the opposing surface of the CMOS/BiCMOS ASICs.

Figure 20B:
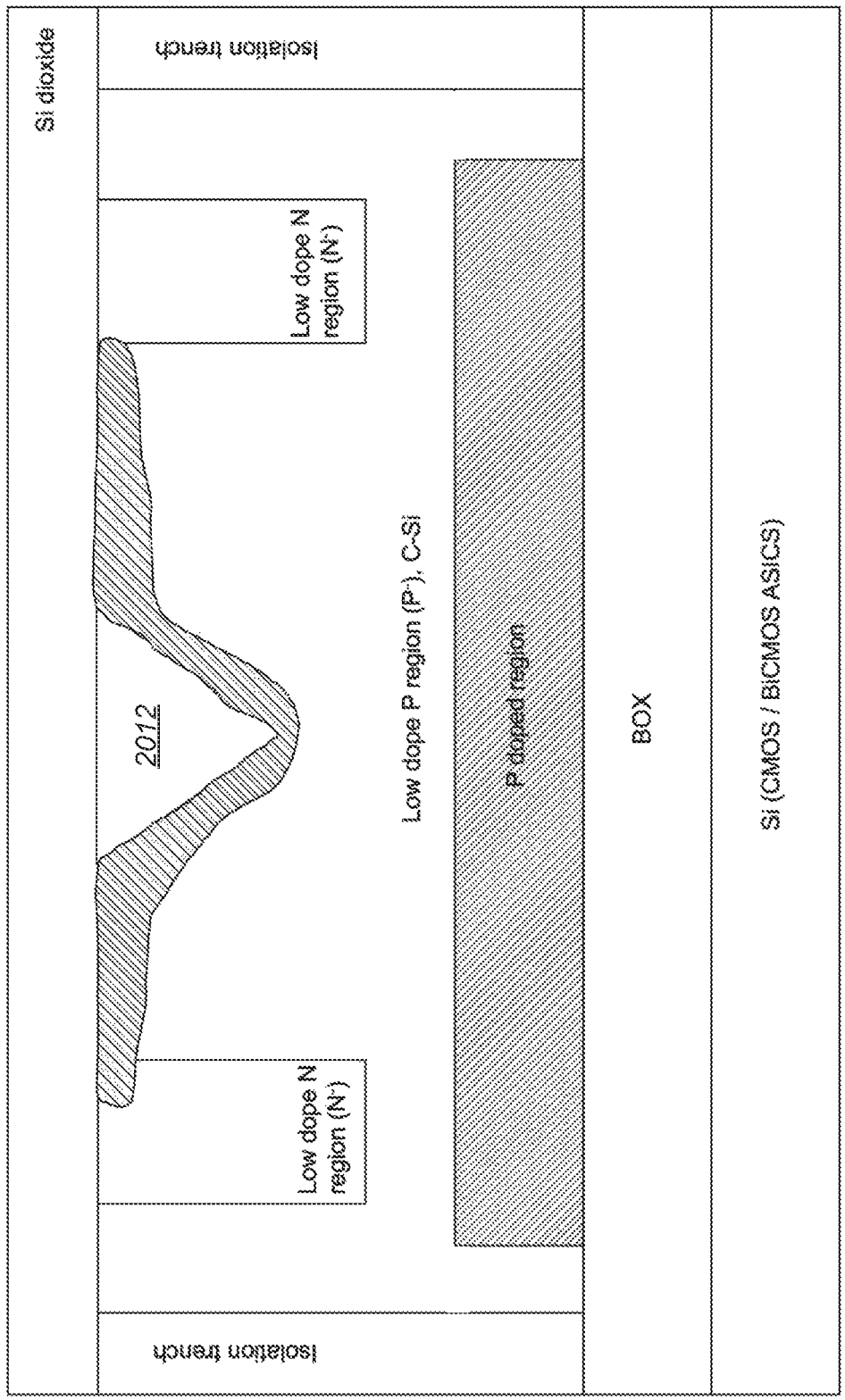

FIG. 20B is simple partial schematic cross section similar to FIG. 20A where the dopant region following the contour of the microstructure hole is rounded without any sharp corners. The dopant regions are often formed by ion diffusion and/or ion implantation in which case high temperature anneal follows the ion implantation to activate the dopant ions. In this application, and in some cases prior applications dopant regions following the microstructure hole contour are often depicted with rectangles and/or polygons for simplicity of drawing, however in most cases the dopant region is often rounded when it comes to corners or sharp edges such that the dopant region itself can have no sharp edges, and can have no pointed regions.

The P and N regions can form PN junctions and in some cases PIN junctions, and in some cases P low dope N or P N junctions, and in some cases PIPN junctions for the device to operate in a photodiode and/or avalanche photodiode (APD) and/or single photon avalanche photodiode (SPAD) with a reverse bias applied to the anode and cathode. In some cases the reverse bias voltage can be anywhere in the range of 0.1 volt-3.3 volts, and in some cases anywhere in the range of 1 volt-10 volts, and in some cases anywhere in the range of 10 volts-35 volts for example.

Figure 20C:
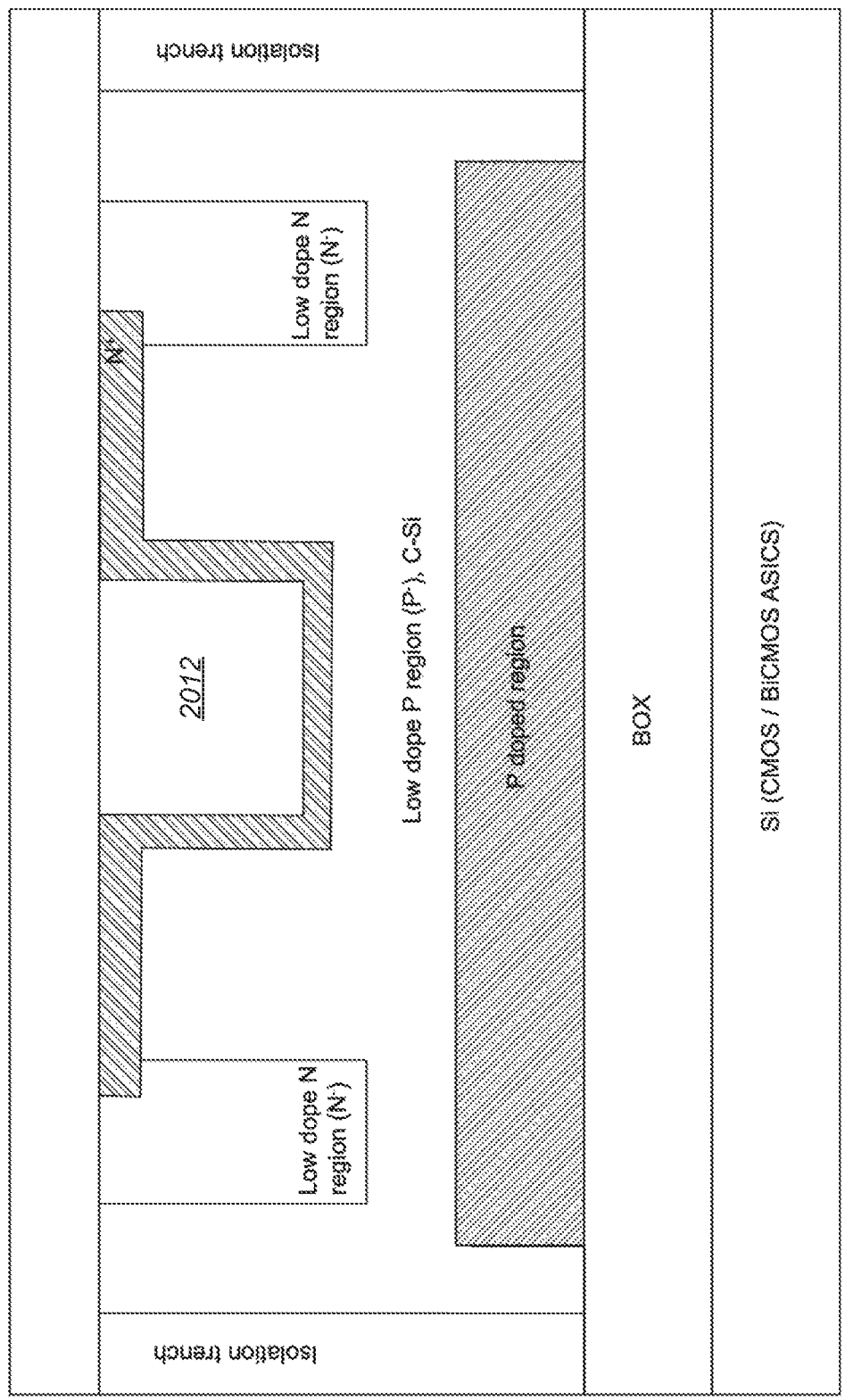

FIG. 20C shows a structure similar to that shown in FIG. 20A with the exception that the microstructure hole 2012 can be cylindrical or polygonal in cross section and the microstructure hole can be circular, rectangular, polygonal, amoebic from the top view. The guard ring of $N^-$ can be optional. The single hole PD/APD/SPAD pixel can have a lateral dimension ranging from 0.5 microns to 2 microns. A reverse bias is applied between the P and N with voltage ranging from 0.1 volts to 40 volts, and in some cases 0.1 volts-10 volts. CMOS/BiCMOS ASICs can be on the same surface as the microstructure hole, and in some cases can be on the opposite surface of the SOI wafer. Wavelength range from 600 nm to 1100 nm. The optical signal can be an image such as for CMOS image sensor and/or an image with Time-of-Flight information for 3D CMOS image sensing and gesturing and/or binary or multi-level optical signal for data communications. Data rate can range from Mb/s to Gb/s and in some cases from 10 Gb/s to 120 Gb/s or more. Jitter for Time-of-Flight applications can range from 1 pico second to 30 pico seconds. Pixels with microstructure hole or holes can have a higher external quantum efficiency than a similar pixel without microstructure holes at certain wavelengths. The enhancement in external quantum efficiency can range from 30% to 500% or more.

Figure 20D:
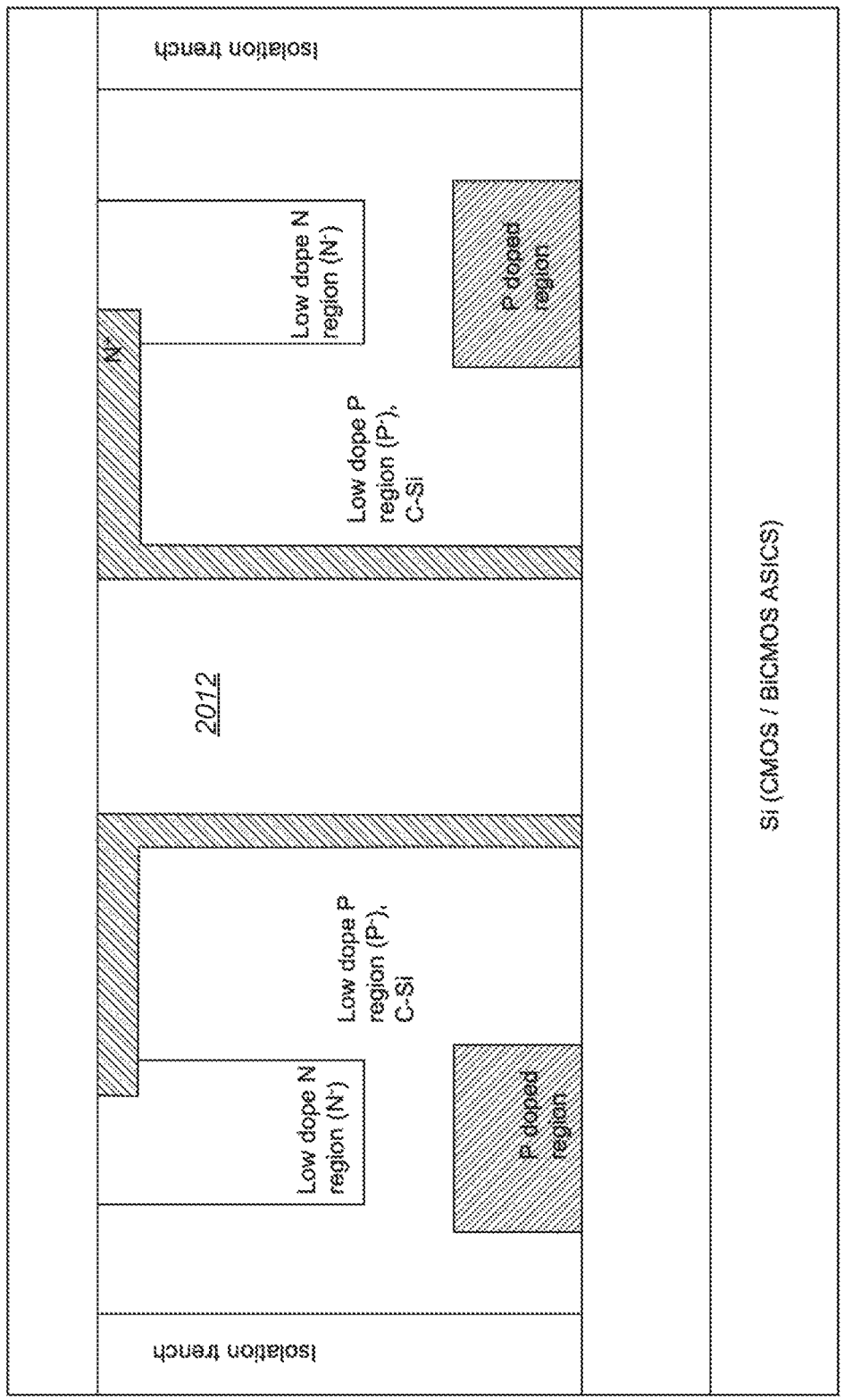

FIG. 20D shows a structure similar to that shown in FIG. 20C with the exception that the microstructure hole 2012 is etched to the BOX layer. The dopant as in the structures shown in FIGS. 20A, 20B, and 20C follows the contour of the microstructure hole 2012. P and N can be interchanged and the guard ring in some cases can be optional.

Figure 21:
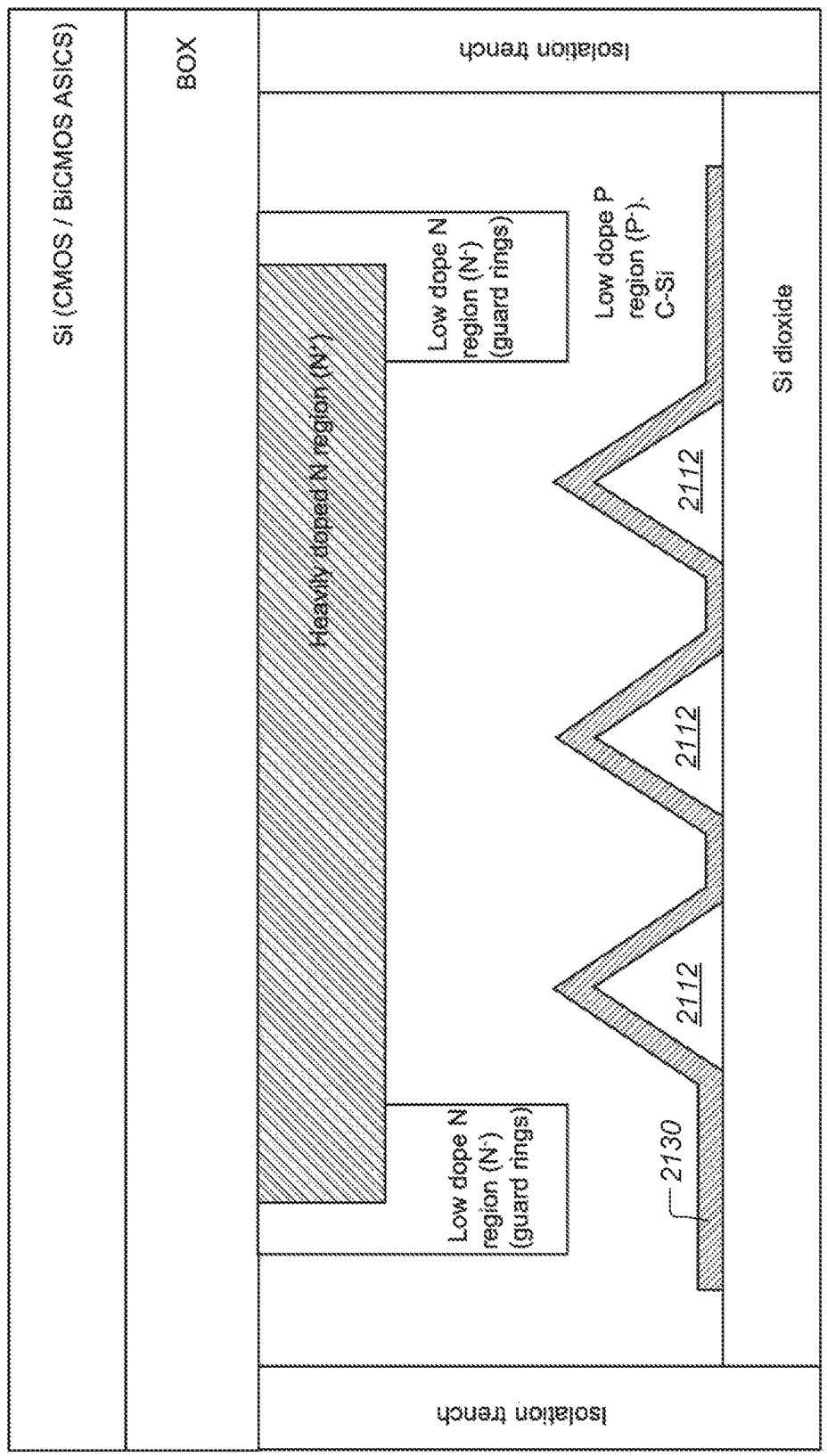

FIG. 21 is a simple partial cross section of a structure similar to that shown FIG. 18 with the exception that the microstructure holes 2112 are formed in the P region 2130, and the P region 2130 follows the contour of the microstructure holes 2112 which can be filled fully or partially passivated with dielectric(s). Optical signals can impinge on the surface where the microstructure holes 2112 are formed. The lateral dimension of the APD/SPAD can range from 1 micron to 100 microns, and in some cases more than 100 microns. The thickness of the silicon can range from 0.5 microns to 3 microns, and in some cases more than 3 microns.

Figure 22:
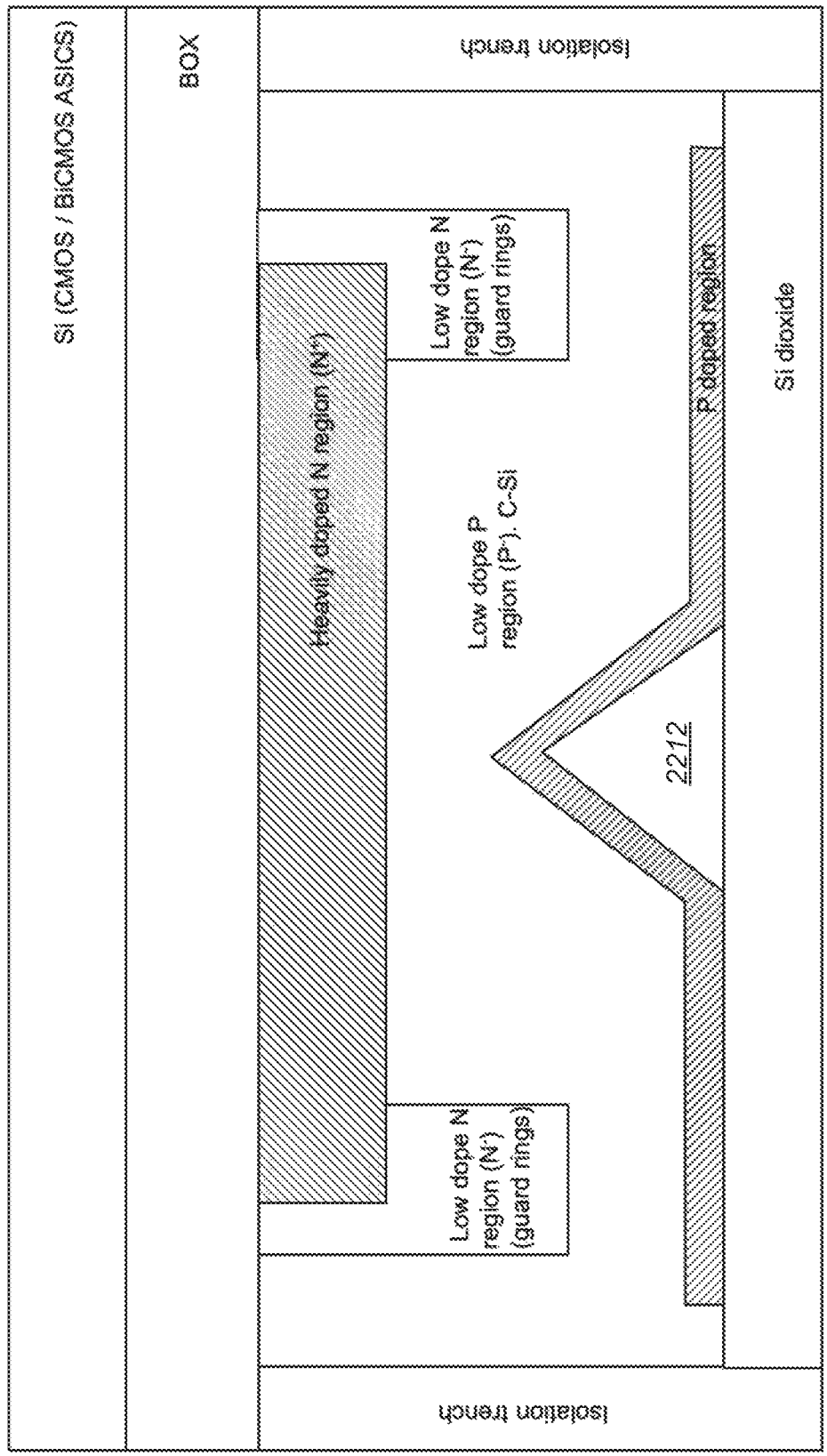

FIG. 22 shows a structure similar to that shown in FIG. 21 with the exception that it has a single microstructure hole 2212 in the P region. The lateral dimension of the APD/SPAD can range from 0.5 microns to 3 microns.

APD, SPAD, phototransistors, photoconductors PN, PIN, PIPN, NPN, PNP, NIN, PIP structures to name a few can be implemented both in monolithic and/or stacked technologies and in addition can be implemented with composite holes.

Figure 23:
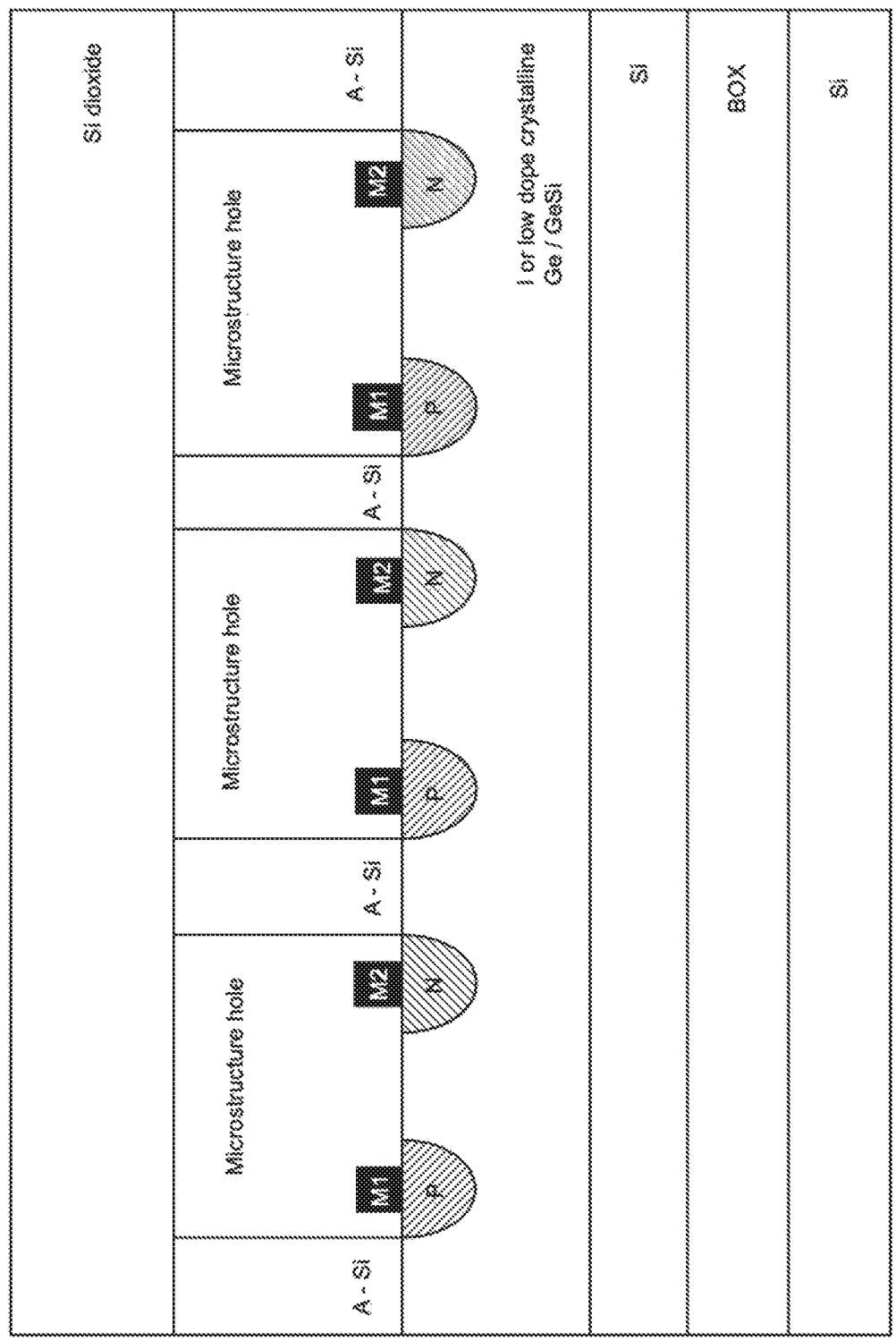
FIG. 23 is a simple partial cross section schematic diagram of an interdigitated photodetector with P and N wells formed in crystalline Ge/GeSi epitaxial layer grown on Si SOI wafer, according to some embodiments.

FIG. 23 is a simple partial cross section schematic diagram of an interdigitated photodetector with P and N wells formed in crystalline Ge/GeSi epitaxial layer grown on Si SOI wafer, according to some embodiments. The Ge layer can be formed by selective area epitaxial growth and can have a thickness ranging from 20 nm to 500 nm. P and N wells can be formed in the Ge/GeSi layer and for the case where the Ge is I or low dope the interdigitated structure can form a PIN junction, and in some cases the P and N regions can overlap to form a PN junction. Electrodes M1 and M2 are formed over the P and N regions, respectively. The electrodes can be metallic and/or metal silicide forming Ohmic contacts to the P and N regions/wells. The electrodes are M1 and M2 of an interdigitated PD/APD/SPAD. The spacing between the electrodes can range from 100 nm to 1000 nm, and the width of the electrodes can range from 3 nm-200 nm, and in some cases 3 nm-40 nm. Amorphous semiconductor such as amorphous silicon can be deposited over the interdigitated PD/APD/SPAD with a thickness ranging from 100 nm to 1000 nm and in some cases more than 1000 nm. Microstructure holes are formed in the amorphous semiconductor and the microstructure holes can be partially in the amorphous semiconductor and/or through the amorphous semiconductor to the Ge/GeSi surface. The microstructure holes can be cylindrical, conical, trapezoidal and polygonal in cross section. The lateral dimension of the microstructure holes can range from 500 nm to 1600 nm, and in some cases 500 nm-1200 nm. The spacing between the microstructure holes can range from 100 nm to 500 nm, and in some cases for conical or trapezoidal holes the spacing can be zero or over lapping or touching microstructure holes. The microstructure holes can be arranged in a periodic, and/or aperiodic and/or random manner. In the case of periodic microstructure holes the arrangement can be a square or hexagonal lattice. The microstructure holes can be partially or entirely filled with a dielectric such as silicon dioxide. Optical signal or optical images impinge on the top surface where the microstructure holes are formed, and in some cases can impinge from the bottom surface opposite from the surface of the microstructure holes. CMOS/BiCMOS ASICs can be formed on the same side of the microstructure hole and in some cases can be formed on the opposite side of the microstructure holes for example CMOS/BiCMOS can be formed on the same surface as the Ge/GeSi and/or on the Si layer on which the Ge/GeSi layers are grown, or the CMOS/BiCMOS can be formed on the opposing Si surface separated by the BOX layer. A reverse bias is applied between the P and N regions with a reverse bias voltage ranging from 0.1 volt to 40 volts, and in some cases 0.1 volt-10 volts. The interdigitated PD/APD/SPAD can be fabricated as a single photodetector or as an array of photodetectors connected to CMOS/BiCMOS ASICs. The wavelength range of the PD/APD/SPAD can be from 800 nm to 1700 nm, and in some cases 1100 nm-1550 nm. The data rate can range from 1 Gb/s to 100 Gb/s and in some cases 25 Gb/s-120 Gb/s or more. The jitter or rise time can range from 1 pico second to 50 pico seconds, and in some cases 1 pico second-100 pico seconds, and in some cases 1 pico second-25 pico seconds.

The amorphous semiconductors can be amorphous silicon and, in some cases, amorphous GaAs, and in some cases amorphous GaN, and in some cases amorphous AlN to name a few.

In some cases, the P and N wells can merge such that a PN junction is formed and at reverse bias voltages ranging from 0.1 volts to 15 volts avalanche gain can occur resulting in higher external quantum efficiency.

The microstructure holes in the amorphous semiconductor can be arranged periodically, and/or aperiodically, and/or random, and/or any combination thereof. The microstructure holes in addition can have similar lateral dimensions and, in some cases, different lateral dimensions. In some cases, the microstructure holes can have similar geometry and in some cases different geometry.

External quantum efficiency of a microstructure photodetector can be greater than the external quantum efficiency of a comparable photodetector without microstructure holes at certain wavelengths. See reference Cansizoglu 2 et al, Surface-illuminated photon-trapping high-speed Ge-on-Si photodiodes with improved efficiency up to 1700 nm, Photonics Research, Vol. 6, No. 7/July 2018 for an example of Ge on Si microstructure holes PD with PIN junctions extending the wavelength to 1700 nm.

Figure 24:
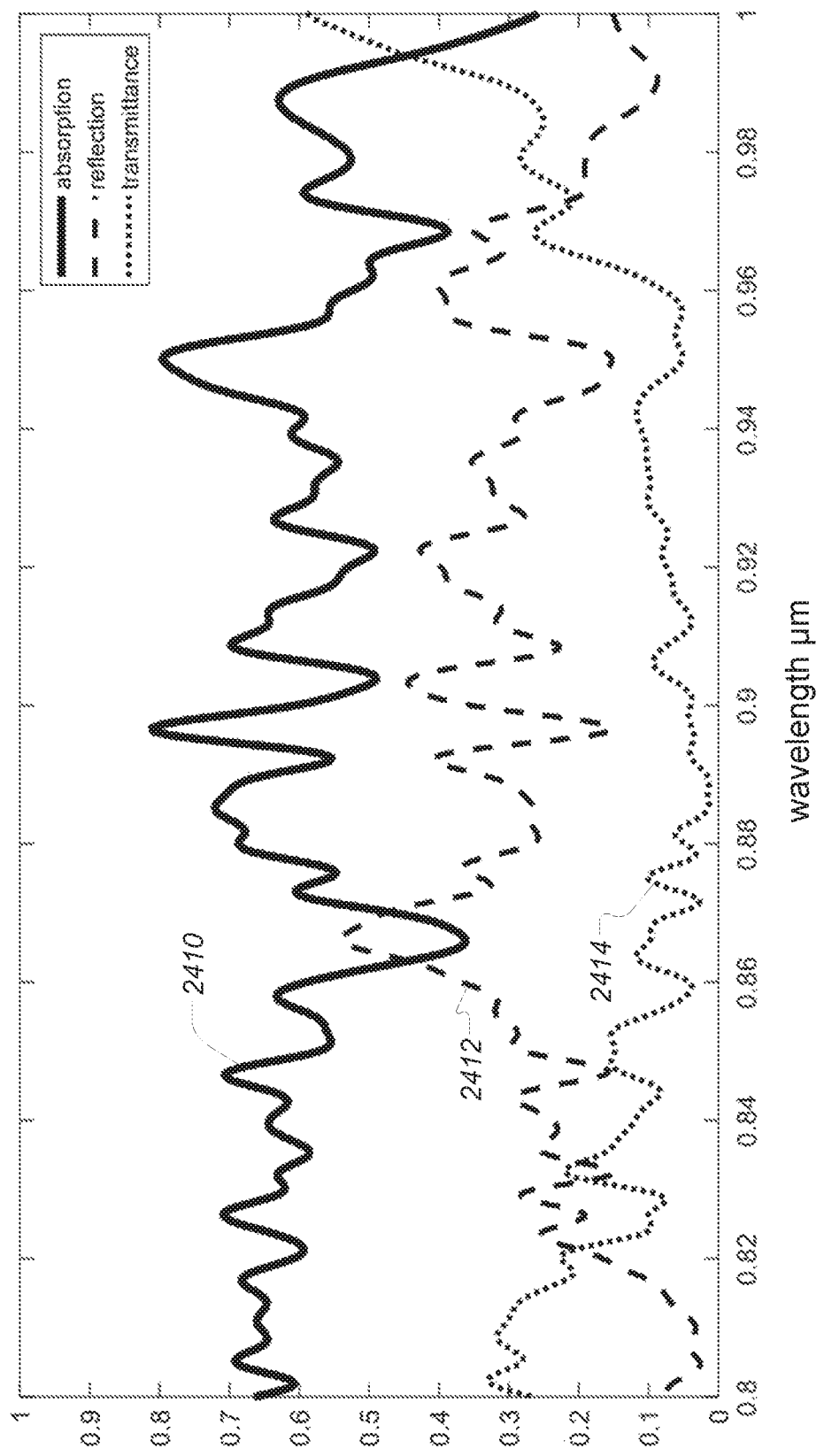
FIG. 24 is a FDTD simulation of the optical field for a structure as shown in FIG. 15A, according to some embodiments.

FIG. 24 is a FDTD simulation of the optical field for a structure as shown in FIG. 15A, according to some embodiments. The simulated structure is an interdigitated lateral PIN or MSM photodetector where the interdigitated electrodes M1 and M2 crosses over microstructure holes. The lateral interdigitated photodetector is a SOI wafer with a device layer of thickness 500 nm and a BOX layer of 1000 nm on Si handle layer or substrate. The device layer is undoped or lightly P or N doped. The microstructure holes are rectangular with a lateral dimension of 1000 nm and a period of 1300 nm in a square lattice. The interdigitated electrodes have a width of 60 nm with a period of 300 nm arranged in a pattern similar to FIG. 15A The FDTD simulation results are shown in FIG. 24 where the vertical axis represents the fraction of absorption, reflection and transmission of the optical field as a function of wavelength from 800 nm-1000 nm. The solid curve 2410 represents absorption which is directly proportional to external quantum efficiency. For most wavelengths the absorption is above 50%, and in some cases can be above 60%. The dashed curve 2412 represents reflection and the dotted curve 2414 represents transmission. The sum of absorption, reflection and transmission equals to unity. The losses of the optical field due to the electrode is approximately 5-6%.

The absorption or the external quantum efficiency of a microstructure hole photodetector is greater than the absorption or external quantum efficiency of a comparable photodetector without microstructure holes at certain wavelengths.

The device layer can have a thickness ranging from 100 to 500 nm, and in some cases 50-250 nm. The data rate bandwidth can have a range of 25-56 Gb/s and in some cases greater than 56 Gb/s. In some cases, the data rate bandwidth of the interdigitated photodetector can have a data rate of 112 Gb/s. This structure can also be used for time-of-flight applications such as 3D imaging and LiDAR with rise time or jitter time ranging from a few pico seconds to 15 pico seconds, and in some cases 1 pico second to 10 pico seconds. Reference Martin-Gonthier et al, Performance Parameters Modeling and Simulation of Single-Photon Avalanche Diodes for Space LIDAR Applications, PRIME 2019, Lausanne, Switzerland.

Figure 25A:
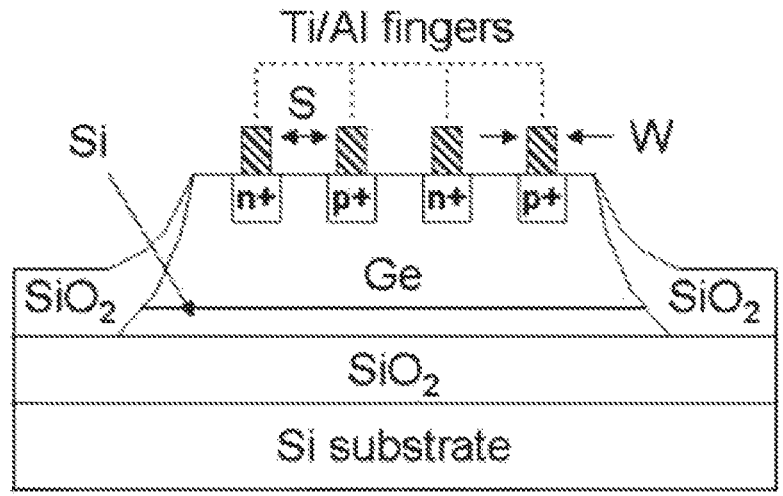
FIG. 25A is a simple partial cross section diagram of a lateral PIN Ge on Si on a SOI wafer according to the prior art.

FIG. 25A is a simple partial cross section diagrams of a lateral PIN Ge on Si on a SOI wafer as discussed in the following references; Dehlinger et. al, High-Speed Germanium-on-SOI Lateral PIN Photodiodes, IEEE Photonics Technology Letters, VOL. 16, NO. 11, November 2004 and Koester et. al, Ge-on-SOI-Detector/Si-CMOS-Amplifier Receivers for High-Performance Optical-Communication Applications, Journal of Lightwave Technology, VOL. 25, NO. 1, January 2007.

Figure 25B:
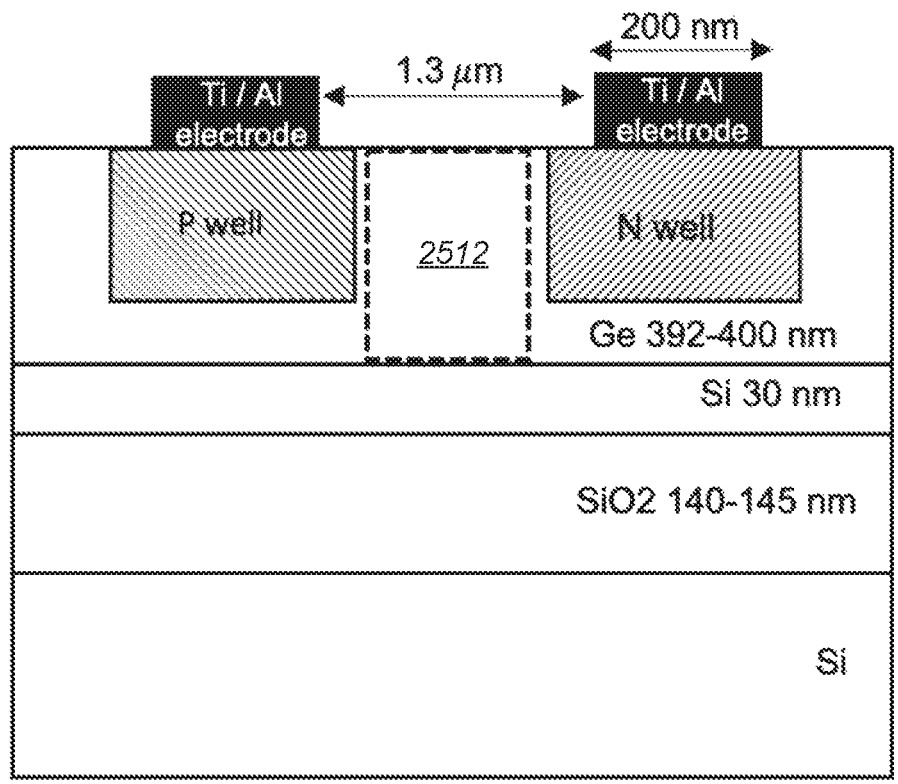
FIG. 25B is a simple partial schematic cross section of the interdigitated photodiode that is similar to the structure shown in FIG. 25A configured with the inclusion of microstructure holes, according to some embodiments.

FIG. 25B is a simple partial schematic cross section of the interdigitated photodiode that is similar to the structure shown in FIG. 25A configured with the inclusion of microstructure holes, according to some embodiments. The Ge has a thickness of approximately 400 nm, and the Si approximately 30 nm, and a BOX layer of approximately 145 nm on Si substrate. P and N wells are formed under the interdigitated electrodes where the electrode width is approximately 200 nm and the spacing between electrodes is 1300 nm.

Figure 25C:
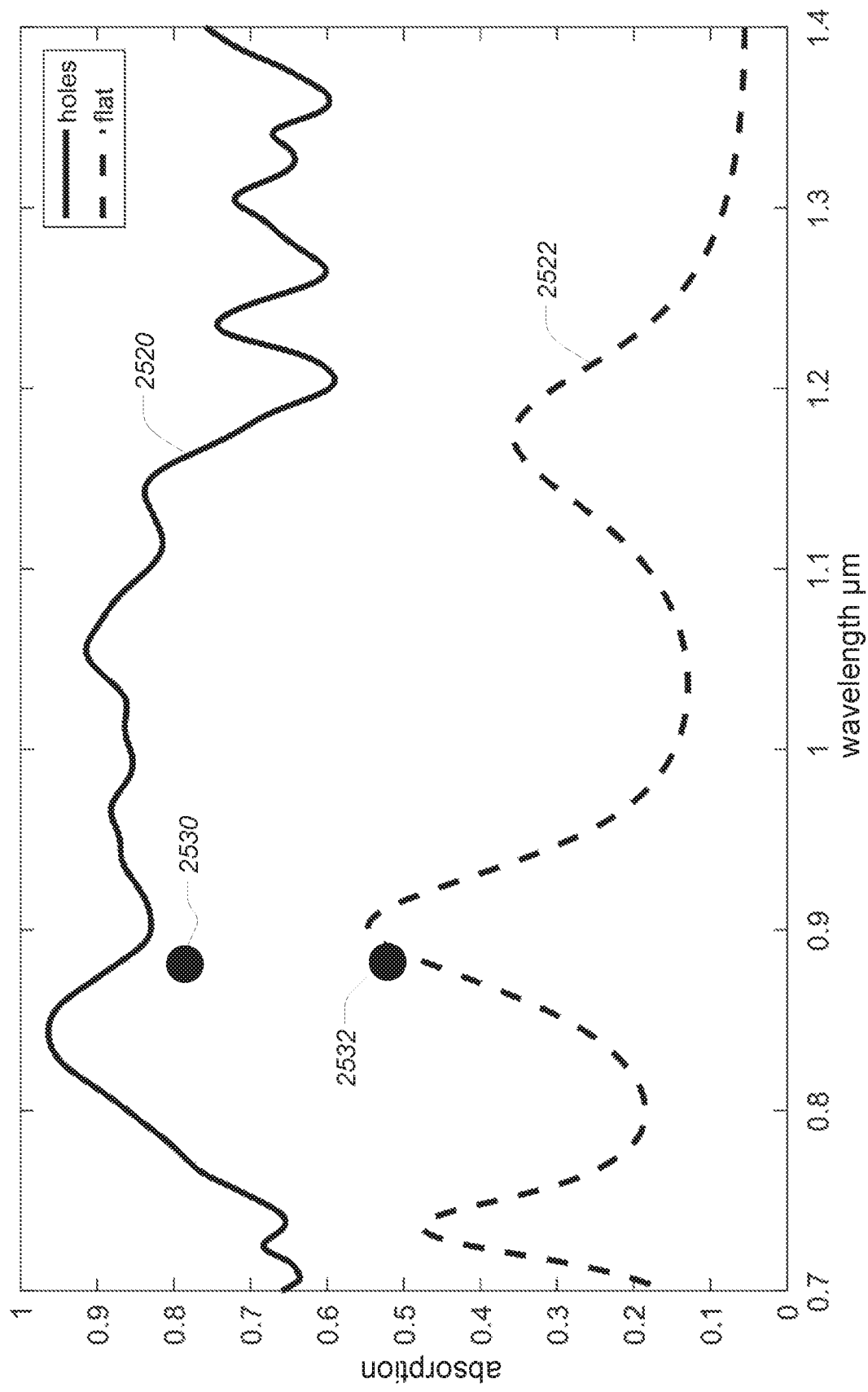
FIGS. 25C and 25D are a plot showing an FDTD simulation of the optical absorption vs. wavelength for the structure shown in FIG. 25B with and without microholes.
Figure 25D:
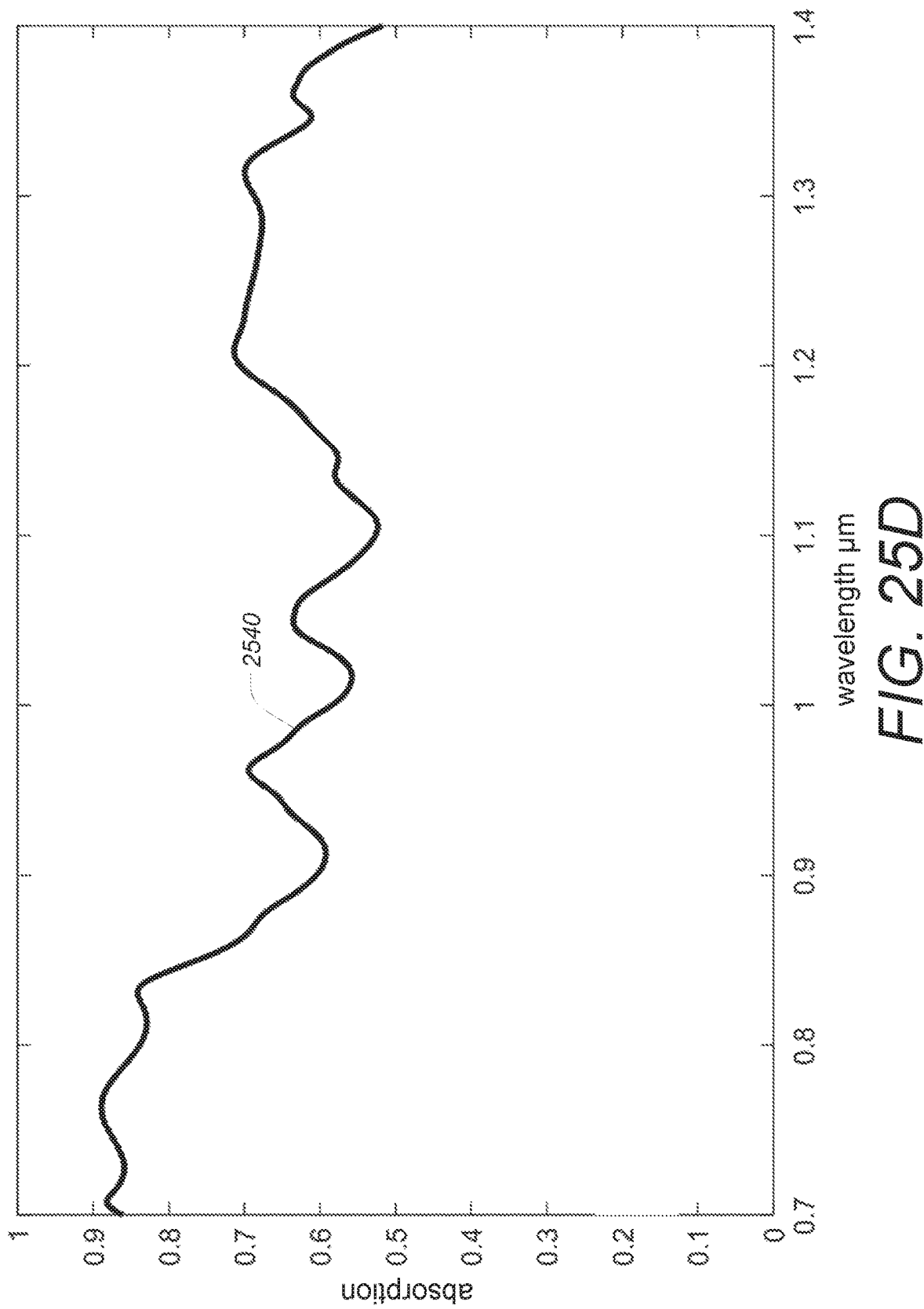

FIGS. 25C and 25D are plots showing an FDTD simulation of the optical absorption vs. wavelength for the structure shown in FIG. 25B with and without microholes. The absorption characteristics without the electrodes is shown in the dotted curve 2522 where absorption is directly proportional to external quantum efficiency for wavelength ranges 700-1400 nm. Curve 2520 shows absorption to the structure with microstructure holes. In this example, the holes 2512 are cylindrical holes etched to the Si layer with hole diameters of 1150 nm, a period of 1500 nm in a square lattice. The microstructure hole 2512 is shown in FIG. 25B as a dotted rectangle in the cross section schematic drawing. The absorption vs. wavelength for such a structure with microstructure holes is shown in the solid curve 2520 in FIG. 25C. As can be seen the absorption or external quantum efficiency (EQE) of a microstructure hole photodiode can be greater than a comparable photodiode without microstructure holes at certain wavelengths. In some cases, the EQE of a microstructure hole PD/APD/SPAD can be 4 times greater than the EQE of a comparable PD/APD/SPAD without microstructure holes at certain wavelengths. In some cases, the EQE of a microstructure hole PD/APD/SPAD can be 50% greater than the EQE of a comparable PD/APD/SPAD without microstructure holes at certain wavelengths.

The black dots 2530 and 2532 in the absorption wavelength plot of FIG. 25C indicate the absorption or EQE of the PD/APD/SPAD taking the finite area into account, in this case 10×10 micron photodetector. Dot 2530 is for the structure of FIG. 25B including the microstructure hole 2512, while dot 2532 is for the structure of FIG. 25B without microstructure hole 2512.

The data rate for this structure is approximately 40 Gb/s; however with narrower electrodes, for example 100 nm or less and with closer spacing of the electrodes for example 1000 nm or less the data rate can be extended to 56 Gb/s, and in some cases greater than 56 Gb/s. In time-of-flight applications the timing jitter or rise time can be less than 15 pico seconds, and in some cases less than 10 pico seconds. The PD/APD/SPAD can operate in the wavelength range of 600 nm-1550 nm and in some cases to 1650 nm.

Not shown are CMOS/BiCMOS ASICs that can be integrated with the PD/APD/SPAD arrays and passivation layers and interconnecting metal layers. The microstructure holes can be passivated with a dielectric and can be filled entirely or partially with dielectric, and in some cases in partial filling of the microstructure hole a dielectric void can be created within the microstructure hole. For example reference Cao et al, Enhancing the absorption of a thin germanium slab with periodical patterning, Journal of Materials Science: Materials in Electronics, 16 Dec. 2019 shows the use of periodic arrays of nanoholes to enhance optical absorption in Ge.

FIG. 25D is similar to FIG. 25C with the exception that the Ge layer thickness is 200 nm. The absorption which is proportional to EQE can be greater than 40% in the wavelength ranges of 700-1400 nm. In some cases, the absorption or EQE can be 50% or greater in the wavelength range 700-1400 nm. In some cases the EQE can be greater than 30% in the wavelength range 700-1650 nm. The EQE or absorption of a microstructure hole Ge on Si photodetector can be greater than the EQE or absorption of a comparable Ge on Si photodetector without microstructure holes at certain wavelengths.

Figure 26:
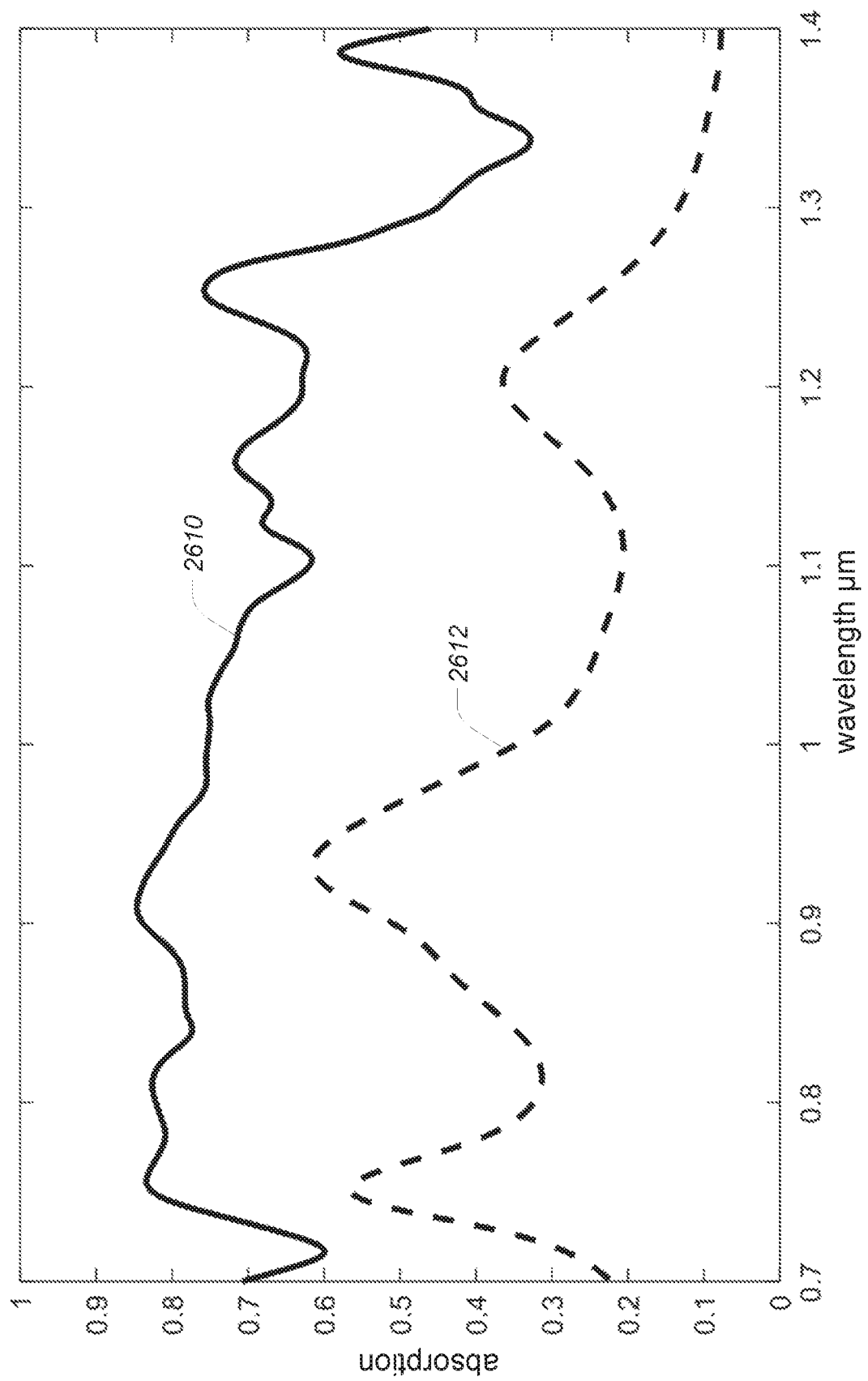
FIG. 26 is a plot showing a FDTD simulation of a structure shown in FIG. 25B having narrower electrodes.

FIG. 26 is a plot showing a FDTD simulation of a structure shown in FIG. 25B having narrower electrodes. In FIG. 26, the solid curve 2610 is for microstructure hole photodetector including the interdigitated electrodes, and the dotted curve 2612 is a comparable photodetector without microstructure holes including the interdigitated electrodes. The vertical axis is absorption directly proportional to EQE and the horizontal axis is wavelength in microns for the curves. The width of the electrode is 200 nm and the spacing between the electrodes is 1300 nm.

With narrower electrode width, for example 100 nm, and in some cases 60 nm, and in some cases 40 nm, and in some cases 28 nm or less the spacing between the electrodes can be decreased to 500 nm for example which can result in a photodetector with a 3 dB bandwidth of 100 GHz or more, which is equivalent to approximately 140 Gb/s. The full width half max is approximately 5 pico seconds, and the rise time is approximately 3 pico seconds.

With appropriate P and N doping the interdigitated Photodetector can operate as a PD/APD/SPAD mode, in addition with narrower electrodes, the EQE or absorption characteristics as a function of wavelength can be almost equivalent to the EQE or absorption characteristics without electrodes.

As shown in the plots in FIG. 25 and FIG. 26 photodetectors with microstructure holes can have a higher absorption which is directly proportional to EQE at certain wavelengths than a comparable photodetector EQE without microstructure holes.

Figure 27:
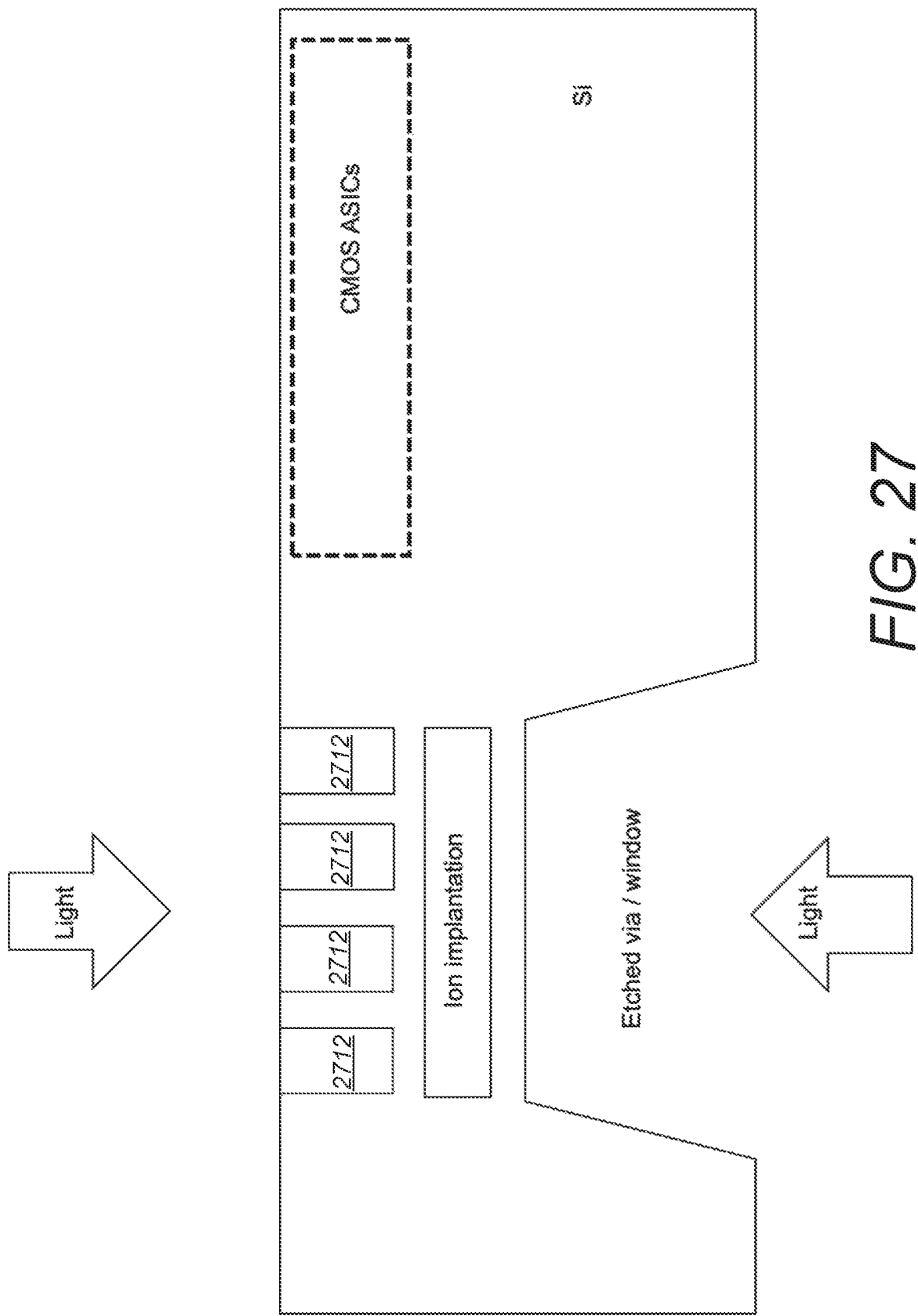
FIG. 27 is a simple partial schematic cross section of microstructure hole photodetector fabricated on bulk Si, according to some embodiments.

FIG. 27 is a simple partial schematic cross section of microstructure hole photodetector fabricated on bulk Si, according to some embodiments. Part of the bulk Si can be removed by etching (dry and/or wet) and a region between the microstructure holes 2712 and the etched via or window can be heavily N or P doped, and in some cases an ion such as oxygen, nitrogen, helium, argon to name a few, can act either as an etched stop layer, or a layer to indicate when to stop the etching, and in some cases the layer can reduce the lifetime of minority carriers. In some cases, such a region may not be necessary. The region can be formed by ion implantation and/or diffusion of ions. The photodetector can be a vertical PIN or PN or PIPN junction, and in some cases the photodetector can be a lateral PIN or PN junction, and the Photodetector can operate in PD/APD/SPAD mode. CMOS ASICs such as TIA can be formed on the bulk substrate see for example reference Li et. al, A 112 Gb/s PAM4 Linear TIA with 0.96 pJ/bit Energy Efficiency in 28 nm CMOS, 978-1-5386-5404-0/18, IEEE 2018. Where 112 Gb/s TIA (trans impedance amplifier) circuit is formed. The microstructure hole photodetector can operate at 56 Gb/s bandwidth using PAM-4 where 2 bits are formed in each time frame.

Not shown are the PN junctions, passivation connecting electrodes and transmission lines from the photodetector to the CMOS electronic circuits. Also not shown are isolation trenches to electrically or optically isolate the photodetector or arrays of photodetectors from each other and/or from the CMOS electronics. In some cases an isolation trench may not be necessary.

The operating wavelength can range from 600 to 1100 nm. Light can impinge from the top surface where the microstructure holes are formed, and/or from the bottom surface where a via/window can be formed. Not shown are anti-reflection layers that can be formed in the via. In some cases, the via can be filled a dielectric such as silicon dioxide for example. The microstructure hole can be filled fully or partially with dielectric and in some cases, it can be additionally covered by dielectric as part of the CMOS ASIC fabrication process.

In the case of CMOS/BiCMOS integration of photodetectors with ASICs planarization layers can be deposited onto the photodetectors and depending on the mode which can range from 200 nm to 5 nm. The planarization and electrode density can be important to maintain required flatness of the wafer for CMOS/BiCMOS processing.

Figure 28:
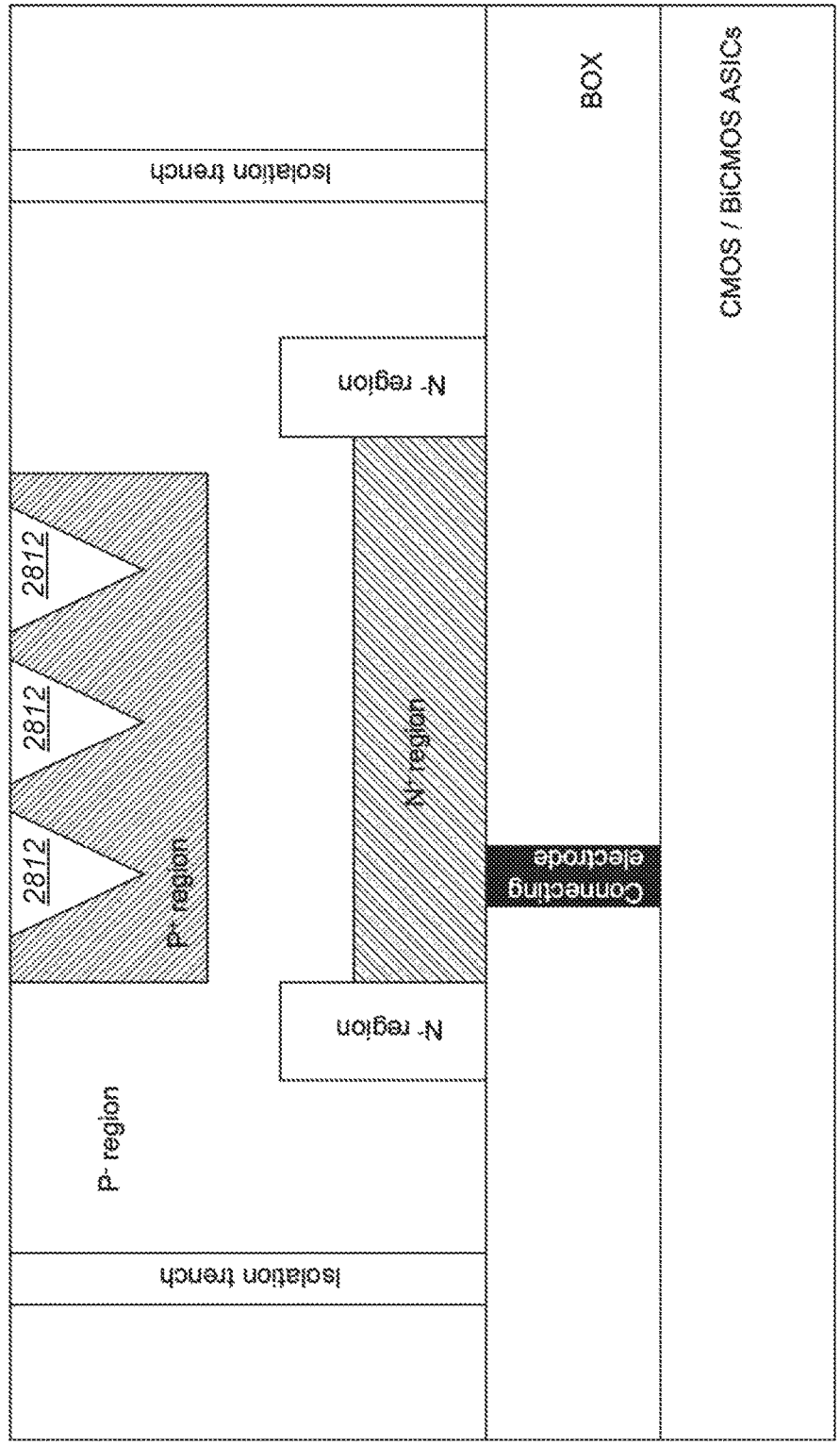
FIG. 28 is a simple partial cross section schematic of an APD/SPAD back illuminated CMOS/BiCMOS Photosensor on a SOI wafer, according to some embodiments.

FIG. 28 is a simple partial cross section schematic of an APD/SPAD back illuminated CMOS/BiCMOS Photosensor on a SOI wafer, according to some embodiments. The CMOS/BiCMOS ASICs and the Photosensor are on the opposite surfaces of the BOX layer. To minimize dark current the microstructure hole/s 2812 can be formed in the $P^+$ region and the substrate or handle layer can be thinned to a thickness ranging from 1 to 5 microns, and in some cases 3 microns. The handle layer can be $P^-$ with a deep N or $N^+$ well and with an $N^-$ well as guard rings. The P and N regions can be formed by ion implantation and/or ion diffusion. In some cases, a P region can be formed in close proximity or touching the N or $N^+$ region. The structure can be PIN or PN or PIPN junctions. The deep N region can be connected to the CMOS/BiCMOS ASIC electronics with an electrode through the BOX layer. The electrode can be metallic and/or metal silicide. Not shown are connecting electrodes for the $P^+$ region which in some cases can be a common ground for example that can connect the $P^+$ regions of multiple Photosensors such as a Photosensor array where pixel sizes can range from 1 micron to 100 microns in lateral dimensions. Isolation trenches can be formed between the pixels. Also not shown are passivation layers that can fully or partially fill the microstructure holes 2812 and the trenches and planarization layers that can further cover the Photosensor. The microstructure hole can be inverted pyramids, conical, trapezoidal, cylindrical, clover leaf, amoebic to name a few, and can be either a single hole in a pixel or multiple holes in a pixel.

As discussed earlier to minimize dark current or leakage current the microstructure holes can be formed in a region of low or minimal electric field such as within a heavily doped region that can be P or N, and where P and N can be interchanged. However, for minimum noise it is desirable that the electrons are primarily responsible for the avalanche gain. As in FIGS. 19 and 20, the dopant can follow the contour of the holes.

The P and N regions can form PN junctions and in some cases PIN junctions, and in some cases P low dope N or P N junctions, and in some cases PIPN junctions for the device to operate in a photodiode and/or avalanche photodiode (APD) and/or single photon avalanche photodiode (SPAD) with a reverse bias applied to the anode and cathode. In some cases, the reverse bias voltage can be anywhere in the range of 0.1 volt-3.3 volts, and in some cases anywhere in the range of 1 volt-10 volts, and in some cases anywhere in the range of 10 volts-35 volts for example. Reference Vila et al, Geiger-Mode Avalanche Photodiodes in Standard CMOS Technologies, DOI: 10.5772/37162, shows an APD in Geiger mode or in SPAD mode or in Si photomultiplier mode.

As discussed in this patent specification the monolithically integrated structure of microhole photodetectors with CMOS/BiCMOS ASICs can also be fabricated as a stacked structure where the photodetector or photosensor arrays can be fabricated on a substrate separate from the CMOS/BiCMOS ASICs and then bonded or stacked together to form a single chip.

Figure 29:
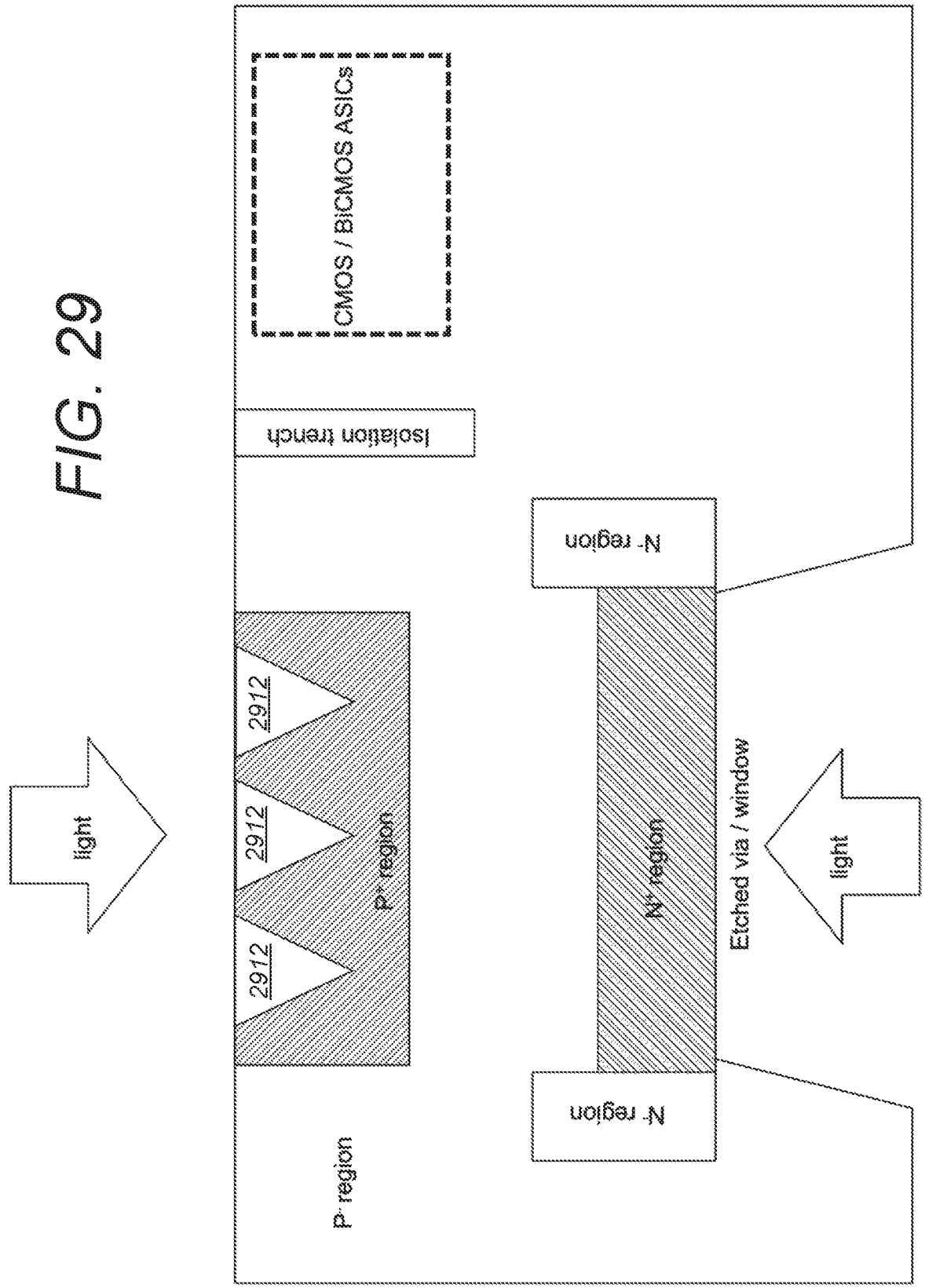
FIG. 29 is a simple partial cross section of microstructure hole photodetector fabricated on bulk Si, according to some embodiments.

FIG. 29 is a simple partial schematic cross section of microstructure hole photodetector fabricated on bulk Si, according to some embodiments. The structure shown in FIG. 29 is similar to that shown in FIG. 27, where the photodetector is formed on a bulk Si wafer and where it is integrated with CMOS/BiCMOS ASIC electronics. In FIG. 29 as in FIG. 28 an APD/SPAD microstructure hole Photosensor is shown where the microstructure holes 2912 are predominantly in the heavily doped P region. The deep $N^+$ region can be used as an etch stop layer for the formation of the bottom via/window. An isolation trench can be included between the Photosensor and the ASIC electronics, and in some cases between Photosensors when there is an array of such Photosensors. The P substrate typically is lightly doped with resistivity greater than 1 ohm-cm, and in some cases 10 ohm-cm or greater. Not shown are passivation layers, planarization layers, connecting electrodes from the P and N regions of the photodetector to the CMOS/BiCMOS ASIC electronics.

The Photosensors operate in a reverse bias ranging from 3 volts to 30 volts, and in some cases 3 volts to 15 volts, and in some cases greater than 30 volts. In some cases, the Photosensor can operate in a photodiode mode in which case the reverse bias can range from 0.5 volts to 3.3 volts, and in some cases 0.5 volts-5 volts. Light can impinge from the top surface where the microstructure holes are formed or from the bottom surface through the via/window. The wavelength can range from 600 to 1100 nm, and in some cases 800-1000 nm. The timing jitter or rise time of the Photosensor can range from 5 pico seconds to 50 pico seconds, and in some cases 3 picoseconds-30 pico seconds, and in some cases greater than 50 pico seconds for time-of-flight applications such as 3D imaging and LiDAR. The Photosensors can also be used for CMOS image sensors in the infrared.

For optical data center interconnect applications, local area networks the data rate can range from 1 Gb/s to 112 Gb/s and in some cases 56 Gb/s-112 Gb/s.

Figure 30:
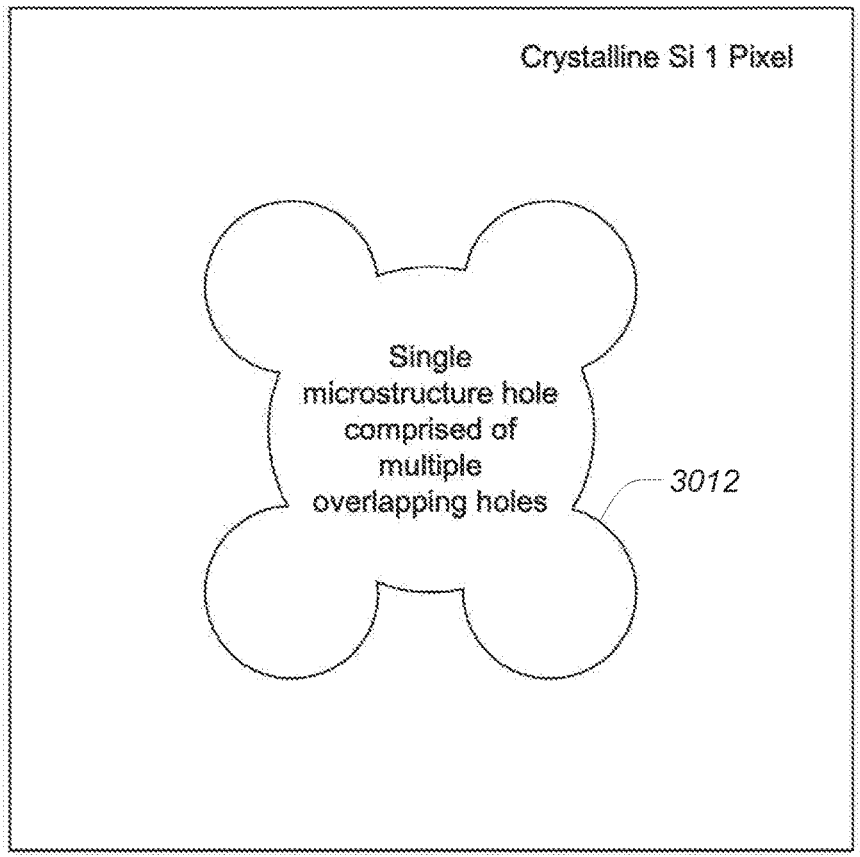
FIG. 30 is a simple partial schematic of the top view of a pixel with a single microstructure hole which is composed of two or more overlapping microstructure holes, according to some embodiments.

FIG. 30 is a simple partial schematic of the top view of a pixel with a single microstructure hole which is composed of two or more overlapping microstructure holes, according to some embodiments. The overlapping holes that form microstructure hole 3012 can be circular, polygonal, amoebic and/or any combination of hole shapes and can touch or overlap to form a single hole that can in some cases have islands of Si and/or Ge within the hole. For example, a ring of intersecting holes can be used. In some cases, the overlapping microholes can consist of 2 holes, 3 holes, 4 holes, 5 or more holes, and the overlapping holes can form a single microstructure hole in the pixel. The lateral dimension of the microholes can range from 100 nm to 1000 nm, and the composite overlapping hole can have a lateral dimension ranging from 500 nm to 800 nm, and in some cases greater than 800 nm. The single pixel can range in size from 1000×1000 nm to 3000×3000 nm. In some cases, the single pixel can be less than 1000×1000 nm, and in some cases the single pixel can be greater than 3000×3000 nm. The pixel shape can be a square, rectangle, polygonal, such as a hexagon for example, and in some cases the pixel can have curves, circular for example or oval.

The image sensor can comprise multiple pixels, and the pixels can have different dimensions and/or shapes. The pixels can be isolated optically and/or electrically from adjacent pixels with an isolation trench. The density of pixels can range from a few per sq cm, for example 100 per sq cm to 1,000,000 or more per sq cm, for example 10-100 million per sq cm, and in some cases greater than 100 million per sq cm.

Ge and/or GeSi layer can be deposited on the handle layer to extend the wavelength range to 1650 nm. The Ge or GeSi layer can have a thickness ranging from 100 nm to 400 nm and in some cases greater than 400 nm. Microstructure hole or holes can be formed in the Ge or GeSi layer, and in some cases the microstructure hole or holes can extend into the Si handle layer both lateral or vertical PN, PIN, PIPN junctions can be formed in either the vertical or lateral Photosensor structures.

Figure 31:
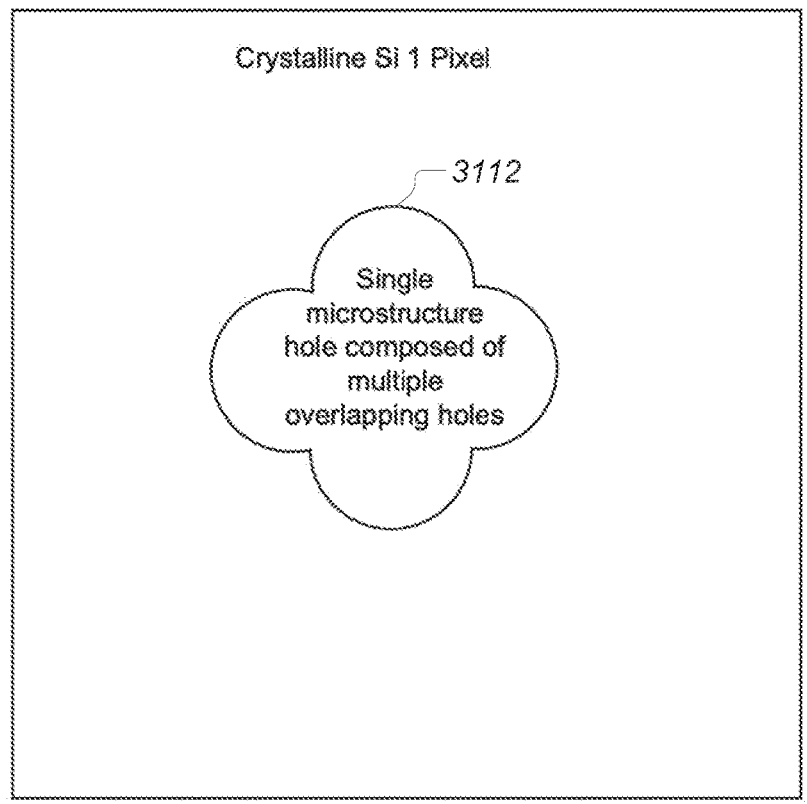
FIG. 31 is a simple partial schematic top view of a single pixel with 4 overlapping circular microholes, according to some embodiments.

FIG. 31 is a simple partial schematic top view of a single pixel with 4 overlapping circular microholes, according to some embodiments. Each microhole is 400 nm in diameter on crystalline Si. The size of the pixel is 1200×1200 nm. In this case the microstructure hole 3112 is formed on the handle layer of an SOI wafer with a thickness of 3 microns. The BOX layer is 20 nm, and the device layer where the CMOS AISCs are formed is also 20 nm thick. A single clover leaf microstructure hole 3112 on a pixel is shown for a back illuminated CMOS image sensor that can also be used for 3D imaging. In the CMOS image sensor the number of pixels in an array can be in the millions.

Multiple lateral dimensions can be implemented in the microstructure hole to allow the low Q resonator to support multiple wavelengths of the incident photons such that the enhanced absorption and therefore the EQE can have a broader and flatter spectrum. In addition, the microstructure hole cross section can have sidewalls that are predominately 90 degrees to the surface, and in some cases can have conical or sloped sidewalls, and in some cases a combination of straight and sloped sidewalls with one or more slope.

Figure 32A:
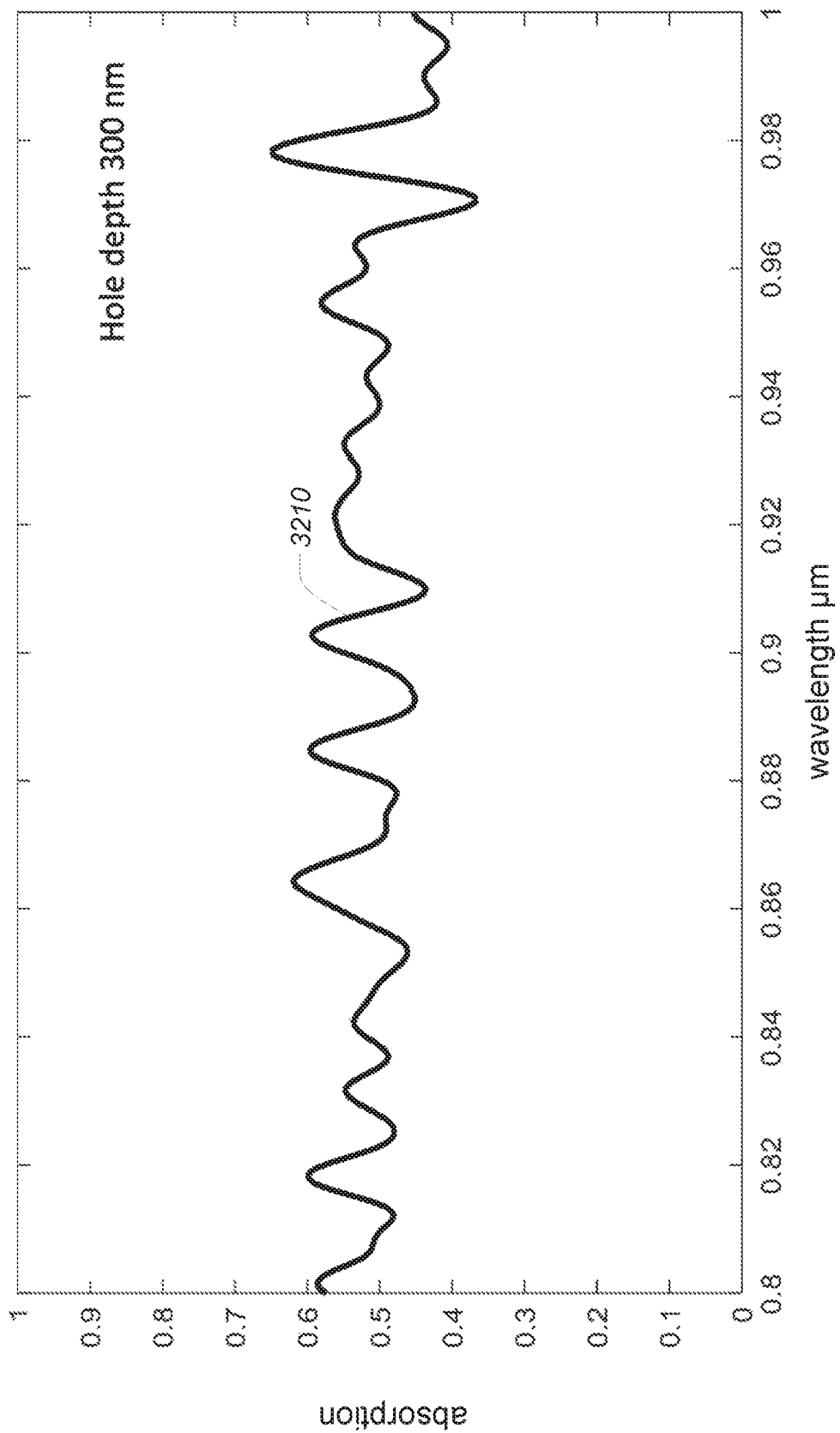
FIGS. 32A and 32B are plots of FDTD simulations of the optical field absorbed for a structure as shown in FIG. 31 with different hole etch depths.
Figure 32B:
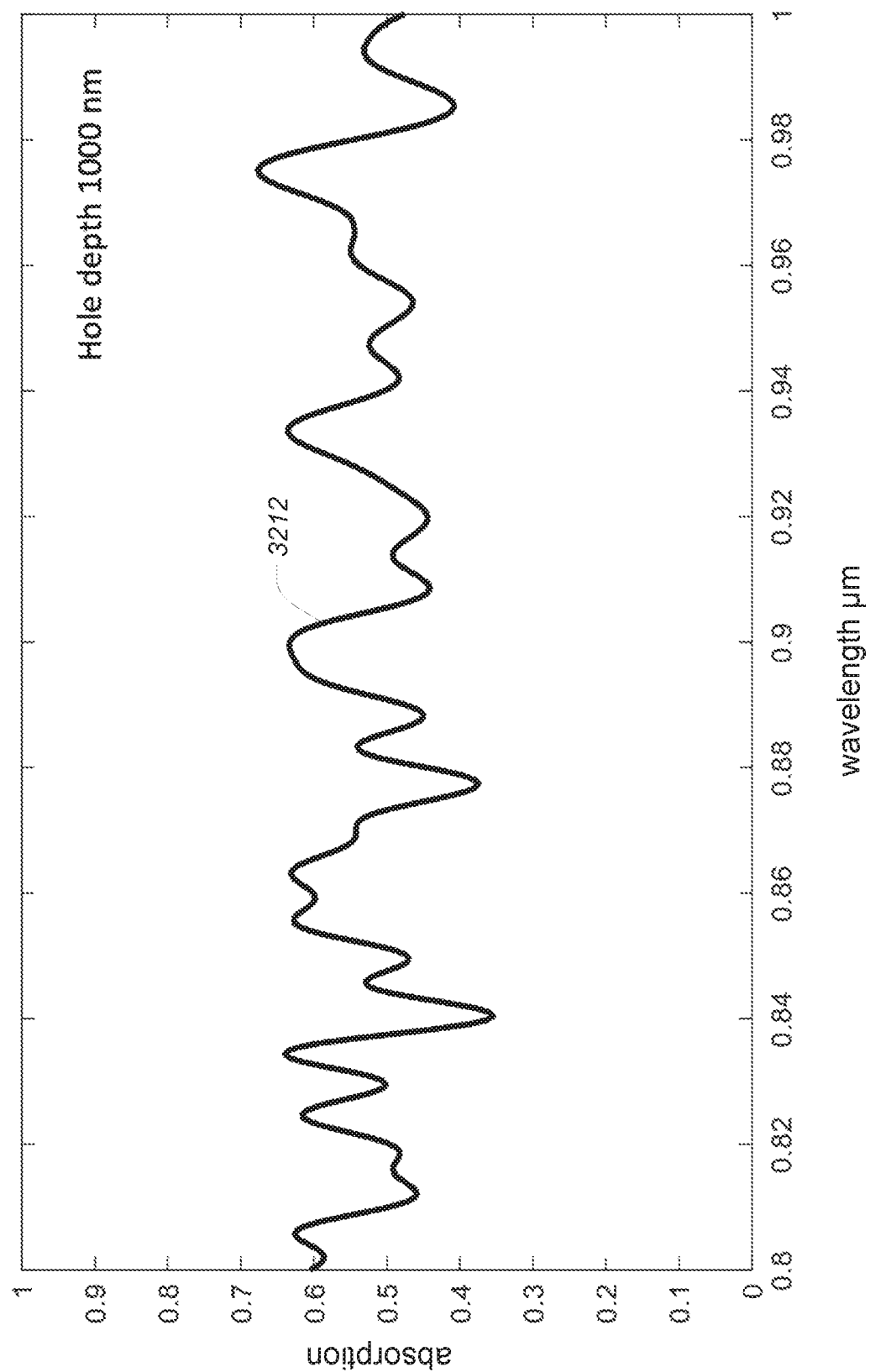

FIGS. 32A and 32B are plots of FDTD simulations of the optical field absorbed for a structure as shown in FIG. 31 with different hole etch depths. The vertical axis is absorption which is directly proportional to EQE and the horizontal axis is the wavelength from 800-1000 nm. In FIG. 32A curve 3210 is the absorption vs wavelength for a single pixel of 1200×1200 nm with a clover leaf microstructure hole as shown in FIG. 31 with a hole depth of 300 nm. FIG. 32B is similar to FIG. 32A but the curve 2312 is for a structure having a deeper hole etch depth of 1000 nm.

Photosensing pixels with microstructure hole or holes can have a higher EQE than a comparable photosensing pixel without microstructure holes at certain wavelengths.

The microstructure hole or holes can be further optimized to increase the absorption/EQE to 60% or higher, and in some cases 40% or higher, and in some cases 30% or higher.

Figure 33A:
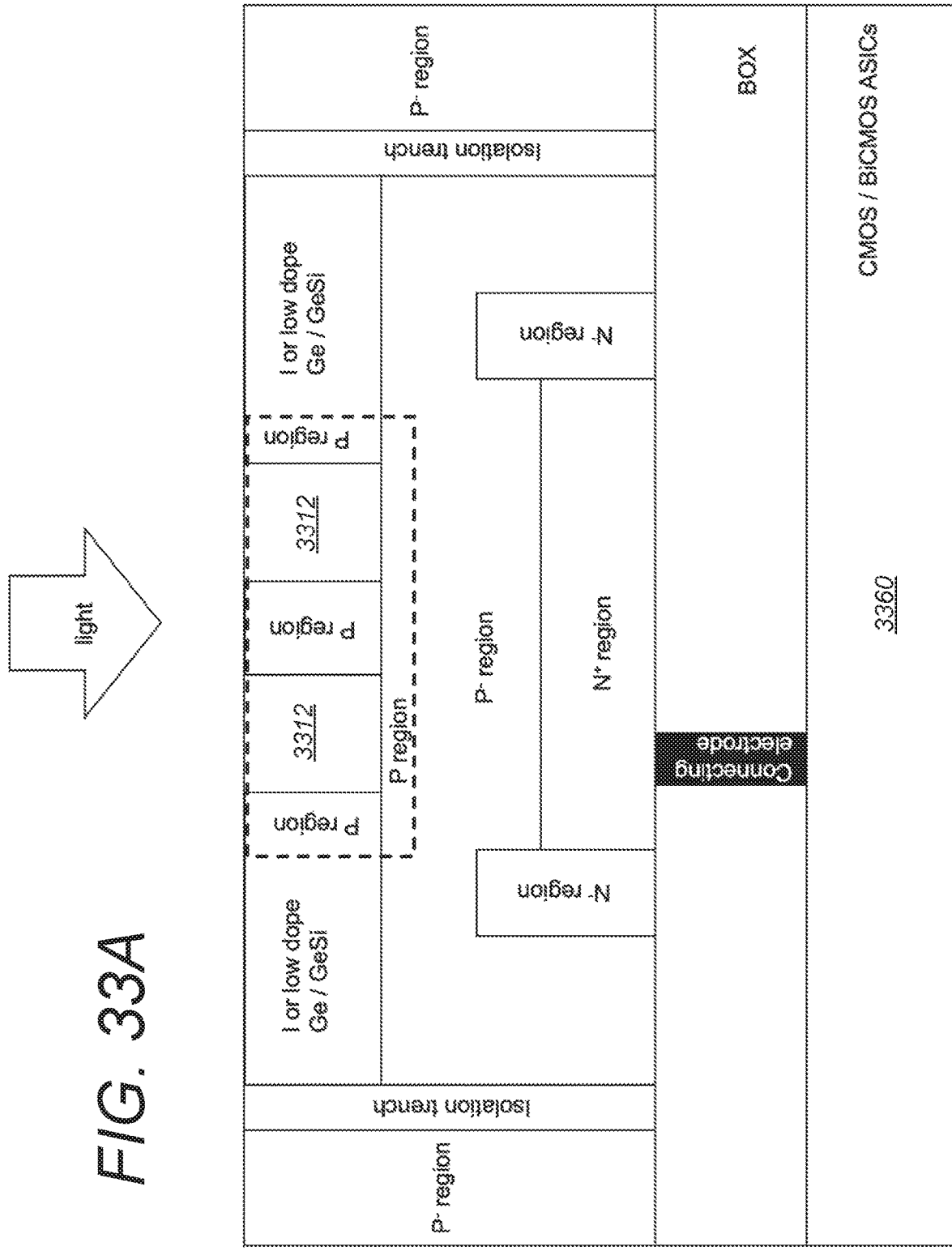
FIG. 33A is a partial simple cross section schematic of a back illuminated CMOS Photosensor, according to some embodiments.

FIG. 33A is a partial simple cross section schematic of a back illuminated CMOS Photosensor, according to some embodiments. CMOS and/or BiCMOS ASICs are formed on the device layer 3360 and the photosensor is formed on the handle layer of a SOI wafer. The handle layer can be thinned to a thickness ranging from 1000 nm-5000 nm, and in some cases 3000 nm. Ge and/or GeSi can be epitaxially grown on the surface of the thinned handle layer using selective area epitaxy for example where only the photosensitive regions have Ge and/or GeSi. The Ge and/or GeSi can have a thickness ranging from 100 nm to 400 nm, and in some cases 200 nm. Selective area epitaxial growth can be used to minimize the strain of Ge and/or GeSi on the Si.

A deep N well can be implanted close to the BOX— handle layer interface with low dope N guard rings for example. The P$^+$ well can be implanted into the Ge/GeSi layer and in some cases can extend into the I or low dope P$^-$ Si handle layer. Isolation trenches between the pixels of the image Photosensor can be formed. Electrodes from the CMOS/BiCMOS ASICs can be formed through the BOX layer connecting to one of the doped regions of each pixel. Not shown are electrodes connecting to the P region of the pixels to the CMOS/BiCMOS ASICs.

Light is illuminated on the Ge/GeSi Photosensor. The light can be an image, pulses of light for time-of-flight applications and in some cases can be pulses of flight for optical data communication.

The microstructure holes 3312 can range from 1 microstructure hole per pixel to multiple microstructure holes per pixel. The number of microstructure holes 3312 per pixel can range from 1 to 1000 or more, and in some cases 10,000 or more. The depth of the microstructure holes 3312 can be partially in the Ge/GeSi layer, and in some cases through the Ge/GeSi layer, and in some cases into the I or low dope Si layer. The lateral dimension of the microstructure hole can range from 400 nm to 1200 nm, and in some cases 500 nm-1500 nm. The microstructure hole/holes 3312 can be filled partially or fully with a dielectric such as Si dioxide in which case the lateral dimension of the holes can be modified by the average index or the index of the dielectric. For example, a 1000 nm hole filled with Si dioxide can have a lateral dimension of approximately 670 nm, in other words, the lateral dimension can be divided by the refractive index or average refractive index of the dielectric. In some cases, the microstructure hole/s can be partially or fully filled with poly crystalline Si and/or amorphous Si, and in some cases a combination of dielectric and poly crystalline Si.

The shape of the hole/s can be circular, oval, polygonal, clover, amoebic, and/or any combination of shapes. The cross section of the microstructure hole can be cylindrical, conical, trapezoidal, inverted pyramidal to name a few.

The wavelength range for the back illuminated Photosensor can range from 600 to 1650 nm. Photosensors with microstructure hole/s can have an EQE greater than the EQE of a comparable Photosensor without microstructure hole/s.

In the simplified partial schematic cross section depiction of FIG. 33A, geometric shapes such as rectangles, triangles, trapezoids are used for structures such as microstructure holes, epitaxial growth regions, electrodes, doped regions to name a few, however in actuality the shapes of such regions may be more complex such as surface roughness, interface diffusion between different materials such as silicon and Ge, and in particular the doped regions are often have diffused regions and gradients in the dopant ions such that clear boundaries can be difficult to define clearly. In addition, doped regions can often have rounded corners and depending on the method of introducing the dopant ions diffusion tales and/or ion implant tales can result. In some cases, high growth temperatures and/or thermal annealing temperatures can further cause ions to diffuse. In some cases, sharper interfaces can be achieved using lower temperature epitaxial growth techniques and/or deposition techniques such as vapor phase deposition, plasma assisted vapor phase deposition, molecular beam epistaxis, atomic layer deposition to name a few.

In addition to enhancing IR sensitivity in the range from 700-1650 nm wavelength the photosensor and/or pixel can have a dimension ranging from 10 microns×10 microns to 0.5 microns×0.5 microns, and in some cases less than 0.5 microns×0.5 microns, and in some cases greater than 10 microns×10 microns. The photosensor/pixel can have jitter or rise time in the pico second range, and in some cases in the 10s of picos second range which can result in a depth resolution in the millimeter range, and in some cases in the sub-millimeter range.

Figure 33B:
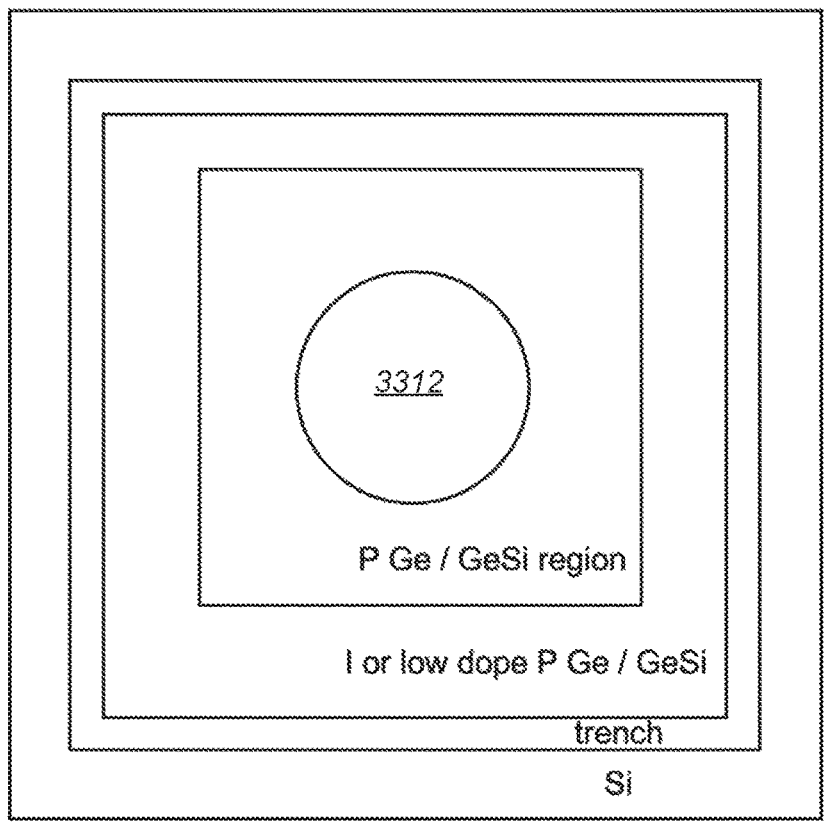
FIG. 33B is a simple partial schematic of a top view of the structure shown in FIG. 33A, according to some embodiments.

FIG. 33B is a simple partial schematic of a top view of the structure shown in FIG. 33A, according to some embodiments. Shown is just one pixel with a single microstructure hole 3312. A pixel array can be fabricated from this single pixel example, in some cases the pixel array can consist of a single hole pixel or multi-hole pixel and the hole lateral dimension can be the same or different for certain pixels, and in some cases the size of the pixel can also have different dimension variations within an array of pixels for photosensing imaging, time-of-flight imaging, and/or optical data communication. The microstructure holes 3312 as shown in FIG. 33B is circular, but can have other shapes such as a polygonal, square, rectangular, oval, clover leaf, amoebic, and/or any combination of shapes to optimize EQE over a certain wavelength range where the wavelength range can span 600 nm-2200 nm. As shown in FIG. 33B, isolation trenches can be formed around each pixel where each pixel has Ge/GeSi absorbing layer and where part of the Ge/GeSi can be doped P type, and where the Ge/GeSi can be selective area epitaxially grown on the I or low dope P handle layer of an SOI wafer. The microstructure hole can be passivated partially or fully with dielectric and/or amorphous or poly crystalline Si. The P and N regions can be interchanged in some cases.

Figure 33C:
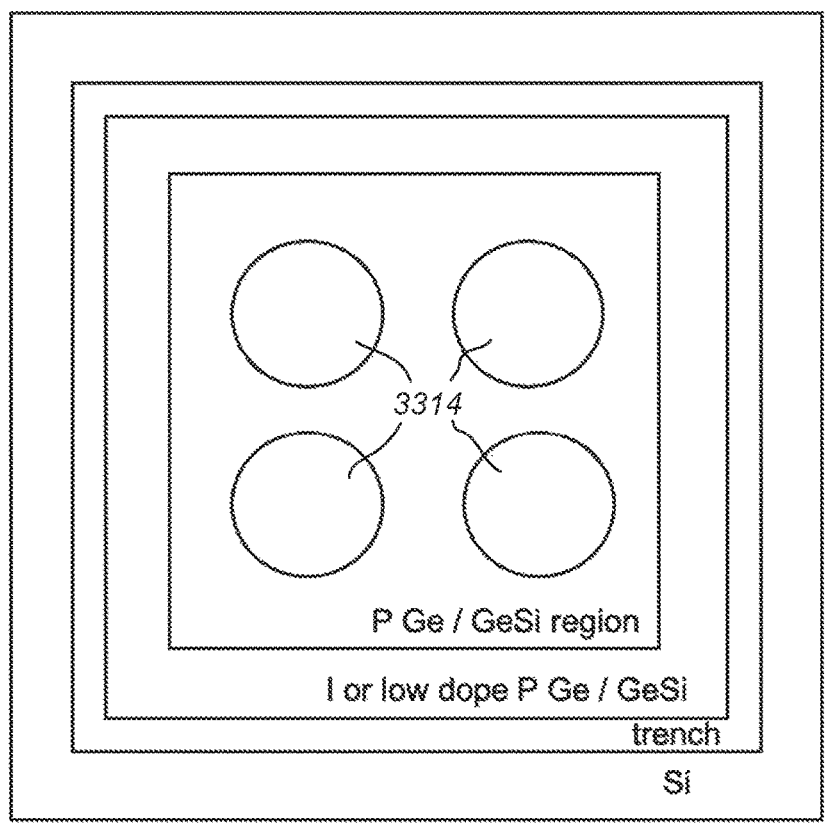
FIG. 33C is a simple partial schematic of the top view of the structure shown in FIG. 33A showing multiple microstructure holes, according to some embodiments.

FIG. 33C is a simple partial schematic of the top view of the structure shown in FIG. 33A showing multiple microstructure holes, according to some embodiments. In FIG. 33C, the lateral dimensions of the holes 3314 can be the same and/or different and the holes can be arranged in a periodic and/or aperiodic and/or random manner. The size of the pixel within an array of pixels can be the same and/or different to enhance the EQE at a certain wavelength. For example at longer wavelengths, 1500 nm or longer the absorption of the Ge and/or GeSi layer can be weaker than the absorption of the Ge/GeSi layer at 800 nm wavelength for example. Therefore, to compensate for the weaker absorption and to increase the sensitivity at longer wavelengths a larger pixel can be used for example as compared to a smaller pixel at shorter wavelengths.

In some cases, the lateral dimension of the microstructure hole/s can be approximately a wavelength where the wavelength is the region of the optical spectrum for optimum EQE. In some cases, the lateral dimension of the microstructure hole/s can vary by +/−0-30% of the wavelength, and in some cases greater than 30%. The wavelength is the wavelength in the material of propagation for example λ/n where λ is the wavelength of light in free space and n is the optical refractive index in which the light is propagating in.

Figure 33D:
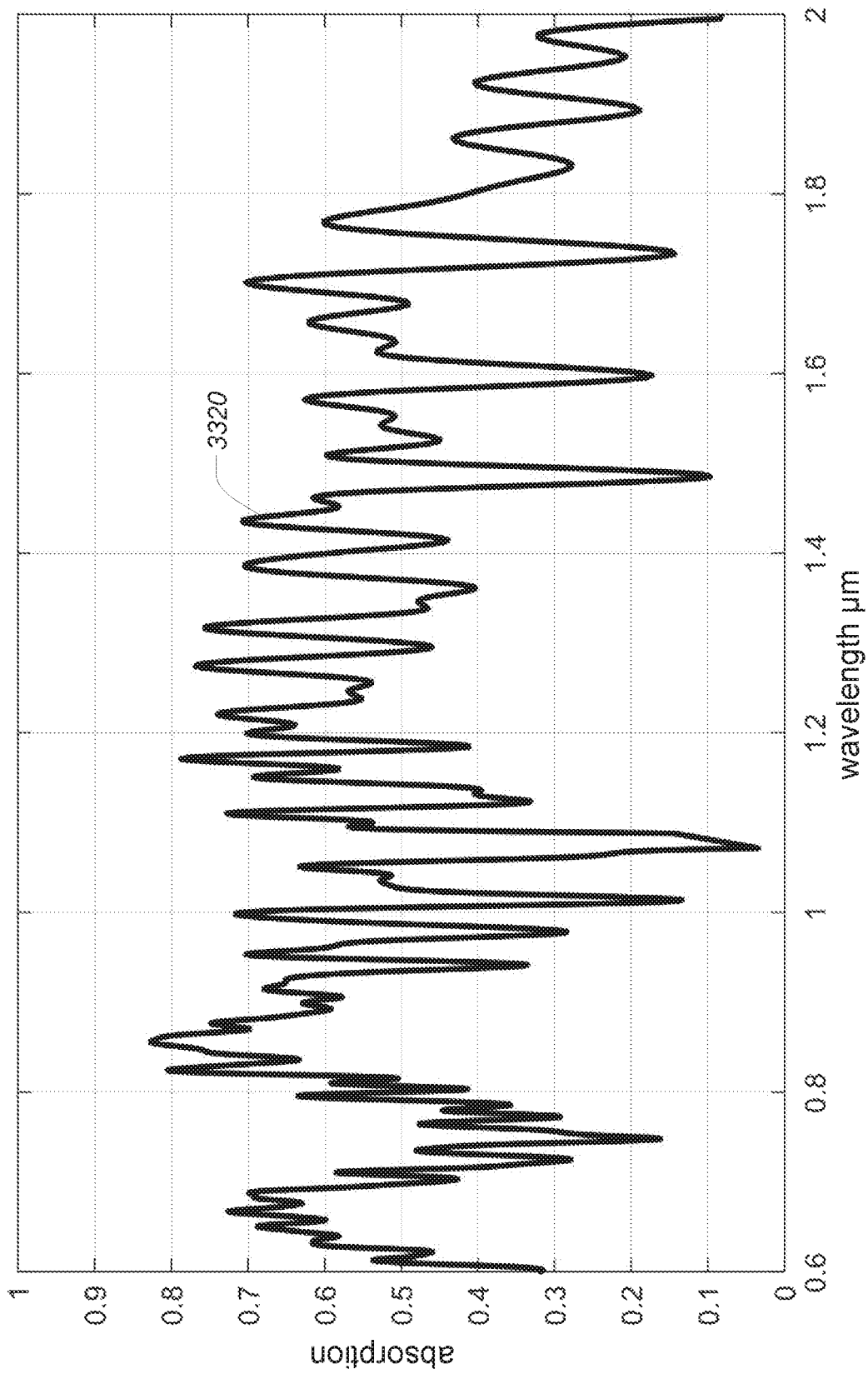
FIG. 33D is a plot of a FDTD simulation for a structure with a cross section such as shown in FIG. 33A and with a single microstructure hole as in FIG. 33B.

FIG. 33D is a plot of a FDTD simulation for a structure with a cross section such as shown in FIG. 33A and with a single microstructure hole as in FIG. 33B. The Ge layer is 200 nm thick on Si that is 3000 nm thick on a 20 nm BOX layer and a 20 nm Si device layer. The single microstructure hole has a diameter of 770 nm and is etched to a depth of 300 nm. The microstructure hole is cylindrical and filled with Si dioxide. In addition, 1000 nm Si dioxide layer covers the microstructure hole and the pixel. The curve 3320 shows the absorption vs wavelength of such a structure where light is normal incident to the surface with the microstructure holes. The wavelength range spans 600 nm-2000 nm. As can be seen in the plots the absorption which is directly proportional to EQE can be greater than 20% over most of the wavelength in that range. And in some cases, can be greater than 40% at some of the wavelengths in that wavelength range.

Figure 34:
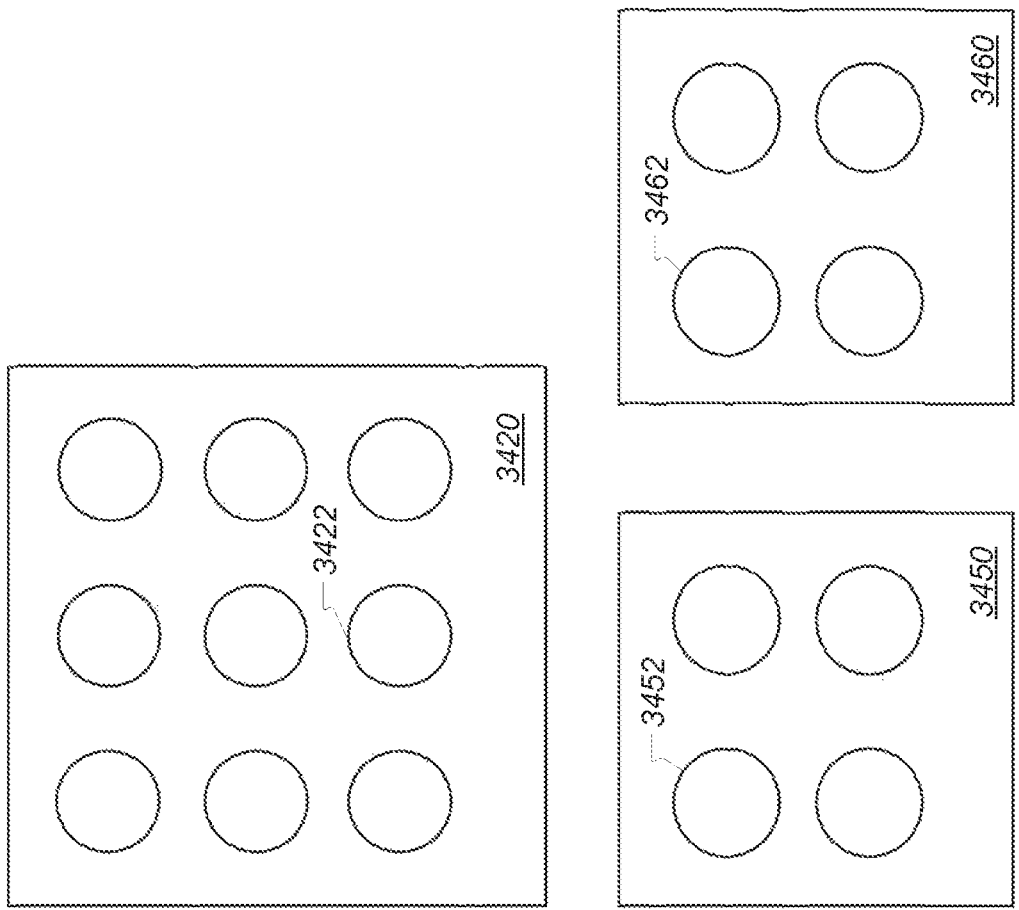
FIG. 34 is a partial simple top view schematic diagram of multiple pixels that can be part of a larger pixel array, according to some embodiments.
Figure 34:
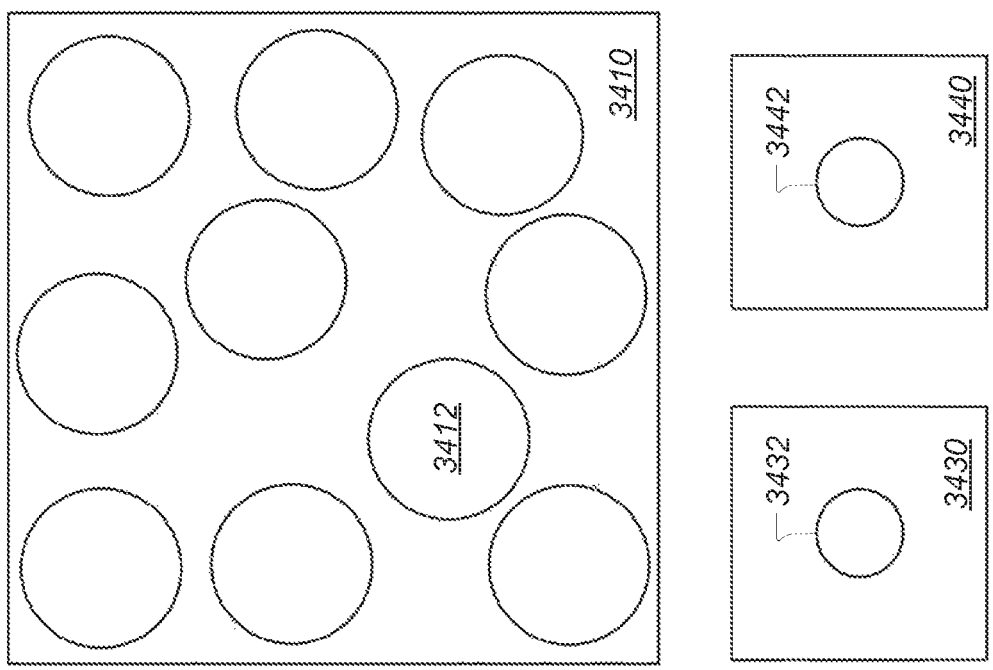

FIG. 34 is a partial simple top view schematic diagram of multiple pixels that can be part of a larger pixel array, according to some embodiments. The pixels 3410, 3420, 3430, 3440, 3450 and 3460 can have different lateral dimensions and microstructure hole/s 3412, 3422, 3432, 3442, 3452 and 3462 can have different lateral dimensions and the holes can have periodic, aperiodic, and/or random arrangements. Each pixel can be optimized for certain wavelength ranges for improved sensitivity, and in some cases for increased resolution.

Figure 35:
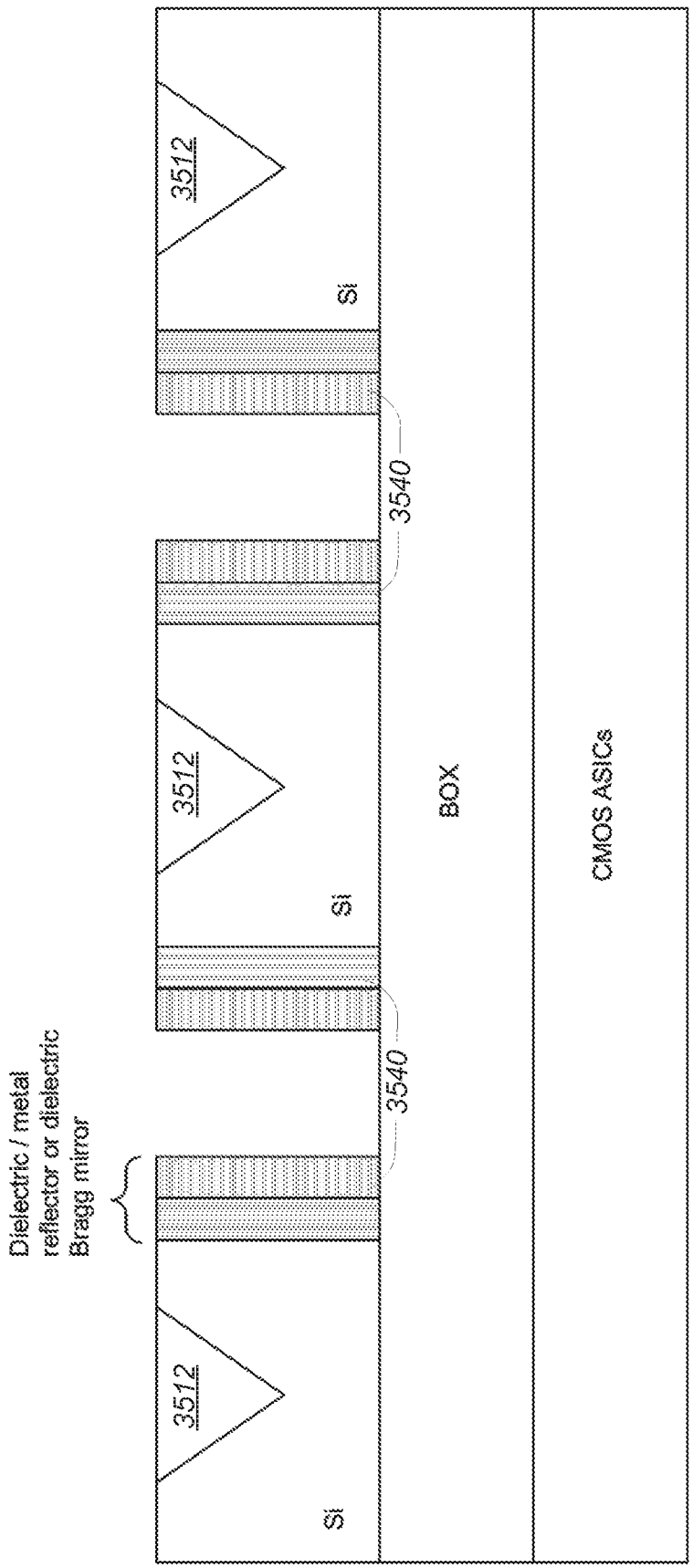
FIG. 35 is simple partial cross section schematic diagram of pixels with reflectors on the side walls of the pixel, according to some embodiments.

FIG. 35 is simple partial cross section schematic diagram of pixels with reflectors on the side walls of the pixel, according to some embodiments. In this case, a back illuminated CMOS Photosensor is shown with one microstructure hole 3512 per pixel. In some cases, multiple microstructure holes per pixel can be configured. The reflectors 3540 on the side wall can be dielectric metal combination where the dielectric can be Si dioxide for example, and the metal can be Al for example. In some cases the reflectors 3540 can be a dielectric Bragg mirror for example see reference, Karaman et. al, Vapor Deposition of Hybrid Organic-Inorganic Dielectric Bragg Mirrors having Rapid and Reversibly Tunable Optical Reflectance American Chemical Society 2008, 20, 2262-2267. In the case of Bragg mirrors the mirrors can select certain wavelengths to optimize in its sensitivity and in some cases each pixel can have same or different Bragg reflectors such that single or groups of pixels can be optimized for certain wavelength sensitivity, for example it can peak at 600 nm or 800 nm or 900 nm or 1550 nm to name a few. In some cases, peaking in sensitivity with the Bragg mirrors can be achieved for red, green, blue, near inferred wavelengths such as 905 nm, 940 nm, 1310 nm, 1550 nm to name a few. In some cases, a broadband reflector may be preferred in which case a dielectric metal reflector can be utilized. In addition, the metal can be used as a connecting common electrode for the anode or cathode. Not shown are the N and P doping profiles, passivation and planarization layers, connecting electrodes to the CMOS ASICs to name a few. Depending on the material of the pixel the wavelength can range from 400 to 1100 nm in Si and 400-2200 nm for Ge on Si pixels. For example, reference Ponnampalam et al, Self-assembled hollow waveguides with hybrid metal-dielectric Bragg claddings, Optics Express, Oct. 1, 2007, Vol. 15, No. 20 shows a metal dielectric Bragg mirror.

Figure 36A:
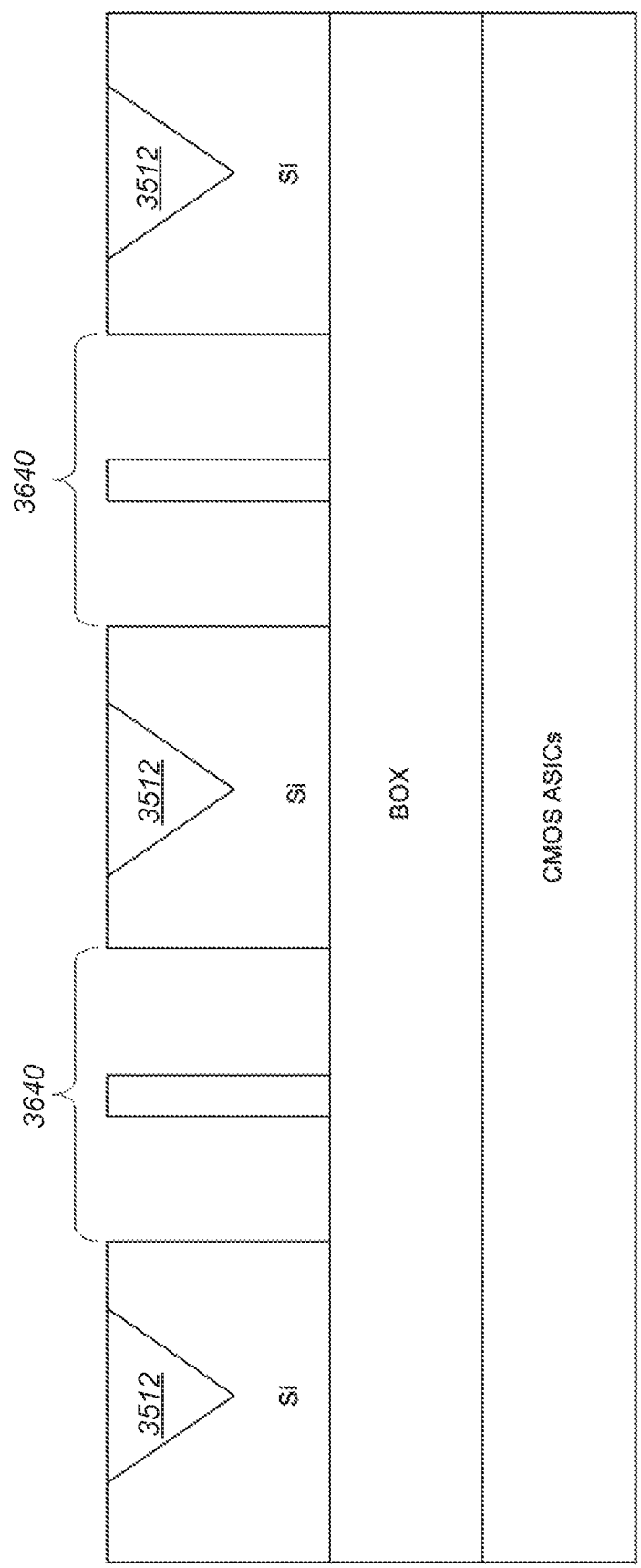
FIG. 36A is a simple partial cross section schematic diagram of a structure similar to that of FIG. 35 except the reflector surrounding each pixel is an air Si or dielectric Si Bragg mirror, according to some embodiments.

FIG. 36A is a simple partial cross section schematic diagram of a structure similar to that of FIG. 35 except the reflector surrounding each pixel is an air Si or dielectric Si Bragg mirror, according to some embodiments. See reference, Pruessner et. al, Integrated waveguide Fabry-Perot microcavities with silicon/air Bragg mirrors, Optical Society of America Mar. 1, 2007/Vol. 32, No. 5. The air silicon Bragg mirrors 3640 can be a single pair or multiple pairs, and in some cases the Bragg mirror can be tuned with an applied voltage. In addition, the air silicon Bragg mirror can be customized for each pixel or group of pixels to optimize the Photosensor sensitivity at certain wavelength ranges, for example red, green, blue, and near inferred wavelengths to name a few. In some cases, the air can be replaced with a dielectric such as Silicon dioxide for example to for a dielectric Si Bragg reflector or mirror.

With either dielectric metal or Bragg mirror at the edges of the pixel or pixels a significant enhancement of the photosensitivity of each pixel can be achieved. Such pixel(s) can have a higher photosensitivity or EQE at certain wavelengths over a comparable pixel without a dielectric metal or Bragg mirrors. See, e.g. reference Masson et al, MEMS Tunable Silicon Fabry-Perot Cavity, SPIE 2019; Pruessner et al, Integrated waveguide Fabry-Perot Microcavities with silicon/air Bragg mirrors, Optics Letters, Mar. 1, 2007, Vol. 32, No. 5, showing silicon air Bragg reflectors.

Figure 36B:
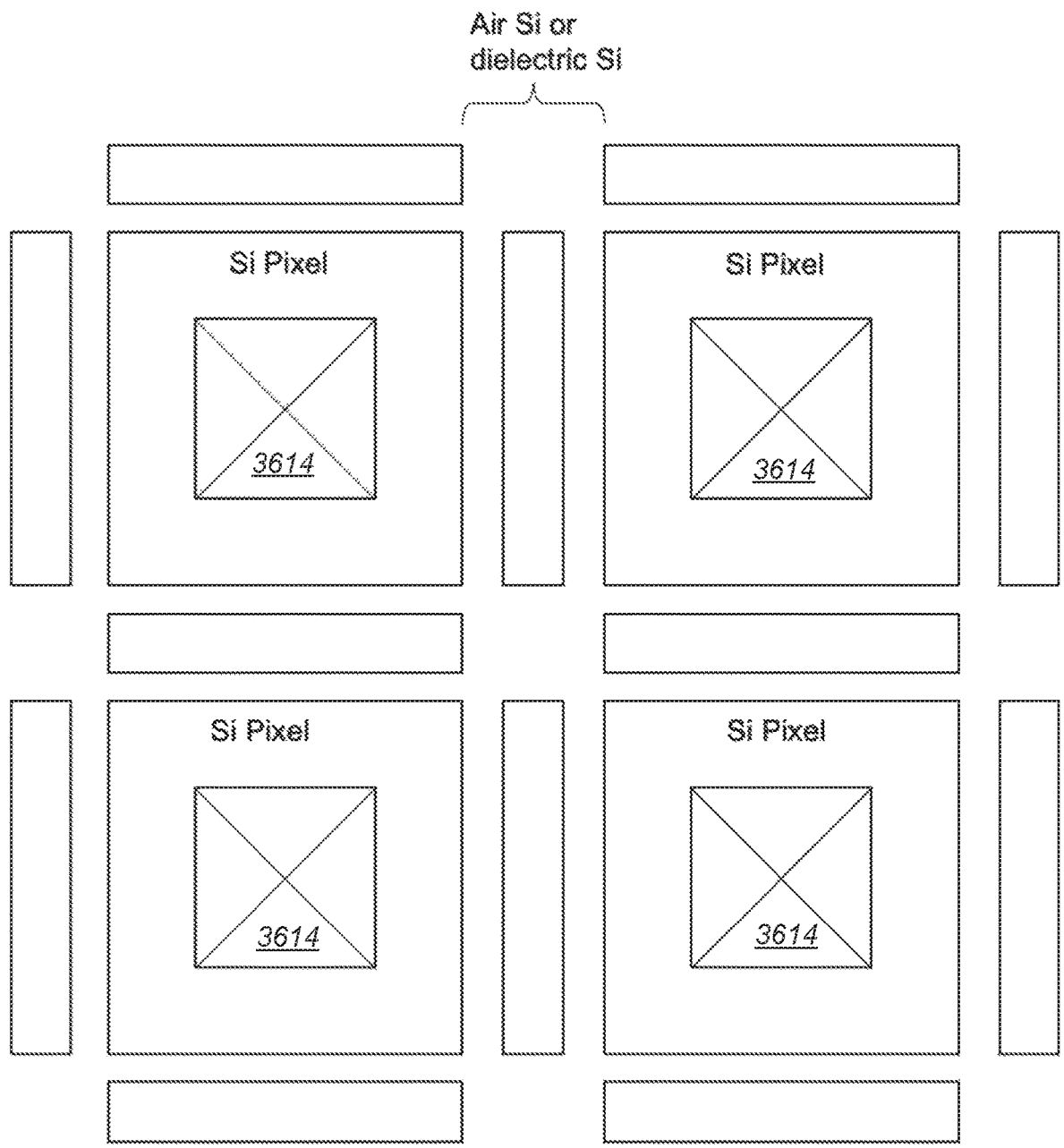
FIG. 36B is a simple partial top view schematic diagram of the structure of FIG. 36A with one pair of air Si or dielectric Si Bragg mirrors surrounding each pixel.

FIG. 36B is a simple partial top view schematic diagram of the structure of FIG. 36A with one pair of air Si or dielectric Si Bragg mirrors surrounding each pixel. In some cases, more than 1 pair of Bragg mirrors can be used. The Bragg mirror can be customized for each pixel to enhance its photo response to certain wavelength ranges. In some cases, the air can be replaced with a dielectric such as Si dioxide, and it can cover the microstructure hole 3614, pixel, Bragg mirror, and can be planarized using standard CMOS process.

Figure 37A:
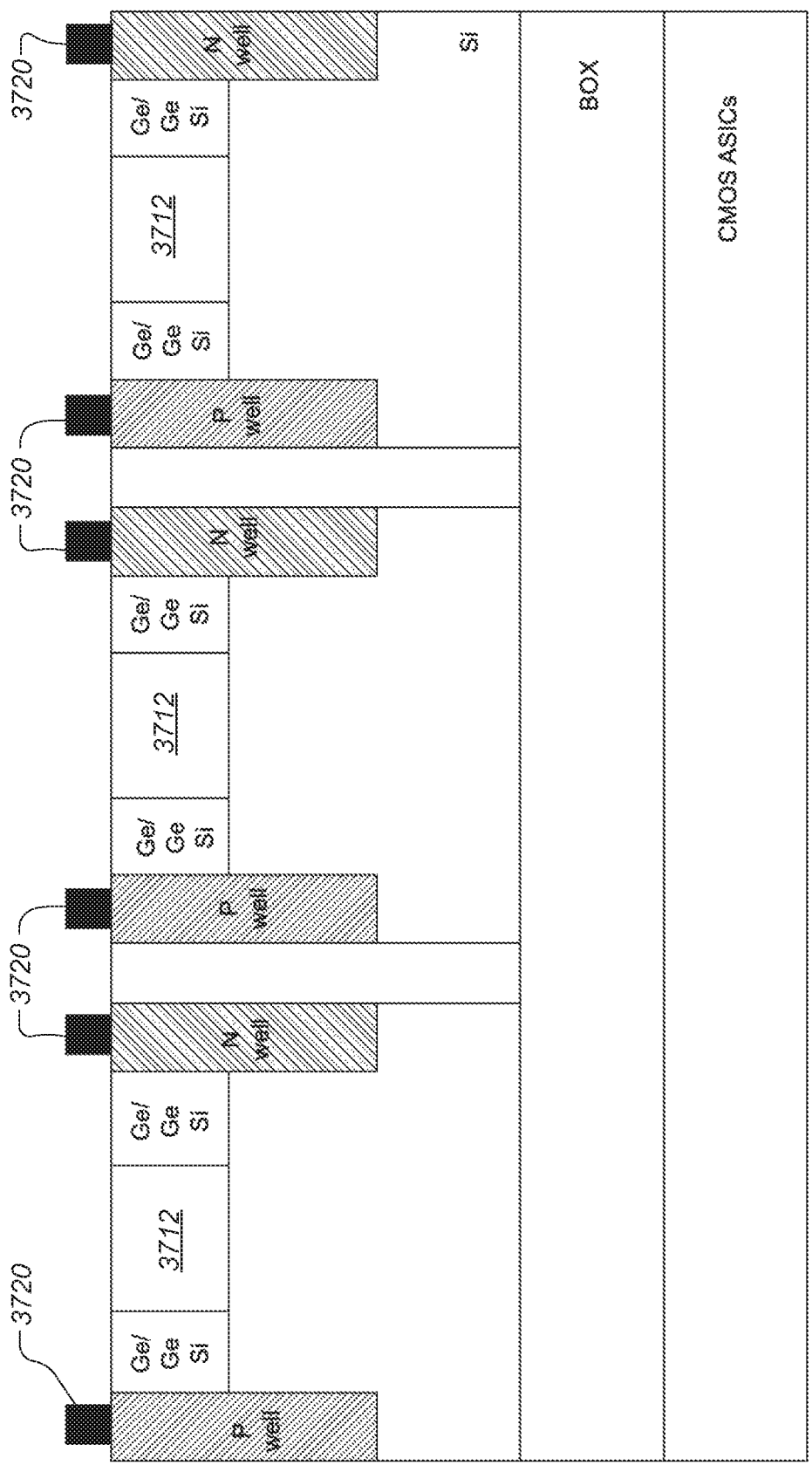
FIG. 37A is a simple partial cross section schematic diagram of pixels in a lateral PIN or PN or P low dope N configuration, according to some embodiments.

FIG. 37A is a simple partial cross section schematic diagram of pixels in a lateral PIN or PN or P low dope N configuration, according to some embodiments. Each pixel can be isolated with an isolation trench. P and N junctions are formed at the edge of the pixels and the pixel can have a single microstructure hole 3712, and in some cases multiple microstructure holes. In addition, the Ge/GeSi layers can be formed on the Si handle layer which can be thinned to 3 microns or less. In some cases, the lateral structure can comprise only the Si handle layer which can be I or low dope P or N type material. The Ge/GeSi layer can be formed on the Si handle layer with selective area epitaxial growth and the Ge/GeSi can be formed only within each pixel to minimize stress on the wafer due to lattice miss match between Ge/GeSi and Si. Electrodes 3720 are formed on the P and N regions and the electrodes can be connected to the CMOS ASICs (not shown).

The wavelength range of sensitivity for Si only can range from 400 to 1100 nm, and with the addition of Ge/GeSi the wavelength range can be 400-2200 nm, and in some cases 400-1600 nm. The thickness of the Ge/GeSi can range from 100 nm to 500 nm, and in some cases 200-400 nm.

For time-of-flight applications it is desirable to operate at longer wavelengths where the photon energy is lower for eye safety concerns—for example 900-980 nm, 1200-1350 nm, and 1550 nm.

Figure 37B:
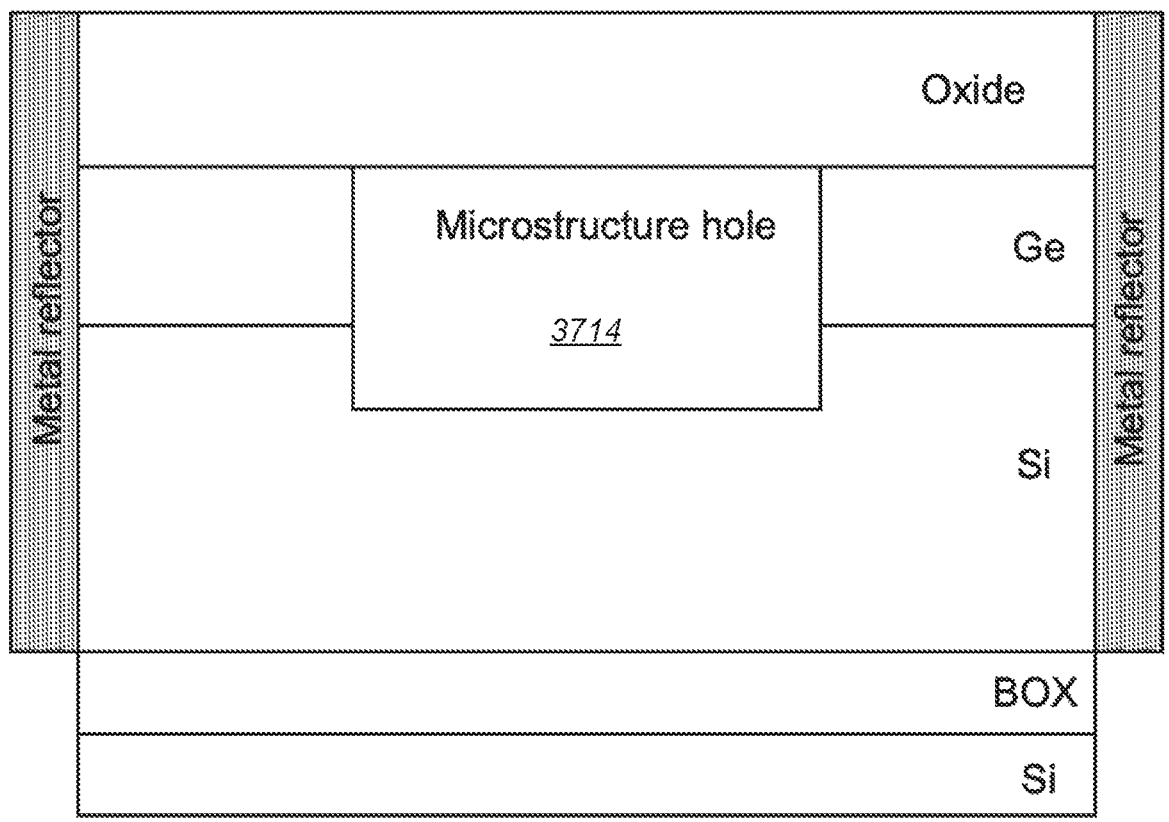
FIGS. 37B and 37C are simple partial cross section and top view schematic diagrams of a back side illuminated (BSI) Ge on Si single hole pixel CMOS image sensor, according to some embodiments.
Figure 37C:
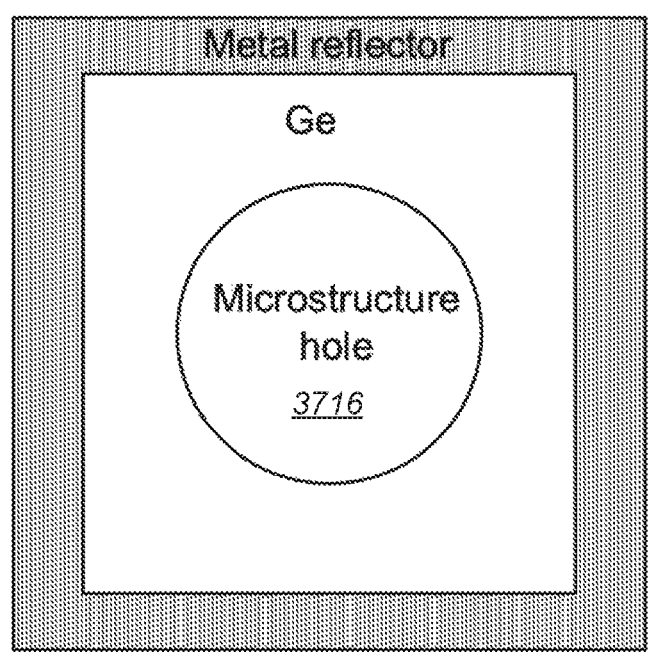

FIGS. 37B and 37C are simple partial cross section and top view schematic diagrams of a back side illuminated (BSI) Ge on Si single hole pixel CMOS image sensor, according to some embodiments. The ASICs are formed on the device layer of 20 nm Si, a BOX layer of 20 nm, a handle layer of 3000 nm Si which can I or low dope and 200 nm Ge grown epitaxially on the Si handle layer, which in some cases can be selective area growth to reduce wafer bending due to stress. In addition, metal reflectors clad this pixel with a single hole as shown, and in some cases a dielectric layer between the metal layer and the Si/Ge layer can be included to avoid any electrical shorting. The metal layer can be Al, Cu, Pt, Ni to name a few, and can have a layer thickness ranging from 30 nm to 300 nm for example. The microstructure hole 3714 is a cylindrical hole with a diameter of 770 nm, with a depth of 600 nm, and is filled with Si dioxide; in addition with a Si dioxide layer of 1000 nm is over the pixel. In some cases, the microstructure hole can be an inverted pyramid, and in some cases the microstructure hole can be a funnel shape, and in some cases the microstructure hole can be circular, oval, clover, polygonal, irregular, amoebic to name a few. For BSI CMOS imager light impinges on the handle layer surface where the microstructure hole 3714 is formed. See reference Xu et al, Backside-Illuminated Lateral PIN Photodiode for CMOS Image Sensor on SOS Substrate, IEEE Transactions on Electron Devices, Vol 52, No. 6, June 2005, showing PIN structures. Other structures and doping profiles can be considered for BSICIS for example reference Murari et al, Which Photodiode to Use: A Comparison of CMOS-Compatible Structures, IEEE Sensors Journal, Vol 9, No, 7 Jul. 2009; in some cases the BSICIS can be stacked as in reference Sukegawa A ¼-inch 8 Mpixel Back-Illuminated Stacked CMOS Image Sensor, IEEE International Solid-State Circuits Conference 2013 (hereinafter "Sukegawa"). In the reference Sukegawa the pixel sensors are fabricated on a separate wafer than the logic process wafer as in their FIG. 27.4.1. According to some embodiments of the present disclosure, back side illuminated CMOS image sensors can be monolithically integrated with the logic/ASIC electronics on an SOI wafer. In some cases as in Sukegawa, the pixel sensors and the logic/ASIC electronics can be fabricated on separate wafers and then bonded together or stacked together to form the completed pixel sensor with logic/ASIC electronics. According to some embodiments, the pixel sensors can comprise of PD or APD or SPAD and can be used for 3D imaging using either indirect time-of-flight (IToF) where the optical waves from a single or multiple wavelength are continuous or direct time-of-flight (DToF) where the optical light is from a pulsed laser source. In all the disclosed structures the CMOS image sensor can be either monolithic integrated or stacked as discussed in Sukegawa.

FIG. 37C is a partial simple schematic of the top view of a single pixel with a microstructure hole. The pixel size is 1400 nm×1400 nm and is clad by a metal reflector. In FIG. 37C a single pixel is shown, however for a CMOS image sensor, millions of pixels can be used to form the image sensor. With an addition of Ge and/or GeSi the wavelength can be extended to 2000 nm and in some cases to 2200 nm. A single hole pixel is shown and, in some cases, multiple holes can be used to enhance the absorption of incoming light. Not shown are PN junctions that can be formed either in parallel or vertical structures, and in some cases guard rings can be included for SPAD and APD operation. Also not shown are passivation, planarization, connecting electrodes to the P and N region and to the CMOS electronics. In some cases, the photosensor can be operated in a photoconductor mode with P and P or N and N contacts, and can operate in either forward or reverse bias. And in some cases, the photosensor can operate in a phototransistor mode where P and P or N and N can form the source and drain contacts and the incoming light acts as a photogate. In the case of PN, PIN, PIPN junctions a reverse bias is applied between the P and the N junctions with reverse bias voltages ranging from 0.1 to 3.3 volts, and in some cases for APD and SPAD the voltages can range from 5 volts to 15 volts, and in some cases to 35 volts. See reference Coudrain et al, Setting up 3D Sequential Integration for Back-Illuminated CMOS Image Sensors with Highly Miniaturized Pixels with low temperature Fully Depleted SOI transistors, IEEE International Electron Devices Meeting, 2008 Fontaine, The State-of-the-Art of Mainstream CMOS Image Sensors, https://pdfs.semanticscholar.org/0c5f/fc366be696cdc44f5774c32dceb 00801a0a4.pdf shows examples of CMOS image sensors of different configurations without the use of microstructure holes for enhancing NIR wavelengths. With the addition of microstructure hole/holes the NIR sensitivity can be significantly improved at certain wavelengths.

In some cases with multiple doping regions to form NPN, PNP, NIN, PIP to name a few the microstructure hole or holes photodetector/sensor can operate in a phototransistor mode and in some cases a photogating mode as discussed in Fang et al, Photogating in Low Dimensional Photodetectors, Advanced Science, DOI: 10.1002/advs.201700323. Photogating can be used in microstructure hole photodetectors/sensors that can comprise of one or more of the following materials, Si, Ge, Si alloy, Ge alloy, quantum dots to name a few for high sensitivity, high speed and in some cases to extend the wavelength to 2000 nm.

Figure 37D:
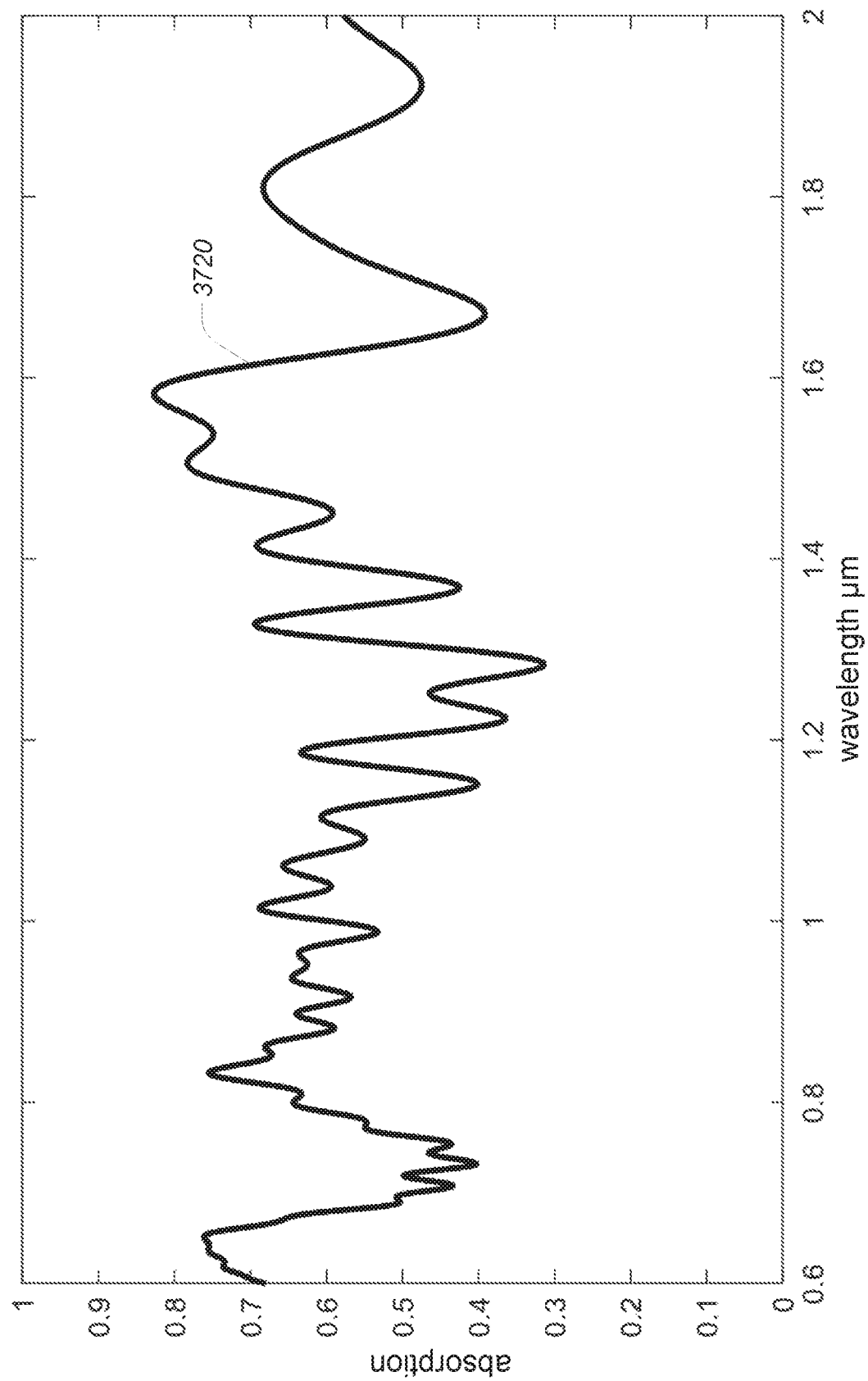
FIGS. 37D and 37E are plots of FDTD simulations of the optical field in single hole pixel for a structure shown in FIG. 37A, according to some embodiments.
Figure 37E:
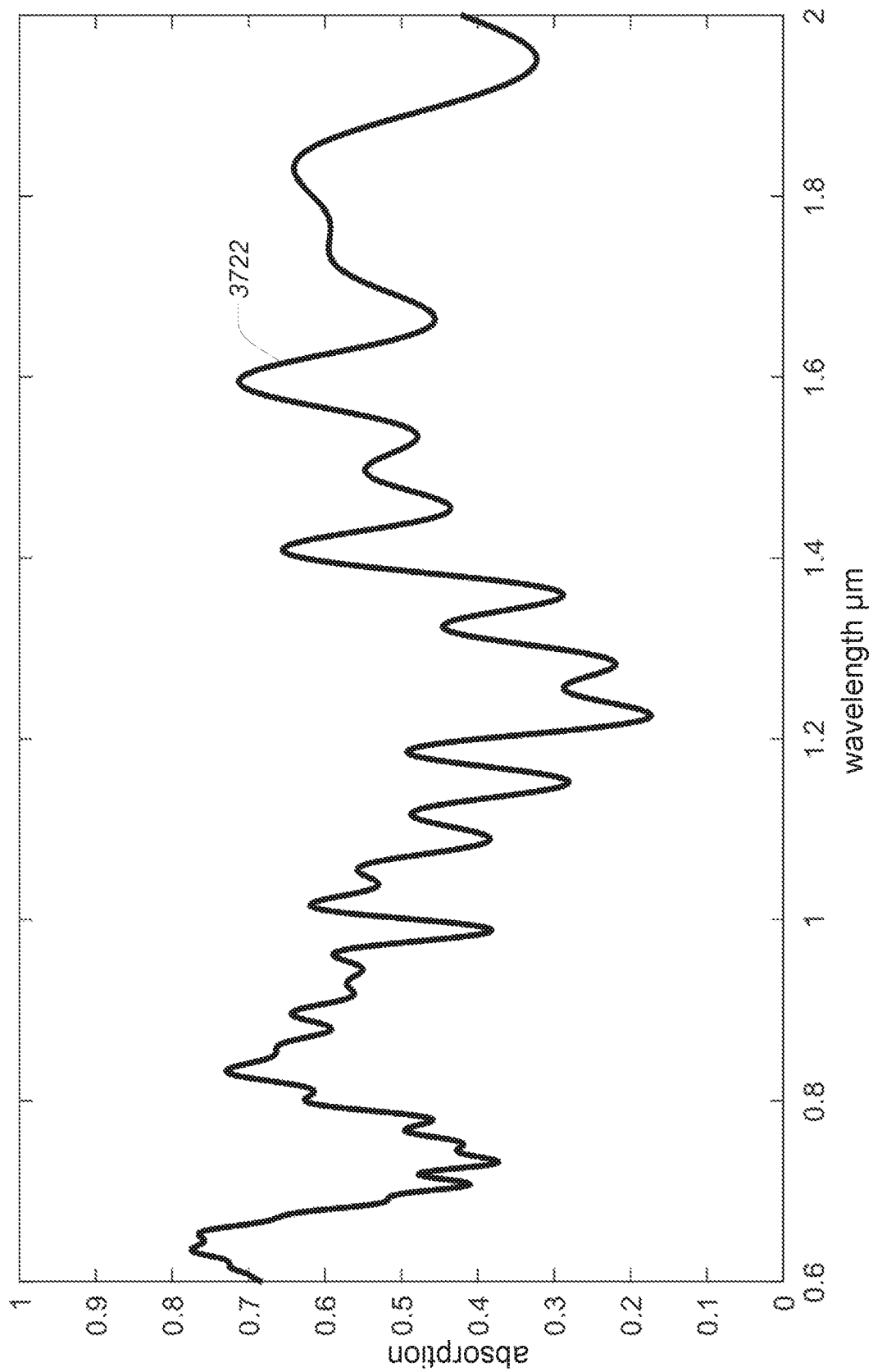

FIGS. 37D and 37E are plots of FDTD simulations of the optical field in single hole pixel for a structure shown in FIG. 37A, according to some embodiments. In FIG. 37D metal cladding is provided around the pixel. The vertical axis is absorption and the horizontal axis is wavelength. The absorption which is proportional to EQE if all the photo-generated carriers are collected and converted to electrical current can have an EQE of 30% or more over a wavelength range of 600-2000 nm, and in some cases the EQE can be 30% or more at certain wavelengths in the range of 600-2000 nm. As can be seen from curve 3720, absorption or EQE can be 60% or more at certain wavelengths in the range of 600-2000 nm.

FIG. 37E is a plot of a FDTD simulation of a structure given in 37A but without metal cladding for the absorption vs wavelength. As can be seen from curve 3722, the absorption and/or EQE can be lower for such structures without metal cladding at certain wavelengths in the range of 600-2000 nm. Pixels with 1 or more microstructure holes can have an EQE greater than a comparable pixel without microstructure holes at certain wavelengths in the range of 600-2000 nm.

Figure 38A:
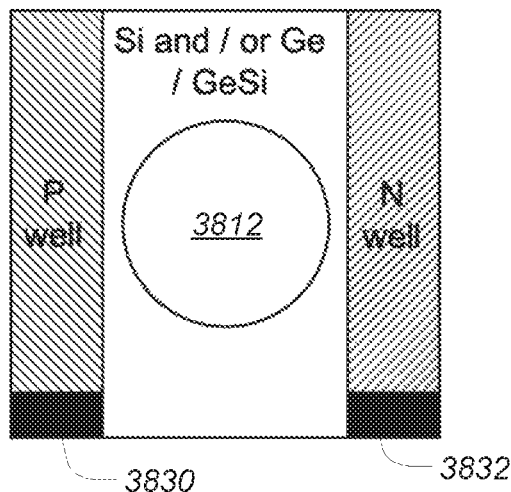
FIGS. 38A and 38B are simple partial top view diagrams a single pixel with a lateral PIN structure, according to some embodiments.
Figure 38B:
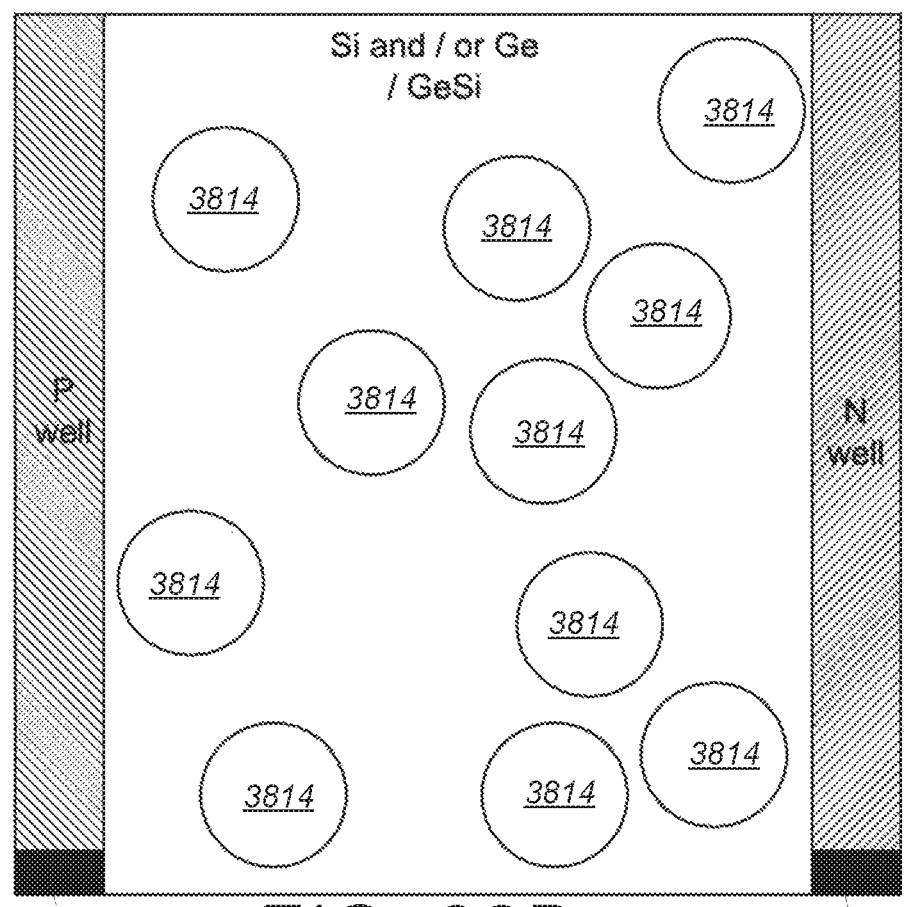

FIGS. 38A and 38B are simple partial top view diagrams a single pixel with a lateral PIN structure, according to some embodiments. In FIG. 38A, single pixel has a single microstructure hole 3812. Electrodes 3830 and 3832 can be formed on the P and N regions, respectively, and can be connected to the CMOS/BiCMOS electronics (not shown). Multiple pixels can be formed with isolation trenches between them. The density of pixels can range from 100× 100 to 1000×1000 to 10,000×10,000 and in some cases greater than 10,000×10,000.

FIG. 38B is a simple partial schematic of the top view of a pixel with multiple microstructure holes 3814 which can be arranged in an aperiodic and/or random manner with a lateral PIN structure, and in some cases can be on Si, and in some cases can be on Ge/GeSi. The electrodes 3830 and 3832 can be connected to the CMOS/BiCMOS ASICs and the pixels with multiple microstructure holes and pixels with single microstructure hole can be formed in a single array. The array sizes can range from 1000×1000 to 10,000×10, 000 or more, and in some cases the array size can range from 100×100 to 1000×1000.

A reverse bias is applied between the P and N junction with a bias voltage ranging from 0.1 volts to 3.3 volts, and in some cases greater than 3.3 volts, and in some cases 3.3 volts-15 volts, and in some cases 3.3 volts to 35 volts.

The pixel can operate in a photodiode mode and/or avalanche photodiode mode and/or a single photon avalanche photodiode mode. Wavelength can range from 400 to-1100 nm for Si, and 400-2200 nm for Ge/GeSi.

EQE can be 50% or greater at certain wavelengths, and in some cases 60% or greater at certain wavelengths, and in some cases 80% or greater at certain wavelengths.

Figure 39:
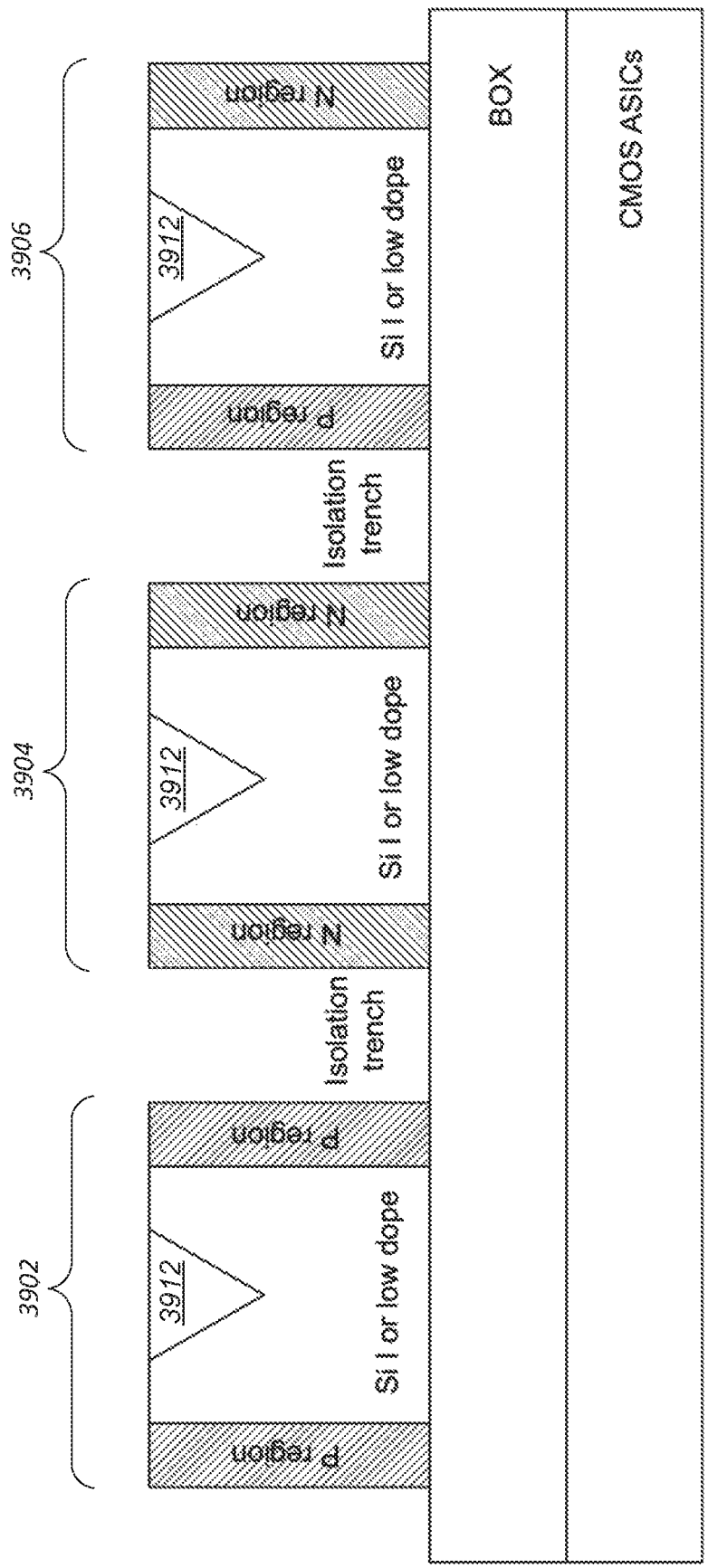
FIG. 39 is a simple partial cross section of photosensors with lateral junctions, according to some embodiments.

FIG. 39 is a simple partial cross section of photosensors with lateral junctions, according to some embodiments. The photosensors have a single microstructure hole 3912, and in some cases can have multiple microstructure holes. The photosensor can be pixels in a back illuminated CMOS image sensor, and in some cases can be a front illuminated CMOS image sensor. The photosensor can be used for imaging in the visible and the IR to 1100 nm wavelength, and in some cases can be used in time-of-flight applications such as 3D imaging for facial recognition and/or for LiDAR applications and in some cases for gesture recognition to name a few. The photosensor can also be used for optical data communication with data rates ranging from 1 Gb/s-100 Gb/s or more.

Three cases are shown in FIG. 39 of lateral junctions. Case 3902 shows a lateral PIP or PNP junction. Case 3904 shows a lateral NPN or NIN junction. Case 3906 shows a lateral PIN junction. A back illuminated CMOS image sensor is shown where the Photosensors or pixels are formed on a handle layer of crystalline Si that is I or low dope P or N of a SOI wafer. CMOS ASICs are formed on the device layer. The handle layer can have a thickness ranging from 300 nm to 3000 nm, and in some cases 500 nm-1000 nm. In case 3902 a single microstructure hole 3912 is shown on a single pixel where the microstructure hole is an inverted pyramid, and in some cases can be a cylindrical hole, and in some cases can be an irregularly shaped hole, and in some cases multiple microstructure holes can be formed on a single pixel where the holes can have different lateral dimensions and cross sectional shapes, and can be regularly or irregularly shaped holes. P dopants are formed on the walls by ion implantation or ion diffusion such that a PIP structure is formed. Case 3904 is similar to case 3902 with the exception of NIN lateral junction, and case 3906 has a PIN lateral junction. Not shown are electrical contacts to the P and N regions, and a bias voltage can be applied to the P region in the PIP structure, to the N region in the NIN structure, and to the P and N region in the PIN structure.

In the cases 3902 and 3904, the structures can be operated in a photoconductor mode, and in some cases in a phototransistor mode. See for example reference Geis et. al, Silicon waveguide infrared photodiodes with >35 GHz bandwidth and phototransistors with 50 AW$^{-1}$ response, Optics Express Vol. 17, No. 7 30 Mar. 2009, where the pixels can operate in a phototransistor mode. Case 3906 can be reverse biased and the change in the voltage and/or photocurrent can be amplified by electronics in the CMOS ASICs. Not shown are electrodes connecting to the CMOS ASICs, passivation layers, micro-lenses, to name a few, necessary to complete a CMOS image sensor.

In case 3902, the photosensor can operate as a PNP phototransistor and where photons generating electron hole pairs in the low dope N region can modulate the base of the phototransistor. In case 3904 the photosensor can operate as a NPN phototransistor where photons that generate electron hole pairs in the N region can modulate the base of the phototransistor.

Figure 40:
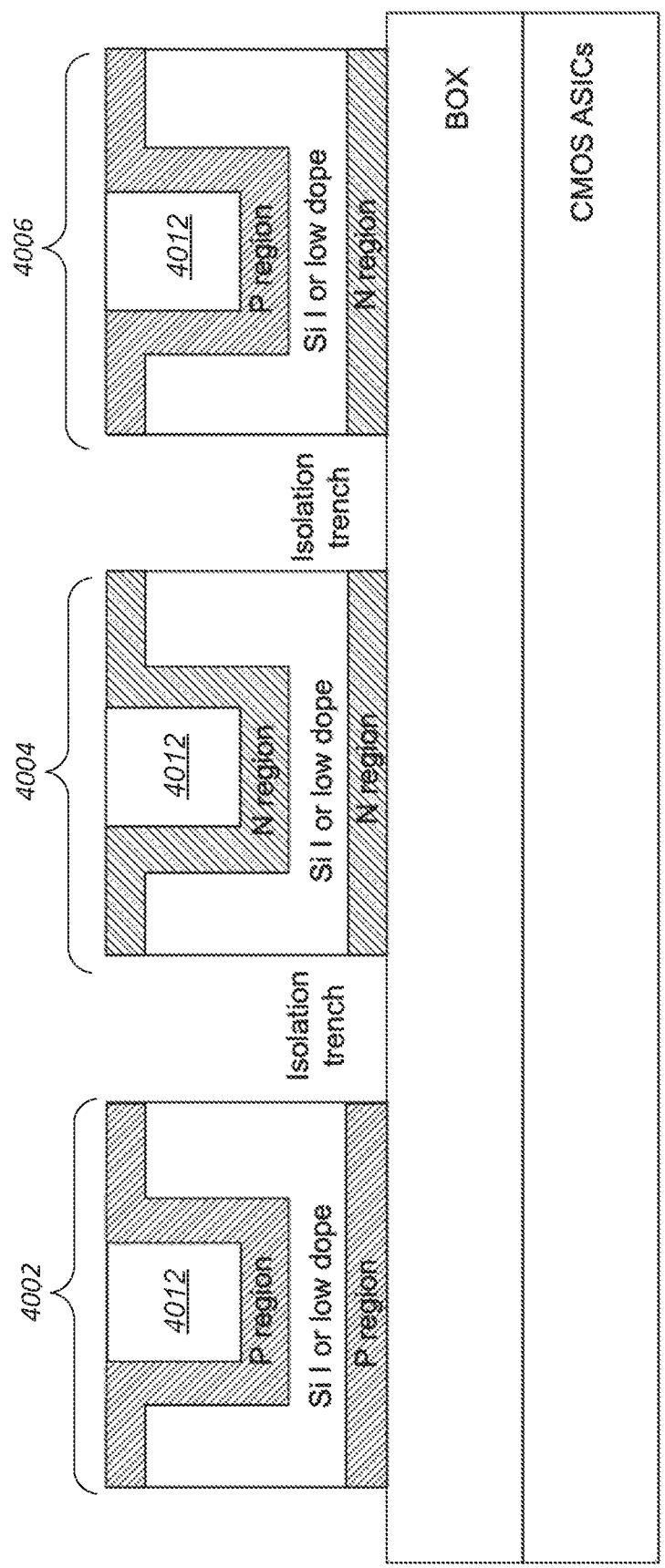
FIG. 40 is a simple partial cross section schematic of 3 different cases of vertical junctions in a back illuminated CMOS image sensor, according to some embodiments.

FIG. 40 is a simple partial cross section schematic of 3 different cases of vertical junctions in a back illuminated CMOS image sensor, according to some embodiments. FIG. 40 is similar to FIG. 39 with the exception that the PIP, NIN, PIN junctions are configured in a vertical manner. A single cylindrical microstructure hole 4012 can be dry etched into Si handle layer which is I or low dope P or N. In case 4002 the microstructure hole 4012 sits within the P dopant, and a P dopant is also at the bottom of the pixel. A single microstructure hole is shown in a pixel, and in some cases multiple microstructure holes that can have the same or different dimension or shapes can be within a pixel. Case 4004 is similar to case 4002 with the exception that it's a NIN vertical structure, and case 4006 is a PIN vertical structure.

In the simple partial schematic cross section depiction of FIG. 40, rectangular or triangular shapes are used for the pixel, the microstructure holes, the doped region, connecting electrodes to name a few, whereas in actuality the shapes of such regions can be more complex. For example, surface roughness, not exactly vertical sidewalls, and diffusion of dopant ions in the P and N regions can result in a more curvy boundaries of the doped region due to diffusion of the dopant ions caused by thermal annealing and/or growth/process temperatures during CMOS ASIC manufacturing. In addition, regions that are ion implanted can have an implantation tail of the dopants, and in some cases after thermal annealing the dopant can move to interfaces causing further dopant redistribution that are not depicted in these simple schematic drawings.

The photosensor/pixel with microstructure holes can enhance the EQE of in the wavelength range of 600-1100 nm, in addition for Time-of-Flight applications such as 3D imaging, virtual reality, augmented reality, facial recognition, gesturing, robotics, machine vision to name a few, due to the thin layer of Si with layer thickness ranging from 20 nm to 3000 nm, and in some cases 200 nm-3000 nm, the jitter time or rise time responding to impulses of light can be in the picosecond range and in some cases 10s of picosecond range resulting in a depth resolution of millimeters, and in some cases sub-millimeter range.

As in case 3902 and 3904 of FIG. 39, case 4002 and 4004 of FIG. 40 can operate in a photoconductor and/or phototransistor mode, where the optical signal can change the conductivity of the I or low dope region. Not shown are the electrodes connecting the P regions in the PIP structure to the CMOS ASICs, and the electrodes connecting the N regions in the NIN structure, and the electrodes connecting the P and N regions in the PIN structure to the CMOS ASICs.

According to some embodiments, an image sensor can have a PIP and/or NIN and/or PIN junctions, and can operate in either photoconductor and/or phototransistor and/or reverse bias mode. In the case of PIN or PN junctions the Photosensor can operate in PD and/or APD and/or SPAD mode with reverse biases ranging from 0.1 volt to 35 volts, and in some cases 1 volt-12 volts.

The wavelength range for these Photosensors can range from 400 to 1100 nm, and the EQE of such microstructure hole Photosensors can be greater than the EQE of a comparable Photosensor without microstructure hole/s at certain wavelengths.

The Photosensors in FIG. 39 and FIG. 40 can be used for CMOS image sensors of 100,000-10 million or more pixels, and in some cases for 3D image sensors with pixel density ranging from 100,000-10 million or more, and in some cases for LiDAR applications with pixel density ranging from 1000 to 10 million or more, in some cases for data centers where the Photosensor density can range from 10 to 1000 or more, and where data rates can range from 1 Gb/s to 100 Gb/s or more, and in some cases 56-112 Gb/s.

In the case of PIP or PNP and NIN or NPN the P or N can be a source and drain and the I or N or P can be the base of a phototransistor. In the case of PIN or PN or PIPN the pixel can operate in a reverse bias.

Other doping profiles can be used for either the phototransistor pixel or the photodiode pixel which can also operate in an APD or SPAD mode. Not shown are guard rings that can be included. Also not shown are connecting electrodes, ohmic contacts, passivation, planarization layers, reflectors on the side of the pixel to name a few. See reference Ghandiparsi et al, High-Speed High-Efficiency Photon-Trapping Broadband Silicon PIN Photodiodes for Short-Reach Optical Interconnects in Data Centers, IEEE Journal of Lightwave Technology, 2019 for an example of a high speed silicon microstructure hole PD with PIN or PN junctions that can be monolithically integrated with CMOS ASICs for data center applications.

Lateral and vertical PN, PIN, PIPN, NPN, PNP, NIN, PIP structures to name a few can be implemented both in monolithic and/or stacked technologies and in addition can be implemented with composite holes.

Figure 41E:
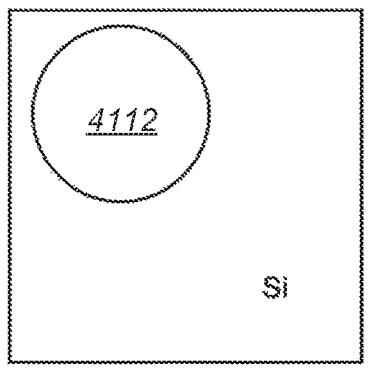
Figure 41F:
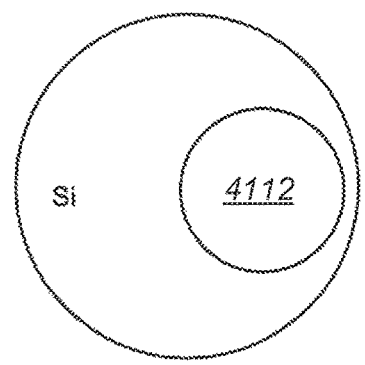
Figure 41G:
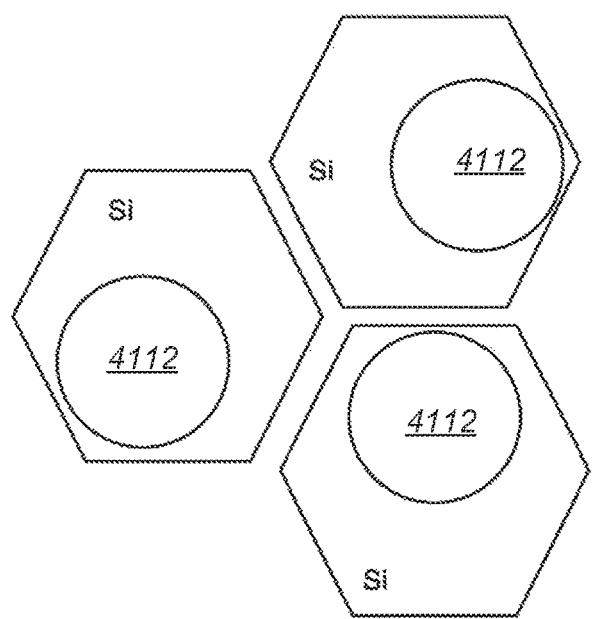
Figure 41H:
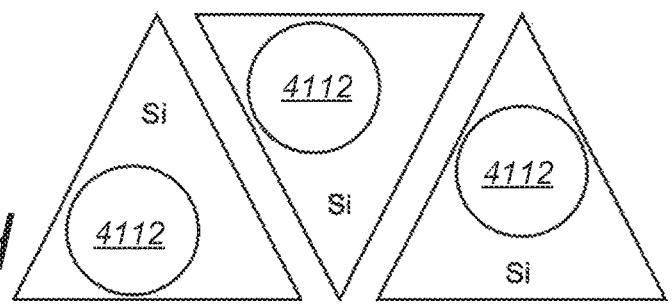

FIGS. 41A to 41H are simple partial schematic top views of single hole pixels with different shape pixels from square to circular to hexagonal and triangular to name a few. FIG. 41A shows a square pixel with a single microstructure hole 4112. FIG. 41B shows a circular pixel with a single microstructure hole 4112. FIG. 41C shows hexagonal pixels, each with a single microstructure hole 4112 that can form a honeycomb arranged image sensor. FIG. 41D shows triangular pixels, each with a single microstructure hole 4112.

FIGS. 41E, 41F, 41G and 41H are similar to FIGS. 41A, 41B, 41C and 41D, respectively with the exception that the microstructure holes are shown to be off center. Circular holes are shown in FIGS. 41A-41H, however the holes can be non-circular, polygonal, clover, irregular, amoebic, combination of various geometric shapes and the hole shapes and lateral dimensions can vary for different pixels to optimize the EQE at certain wavelengths. For example, pixels for detecting red light can have microstructure holes with different dimensions, and the number of microstructure holes can be one or multiple microstructure holes, and for pixels for detecting NIR wavelength such as 905, 940, 980 nm the microstructure hole can have a different dimension and shape for each of those wavelengths to optimize the EQE at that certain wavelength range.

Figure 42A:
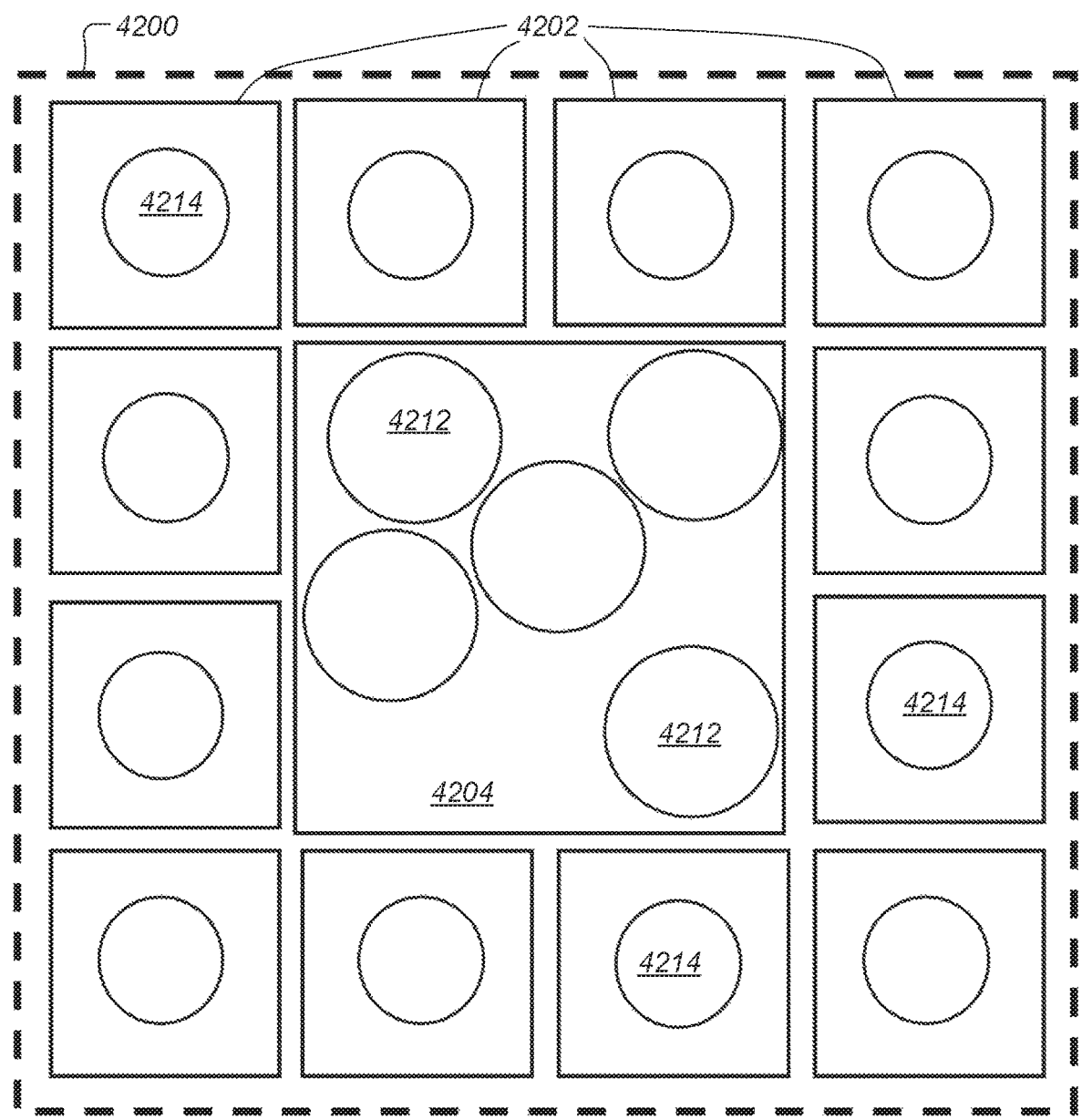
FIGS. 42A and 42B are simple partial schematic of a top views of multiple pixels with different lateral dimensions and different size microstructure holes, according to some embodiments.
Figure 42B:
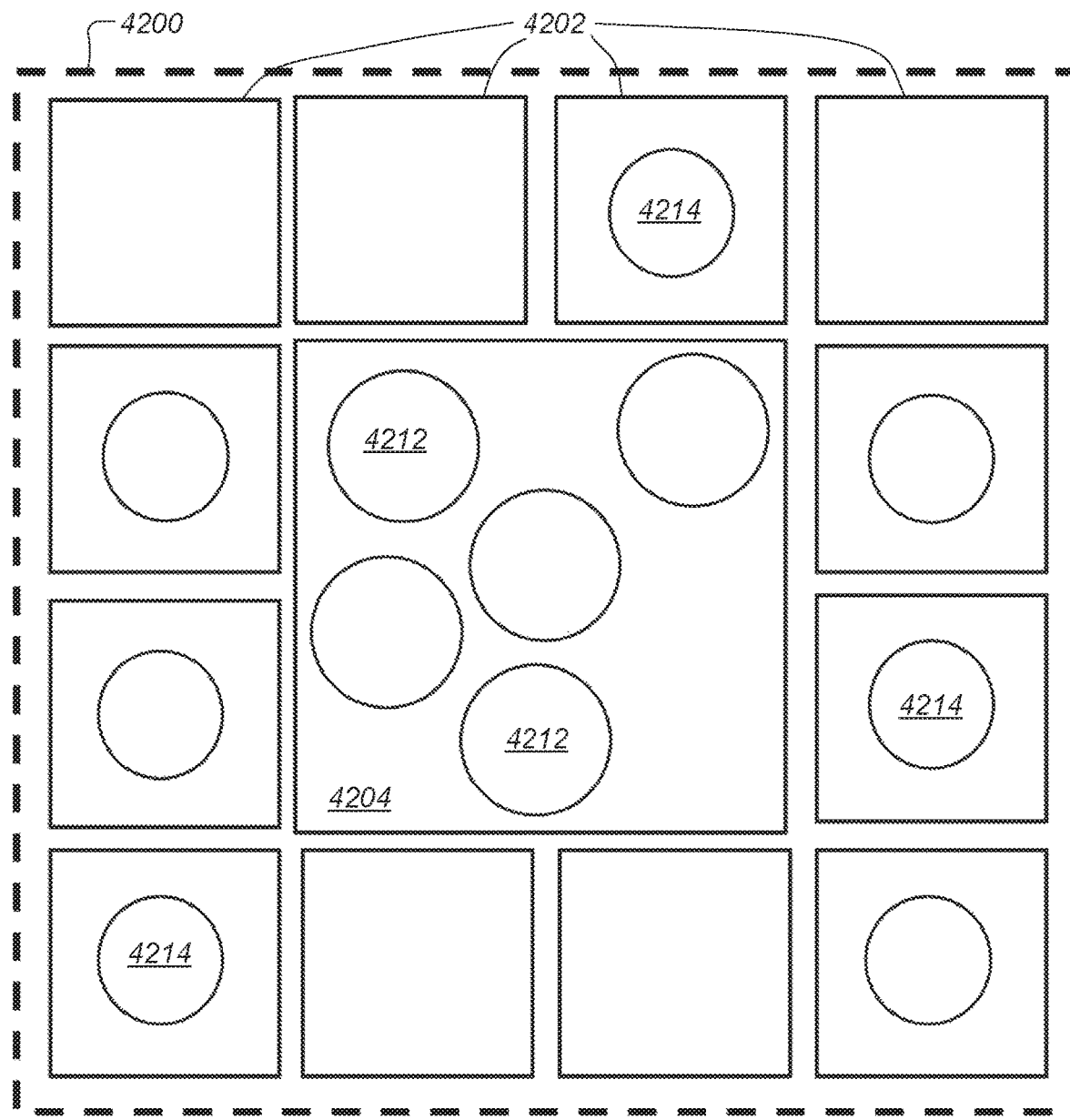

FIGS. 42A and 42B are simple partial schematics of a top views of multiple pixels with different lateral dimensions and different size microstructure holes, according to some embodiments. In FIG. 42A, a larger pixel 4204 can be used in conjunction with smaller pixels 4202 where the larger pixel 4204 can have multiple microstructure holes 4212 that can be arranged periodically, aperiodic and/or random, and with larger microstructure holes optimized for NIR (Near infrared) wavelengths. The smaller pixels 4202 with single microstructure hole 4214 can be optimized for detection in the red wavelength, and in some cases the blue and green wavelength. This set of pixels is one example of different pixel sizes and hole shapes, and can be repeated to form a CMOS image sensor.

FIG. 42B is similar to FIG. 42A with the exception that certain pixels may not need microstructure holes such as for the blue and green wavelengths. Different size pixels can be used in CMOS imaging, Time-of-Flight imaging, such as 3D imaging, LiDAR, gesturing, machine vision to name a few.

Another advantage is that CMOS imagers with different pixel sizes can capture both visible images and NIR images at high resolution simultaneously. The number, density and placement of the large and small pixels can be arranged to optimize image quality for example. The microstructure hole shown are circular, however non-circular, irregular, off centered, centered, periodic, aperiodic, and random microstructure holes may be used.

In some cases, the BOX layer may not be necessary for FSI (front side illuminated) CMOS image sensors, and where the CMOS ASICs and the FSI sensors are formed on the same surface, that in some cases can include a Ge/GeSi layer.

In some cases for CMOS image sensors that include 3D sensing, Time-of-Flight applications, LiDAR, the sensors can be formed on the device layer of a SOI wafer, and in some cases can be formed on the handle layer of a SOI wafer, and in some cases can be formed on both the front side and back side of a SOI wafer for both FSI and BSI capable image sensor. In this case the FSI can be optimized for visible, and the BSI can be optimized for NIR wavelengths for example. Light can impinge on the front side, and the infrared light can propagate through the front side and to the pixels formed on the back side. In some cases, light can impinge simultaneously on the front and back. In some cases, a wavelength selector element can be used such that only NIR wavelength impinge on the back for a BSI and visible light impinge on the front side for FSI.

Figure 42C:
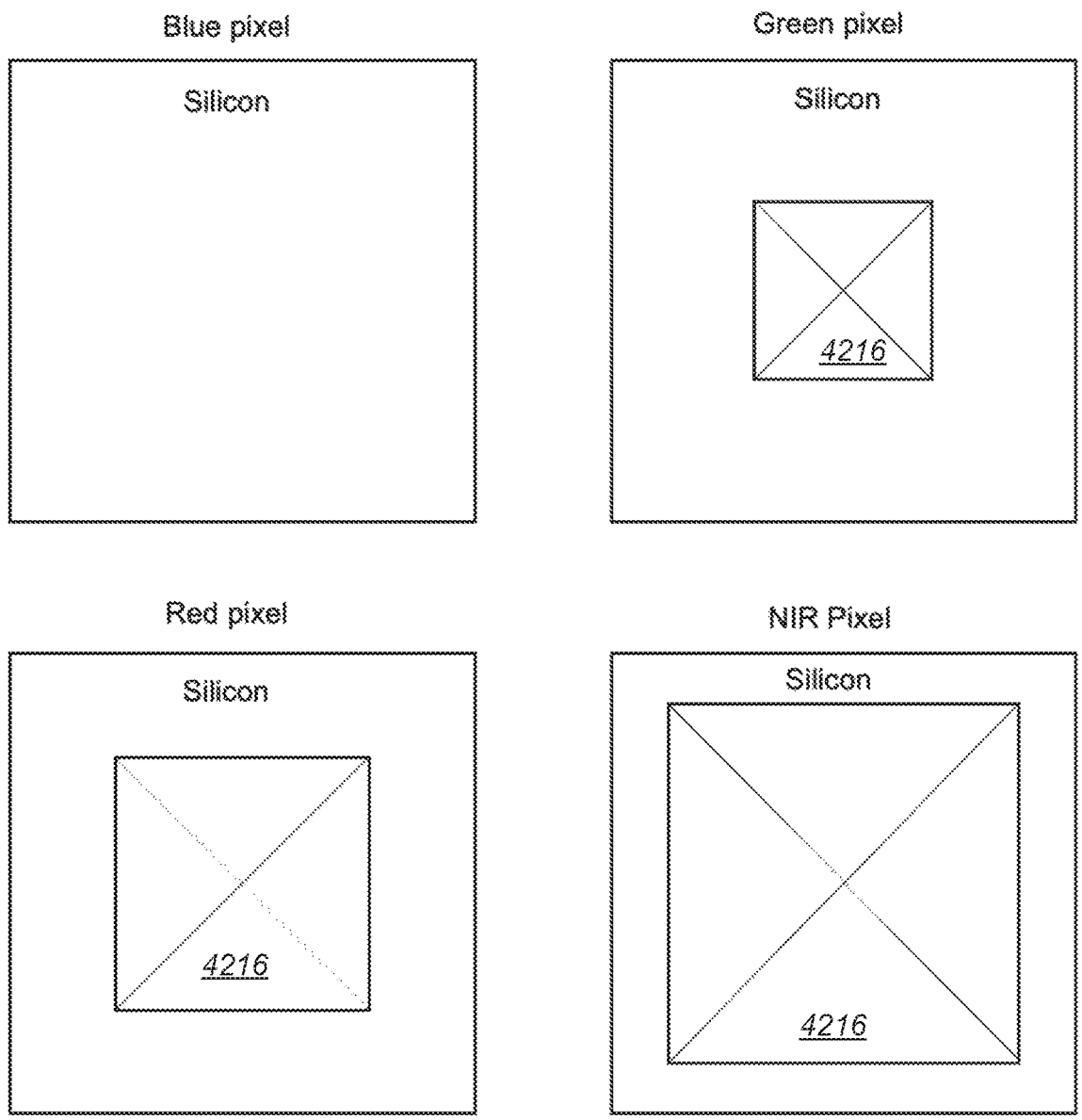
FIGS. 42C and 42D are simple partial schematic of the top views of small pixel arrangements, according to some embodiments.
Figure 42D:
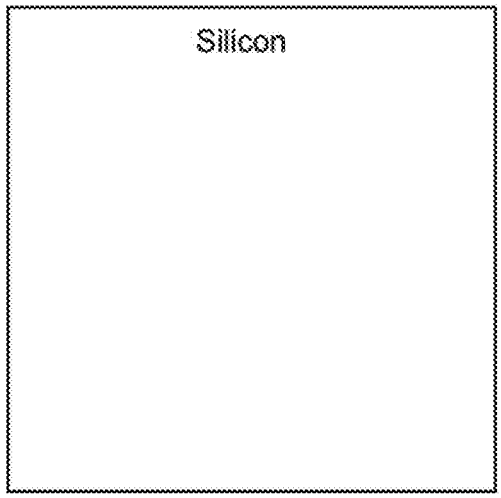
Figure 42D:
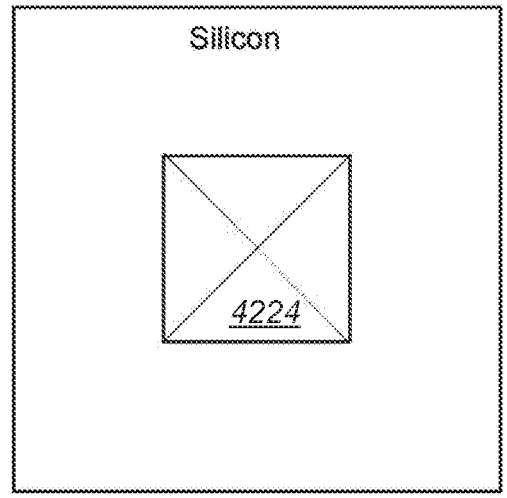
Figure 42D:
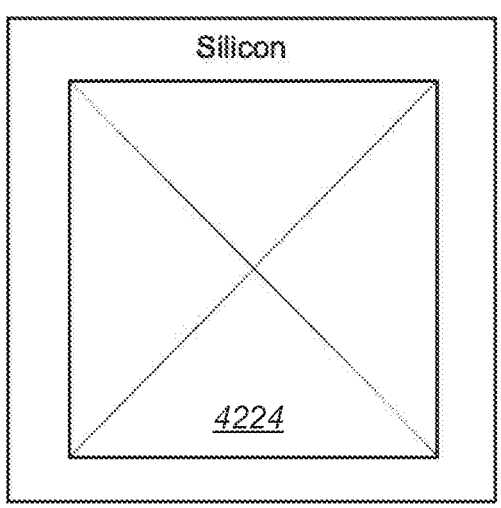
Figure 42D:
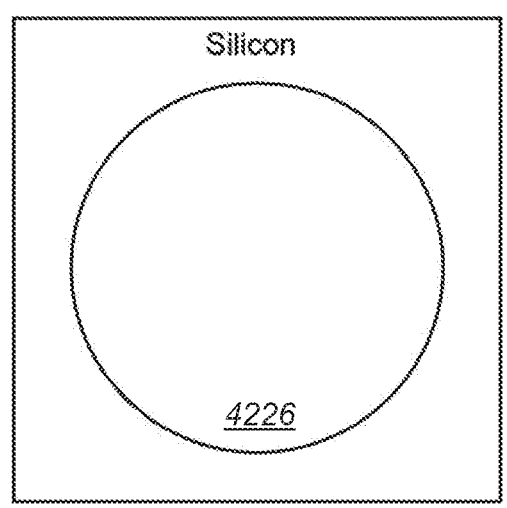

FIGS. 42C and 42D are simple partial schematics of the top views of small pixel arrangements, according to some embodiments. In FIG. 42C, the small pixels shown can have dimensions of approximately 1 micron×1 micron and in some cases with lateral dimensions of 0.8 micron-1.2 micron. Shown are red, green, blue pixels and a near infrared wavelength pixel for wavelength ranging from 800 nm to 1000 nm for example. The pixels can have a silicon thickness of approximately 3 microns, and in some cases less than 3 microns. For the case of 3 micron thick silicon, the blue pixel can be a flat structure without any microholes, however for thinner silicon microholes may be used to increase absorption. For the green pixel an inverted pyramid microhole can be etched into the silicon with lateral dimensions ranging from 500 nm to 600 nm for example. For the red pixel the inverted pyramid can have a lateral dimension of 600 nm-800 nm for example, and for the near infrared the inverted pyramid can have a lateral dimension ranging from 700 nm to 900 nm for example. Other dimensions for the inverted pyramid may be possible depending on the dielectric that fills the inverted pyramids. The inverted pyramids are often filled with Si dioxide in a CMOS (complementary metal oxide semiconductor) process, and the surfaces are often passivated with Si dioxide. These pixels are often used for back side image CMOS Photosensors for red, green, blue and near infrared applications in silicon.

Inverted pyramid microstructure holes 4216 are shown; however other microholes such as cylindrical, or conical can be used also.

FIG. 42D similar to FIG. 42C shows a simple partial schematic of the top view of small pixels of approximately 1 micron×1 micron in dimension where some pixels may not need a microstructure hole or microhole or holes for example such as the blue pixel where the absorption is strong and where other pixels can have a microhole or holes to help enhance the absorption such as the green and red pixels for example, and the near infrared pixels can also have a microhole or holes. In addition, as shown in this figure the microhole can be of different shapes for example inverted pyramids (holes 4224) or different dimensions and cylindrical hole for example (hole 4226). Other microhole shapes can also be implemented such as hexagonal, cross, rectangular, oval, amoebic to name a few. In addition, the microhole can be a composite microhole where multiple nanoholes can be etched in place of a single large microhole as discussed in this patent specification.

For Si layer thickness thinner than 3 microns a microhole may be used for all pixels including the blue pixel to enhance absorption and therefore the sensitivity or EQE. The cross section of the microhole can have a slope such as the inverted pyramids, and in some cases the slope can be formed in dry etching to form a funnel or conical shape hole, and in some cases the microhole can be cylindrical with vertical sidewalls.

FIGS. 42E, 42F, 42G and 42H are partial simple top view schematics of Bayer Red, Green, Blue (RGB) pixel arrays, according to some embodiments. In FIG. 42E cylindrical microhole 4232 can be etched to enhance absorption at the RGB wavelength and also at near infrared (NIR) wavelengths from 700 to 1100 nm. The microhole 4232 can be of any shape or dimension and can be polygonal amoebic, combination of geometric shapes, and also the cross section of the microhole can be cylindrical, conical, and in some cases the sidewall of the microhole can be slanted with positive and/or negative slopes and can have multiple slopes. The depth of the microhole can range from ¼ the thickness of the Si and/or Ge, GeSi, Ge alloy on which the Photosensor is fabricated, and in some cases ½ the thickness, and in some cases ⅓ the thickness and in some cases through the entire thickness of the semiconductor material to the Si dioxide or dielectric layer. The lateral dimension of the microhole can be approximately a wavelength of the incident radiation and where the dimension can be adjusted by the refractive index constant n of the dielectric that fills the microhole for example wavelength/n. The microhole lateral dimension can range from 400 nm to 1000 nm and in some cases to 1200 nm. In addition, the microhole can be a composite microhole as discussed in this application. The pixel is a square pixel with lateral dimensions ranging from 600 nm to 2000 nm, and in some cases 800 nm-1200 nm.

FIG. 42F shows a Bayer array of RGB pixels each with a single inverted pyramid 4324. The pyramid lateral dimension can range from 400 nm to 1000 nm, and in some cases to 1200 nm. Microholes are formed in each of the blue, green, red pixels in the Bayer pattern array to enhance NIR sensitivities where as shown in reference Han et al, the red, green and blue filters allow transmission fully or partially of 850 nm wavelength and longer such that the RGB pixels can detect NIR wavelengths 800 nm-1100 nm simultaneously. In some cases to minimize optical cross talk it may be desirable to have the microhole only in some of the RGB pixels. For example a single microhole or a single composite microhole only in the blue pixel, and in some cases in the blue and green pixel, and in some cases in the blue and red pixel, and in some cases the microhole for the blue pixel and the red pixel can be different.

According to some embodiments, the microholes and inverted pyramids are filled with Si dioxide and can be planarized with color filters and microlenses can be provided as in reference Yokogawa et al, IR sensitivity enhancement of CMOS Image Sensor with diffractive light trapping pixels Scientific Reports DOI: 10.1038/s41598-017-04200-y and Han et al, Deep Trench Isolation and Inverted Pyramid Array Structures Used to Enhance Optical Efficiency of Photodiode in CMOS Image Sensor via Simulations, Sensors 2020, DOI: 10.3390/s20113062, and where inverted pyramid arrays are formed on the RGB pixel to enhance to RGB wavelength and 850 nm wavelength.

Isolation trenches can be formed between pixels to electrically isolate the pixels and to optically isolate the pixels to minimize crosstalk between adjacent pixels. In some cases, a metal shield as discussed in this patent specification and/or amorphous and/or poly Si or Ge and/or carbon can be included in the isolation trench to further optically isolate adjacent pixels to minimize crosstalk. In some cases, only certain pixels may need metal and/or amorphous semiconductor and/or carbon for optical isolation. In some cases, organic dye for example rhodamine-6G, crystal violet to name a few and/or other organic dyes can be used in the isolation trenches to partially absorb leakage radiation from the pixels to reduce crosstalk. The organic dyes can be combined with spin-on-glass (SOG) and/or other polymers can be used as a base. In addition, metal nano particles and/or amorphous carbon in a polymer or SOG base can be used in the isolation trench to partially absorb leakage radiation from the sidewall pixels to reduce crosstalk.

The Si layer on which the pixels or Photosensors are fabricated can have a layer thickness ranging from 0.1 to 6 microns and in some cases 1-3 microns. The pixel array can be fabricated on monolithic integrated technology where the pixel or Photosensors are monolithically integrated with CMOS ASICs in a single chip or can be fabricated using stacked technology where the pixel arrays or Photosensors are fabricated on a separate wafer and bonded with the CMOS ASICs wafer which is also fabricated on a separate wafer as described in FIG. 56.

FIGS. 42G and 42H are similar to FIGS. 42E and 42F, respectively, with the exception that only certain pixels have an absorbing enhancement microhole. FIG. 42G shows, for example, a cylindrical microhole 4242 in the Red pixel only. The microhole can be any shape and cross section for example the microhole can be rectangular, polygonal, amoebic, oval, to name a few, and can in addition be a composite microhole. In certain cases, the microhole can be at one or more of the RGB pixels. In some cases, the single microhole can be in the blue pixel to minimize optical cross talk, and to enhance the NIR sensitivity.

FIG. 42H shows, for example, an inverted pyramid 4246 in the Red pixel and a cylindrical microhole 4244 in the blue pixel. In some cases, only one microhole in the blue pixel in the Bayer pattern may be used. The selection of which RGB pixel gets a microhole for enhancing either the RGB wavelength or the NIR wavelength can be based on the reduction of optical cross talk and enhancement of sensitivity tradeoff. In this example the blue pixel has a cylindrical hole for enhancing the NIR wavelength and not so much for enhancing the blue wavelength since the blue wavelength at 400-450 nm wavelength is strongly absorbing in Si. A microhole such as an inverted pyramid can be used in the Red pixel to enhance its sensitivity, and in some cases also enhances the NIR sensitivity. The Si layer on which the pixel or Photosensors are fabricated can have a thickness of 3 microns or less. And in some cases, can have a thickness of 6 microns or less.

In some cases, a large inverted pyramid can be used in place of a cylindrical hole; for example the blue pixel can have a large inverted pyramid and the red pixel can also have a large inverted pyramid. The lateral dimension of the inverted pyramid can range from 400 to 1000 nm, and in some cases to 1200 nm, and in some cases the lateral dimension of the inverted pyramid can be adjusted for the optical wavelength in the medium; for example for Si dioxide filled microholes the lateral dimension of the inverted pyramid can be divided by 1.45 where 1.45 is the optical refractive index of Si dioxide.

Figure 42I:
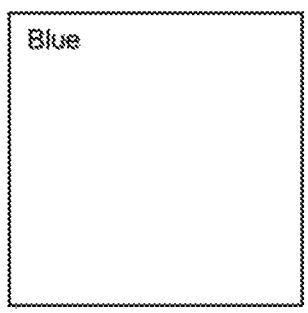
FIGS. 42I and 42J are simple top view diagrams showing a modified Bayer pattern where one or more pixels is dedicated to an NIR wavelength, according to some embodiments.
Figure 42I:
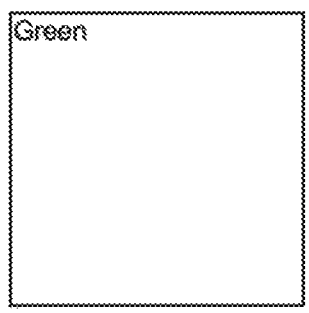
Figure 42I:
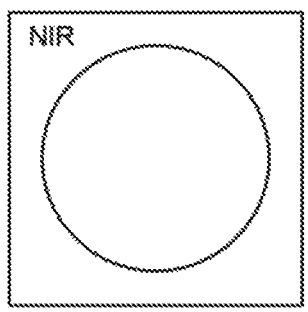
Figure 42I:
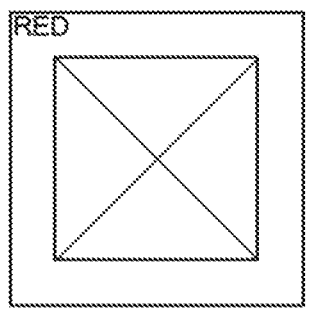
Figure 42J:
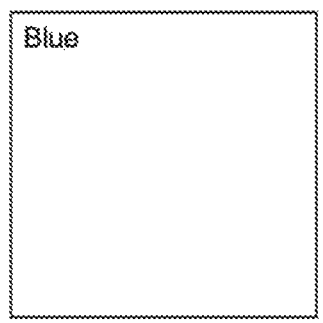
Figure 42J:
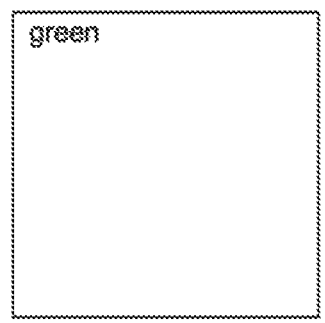
Figure 42J:
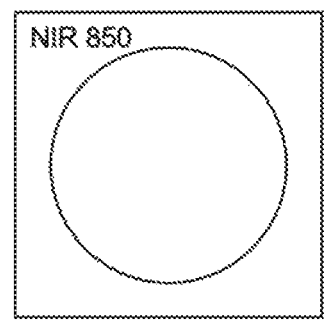
Figure 42J:
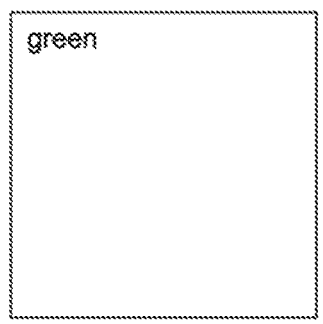
Figure 42J:
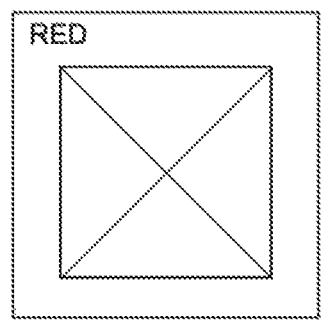
Figure 42J:
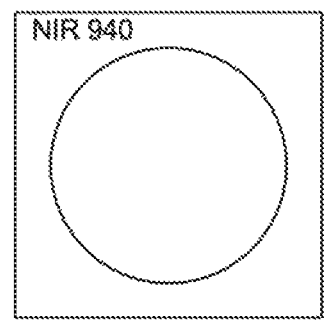

FIGS. 42I and 42J are simple top view diagrams showing a modified Bayer pattern where one or more pixels are dedicated to an NIR wavelength, according to some embodiments. The NIR pixels can be configured for wavelengths in the range from 700 to 1100 nm. FIG. 42I shows a dedicated pixel, for example one of the green pixels, configured as an NIR wavelength with corresponding NIR filter. FIG. 42J shows the addition of two extra pixels to the Bayer pattern where one pixel can be dedicated to 850 nm with its corresponding filter and another pixel can be dedicated to 940 nm with its corresponding filter. In some cases, RGB and NIR pixels can be arranged to form a 3×3 pixel array with a Bayer of modified Bayer pattern.

In some cases it may be beneficial that RGB and NIR wavelengths are detected by separate pixels so that in bright visible light a dim NIR image can still be recorded, for example in facial recognition applications in the sunlight dim 940 nm for example for casts a grid or a series of dots on the face can still be imaged by separate NIR pixels. This may require deviation from the Bayer pattern and NIR pixels can replace a green pixel for example or NIR pixels can be added together with a RGB pixel array, and one or more NIR pixels can be added together with additional Red and/or green, and/or blue pixels if needed.

In some cases CMOS image sensor chips for imaging, 3D imaging, and time-of-flight imaging can consist of a mixture of RGB Bayer pattern with or without microholes and a modified Bayer pattern where NIR pixel can be inserted in place of a green pixel, and in some cases where the modified Bayer pattern can consist of one or more NIR pixels at the same or different wavelengths together with Bayer RGB pattern array.

Figure 43A:
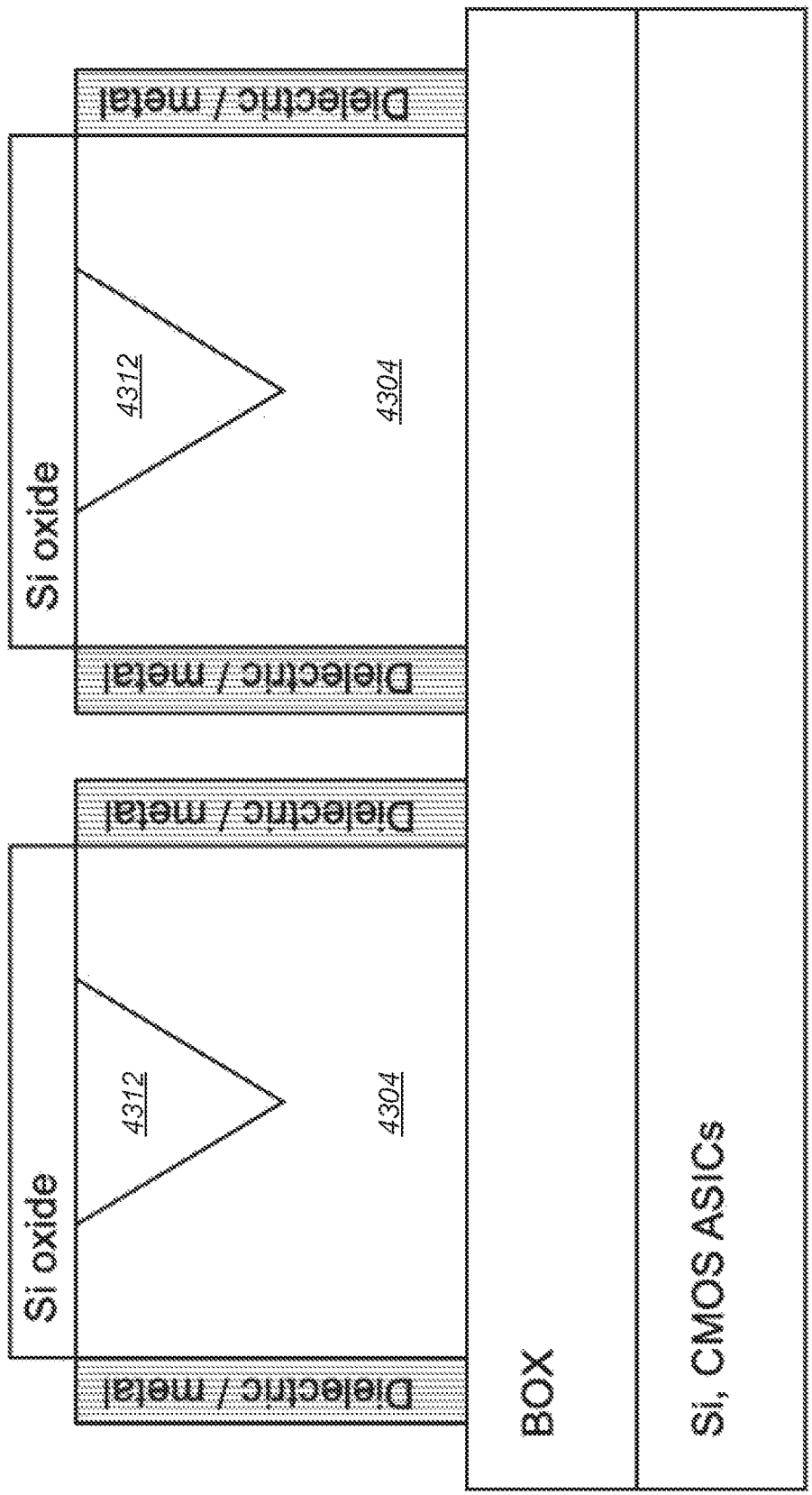
FIGS. 43A and 43B are a cross section diagram of a structure including Si pixels each with a single microstructure hole for a back illuminated sensor (BIS) fabricated on an SOI wafer, and a plot of an FDTD simulation of the optical absorption vs wavelength for such a single hole Si pixel, according to some embodiments.
Figure 43B:
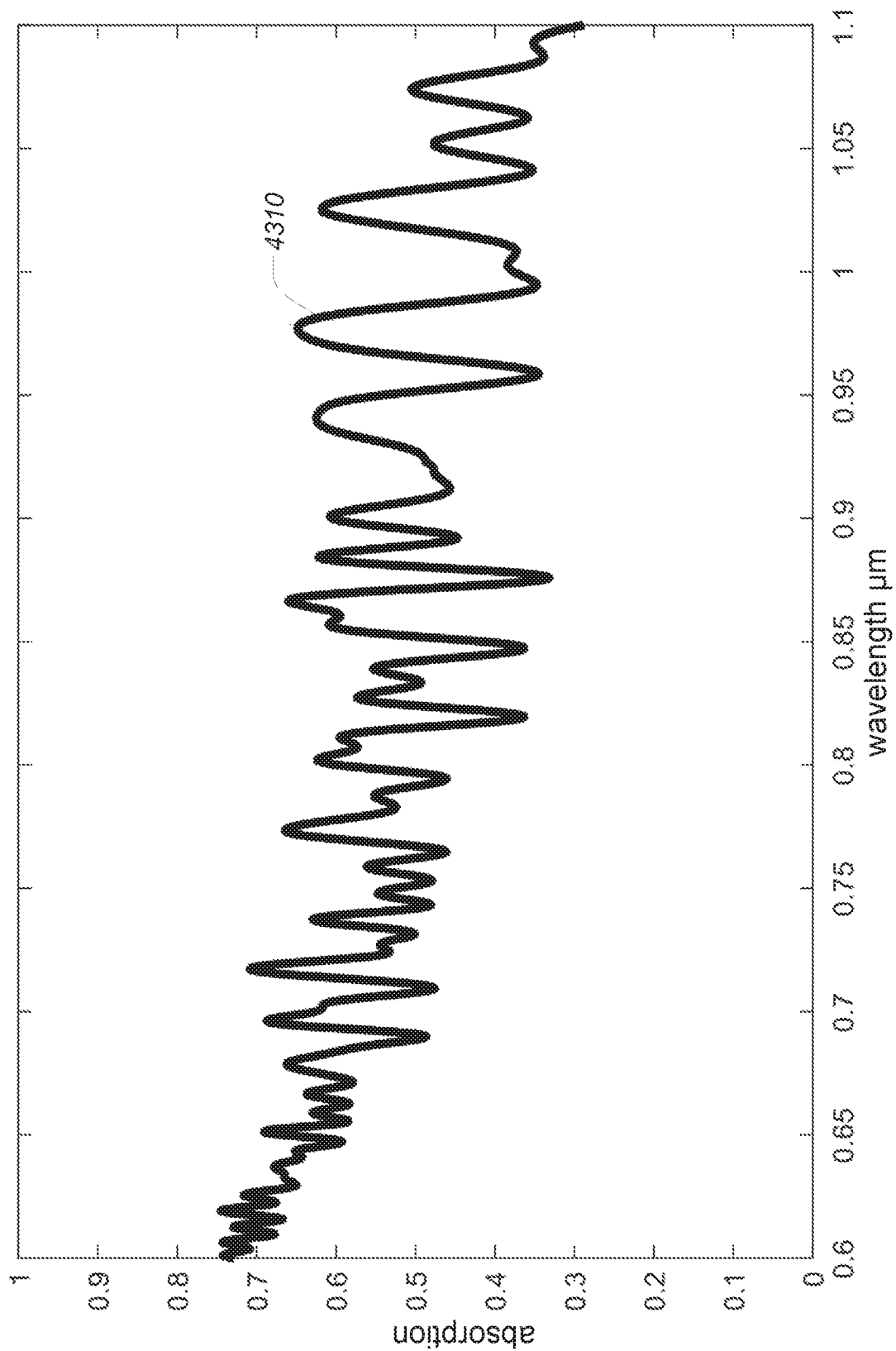

FIGS. 43A and 43B are a cross section diagram of a structure including Si pixels each with a single microstructure hole for a back illuminated sensor (BIS) fabricated on an SOI wafer, and a plot of an FDTD simulation of the optical absorption vs wavelength for such a single hole Si pixel, according to some embodiments. In FIG. 43A an inverted pyramid 4312 is etched into each pixel with dimensions of 1 micron×1 micron and the inverted pyramid has a base dimension of 870 nm and is filled with Si dioxide. The pixel height above the BOX layer is 3 microns and the BOX layer thickness is 20 nm and the Si device layer is 20 nm where CMOS ASICs are formed. The edge of the pixel can be coated with a dielectric and a metal layer to further confine the photons within the pixel. The optical photons impinge on the surface where the microstructure holes are formed. Region 4304 is crystalline Si that can be doped to N, P, or can be an I region or a low dope region.

FIG. 43B is a plot of the absorption which is proportional to the external quantum efficiency and can be equal to the external quantum efficiency if all the photo generated carriers are collected by the P and N junction (not shown) vs wavelength from 600-1100 nm. As can be seen from curve 4310, the absorption and/or EQE can be greater than 30% over the wavelength range of 600 to 1100 nm. And in some cases at certain wavelengths the absorption or EQE can be greater than 50% over the wavelength range of 600-1100 nm. And in some cases, at certain wavelengths the absorption or EQE can be 60% or greater at certain wavelengths in the range or 600-1100 nm.

Pixels with microstructure holes can have an EQE greater than a comparable pixel without microstructure holes at certain wavelengths in the wavelength range of 600-1100 nm. The doping profiles for this single hole pixel are not shown, however it can be doped as a phototransistor or PD/APD/SPAD, and in some cases in an array of pixels a mixture of phototransistors and PD/APD/SPAD can be formed in a single CMOS image sensor that can operate in time-of-flight (ToF) and/or non-ToF mode.

Only two simple partial schematic cross sections of the single hole pixel in crystalline Si are shown, however a high density of such pixel can be fabricated with pixel count ranging from 10s of thousands to 10s of millions and in some cases to hundreds of millions.

Figure 44A:
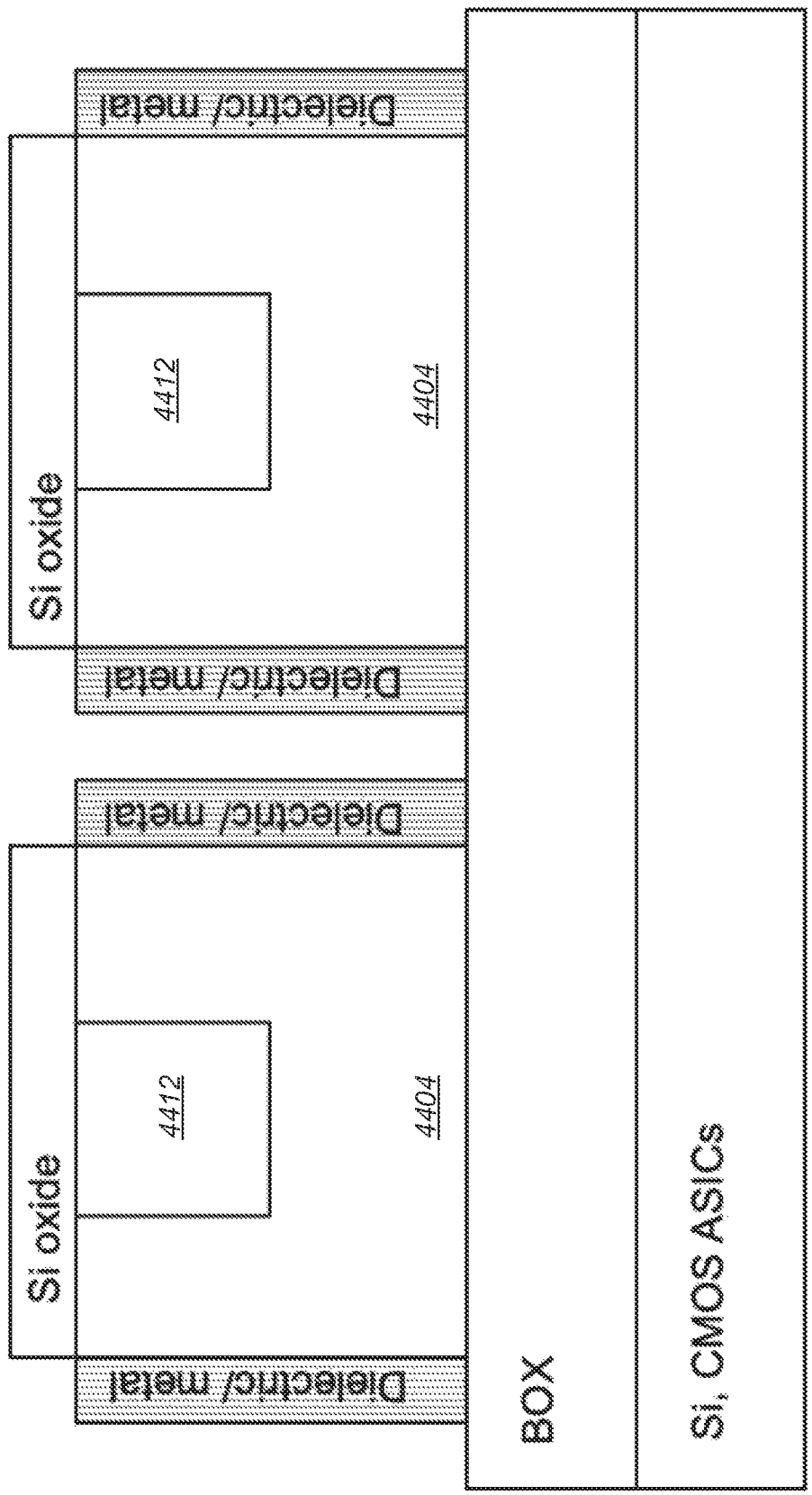
FIGS. 44A and 44B are a cross section diagram of a structure including Si pixels each with a single microstructure hole for a back illuminated sensor (BIS) fabricated on an SOI wafer, and a plot of an FDTD simulation of the optical absorption vs wavelength for such a single hole Si pixel, according to some embodiments.
Figure 44B:
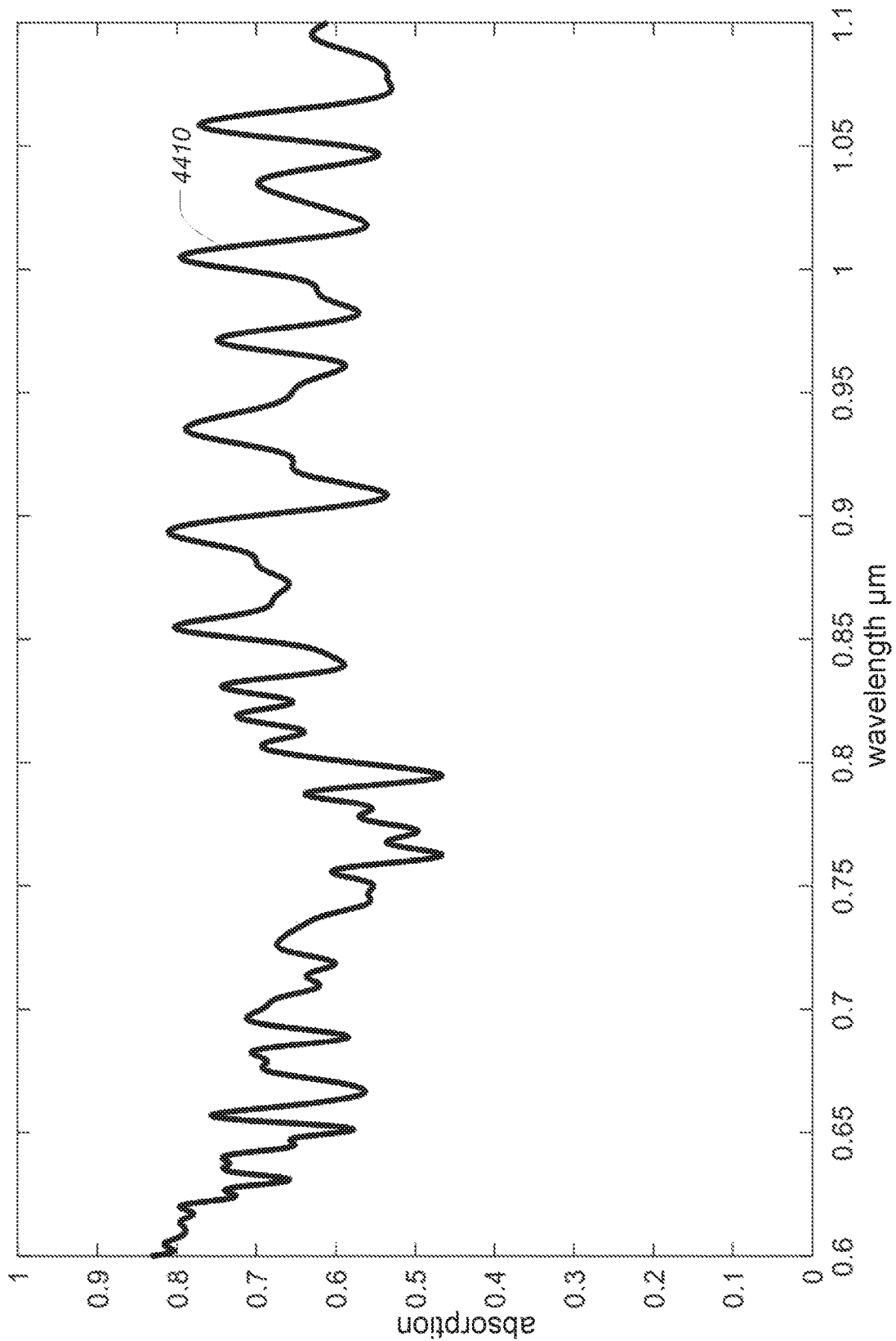

FIGS. 44A and 44B are a cross section diagram of a structure including Si pixels each with a single microstructure hole for a back illuminated sensor (BIS) fabricated on an SOI wafer, and a plot of an FDTD simulation of the optical absorption vs wavelength for such a single hole Si pixel, according to some embodiments. FIGS. 44A and 44B are similar to FIGS. 43A and 43B, respectively with the exception that the cylindrical microstructure hole is etched into the pixel with the lateral dimension of 870 nm and a depth of 1500 nm. The single microstructure hole 4412 is filled with Si oxide. A simple partial schematic of two pixels with single microstructure holes is shown, however a pixel array with pixel count ranging from 10s of thousands to 10s of millions, and in some cases more than 10s of millions can be fabricated within a single photosensor. Not shown are doping profiles that can operate the pixel as a phototransistor and/or PD and/or APD and/or SPAD. Also not shown are ohmic contacts, connecting electrodes, passivation layers, planarization layers, CMOS ASICs, connections to the CMOS ASICs to name a few. As in FIG. 43A, the dielectric/metal mirror can be formed around the edges of the pixel to confine the incident photon within the pixel.

In FIG. 44B, absorption is shown which is directly proportional to EQE vs wavelength from 600 to 1100 nm for the structure shown in FIG. 44A. From curve 4410, it can be seen than absorption or EQE can be 40% or greater over the wavelength range 600-1100 nm, and in some cases at certain wavelengths can be 50% or greater over the wavelength range of 600-1100 nm, and in some cases can be 60% or greater at certain wavelengths in the wavelength range of 600-1100 nm.

Figure 45:
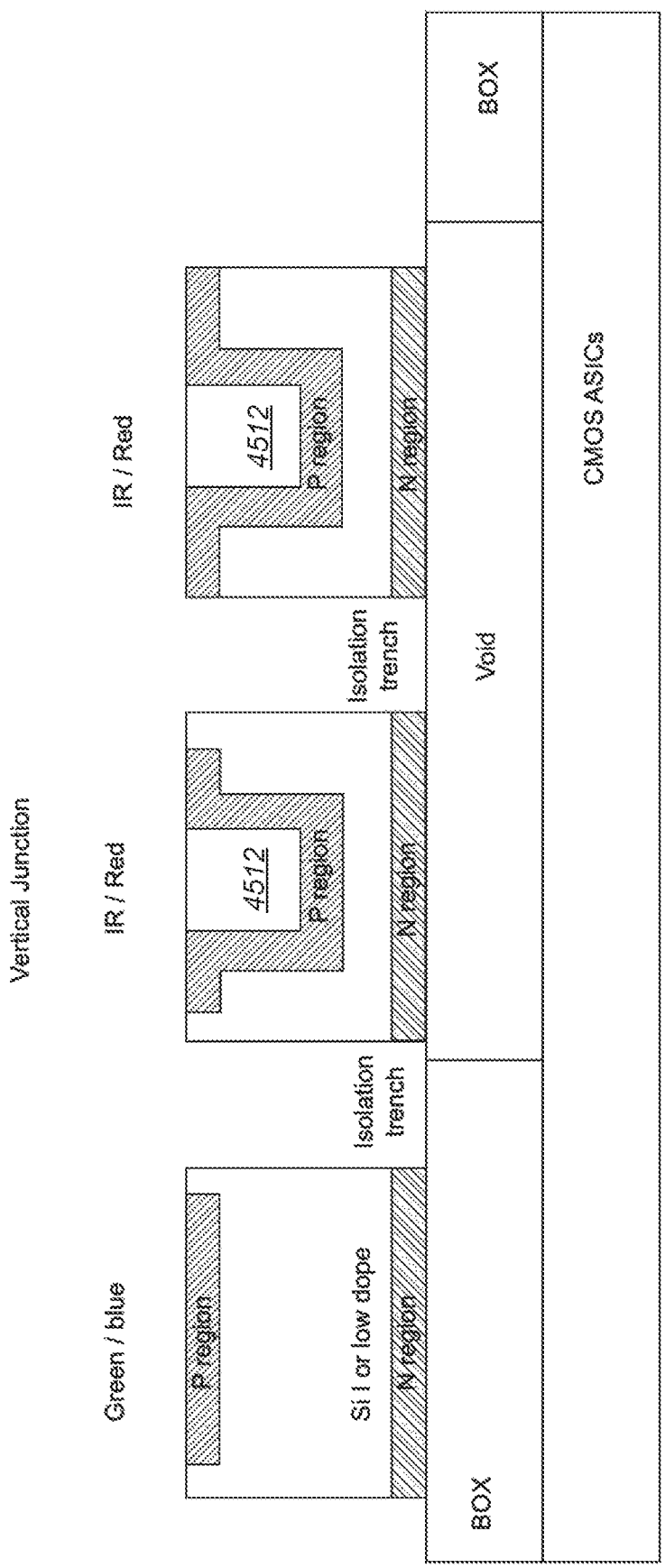
FIG. 45 is a simple partial schematic cross section diagram of pixels with single or multiple microstructure holes, according to some embodiments

FIG. 45 is a simple partial schematic cross section diagram of pixels with single or multiple microstructure holes, according to some embodiments. In the example shown in FIG. 45, each of the IR/red pixels has a single microstructure hole 4512. In some cases, one or more of the pixels can have multiple microstructure holes. Note that in the example shown, the green/blue pixel does not have any microstructure hole. In some cases, the BOX layer can be etched away to from a void under certain pixels, and in some cases the void may not be necessary. The purpose of the void is to increase the index contrast between Si and the void which can be vacuum or filled with air, or in some cases filled with an inert gas such as argon. This increase in contrast can further confine the photons within the pixel. In some cases, certain pixels responding to short wavelength light such as blue or green microstructure hole/holes may not be used. However, in the case of Infrared (IR) wavelength light microstructure hole/holes can improve the EQE. Further in some cases microstructure hole/holes can be used with red light to further enhance the absorption at that wavelength to improve the EQE. As shown PN or PIN doping profiles for PD/APD/SPAD operation and in some cases other doping profiles such as PIPN, PPN, for example and with and without guard rings can be included. In some cases, doping profiles for photo transistors can be used such as NIN, PIP, NPN, PNP to name a few. Also not shown are ohmic contacts, connecting electrodes, passivation, planarization, side wall mirrors around each pixel, CMOS ASICs, connections to CMOS ASICS to name a few. In some cases sidewall mirrors that can comprise of metal, dielectric metal, or Bragg mirrors can be used; in some cases such mirrors may not be necessary. The thickness of the pixel can have a range from 20 nm to-3000 nm, and in some cases 300 nm-3000 nm, and in some cases greater than 3000 nm.

As shown is a schematic of a back illuminated CMOS image sensor or 3D CMOS image sensor, however in some cases the structure can be implemented as a front illuminated CMOS image sensor and/or 3D image sensor where 3D include time-of-flight measurements. See reference Sun et al, Uniformly spaced λ/4—shifted Bragg grating array with wafer-scale CMOS-compatible process, Optics Letters, Vol 38, No 20, Oct. 15, 2013.

Figure 46A:
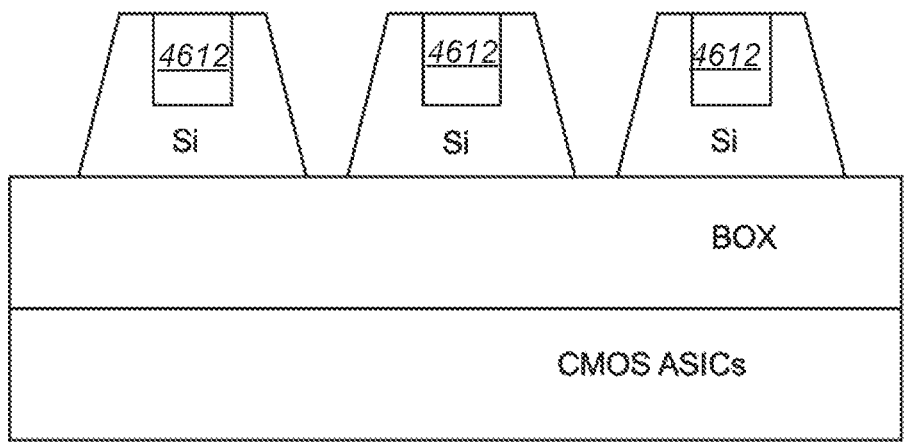
FIGS. 46A to 46C are simple partial cross section schematic diagrams of pixels with slanted side walls, according to some embodiments.
Figure 46B:
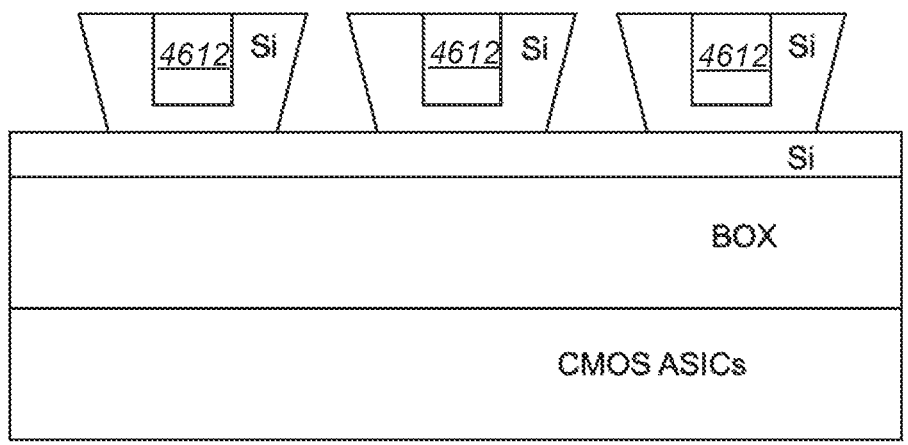
Figure 46C:
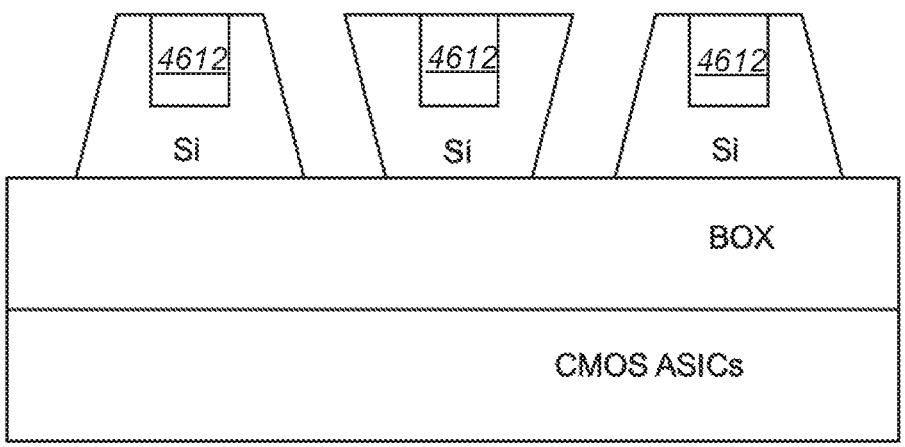

FIGS. 46A to 46C are simple partial cross section schematic diagrams of pixels with slanted side walls, according to some embodiments. The slanted side walls can help confine photons within the pixel. In the example shown, each pixel is configured with a single microstructure hole 4612, although in some cases some or all of the pixels can have multiple microstructure holes. In some cases, orthogonal sides of the pixel can have different angle of the sidewalls and in some cases can have similar angles of the side walls, and in some cases the slope of the side wall of orthogonal sides can be of opposite polarity. As shown in FIG. 46A trapezoidal side walls are shown, in FIG. 46B inverted trapezoidal side walls are shown, and in FIG. 46C a combination of trapezoidal and inverted trapezoidal pixels are shown. The side walls in some cases can be vertical and, in some cases, can have a small angle or slope and in some cases can have multiple angles and slopes. Not shown are mirrors that can be coated on the side walls if necessary, passivation layers, planarization layers P and N doping to form photoconductor, phototransistor, PD, APD and/or SPAD and necessary contacts to the P and N regions and connecting electrodes to the CMOS ASICs to name a few. Light impinges on the surface where the microstructure holes are formed, and in some cases light can impinge on the surface where CMOS ASICs are formed.

In some cases image sensors can be made on both sides of the BOX layer for example on the handle layer and on the device layer, and the photosensor can have light impinge on the front side where red, green and blue lights are captured by the appropriate red, green and blue pixels and IR light can pass through and are captured by pixels formed on the handle layer.

The deep trench isolation (DTI) etch can be partially etched in the Si layer such as FIG. and in some cases the DTI etch can extend to the Si oxide or BOX layer as in FIG. 46A AND 46C. Deep trench isolation can be used to isolate the pixels or Photosensors electrically and optically.

Figure 47:
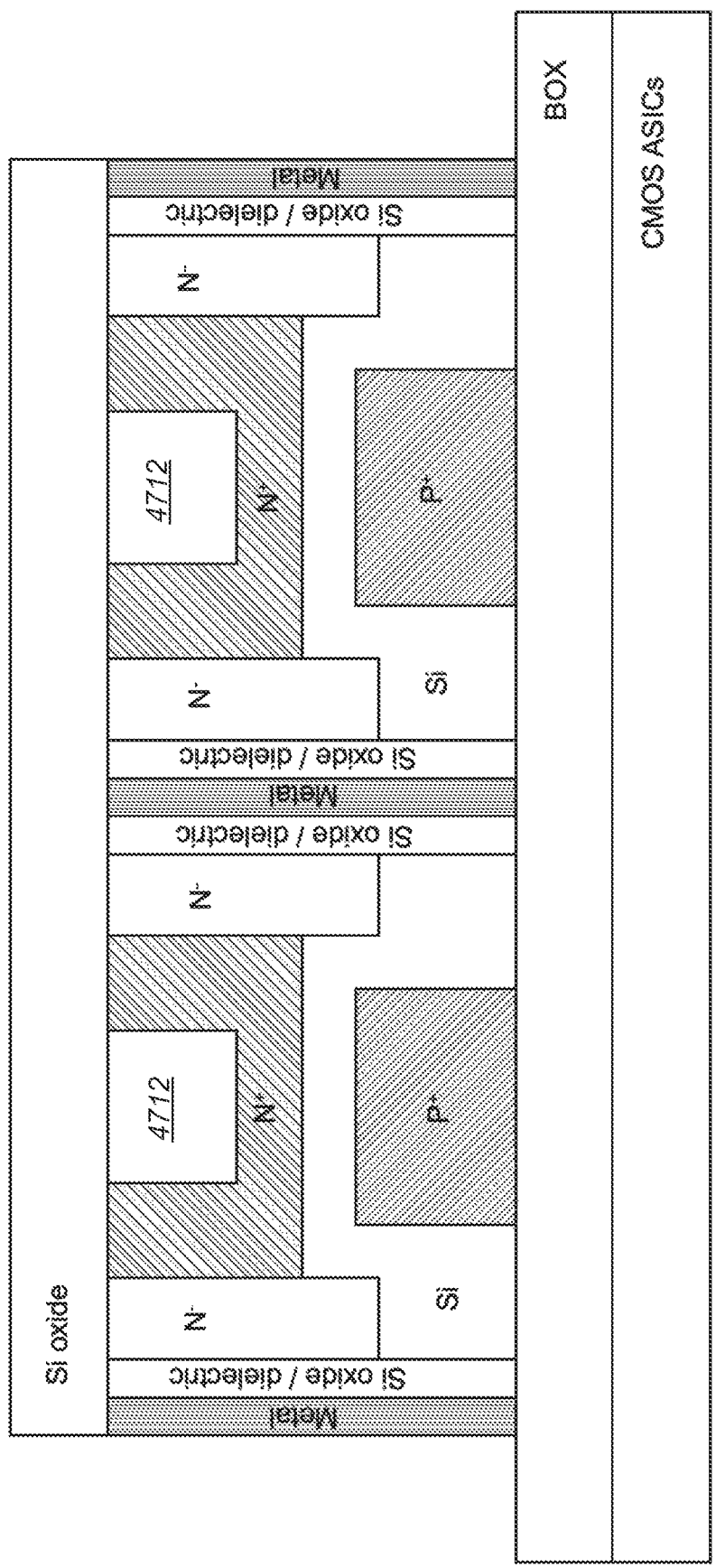
FIG. 47 is a simple partial cross section schematic diagram of a bottom illuminated CMOS sensor pixel, according to some embodiments.

FIG. 47 is a simple partial cross section schematic diagram of a bottom illuminated CMOS sensor pixel, according to some embodiments. Each pixel can have a single microstructure hole 4712 as shown. In some cases, each or some pixels can have multiple microstructure holes that can have aperiodic and/or of different hole shapes and/or dimensions, and the microstructure hole/holes can be within a doped region such as $N^+$ doped region as shown and guard rings can be formed around the perimeter of the N or $N^+$ region and the guard rings are doped N or $N^-$. In some cases, the guard ring can extend partially or entirely along the depth of the pixel. A P or $P^+$ region can be formed beneath the N or $N^+$ region and where the pixel can be an I or low dope N or P silicon. The junctions formed by the N and P doped regions can be a PIN, PN, PIPN junctions such that the pixel can operate in PD and/or APD and/or SPAD mode. The doped regions in this simple schematic are shown as rectangular boxes, however in actuality the doped regions will have a gradient due to diffusion of dopant ions during the formation of the doped regions by diffusion and/or ion implantation, and in some cases further diffusions of dopants can occur during growth, annealing, and other CMOS processing steps. For example, in reference, Kindt et al, A silicon avalanche photodiode for single optical photon counting in the Geiger mode, Sensor and Actuators A 60/(1997) 98-102, special circuitry in the CMOS ASICs may be required to operate the pixel and pixel arrays in a SPAD mode. In some cases, specialized CMOS circuitry may be required to operate in an APD and/or PD mode. Not shown are the CMOS circuits and connecting electrodes to the pixel. The microstructure hole/holes can be passivized and filled partially or entirely with a dielectric such as silicon dioxide. Similarly, the top and side walls of the pixel can be coated or grown with a dielectric such as silicon dioxide. A trench isolation separates adjacent pixels and the trench can be filled with metal or metal oxide to minimize optical cross talk between adjacent pixels. The metal or metal oxide can be aluminum, nickel, titanium, copper, tungsten, to name a few as an optical reflector. The wavelength range for the pixel can be from 400 to 1100 nm, in some cases microstructure hole/holes can be used to enhance the EQE at wavelengths of 600-1100 nm, and such pixels with microstructure hole/holes can have a higher EQE than comparable pixels at certain wavelengths in the wavelength range of 700-1100 nm. A reverse bias is applied to the P and N region or the anode and cathode with bias voltage ranging from 0.1 to 3.3 volts for PD operation and 3 volts-35 volts range for APD and SPAD operation, and in some cases 5-volts for APD/SPAD operations.

The P and N regions can be interchanged, the thickness of the pixel can range from 500 to-5000 nm, and in some cases 100-3000 nm, and the lateral dimension of the pixel can range from 300 nm to 5000 nm or more, and in some cases 800 nm-2200 nm.

The jitter and/or rise time of the pixel can range from 1 pico second to pico seconds, and in some cases 5 pico seconds to 15 pico seconds for a depth resolution in time-of-flight applications in the millimeter or sub-millimeter range, and in some cases in the 10s of millimeter range. Applications include imaging in the IR wavelength, time-of-flight such as 3D imaging, virtual reality, augmented reality, gesturing, robotics, machines vision and advanced driver assistance systems.

Figure 48:
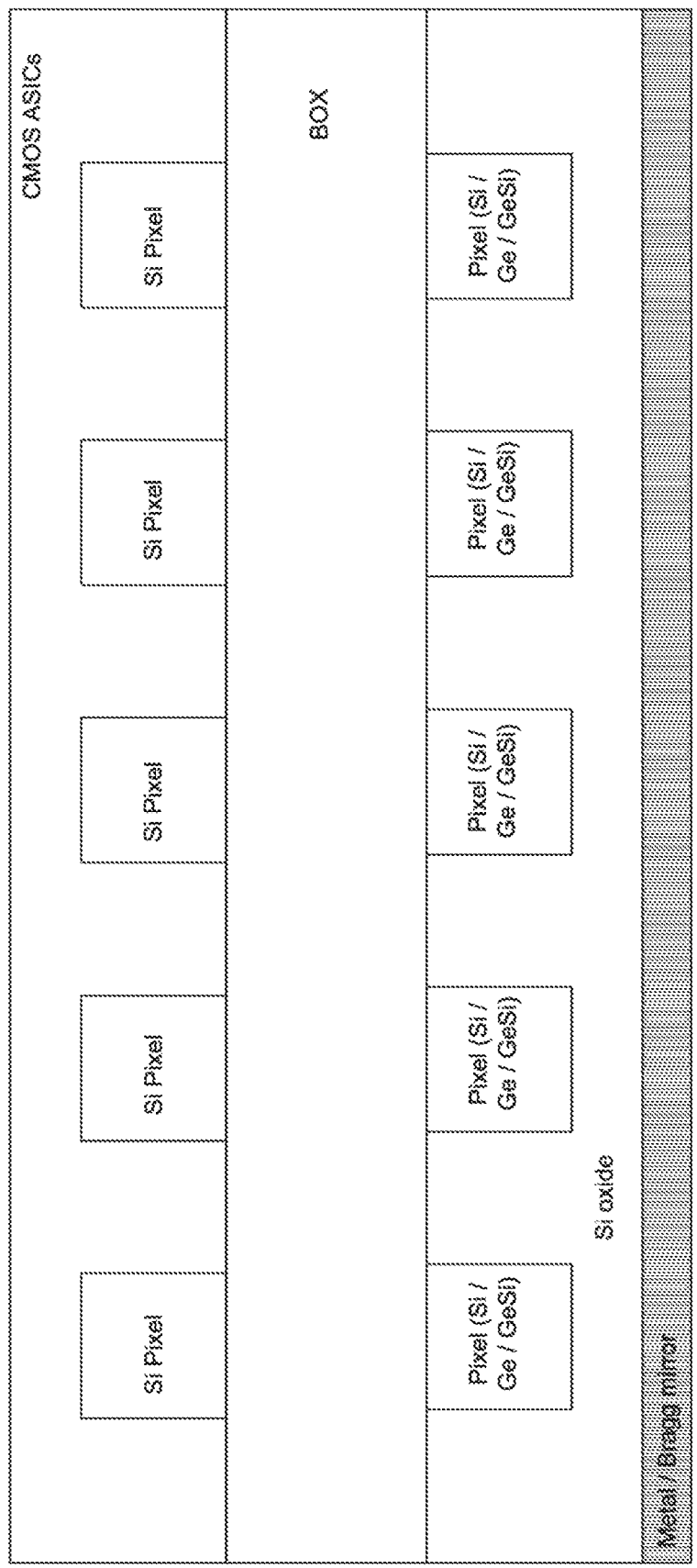
FIG. 48 is a simple partial schematic cross section diagram of a CMOS image sensor, according to some embodiments.

FIG. 48 is a simple partial schematic cross section diagram of a CMOS image sensor that can include time-of-flight and where pixels are formed on both the device layer (front side) and the handle layer (back side) of an SOI wafer. The pixels formed on the device layer where the CMOS ASICs are formed can capture red, green and blue wavelength photons, and the infrared photons can pass through the top layer into the bottom pixels for IR imaging. In this case photons impinge on the front surface, and visible light is captured by the pixels on the front surface and IR light can be captured by the pixels on the bottom surface. A reflector such as metal or Bragg mirror comprised of dialectic layers can be formed on the back side to further enhance the sensitivity of the pixels. In addition, the back side pixels can have microstructure hole/holes to further enhance the EQE at the infrared wavelength. In some cases the back side pixels can have Ge grown on its surface to further enhance IR sensitivity and extend the wavelength to 2 microns. The front side pixels can have microstructure hole/holes on the red pixel to enhance EQE at the red wavelength.

Figure 49A:
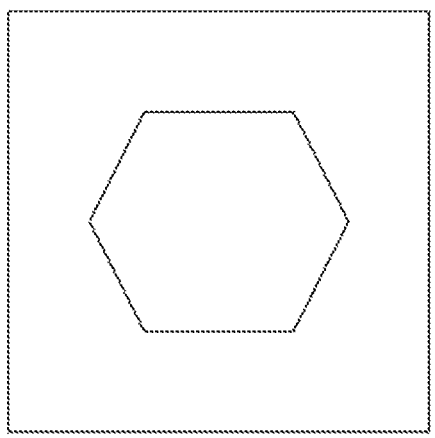
FIGS. 49A to 49F are simple partial schematic of top views of pixels with different microstructure hole/holes shapes and arrangements, according to some embodiments.
Figure 49B:
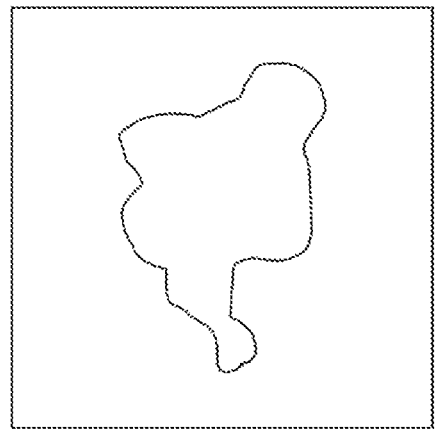
Figure 49C:
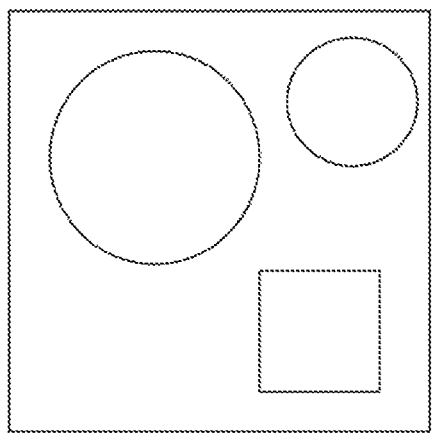
Figure 49D:
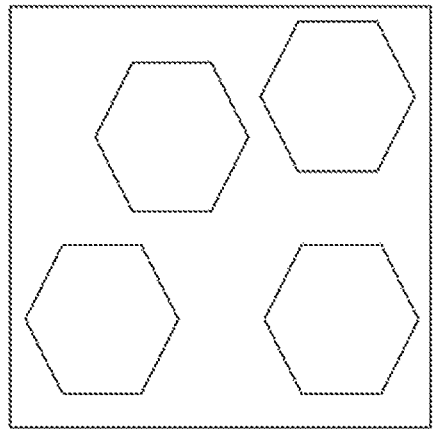
Figure 49E:
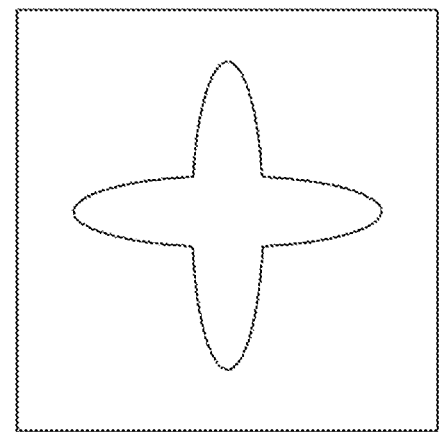
Figure 49F:
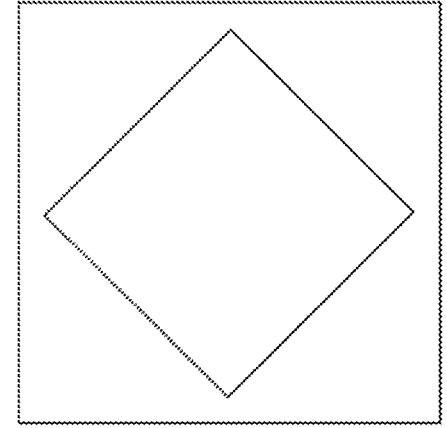

FIGS. 49A to 49F are simple partial schematic of top views of pixels with different microstructure hole/holes shapes and arrangements, according to some embodiments. In FIG. 49A a polygonal single hole pixel is shown and where the polygonal microstructure hole can be circular, oval, square and/or any combination of shapes to form a single hole. In FIG. 48B an amoebic microstructure hole is shown, and in some cases more than one amoebic microstructure hole can be formed on the same pixel. In FIG. 49C microstructure holes with different shapes are formed on a single pixel and in FIG. 49D aperiodic or randomly arranged microstructure holes can be formed on a single pixel. In an image sensor array pixels can have the same hole patterns, and in some cases the photosensor arrays can have pixels with different microstructure hole shapes or patterns, and in some cases only certain pixels such as pixels for capturing red photons and/or IR photons can have microstructure hole/holes for enhancing the EQE. FIG. 49E shows intersecting oval or rectangular and/or any other shape micro holes that can have an intersecting angle ranging from 10 degrees to 90 degrees. In the case of orthogonal intersection of ovals as shown the pixel is not polarization sensitive to the incoming radiation, however with a single oval the pixel can be polarization sensitive in some applications. FIG. 49F shows a diamond shaped microhole is shown that can be dry or wet etched. The pixels can be Si (crystalline) and in some cases Ge/GeSi can be grown on the Si pixels to extend the wavelength to 2 microns.

Figure 50:
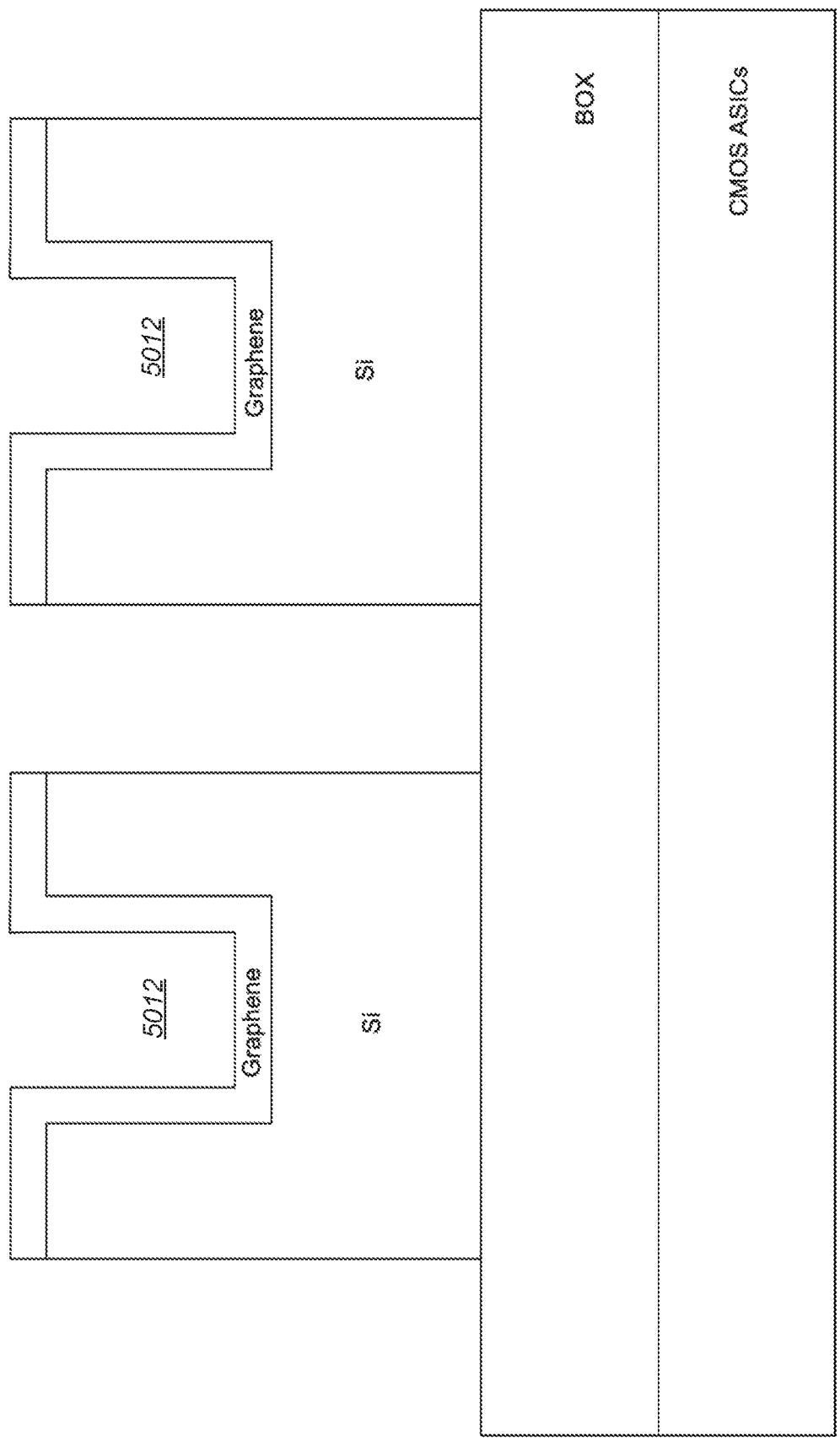
FIG. 50 is a simple partial cross section diagram of pixels with microstructure hole/holes, and where the microstructure hole/holes can be conformably coated with a material such as Graphene, according to some embodiments.

FIG. 50 is a simple partial cross section diagram of pixels with microstructure hole/holes, and the microstructure hole/holes can be conformably coated with a material such as Graphene, according to some embodiments. The coating can further enhance the EQE at certain wavelengths, see for example reference, Yang et al, Light Trapping in Conformal Graphene/Silicon Nanoholes for High-Performance Photodetectors, American Chemical Society, ACS publications, DOI:10.1021/acsami.9b08268. The Graphene layer can be deposited directly on the pixel or in some cases a dielectric or oxide layer can be formed on the pixel and in the microstructure hole 5012 prior to graphene deposition. PN junctions can be formed laterally or vertically, and a reverse bias can be applied between the P and N regions.

As shown the pixels are formed on the back side for a back illuminated sensor, however the pixels can also be formed on the front side for a front illuminated sensor and Graphene can also be used to coat the front illuminated pixels with microstructure holes.

Other materials can be used instead of Graphene such as MoS, and in some cases quantum dots comprised or III-V material and/or nanowires grown inside the microstructure hole/holes to enhance the EQE at certain wavelengths, and/or extend the wavelength beyond the Si bandgap of 1100 nm. Reference Yang et al, Silicon-Compatible Photodetectors: Trends to Monolithically Integrate Photosensors with Chip Technology, Advanced Functional Materials, 2019 shows other silicon photodetector structures and material that can be monolithically integrated with a single chip. In this patent specification the monolithic integration with CMOS ASICs utilize standard CMOS process such as trench isolation etch to form its microholes for enhancing optical absorption particularly in the IR wavelength 800-1100 nm for silicon, and in some cases 700-1100 nm without the use of exotic materials or processes that are not standard CMOS process.

In some cases graphene/Si and/or graphene/Ge and/or graphene/Ge and/or Si alloys can be used together with microstructure holes. The microstructure holes can be periodic and/or aperiodic and/or randomly arranged photodetectors/sensors in PD/APD/SPAD/phototransistor/photoconductor mode can be used to further enhance responsivity and/or quantum efficiency of the photodetector/sensor for example see reference Riazimehr et al, High Responsivity and Quantum Efficiency of Graphene/Silicon Photodiodes Achieved by Interdigitating Schottky and Gated Regions, ACS Photonics, 2019, 6, 107-115. In some cases, the graphene can be within the microstructure hole/holes and in some cases for small pixel dimensions for example pixels with lateral dimensions of 1.5 micron×1.5 micron or less a single microstructure hole can be used that can include graphene within the hole to enhance sensitivity.

In some cases metal nano particles and/or nano scale metallic films can be formed within the microstructure hole or holes of photodetector/sensor to further enhance optical sensitivity as discussed in Frydendahl et al, Giant enhancement of silicon plasmonic shortwave infrared photodetection using nanoscale self-organized metallic films, Optical Society of America, 2020, 2334-2536/20/050371-09.

In some cases quantum dots can be used within the microstructure hole/holes of the photodetector/sensor to further enhance optical sensitivity and in some cases to extend the wavelength of the photodetector/sensor in cases where III-V quantum dots are used as discussed in reference Yu, Quantum Dot Optoelectronic Devices, Springer. In some cases a thin dielectric such as Hf oxide and/or ZnO layers can be included with or without the graphene on the surface of the semiconductor where the thin dielectric can follow the contour of the microstructure hole and can operate in a photogating mode for example as in reference, Wang et al, Photogating-controlled ZnO photodetector response for visible to near-infrared light, https://doi.org/10.1088/1361-6528/ab8e75

Figure 51A:
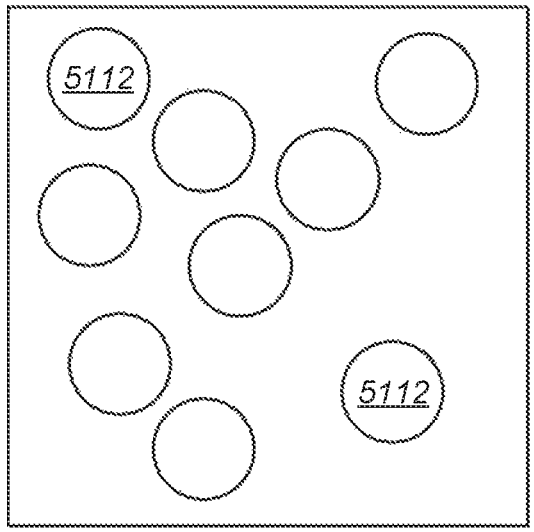
FIGS. 51A to 51H are simple partial top view schematic diagrams for pixels for different colors or wavelengths, according to some embodiments.

FIGS. 51A to 51H are simple partial top view schematic diagrams for pixels for different colors or wavelengths, according to some embodiments. The number of microstructure holes can be different depending on the wavelengths or colors that the pixels are responding to. For example, the number of microstructure holes for blue can be greater than pixels responding to longer wavelengths as shown in FIG. 51A. The microstructure holes 5112 can be optimized for the blue wavelength and can be arranged in an aperiodic and/or random pattern, and in some cases in a periodic pattern. See reference Lee et al, Random nanohole arrays and its applications to crystalline Si thin foils produced by proton induced exfoliation for solar cells, Scientific Reports, 2019.

Figure 51B:
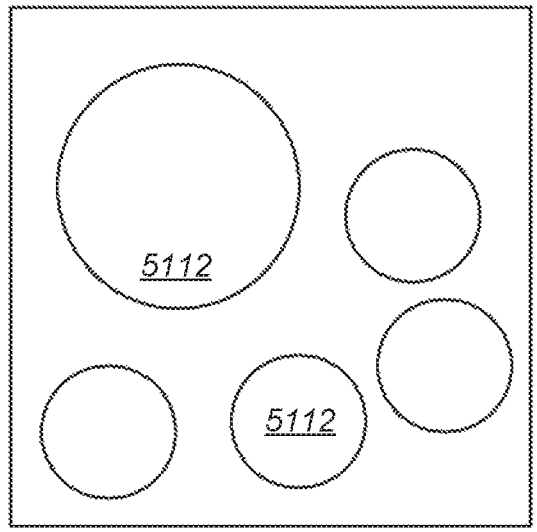
Figure 51C:
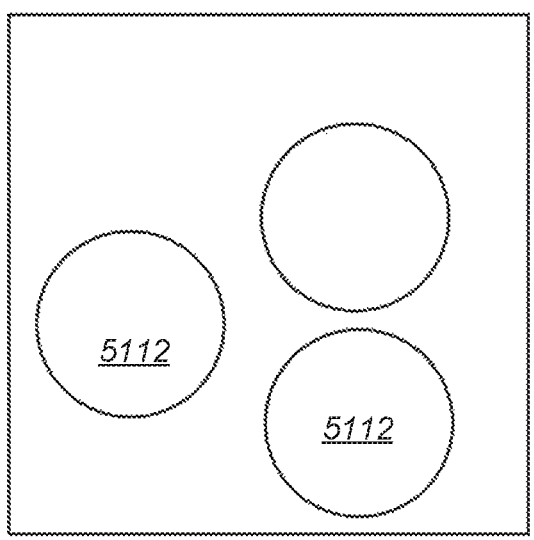
Figure 51D:
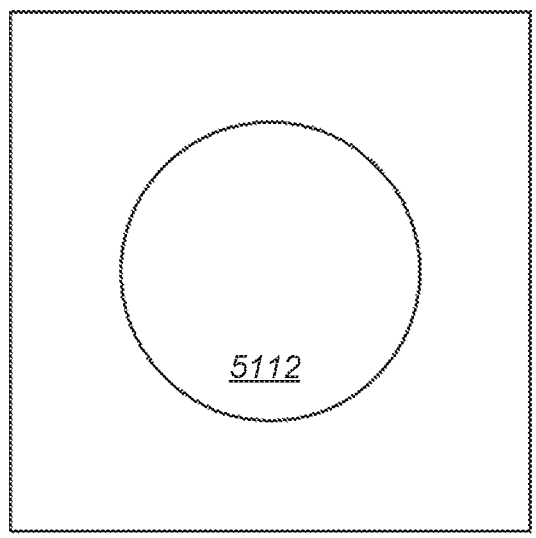

FIGS. 51B and 51C show microstructure holes 5112 for green and red respectively for example, in some cases a single microstructure hole can be used in a pixel for example for near infrared (NIR) and red wavelengths as shown in FIG. 51D. The microstructure holes or hole can be circular, oval, amoebic, rectangular, polygonal, or any combination thereof, and can be dry etched, and in some cases for inverted pyramids can be wet etched, and where the microstructure hole patterns can be aperiodic and/or random.

Figure 51E:
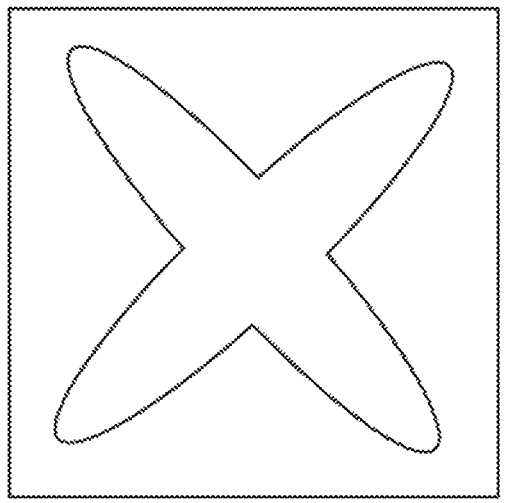
Figure 51F:
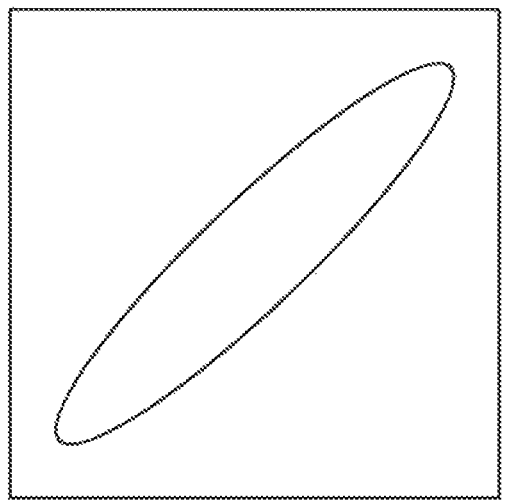

In some cases, for small pixels for approximately 1 micron×1 micron in dimension, a larger hole may be used for longer wavelengths for example 940 nm-1000 nm wavelength in which case an elongated microhole such as an oval for example can be stretched along a diagonal as shown in FIG. 51E and FIG. 51F. In FIG. 51E, a cross oval shaped microholes are shown to reduce polarization sensitivity and in FIG. 51F, a single diagonal microhole is shown for cases where polarization sensitivity is desired. The single elongated hole can be along a diagonal or along a vertical or horizontal axis, or with any orientation. Elongated microhole or holes along a diagonal allow of a larger dimension hole.

Figure 51G:
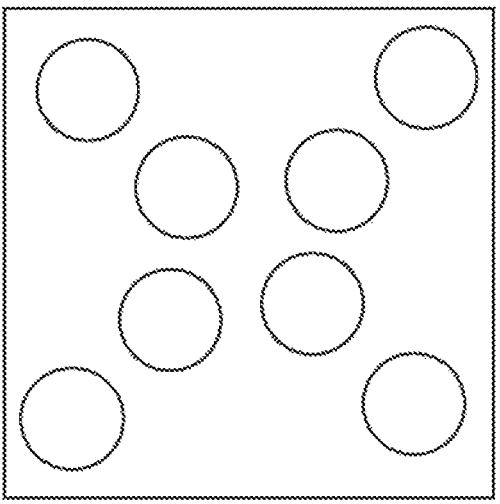
Figure 51H:
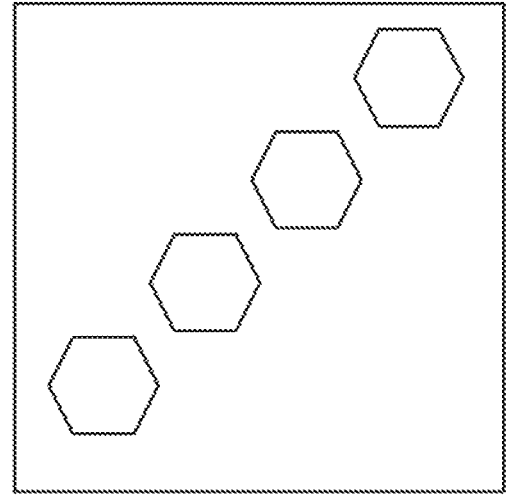

FIGS. 51G and 51H show a series of smaller microstructure holes that can mimic the optical response of a larger microstructure hole or holes. As will be discussed in FIG. 67 such clusters of smaller micro or nanoholes can be considered as a composite microhole as shown in FIGS. 67A-67F. The microhole or holes or nanoholes are commonly partially or fully filled with a dielectric such as Si dioxide, and in some cases dielectric with higher optical refractive index such as Hf oxide for example.

FIGS. 52A, 52B, 53A and 53B are simple partial schematics of a cross sections of a pixel with a single microstructure hole, according to some embodiments. Although each case is depicted with each pixel having a single microstructure hole, in some cases some or all pixels can have multiple microstructure holes. Although only a single pixel is shown, an integrated array of pixels can be formed for CMOS image sensors and time-of-flight applications. As shown the pixel is a back illuminated photo sensor fabricated on an SOI wafer where the CMOS circuits are fabricated on the device layer, and the pixels are fabricated on the handle layer which can be thinned to 10 microns or less and in some cases 3 microns, and in some cases 1 micron, and in some cases less than 1 micron.

Hyperdoping 5230 can be used inside the side walls and/or bottom of the microstructure hole 5212, or holes by means of a femtosecond laser with dopant gas, and in some cases with a deposit layer of dopants as discussed in the following references, Xuan et al, High near infrared absorption of hyper-doped silicon induced by co-doping of sulfer and nitrogen, PSS applications and materials science, Nov. 1, 2016; reference Zhang et al, Broadband infrared response of sulfur hyperdoped silicon under femtosecond laser irradiation, Materials Letters, 196 (2017), reference Smith et al, The effects of a thin film dopant precursor on the structure and properties of femtosecond-laser irradiated silicon, Applied Physics A Materials Science & Processing, 2011; using sulfur and nitrogen as N dopant for the hyper doped N region. Due to the hyperdoping region, the bandgap of silicon is narrowed and photosensors can respond to wavelengths greater than 1100 nm, and in some cases to 2000 nm.

Figure 52A:
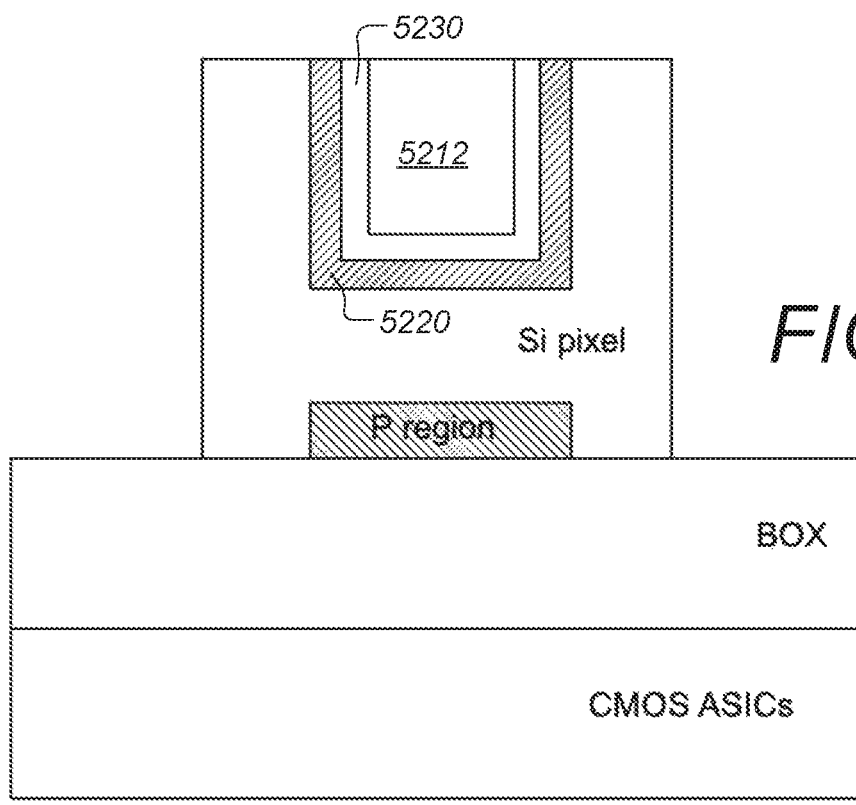
FIGS. 52A, 52B, 53A and 53B are simple partial schematic of a cross sections of a pixel with a single microstructure hole, according to some embodiments.
Figure 52B:
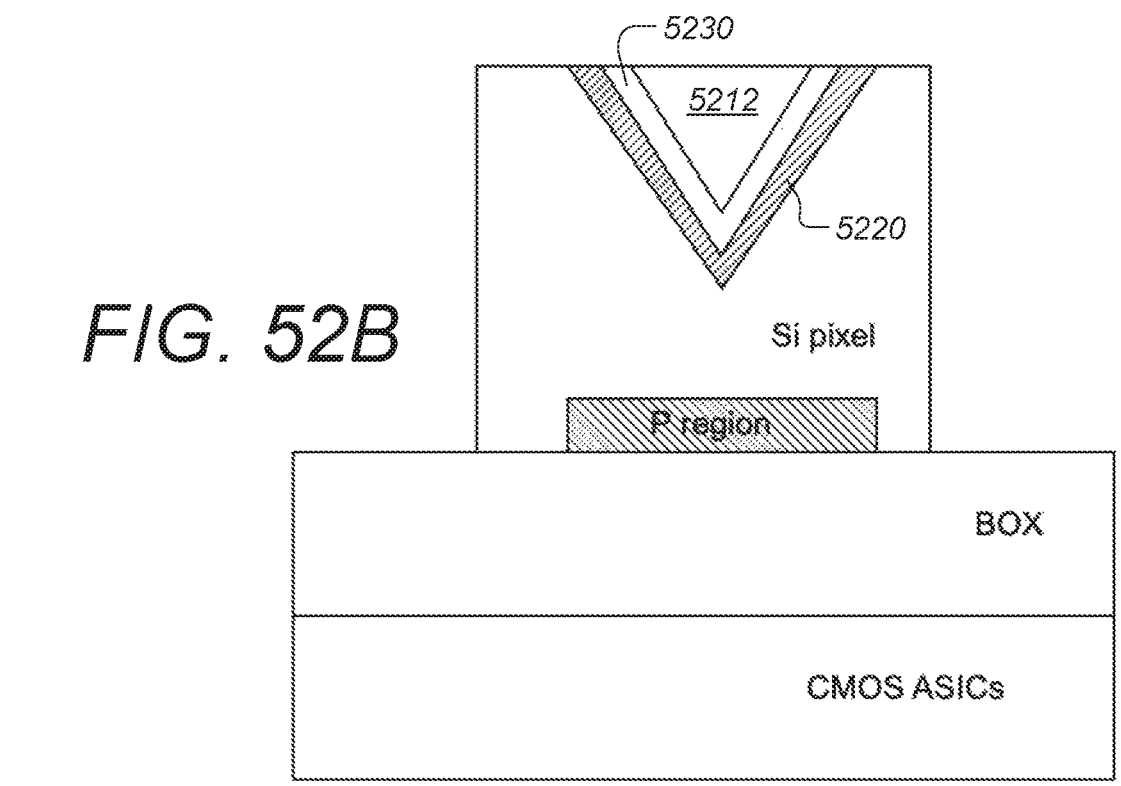

P region and N region 5220 are also shown for both cylindrical hole examples in FIG. 52A, and in FIG. 52B a conical shape microstructure hole is shown also with hyperdoping together with N region 5220 and P region, and in some cases the microstructure hole 5212 can be an inverted pyramid.

FIGS. 52A and 52B show pixels with a single microstructure hole each, however in some cases multiple microstructure holes in periodic and/or aperiodic and/or randomly arranged can be formed in a single pixel only one pixel is shown in this schematic for simplicity and for an image sensor there can be 100,000-10s of millions or more pixels.

Doping in FIG. 52A of P and N junctions which can also include I or low dope regions are shown as an example, however other arrangements of the P and N region can also be formed such as having P and N regions both on the same surface, and in some cases can have multiple PN regions to form a transistor or phototransistor light structure such as PNP or NPN, and in some cases photoconductor structures using homojunctions such as NIN and PIP can be used.

The structure with P and N regions can operate as a photodiode, SPAD, APD with a reverse bias applied between the P and N regions. The reverse bias voltage can range from 0.1 to 3.3 volts for PD operation, and to 15 volts or more for APD and SPAD operation. The response time such as the rise time or jitter time can range from 1 picosecond to 10 nanoseconds, and in some cases less than 1 picosecond. The wavelength range can be from 400 nm to 1100 nm, and in some cases 400 nm-2000 nm.

For simplicity passivation, planarization, side wall reflectors on the pixels, connecting electrodes to the P and N regions to the CMOS ASICs and other elements required to complete an image sensor and/or time-of-flight image sensor are not shown. Also not shown are the details of the CMOS circuits which consist of transistors, charged storage devices, memories, timing circuits, readout circuits to name a few that are necessary for a complete state of the art CMOS image sensor and/or CMOS time-of-flight image sensor.

In addition to extending the wavelength the hyper doped region also reduces surface states.

Figure 53A:
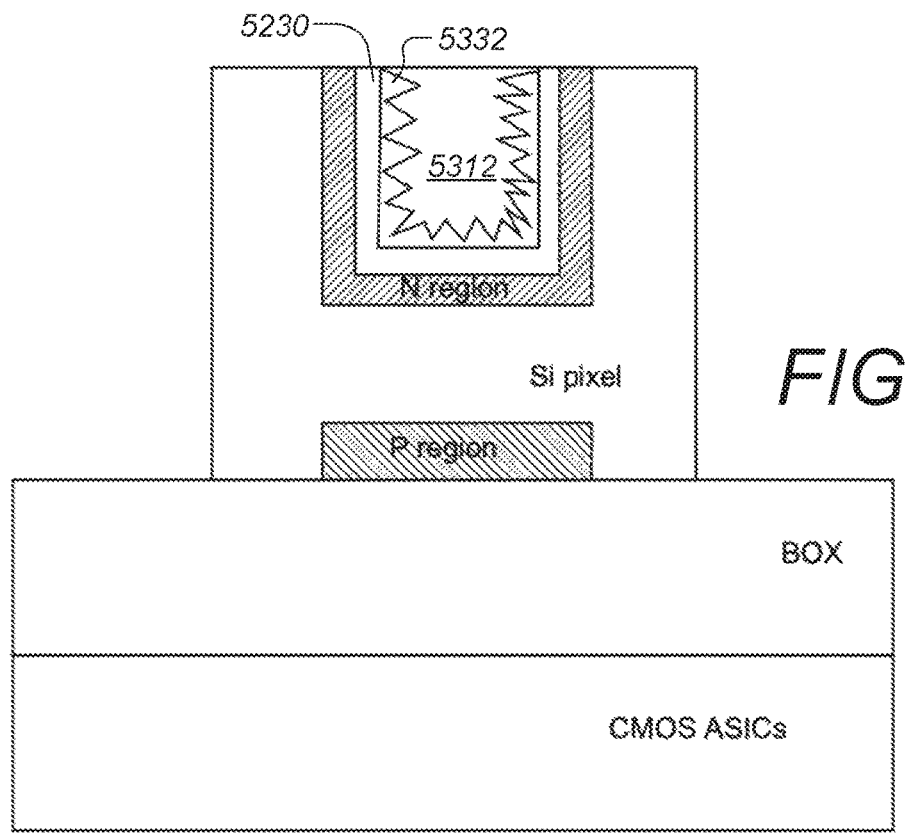
Figure 53B:
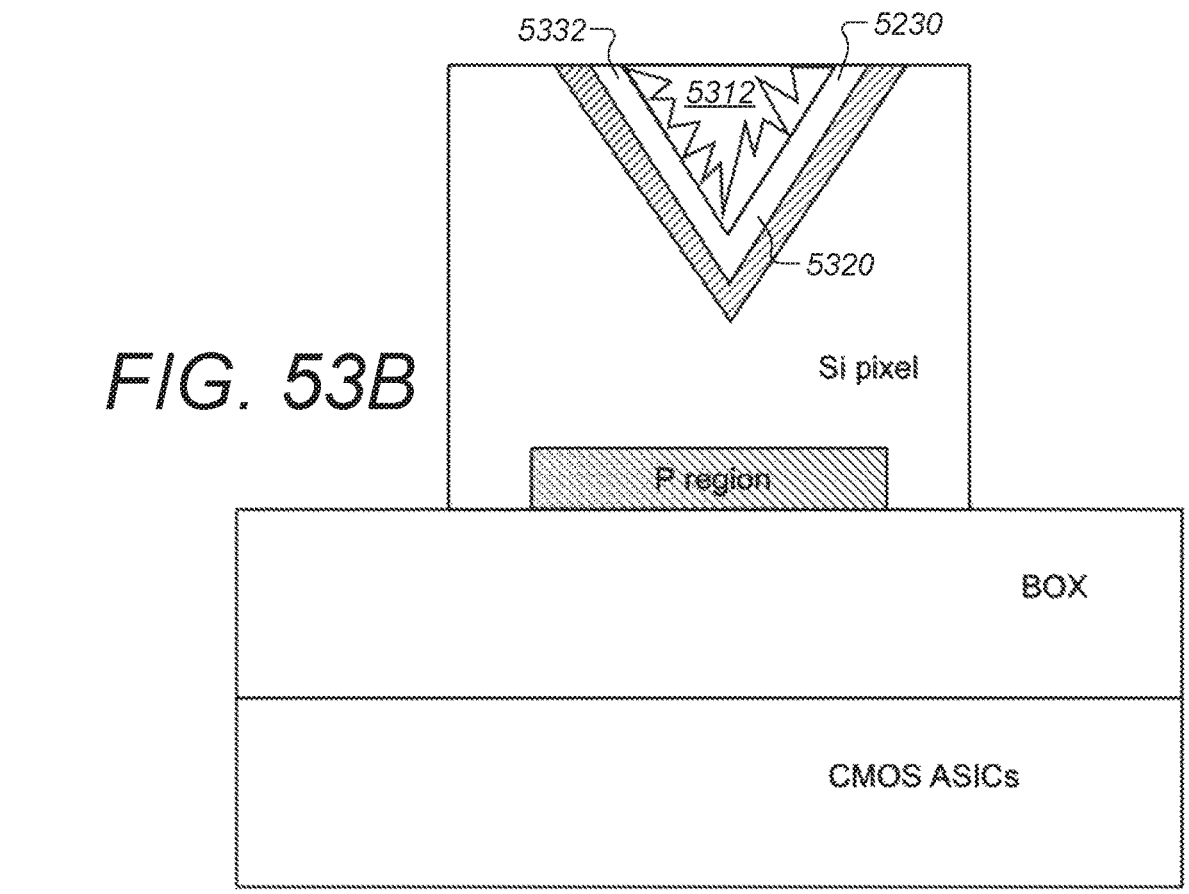

FIGS. 53A and 53B are similar to FIGS. 52A and 52B, respectively, with the exception of surface texturing within the microstructure hole or holes 5312. For example see reference Sher et al, Pulsed-laser hyperdoping and surface texturing for photovoltaics, Materials Research Society, 2011, reference Pralle et al, Extending Black Silicon imaging to Backside Illumination, SPIE 2016, reference Li et al, Black Silicon IR Photodiode Supersaturated With Nitrogen by Femtosecond Laser Irradiation, IEEE Sensors Journal, Vol. 18 NO. 9, May 1, 2018, Yahaya et al, Characterization of light absorption in thin-film silicon wither periodic nanohole arrays, Optics Express 11 Mar. 2013, Vol. 21, No. 5 show the use of nanoholes to enhance absorption in thin silicon for photovoltaic applications where periodic arrays of nanoholes are used with silver reflectors at the bottom of the thin silicon. In this patent specification a reverse bias is applied between the anode and cathode for PD, APD, SPAD operations and in the case of phototransistors a bias is applied between the source and drain which can be N type or P type for example for NPN or PNP or NIN or PIP phototransistors. In addition in some cases a single microhole can be used with a pixel, and in some cases aperiodic and/or random microhole patterns can be used with a pixel, and in some cases the microhole can have other shapes and sizes not necessarily circular. The texturing due to pulsed or femtosecond lasers together with hyperdoping in some cases can extend the wavelength of the silicon photodetector to 1100 nm or greater, and in some cases to 2000 nm, and can also improve the quantum efficiency. In some cases a thermal anneal such as rapid thermal anneal (RTA) can be used after laser hyperdoping and/or texturing to remove any damages caused by the laser processing.

Microstructure holes formed by dry etching using standard CMOS shallow or deep trench isolation etch allow for greater flexibility in hole shape, hole cross section, hole depth for optimizing optical absorption which is proportional to EQE for sensitivity improvements at red and near infrared (NIR) wavelengths than anisotropic wet etch for example. After dry etch a thermal anneal such as rapid thermal anneal can be used to remove damages due to dry etching and further passivation such as silicon dioxide can be used to further passivate the surfaces. In addition doping P and N type can be used within the microstructure hole or holes to reduce surface recombination at the silicon and dielectric interface for example. And in some cases the microstructure hole/holes can be within a doped N or P region which can also minimize leakage and/or dark current.

Figure 54A:
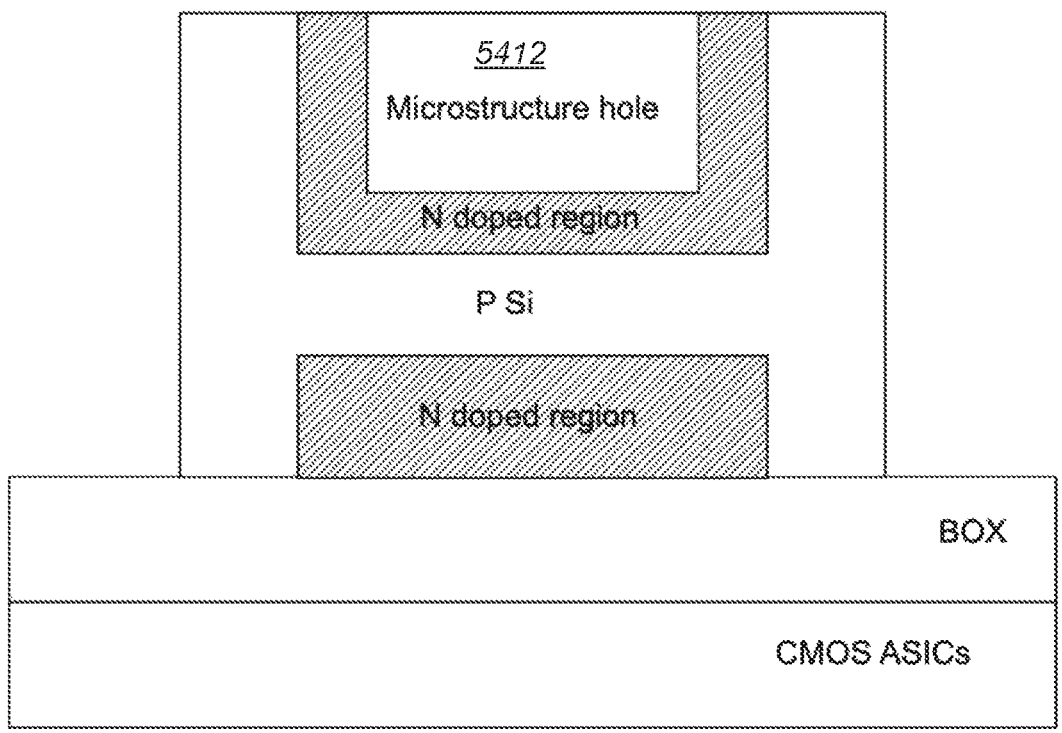
FIGS. 54A and 54B are simple partial schematics of a cross section and a top view, respectively, of a single pixel, according to some embodiments.
Figure 54B:
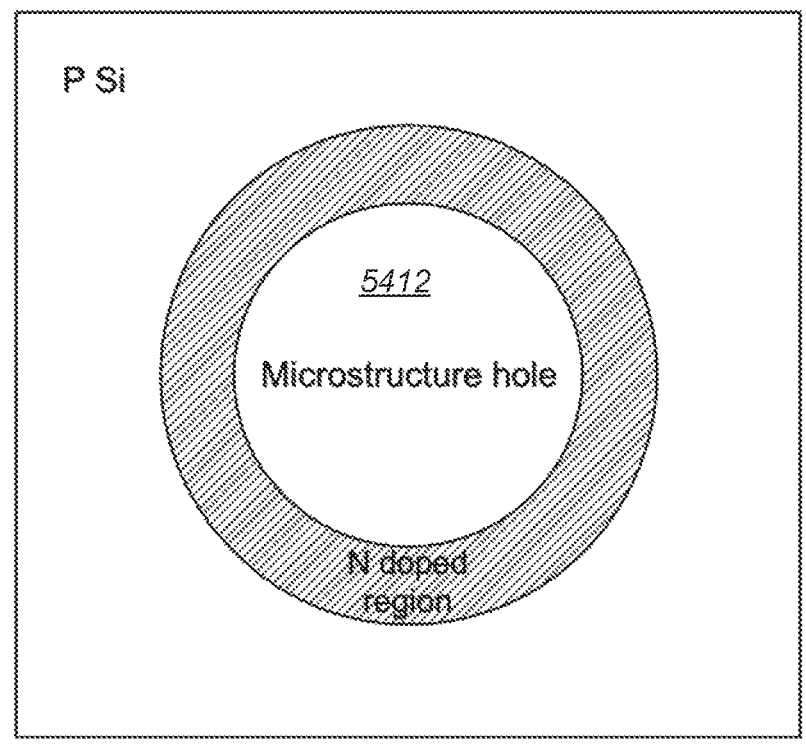

FIGS. 54A and 54B are simple partial schematics of a cross section and a top view, respectively, of a single pixel, according to some embodiments. For simplicity only a single pixel is shown, whereas in a back illuminated CMOS image sensor (BICIS) which in actuality can have 100,000-100 million pixels fabricated on a SOI wafer where CMOS ASICs are monolithically integrated and where the CMOS ASICs include electronics to accept the electrical signals generated by the photo transistor to form an image and in some cases a 3D image as in the case of time-of-flight applications. FIG. 54A shows a microstructure hole 5412 that can be formed using dry etching, and in some cases can be formed using wet etching. The side walls of the microstructure hole and the region beneath the microstructure hole can be doped N type and the Si can be P type Si to form NPN phototransistor. FIG. 54B shows a top view of the pixel, in some cases the pixel can include one microstructure hole, and in some cases the pixel can include more than one microstructure hole. Examples of phototransistors are shown in the following references, Hsu et al, Phototransistor-based optoelectronic tweezers for dynamic cell manipulation in cell culture media, The Royal Society of Chemistry, Sep. 7 2009; Tan et al, High-performance silicon nanowire bipolar phototransistors, Applied Physics Letters, Jul. 20, 2016.

The P and N regions, and the Si handle layer doping can be interchanged to form a PNP phototransistor in some cases. Not shown are connecting electrodes to the CMOS ASICs, planarization layers, passivation layers, isolation trenches, side wall dielectric mirrors to name a few for simplicity.

Figure 55A:
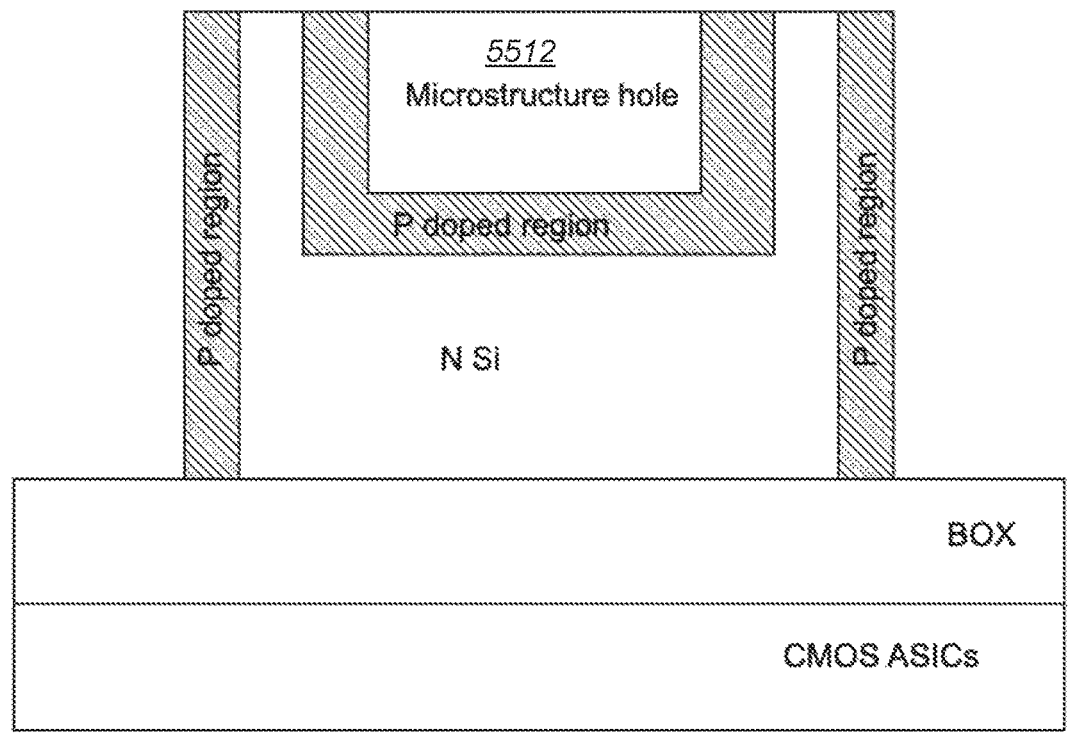
FIGS. 55A and 55B are simple partial schematics of a cross section and top view, respectively, of a pixel phototransistor with a different doping configuration, according to some other embodiments.
Figure 55B:
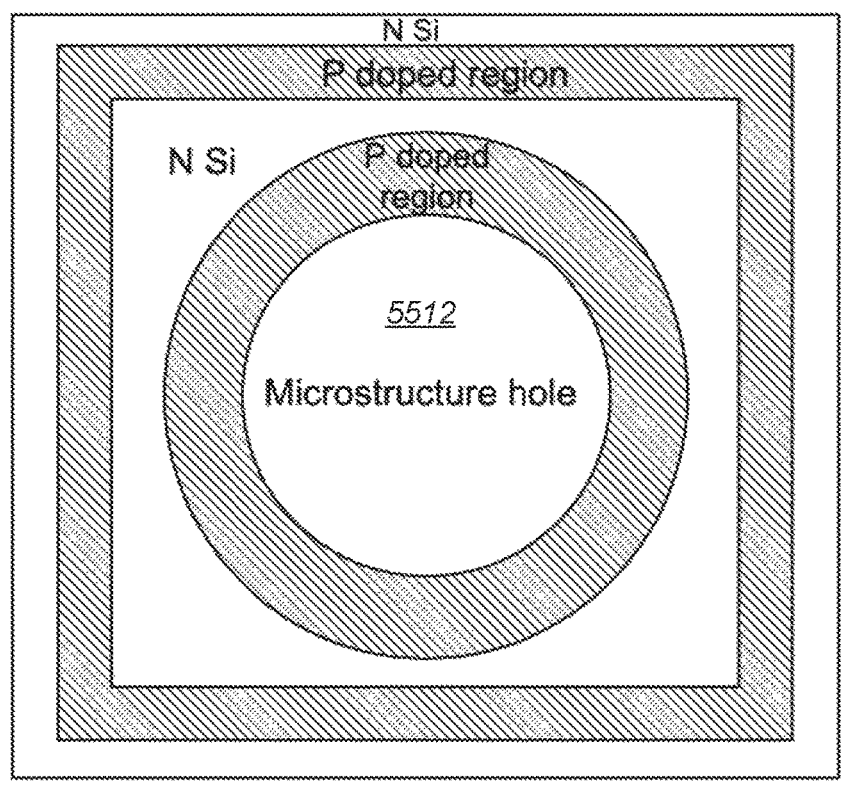
Figure 56A:
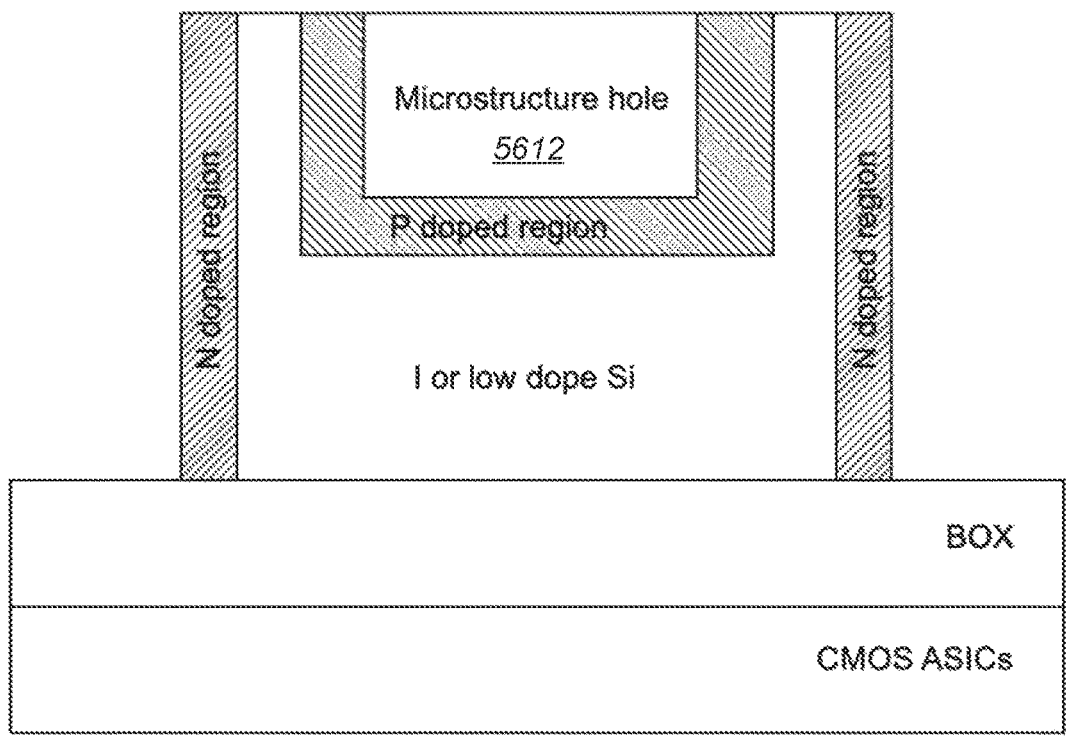
FIGS. 56A and 56B are simple partial schematics of a cross section and top view, respectively, of a BICIS pixel with one or more microstructure holes, according to some embodiments.
Figure 56B:
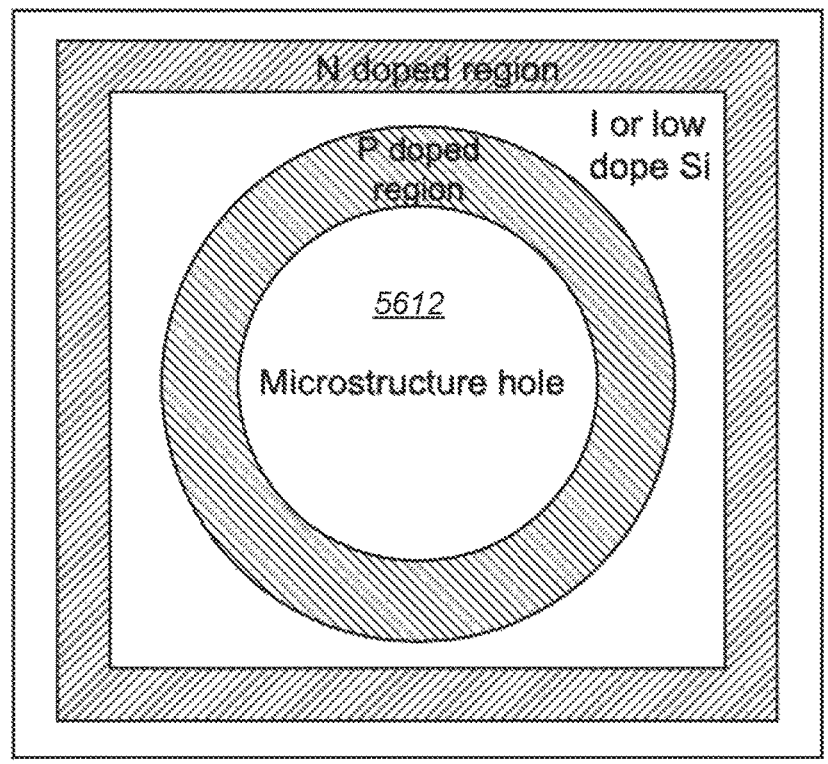

FIGS. 55A and 55B are simple partial schematics of a cross section and top view, respectively, of a pixel phototransistor with a different doping configuration, according to some other embodiments. Shown is another example of a PNP pixel transistor with one or more microstructure holes 5512 for a BICIS that can operate both as a conventional image sensor or a 3D image sensor. The wavelength of impinging photons can range from 400 to 1100 nm, and in some cases with hyper doping the wavelength can extend beyond 1100 nm, and in some cases to 2000 nm FIGS. 56A and 56B are simple partial schematics of a cross section and top view, respectively, of a BICIS pixel with one or more microstructure holes, according to some embodiments. In some cases, the pixel can have a single microstructure hole. The doping regions consist of both P and N type, and the handle substrate can be I or low dope P or N. In this example the side walls of the holes are doped P type, and the side wall of the pixel are doped N type. The doped regions can form PIN or PN junctions, and in some cases with additional doped regions can form a PIPN region, and in some cases PIPIN junction, and in some cases the P and N can be interchanged. Under a reverse bias between the P and N regions the device can operate as a PD, APD, or SPAD with appropriate CMOS electronic circuitries such that the electronics can enable electrical signals to form an image or 3D image on a screen. The voltage range depending whether it is a PD, APD, or SPAD can range from 0.1 volt to 35 volts, and in some cases 0.1 volts-15 volts. The impinging photon wavelength can range from 400 to 1100 nm, and in some cases with hyper doping and with or without texturing within the microstructure hole the wavelength can be extended beyond 1100 nm, and in some cases to 2000 nm.

Figure 57:
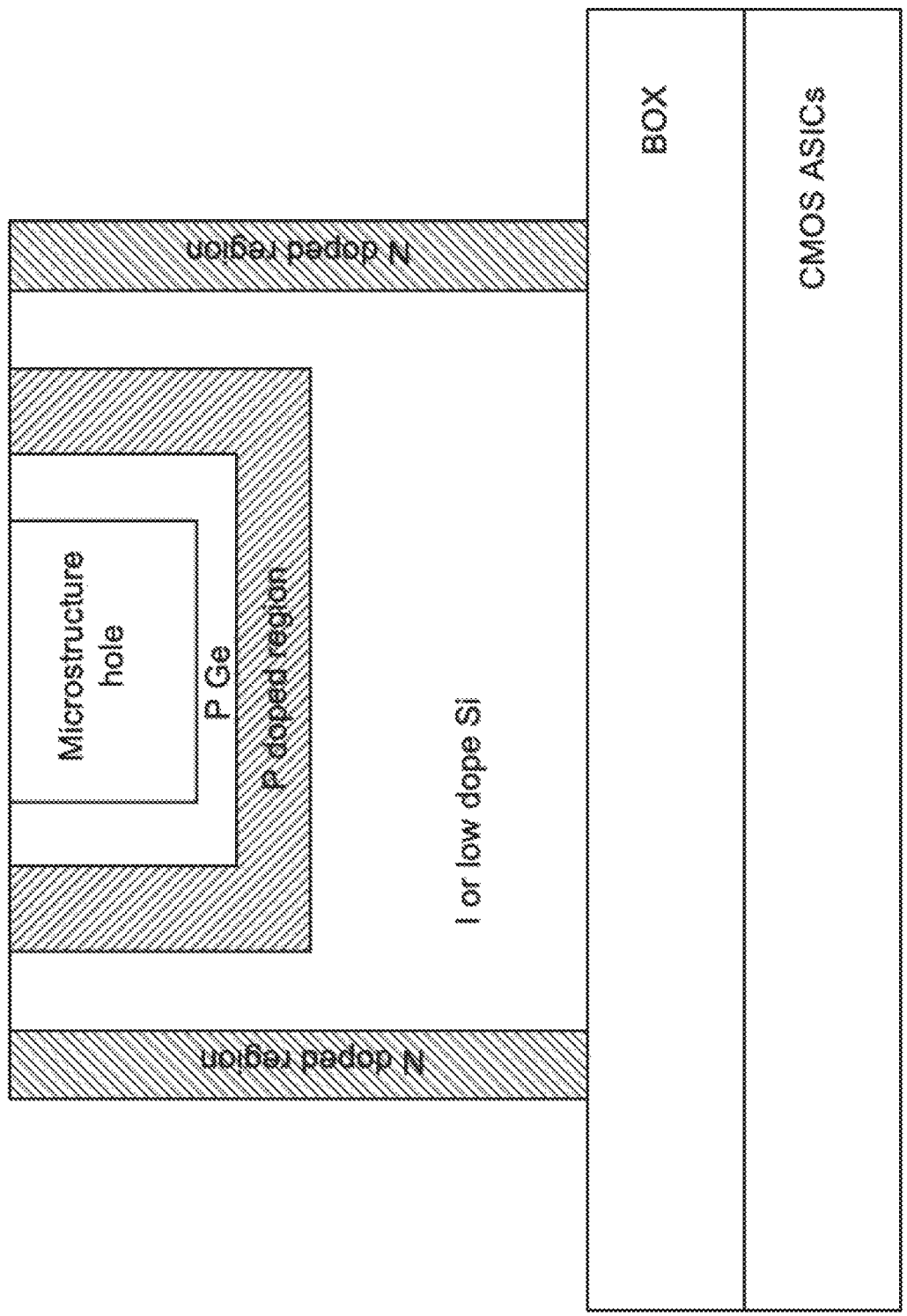
FIG. 57 is a simple partial cross section schematic diagram of a single pixel, according to some embodiments.

FIG. 57 is a simple partial cross section schematic diagram of a single pixel, according to some embodiments. For simplicity, for BICIS imaging amorphous Ge can be deposited within the microstructure hole, and it can be crystallized into crystalline or polycrystalline Ge using high powered pulsed laser as in reference, Schmelz et al, Black-silicon-structured back-illuminated Ge-on-Si photodiode arrays, SPIE 2019, where the Ge can be hyper doped and/or textured to improve its absorption efficiency, and in some cases can extend the wavelength beyond the Ge bandgap. P and N doping regions are shown as an example, other P and N doping configurations and in some cases, multiple P and N doped regions can be used to operate the pixel as a PD, APD, SPAD under reverse bias ranging from 0.1 volts to-35 volts, and in some cases from 0.1 volts-10 volts. Doping can be monopolar with an opposite doped handle layer to form NPN or PNP phototransistor pixels as discussed above. Other examples of doping that are known in the arts can be used for phototransistors, PD, APD, SPAD and in some cases photoconductors. The wavelength range of impinging photons can be from 400 nm to 2000 nm, and in some cases beyond 2000 nm.

Figure 58A:
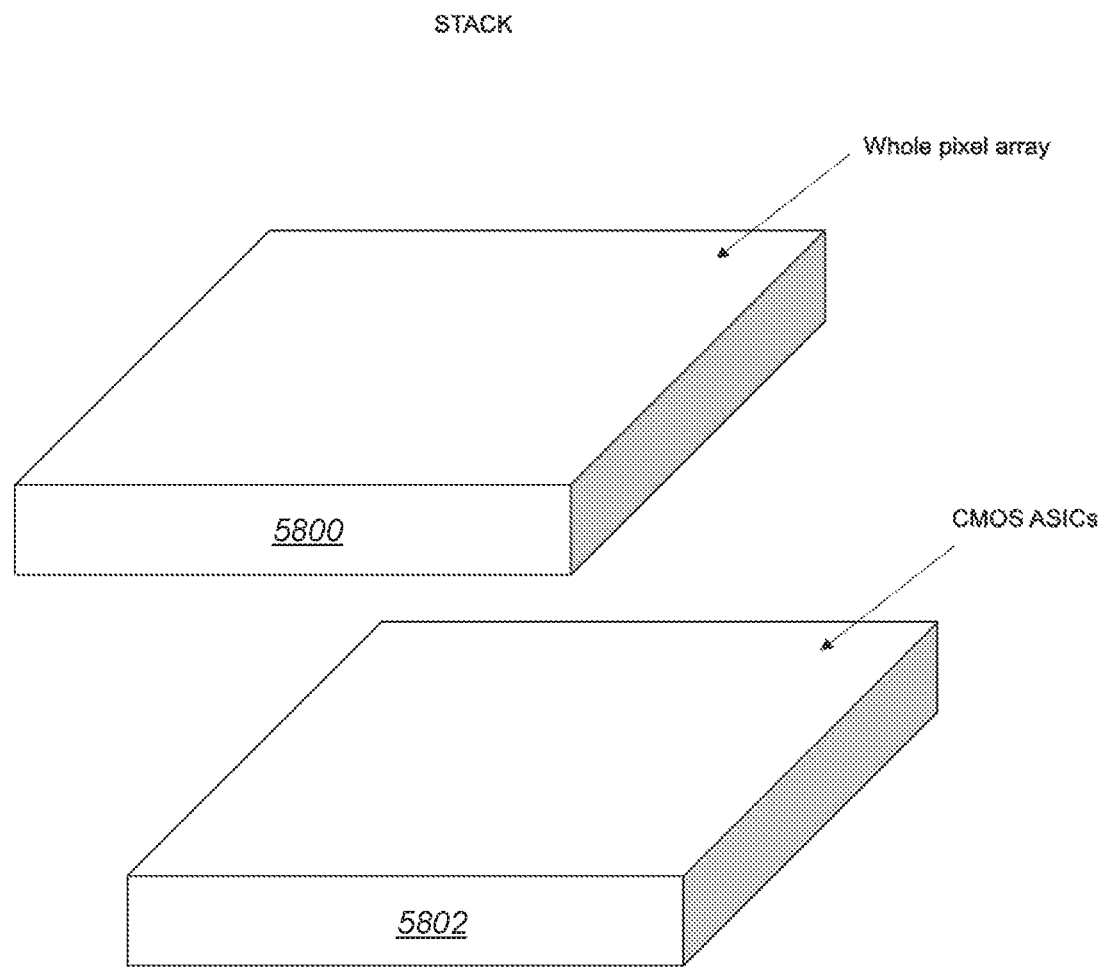
FIG. 58A is a simple partial schematic diagram of stacking photosensor wafer with CMOS ASICs wafer, according to some embodiments.

FIG. 58A is a simple partial schematic diagram of stacking photosensor wafer with CMOS ASICs wafer. The photosensor wafer 5800 for CMOS imaging can include arrays of pixels with pixel lateral dimension ranging from 0.3 microns to 3 microns for high resolution CMOS image sensors that can be used for ToF applications. The pixels can be PD or APD or SPAD or phototransistors depending on the application. The CMOS ASICs wafer 5802 can consist of electronics for image processing and/or ToF image processing, and any other electronics necessary to complete the back side illuminated CMOS image sensor.

In some cases, the optical sensors in the sensor wafer can have lateral dimensions ranging from 10 microns to 100 microns or more for applications in autonomous vehicle LiDAR. The array can have a size ranging from 100 pixels to 10,000 pixels or more.

In some cases, the sensor wafer can include high-speed PD/APDs for optical data communications with photodetector lateral dimensions ranging from 5 microns to 30 microns or more, and the array of photodetectors can range from 10 to 100 or more. The CMOS ASICs electronics can be transimpedance amplifiers, clock recovery circuits, and any other electronics used to process high speed digital signals for optical data communications for applications such as data centers for example. Reference Lhostis et al, Reliable 300 mm Wafer Level Hybrid Bonding for 3D Stacked CMOS Image Sensors, 66th Electronic Components and Technology Conference IEEE 2016; Kagawa et al, Novel Stacked CMOS Image Sensor with Adanced Cu2Cu Hybrid Bonding, 978-1-5090-3902-9/16, IEEE2016 showing state of the art stacking of pixel array wafer with CMOS electronics to form single unit CMOS image sensor chip.

Reference Lee 2 et al, A Back-Illuminated Time-of-Flight Image Sensor with SOI-Based Fully Depleted Detector Technology for LiDAR Application, Proceedings, 2018, 2,798, shows BSICIS time-of-flight image sensor on SOI using fully depleted layers for LiDAR applications.

Figure 58B:
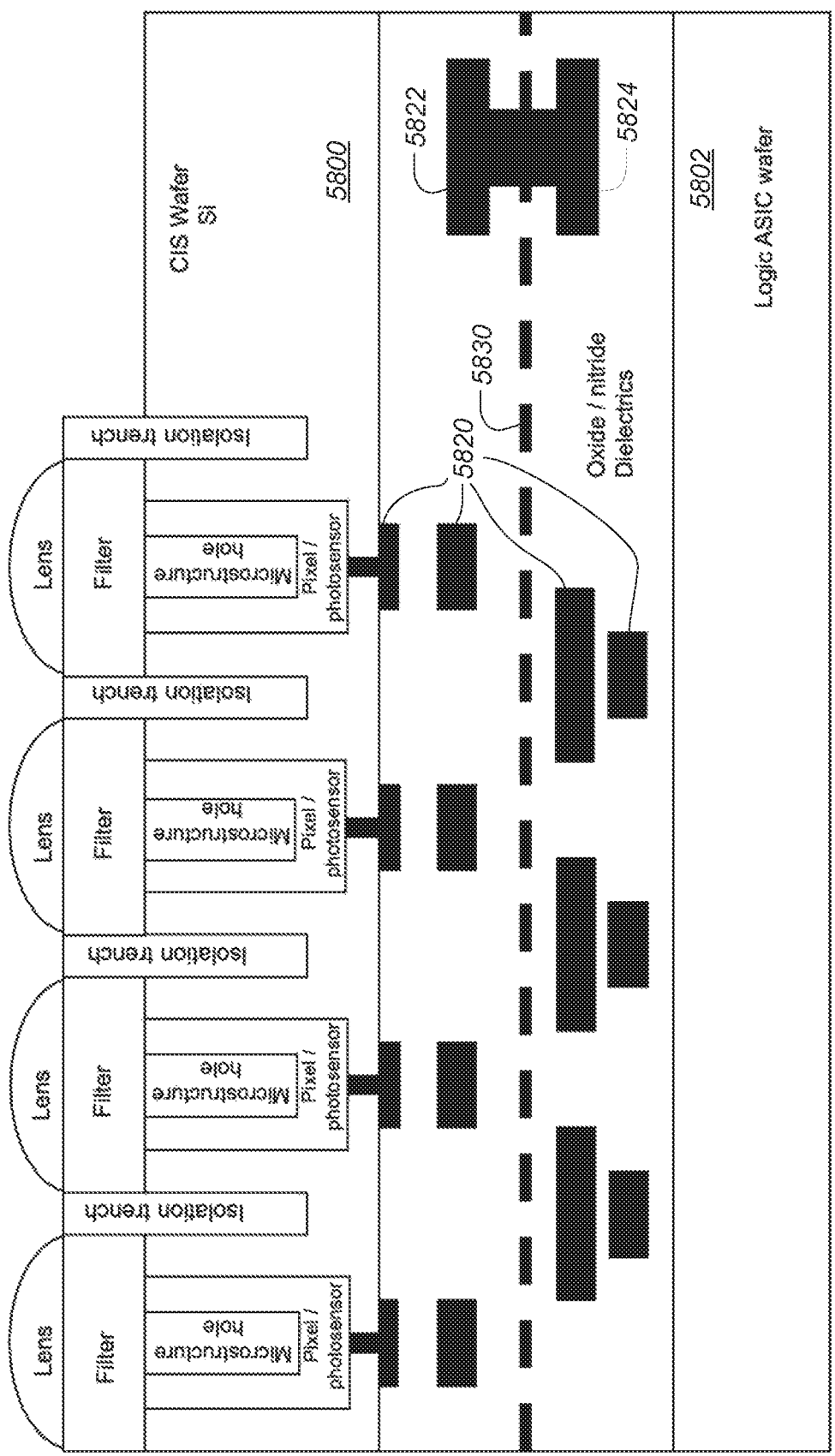
FIGS. 58B and 58C are partial simple schematic cross section diagrams of a stacked back illuminated CMOS image sensor, according to some embodiments.
Figure 58C:
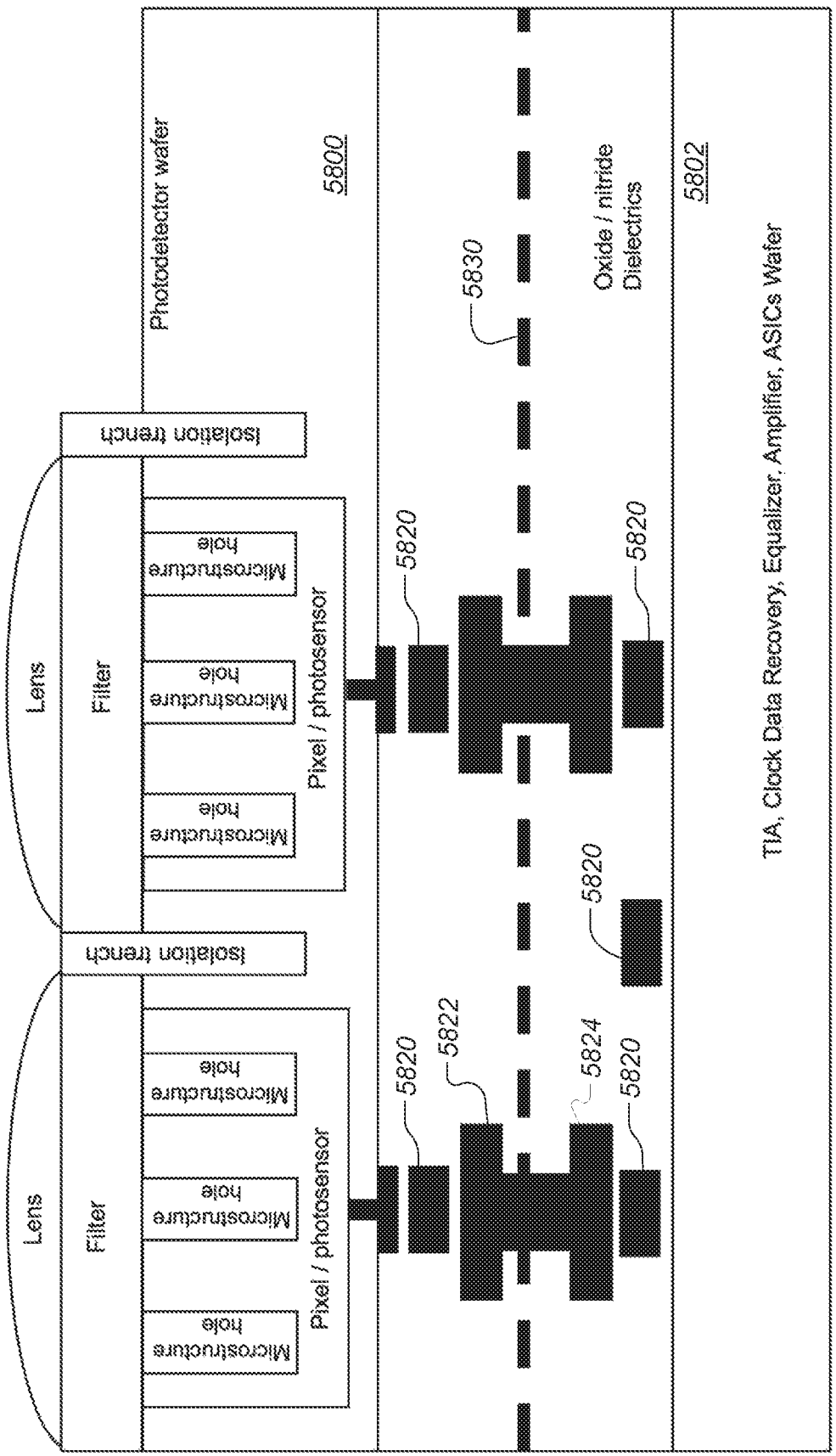

FIGS. 58B and 58C are partial simple schematic cross section diagrams of a stacked back illuminated CMOS image sensor, according to some embodiments. In FIG. 58B, the sensor wafer 5800 is fabricated separately from the logic ASICs wafer 5802 and then bonded together (along dashed line 5830) where metal electrodes 5822 and 5824 such as copper or copper alloy are bonded at the interface. Also shown are connecting electrodes 5820. See reference Hasegawa et al, A new 0.8μ,m CMOS image sensor with low RTS noise and high full well capacity https://www.imagesensors.org/Past%20Workshops/2019%20Workshop/2019%20Papers/R02.pdf. CMOS image sensors with pixel size as small as 0.8 micron×0.8 micron are shown. Inn this patent specification a microhole can be formed in the small pixel. The microhole can be an inverted pyramid with lateral dimensions ranging from 0.8 microns to 0.6 microns for example and in some cases 0.8 microns to 0.4 microns, and in some cases 0.7 microns. In addition, the microhole can be cylindrical with lateral dimensions ranging from 0.7 microns to 0.4 microns that can be etched partially or fully in the Si wafer and in addition the microhole can be along a diagonal of the pixel, and in some cases along both diagonals forming a cross. The microhole can be of any shape for example oval, polygonal, amoebic, circular, to name a few. The depth of the hole can range from $1/10^{th}$ the thickness of the Si to $8/10^{th}$ the thickness of the Si and in some cases can etch through the Si to the oxide or dielectric layer. The CIS wafer (CMOS image sensor wafer) can have a thickness ranging from 3 microns to 0.1 microns and in some cases 3 microns to 1 micron, and in some cases 5 microns to 3 microns. The Photosensor can be a photodiode, APD, SPAD, phototransistor, photoconductor, depending on the doped regions of N type and/or P type, and can have multiple doped regions of N type and/or P type.

FIG. 58C, is similar to FIG. 58B but with larger photodetectors that can be photodiodes, APD, SPAD, Phototransistors, for applications in optical communications and/or LiDAR. In the case of high data rate for optical communications such as 56 Gb/s to 112 Gb/s or higher the CMOS ASICs such as transimpedance amplifier (TIA) clock data recovery circuits, equalizers, amplifiers are fabricated on SOI wafers with device layer thickness ranging from 5-25 nm approximately. The photodetector wafer can have a thickness ranging from 0.1 to 3 microns and can have detector lateral dimensions ranging from 5 microns to 100 microns, and in some cases greater than 100 microns. For high speed photodetectors of 25 Gb/s or more, the lateral dimension of the photodetector can range from 5 microns to 30 microns and can be a circular photodetector to match the optical fiber for example. Arrays of high-speed photodetectors with array size ranging from n×m where n and m can be integers ranging from 1 to 100. Using stacked technology where the photodetector wafer and the CMOS ASICs wafer are fabricated separately and then bonded together allows for a reduction in parasitics, and can significantly improve the performance of the high speed optical receiver. Wavelengths can range from 700 nm to 1100 nm for Si photodetectors and with the addition of Ge on Si and/or Ge alloys on Si the wavelength range can be extended to 1700 nm.

For LiDAR applications and/or LiDAR imaging applications the square pixel photodetector can have a lateral dimension ranging from 5 to 500 microns, and in some cases greater than 500 microns, and can have array sizes ranging from 10×10 to 1000×1000, and the photodetector can be a photodiode, APD, SPAD and/or phototransistor with rise time ranging from a few picoseconds to 10s of picoseconds, and in some cases from 0.1 to 50 picoseconds, and in some cases greater than 50 picoseconds. Wavelength range in Si photodetector can range from 800 to 1000 nm, and in some cases 905 nm, with the addition of Ge and/or Ge alloy on Si the wavelength range can be extended to 1700 nm, and in some cases 1550 nm.

Figure 59:
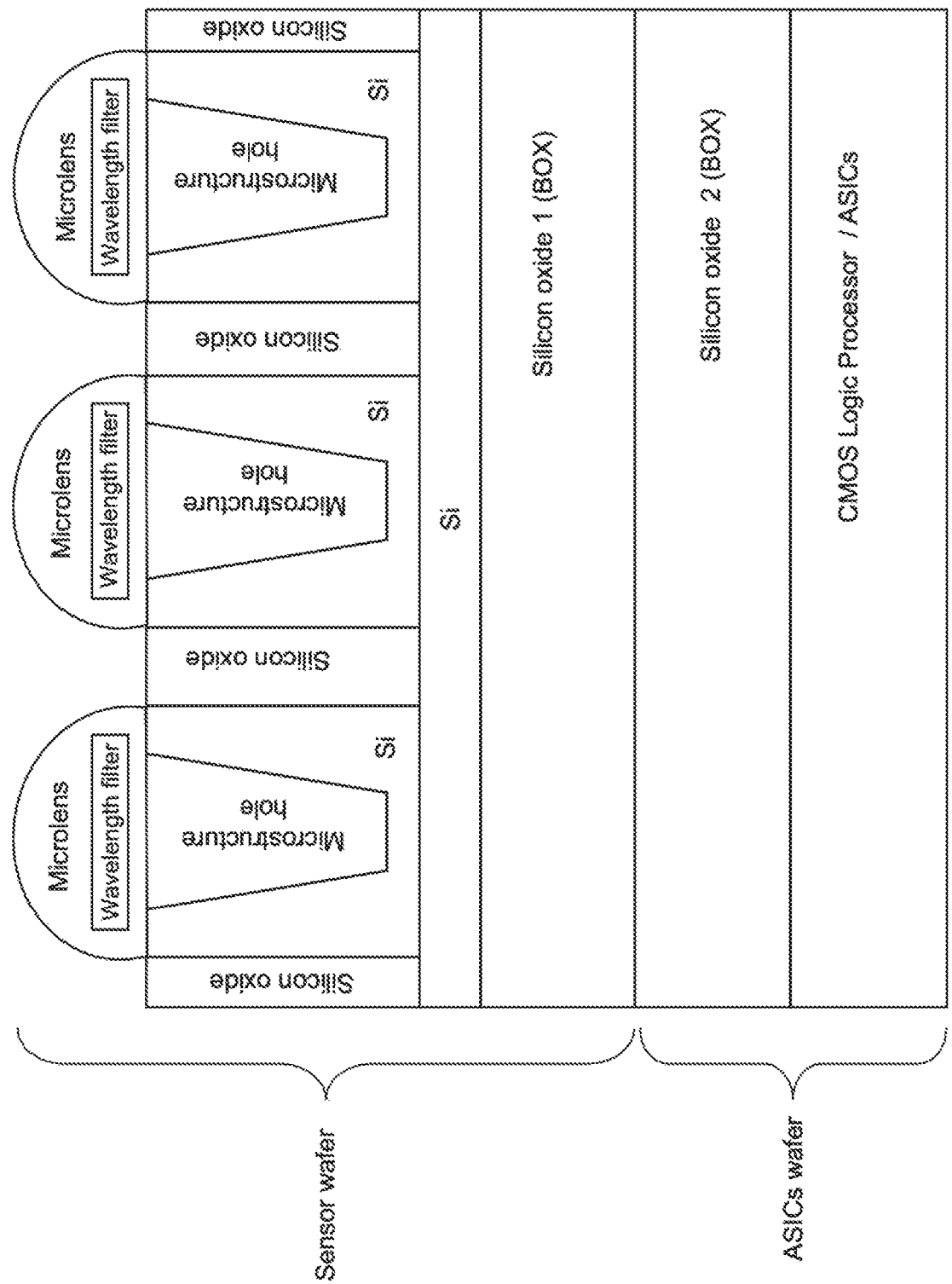
FIG. 59 is a simple partial cross section schematic of a back side illuminated stacked photosensor with microstructure hole/holes, according to some embodiments.

FIG. 59 is a simple partial cross section schematic of a back side illuminated stacked photosensor with microstructure hole/holes, according to some embodiments. In this example, each pixel has a single conical shaped microstructure hole, and in some cases the holes can be cylindrical shaped microstructure holes. The sensor wafer can be fabricated separately from the CMOS ASIC wafer and bonded together to form a single unit sensor chip. Not shown are the connecting electrodes between the CMOS ASICs and the photosensor pixels. Also not shown are the doped regions in the silicon pixel and connecting electrodes to the cathode and anode for PD/APD/SPAD operation or connection to the source and drain contacts for phototransistor operation. Also not shown for simplicity are reflectors on the side walls of the pixel that can be included to confine the trapped light further within the pixel. Also not shown for simplicity are Bragg reflectors that can be included in the silicon oxide 1 layer to further confine the trapped light within the pixel. Wavelength selective filters can be included to select the desired wavelength and the filters can be Bragg filters for example to select wavelengths at 850 or 905 or 940 nm or other wavelengths, and in some cases such filters may not be necessary for color image capture filters such as red, green and blue for example can be included.

For high resolution image capture the pixel later dimensions can range from 0.3 to 3 microns with array sizes ranging from 10 million to 100 million pixels or more. In some cases, for low resolution applications such as for autonomous vehicle LiDAR in certain cases the pixel lateral dimension can range from 3 micons to 300 microns or more and with pixel array size ranging from 1000 to 1 million or more.

The following references, Hasegawa et al, A new 0.8 um CMOS image sensor with low RTS noise and high full well capacity, www.imagesensors.orq, Park et al, A 2.2 um stacked back side illuminated voltage domain global shutter CMOS image sensor, 978-1-7281-4032-2/19, IEEE 2019 Haruta et al, A1/2 0.3 inch 20 Mpixel 3-Layer Stacked CMOS Image Sensor with DRAM, 2017 IEEE International Solid-State Circuits Conference show greater details of known CMOS image sensors using stacking technology. In this patent specification the use of microstructure hole/holes for light trapping can significantly enhance the sensitivities or EQE of near infrared wavelengths, and in some cases the red wavelength also. In addition, with the use of microstructure hole/holes light trapping technology as disclosed in this application, the thickness of Si can be reduced to a range of 100 nm to 3000 nm, and in some cases 1000 nm-3000 nm for the Si photosensors which can greatly improve spatial resolution, reduce cross talk, and reduce manufacturing costs.

The deep trench isolation etch separating the pixels can be partially etched into the Si layer to a depth of ½ the thickness of the Si layer and in some cases ⅔ the thickness of the Si layer, and in some cases through the Si layer to the Si oxide or BOX layer.

Figure 60A:
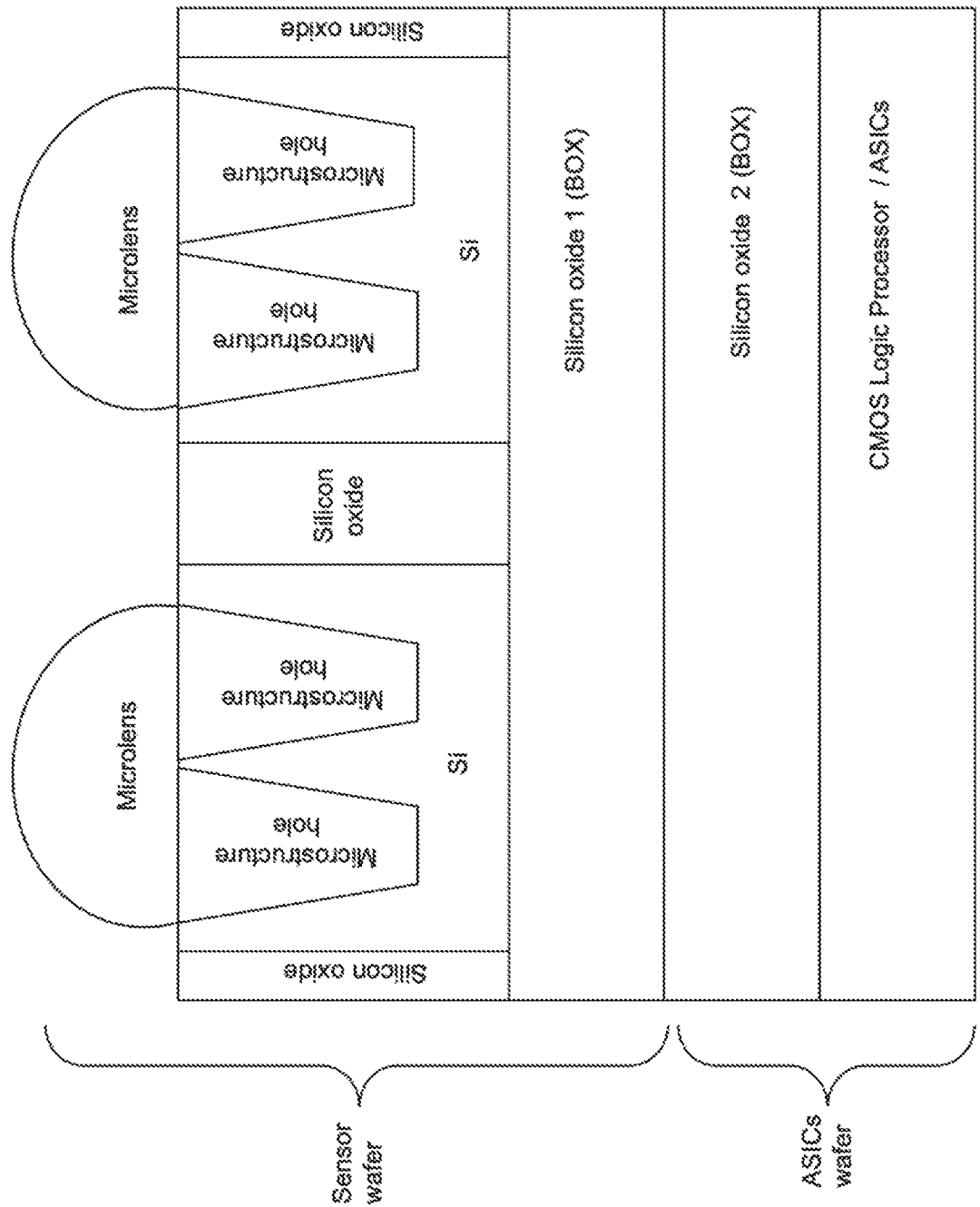
FIGS. 60A and 60B are simple partial cross section schematic diagrams of high-speed detectors that can operate in PD or APD mode for data center communications, according to some embodiments.
Figure 60B:
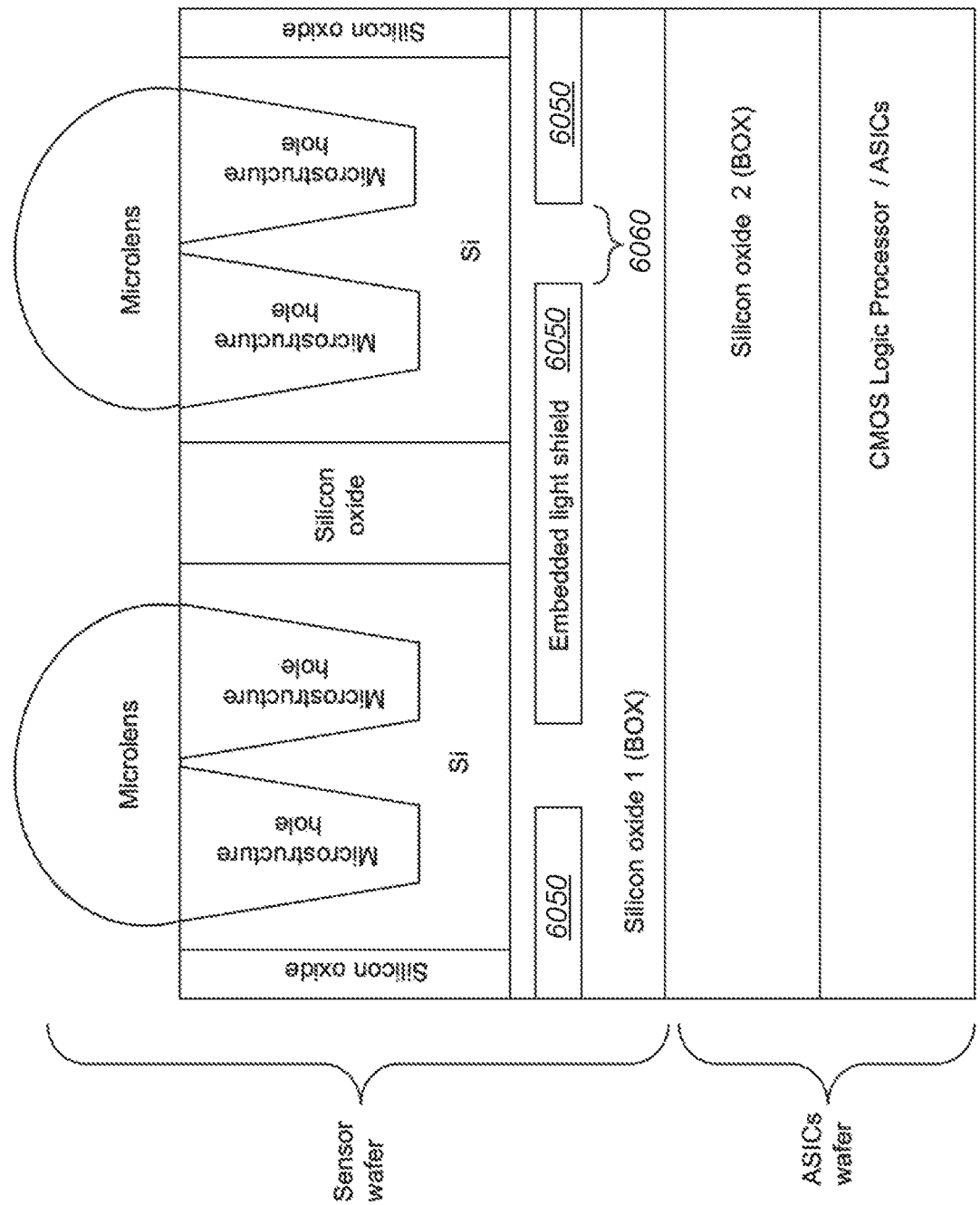

FIGS. 60A and 60B are simple partial cross section schematic diagrams of high-speed detectors that can operate in PD or APD mode for data center communications, according to some embodiments. The photo detectors can have lateral dimensions ranging from 5 microns to 100 microns, and in some cases 3 microns-30 microns, and with array sizes ranging from 10 to 100 or more photodetectors. The high-speed photodetector wafer (sensor wafer) can be fabricated separately from the CMOS ASICs wafer, and the stacked or bonded together to form a single unit. The CMOS ASICs can include electronics such as transimpedance amplifier, limiting amplifier, clock data recovery circuits to name a few, and can operate in PAM-4 (pulsed amplitude modulation) mode. Not shown are connecting electrodes between the CMOS ASICs and the high-speed photodetector, doping regions in the high-speed photodetector, contacts to the anodes and cathodes to name a few for simplicity. At data rates of 56 Gb/s or higher parasitics can reduce performance, reliability and reproducibility but by stacking the high-speed photodetectors with the CMOS ASICs the parasitics can be significantly reduced with improved performance, reproducibility and reliability. In the cross section of FIG. 60A, Si photodetectors are shown. However, Ge/GeSi can be selective area grown on the Si layer to extend the wavelength to 1700 nm for example. The wavelength without Ge/GeSi layer can range from 600 nm to 1000 nm. The microstructure holes can be formed in the photodetector to enhance the EQE. See Reference Takemoto et al, A 50-Bb/s High-Sensitivity (−9.2 dBm) Low-Power (7.9 pj/bit) Optical Receiver Based on 0.18-um SiGe BiCMOS Technology, IEEE Journal of Solid-State Circuits. Vol. 53, No. 5, May 2018, and in addition reference Li (Intel) where the circuits for the optical receiver can be fabricated on one substrate and the high speed photodetectors either Si and/or Ge/GeSi can be fabricated on a separate substrate and can be stacked or bonded together to form a single unit optical receiver with CMOS/BiCMOS ASICs as discussed in these two references.

FIG. 60B shows a simple partial schematic cross section similar to FIG. 60A of a stacked back illuminated CMOS image sensor. In some cases, the structure can be configured as a back illuminated high speed photodetector for data center optical interconnect applications, and in some cases as a back illuminated low jitter photodetector such as PD, APD, SPAD for time-of-flight and LiDAR applications. Prior to stacking, embedded elements 6050 are provided that can include metallic, semi metallic, dielectric reflectors, and in some cases amorphous semiconductor such as Si and/or Ge and/or III-V material that can act as a light shield and/or reflector to prevent light from impinging on the CMOS ASICs. Gaps 6060 in the embedded element or elements 6050 can be included to allow passage of connecting electrodes from the photodetector or photosensor to the CMOS ASICs. The embedded element(s) 6050 can be in the oxide layer of the photodetector/sensor wafer and/or in the oxide layer of the CMOS ASICs wafer.

Figure 61A:
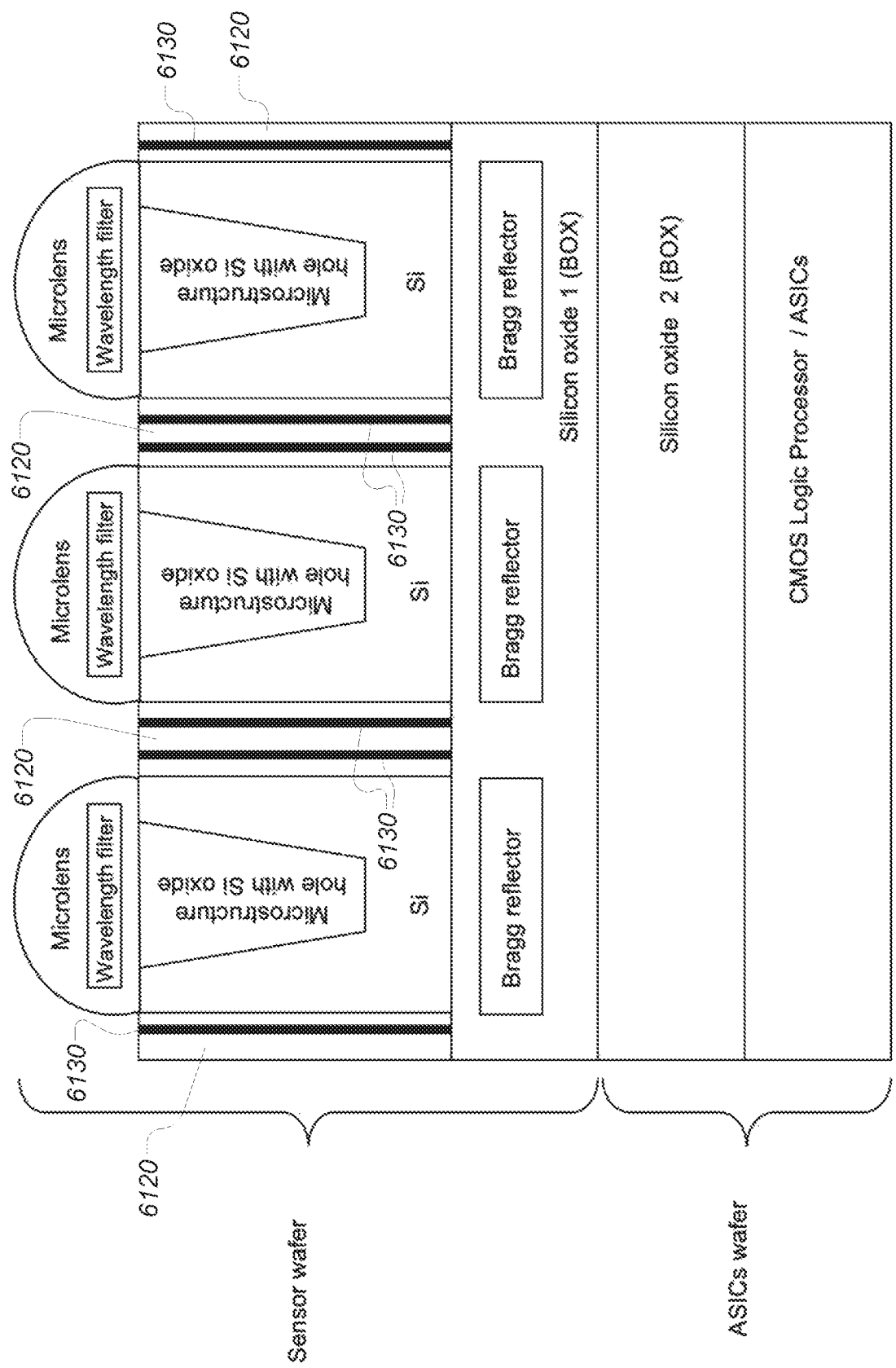
FIG. 61A is a simple partial cross section schematic of pixels with one or more microstructure holes, according to some embodiments.

FIG. 61A is a simple partial cross section schematic of pixels with one or more microstructure holes, according to some embodiments. The holes can be conical in shape and in some cases trapezoidal, and in some cases cylindrical in cross section and the holes surface shapes can circular, oval, polygonal, amoebic, and/or a combination of geometric shapes similar to FIG. 59. The pixels are made of Si with the addition of Bragg reflectors beneath the pixels, and the Bragg reflectors can be fabricated on the Si oxide layer or buried within the Si oxide layer. In addition, the Bragg reflectors can be a continuous set of layers underneath the Si pixels. The Bragg reflectors are alternating dielectric material with different optical refractive indexes which are commonly found in the literature. Further to confine the light within each pixel metal reflectors 6130 can be formed around each pixel, and the metal reflector can have a dielectric layer 6120 such as Si oxide between the metal reflector and the pixel walls. The wavelength selective filters such as Bragg filters for example can be formed above each pixel to select certain wavelengths, for example red, green, blue, and in some cases to select certain NIR wavelengths ranging from 800 to 1000 nm. Reference Sumi et al, Next-generation Fundus Camera with Full Color Image Acquisition in 0-1× Visible Light by 1.12-micron Square Pixel, 4×, 30-fps BSI CMOS Image Sensor with Advanced NIR Multi-spectral Imaging System, Symposium on VLSI Technology Digest of Technical Papers, 2018 (hereinafter the "Sumi Reference"), shows a BSI CIS where full color was recreated using 3 NIR wavelengths in total darkness. For example, the wavelength selective filter can select 3 NIR wavelengths and create a color image in total darkness. See Reference Cao et al, A Two-Tap NIR Lock-In Pixel CMOS Image Sensor with Background Light Cancelling Capability for Non-Contact Heart Rate Detection, Symposium on VLSI Circuits Digest of Technical Papers, 2018, showing further examples of CIS applications. Reference Oike et al, An 8.3 M-pixel 480 fps Global-Shutter CMOS Image Sensor with Gain-Adaptive Column ADCs and 2-on-1 Stacked Device Structure, Symposium on VLSI Circuits Digest of Technical Papers, 2016, shows multiple stacking and details of the CMOS ASICs.

As shown in the Sumi reference, color images can be re-created using 3 infrared wavelengths in complete absence of visible light. This method can be applied to night vision with applications in security cameras, and in some cases to advanced driver assistance systems (ADAS) where the object can be illuminated by a single or multiple IR wavelength and then detected with BSICIS with wavelength selective filters at those IR wavelengths. The IR wavelengths in some cases can penetrate fog, rain, particularly at wavelengths from 800 to 1550 nm and in some cases to 2000 nm, significantly better than at wavelengths of 400-700 nm. This method can be used for imaging and in some cases can be used for Time-of-Flight imaging. Multiple BSICIS cameras can be used in ADAS for 3D imaging.

Deep trench isolation can be used to electrically and optically isolate adjacent pixels or Photosensors from electrical and/or optical cross talks. In some cases, metal can be further used for optical cross talk isolation between adjacent pixels or Photosensors and in some cases only certain pixels may require the addition of metal in the deep trench isolation to reduce optical cross talk.

Figure 61B:
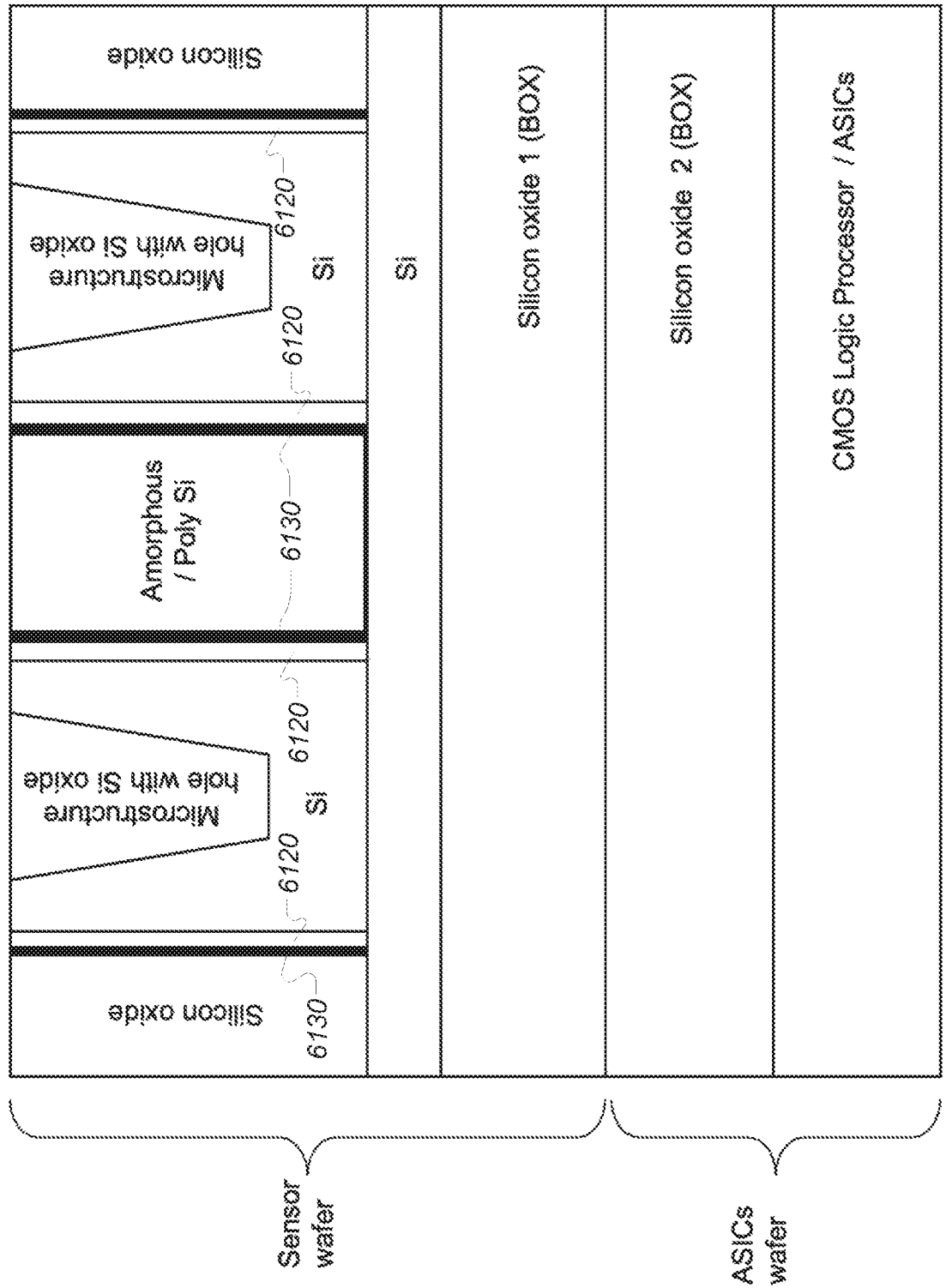
FIGS. 61B and 61C are partial simple cross section schematic diagrams of a small pixel of a photosensor devices, according to some embodiments.
Figure 61C:
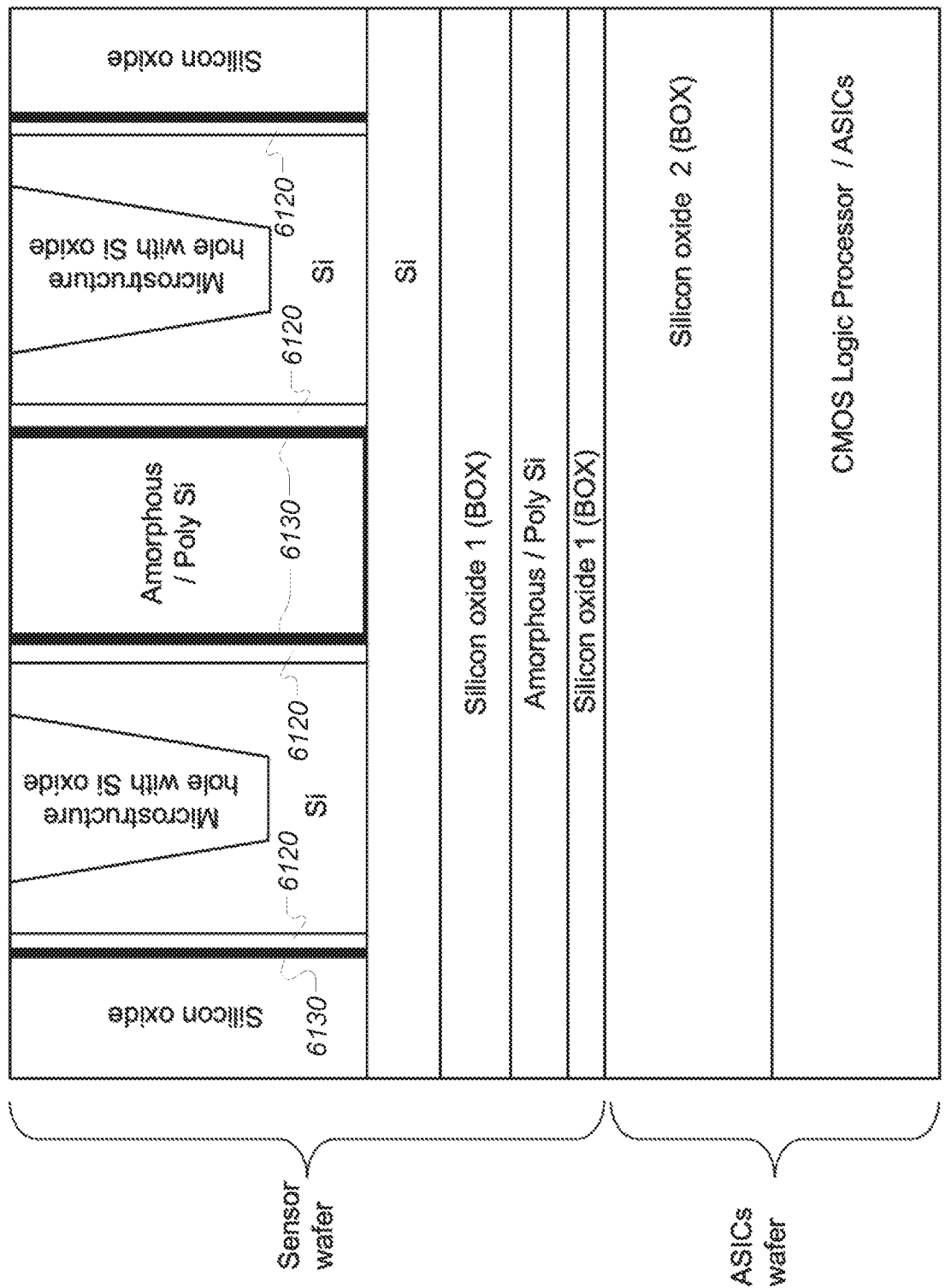

FIGS. 61B and 61C are partial simple cross section schematic diagrams of a small pixel of a photosensor devices, according to some embodiments. The pixels can have lateral dimensions 3 micron×3 micron or less, and in some cases 1.12 micron×1.12 micron with a single microstructure hole that can be filled with Si dioxide and the deep trench isolation etch can extend partially into the Si and in some cases can extend entirely through the Si. As in the case of FIG. 61A, in FIG. 61B the pixel or Photosensor can have a metal reflector 6130 around its perimeter and, where the metal reflector is not in contact with the Si, can be separated from the Si by a thin layer of dielectric 6120 such as Si dioxide for example, and the space between the pixels or Photosensors can be filled with a light absorbing material such as amorphous Si, polycrystalline Si, amorphous Ge, Carbon, Poly Carbon, Graphene to name a few to absorb stray light that can be from adjacent pixels to further reduce cross talk between adjacent pixels or Photosensors.

FIG. 61C is similar to FIG. 61B with the addition of a light absorbing layer beneath the pixels or Photosensors to block stray light impinging on the CMOS ASICs. This light blocking layer can be amorphous or poly crystalline Si, amorphous Ge, carbon, poly carbon, or graphene for example.

Figure 61D:
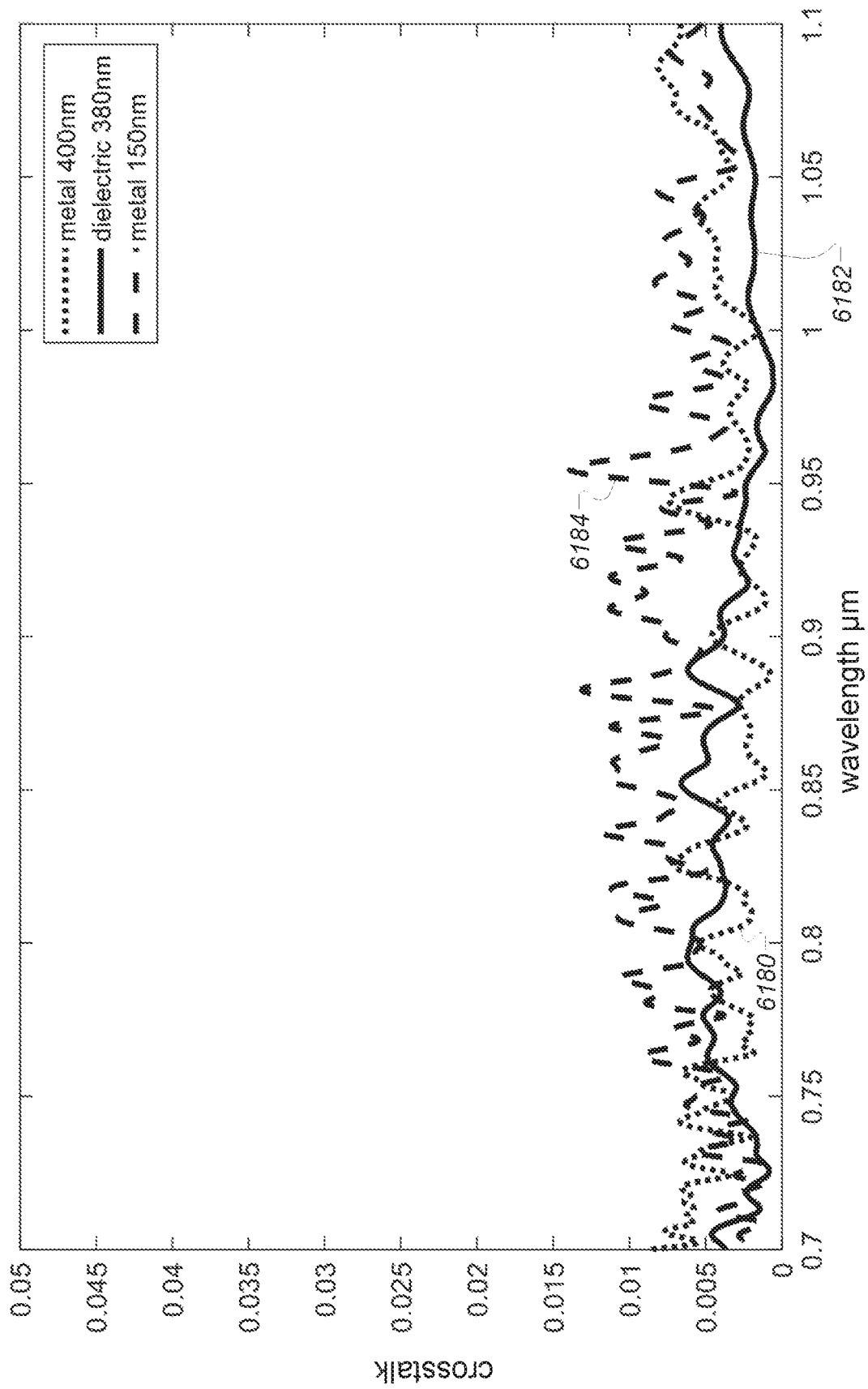
FIG. 61D is a plot showing a simulation of cross talk vs wavelength between adjacent pixels, according to some embodiments.

FIG. 61D is a plot showing a simulation of cross talk vs wavelength between adjacent pixels, according to some embodiments. The cross talk is the amount of optical power that leaks from one pixel to the adjacent pixel. Cross talk is an important factor for CMOS image sensors which directly affects contrast which is one of the key elements of modulation transfer function (MTF) of image sensors. The pixel size in the simulation is 1.12 micron×1.12 micron square, and a 900 nm cylindrical hole is etched into the Si to a depth of 2 microns and the cylindrical hole is filled with Si dioxide. The thickness of the Si is 3 microns on a Si dioxide layer. A deep trench isolation etch is formed between pixels, and the simulation shows three examples of ways to mitigate cross talk between adjacent pixels. The solid curve 6182 shows a trench width of 380 nm filled with Si dioxide where the width was selected as a nominal half wavelength at approximately 1 micron wavelength such that any optical field leak from the pixel is partially reflected from the adjacent pixel in approximately destructive interference. The dotted curve 6180 shows a 400 nm isolation trench width that is filled with metal as a reflector, and the dashed curve 6184 shows the case of 150 nm isolation trench width filled with metal. As can be seen from the set of curves the cross talk can be approximately 1% (shown as 0.01 in the figure) over the wavelength range of 700 nm-1100 nm.

Figure 62:
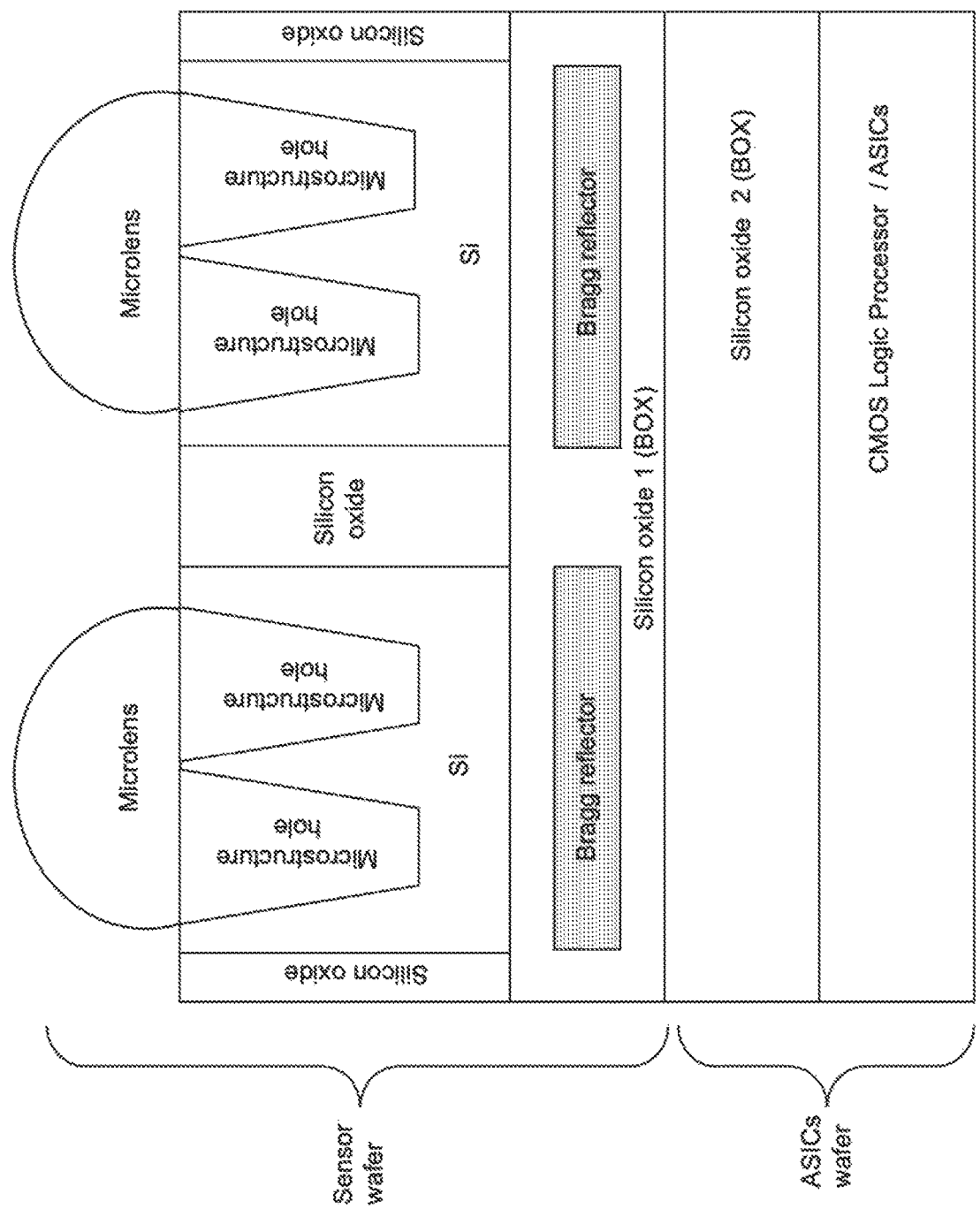
FIGS. 62 and 63 are simple partial cross section schematic diagrams of photodetector configurations, according to some embodiments.

FIG. 62 is a simple partial cross section schematic diagram of a photodetector configuration, according to some embodiments. The structure shown in FIG. 62 is similar to that shown in FIGS. 60A and 60B with the exception that Bragg reflectors can be formed under each photodiode or APD. In some cases, metal reflectors can be used. Not shown are the connecting electrodes to the photodetector from the CMOS/BiCMOS ASICs, nor are the doping regions of P and N type. The doping regions examples have been discussed in this application.

Incident photons impinging on the photodetector on the surface with the microstructure holes and microlens can result in an enhanced IR sensitivity due to the microstructure holes behaving as a low Q resonator and in the case of multiple microstructure holes can be coupled low Q resonators with Q factor ranging from 5 to 50, and in some cases 2-30, and in some cases greater than 50. The bottom Bragg reflector can reflect photons that exit from the photodetector back into the microstructure hole photodetector. The bottom Bragg reflector can also keep photons from impinging on the CMOS/BiCMOS ASICs. In some cases, the Bragg reflector can be continuous across the bottom surface.

Not shown are doping regions, for simplicity. The doping regions can be conformal to the microstructure hole and can be N or P doped, and in some cases each microstructure hole can have opposite polarity conformal doping; for example one hole can be conformally doped N, and another hole can be conformally doped P. Other doping examples can include PNP, NPN doping for a phototransistor where the microstructure holes can be conformally doped N, and the Si can be P type. In addition, doping configurations such as PN, PIN, or PIPN for APD and SPAD applications. In some cases, Si can be fully depleted, and P and N junctions can be formed where P or N can be conformally doped in the microstructure hole, and N or P formed in a separate region in the Si. A reverse bias can be applied between the anode (P) and cathode (N).

In some cases, the Ge layer can be GeSi and/or GeSn and/or GeSiSn and/or any combination thereof, and in some cases multiple layers of such combinations can be used to absorb incident photons. In some cases multiple quantum wells (MQW) can be used to absorb incident photons with wavelengths up to 2000 nm for example, see reference Zhou et al, High-efficiency GeSn/Ge multiple-quantum-well photodetectors with photon-trapping microstructures operating at 2 um, Optics express Vol. 28, No. 7/30 Mar. 2020. This structure of Ge/GeSi/GeSn/GeSiSn single or multiple layers can be used for CMOS image sensors, Time-of-Flight CMOS image sensors and optical receivers for data centers for example. The structure of Ge/GeSn/GeSi/GeSiSn on Si can be doped for PD/APD/SPAD photodetectors. And in some cases, the doping for example PNP or NPN can be used for phototransistors operation. As discussed herein supra, guard rings can be formed for APD/SPAD photodetectors and P and N doping can be a PN junction, PIN junction, PIPN junction, and in some cases multiple regions of P and N doping.

Figure 63:
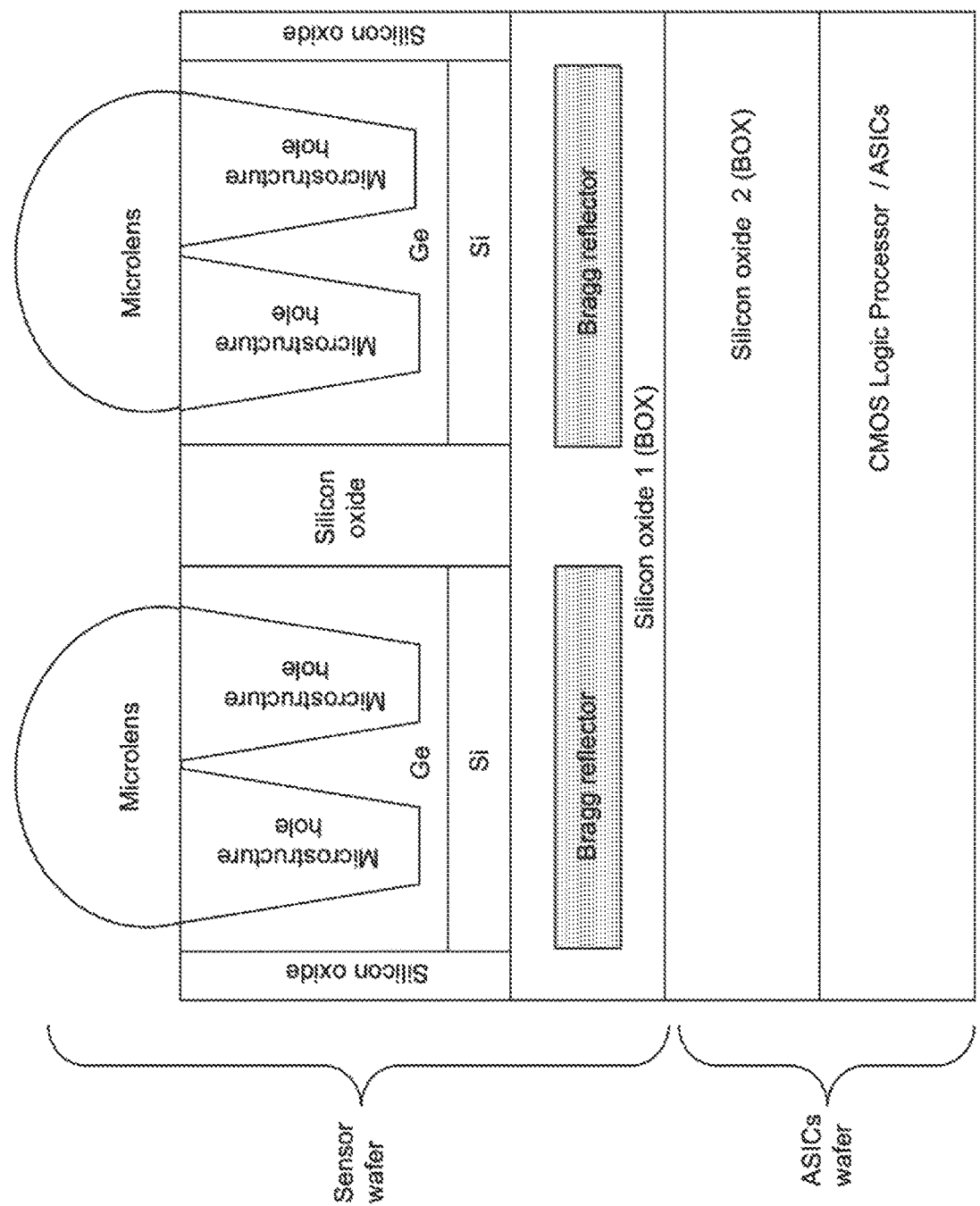

FIG. 63 is a simple partial cross section schematic of pixels for image sensors and/or high-speed photo detectors for optical data communication, according to some embodiments. The photo detectors for optical data communication can be for wavelengths ranging from 800 to 1700 nm, and in some cases 400-1700 nm. The extension of the wavelength can be accomplished with the addition of Ge and/or GeSi that can be selective area grown on Si. The microstructure hole/holes are formed in the Ge. The doping can be such that a P dopant region is formed in the Ge, and an N dopant region is formed in the Si for a PD/APD/SPAD operation. In addition, the P and N regions can be interchanged and there can be multiple P and N regions with different doping densities. For example, the P dopant can follow the contour of the microstructure hole and the N dopant can be in the Si layer. A reverse bias can be applied to the P and N region to operate in the PD mode, and with a higher bias can operate in the APD/SPAD mode. The bias voltage can range from 0.1 volt to 10 volts, and in some cases 0.1 volt-15 volts or higher. Not shown are connecting electrodes between the CMOS/BiCMOS ASICs to the photosensor arrays, wavelength selective filters, cathode and anode contacts to name a few.

In some cases, the pixel and/or high speed photodetector can operate in a phototransistor mode where a bias can be applied to the source and drain.

Pixels and/or photodetectors with microstructure holes can have a higher EQE than comparable pixels and/or photodetectors at certain wavelengths, in the wavelength range of 800-1700 nm.

As shown, the photosensors are fabricated on a separate wafer than the CMOS/BiCMOS ASICs, electronics, and the 2 wafers are stacked or bonded at the oxide interface to form a single chip consisting of pixels and/or high speed photodetectors with CMOS/BiCMOS electronics.

Reference Song et al, High efficiency resonant-metasurface germanium photodetector with ultra-thin intrinsic layer, arxiv.org, 2019 shows thin Ge on Si high speed photodiode using microhole arrays to enhance absorption and therefore the sensitivity or EQE. In this patent specification photodetector with very small lateral dimension for example 5 microns×5 microns or less, and in some cases 1 micron×1 micron, a single microhole can be used to enhance EQE over a comparable photodetector without microholes at certain wavelengths in the wavelength range from 800-2000 nm. In some cases, multiple microholes can be used but not in a periodic array and in some cases can be arranged randomly. In some cases, the microholes can have different lateral dimensions within a single photodetector or pixel. The high-speed Ge on Si PD array can be back surface illuminated and stacked with CMOS ASICs for further signal processing and communication. In some cases, the Ge on Si back surface illuminated PD array can be monolithically integrated with CMOS ASICs in a single chip.

The photodetector/sensor can include 1 or more of the following materials, Si, Si alloys, Ge, Ge alloys, quantum well of such alloys, or any combination of such material and can include one or more regions of doping of N or P type dopants to form PIN, PIPN, PN, PIPIN, NIN, PIP, NPN, PNP type of junctions in the photodetector/sensor, and in some cases within single array photodetector/sensor can have different doping schemes, for example 1 photodetector/sensor can be a phototransistor, and another can be an APD/SPAD/PD and/or photo conductor. In some cases no doping or very low doping or intrinsic structures can be used and metal contacts or metal silicide contacts can be used to form Schottky junctions.

Figure 64A:
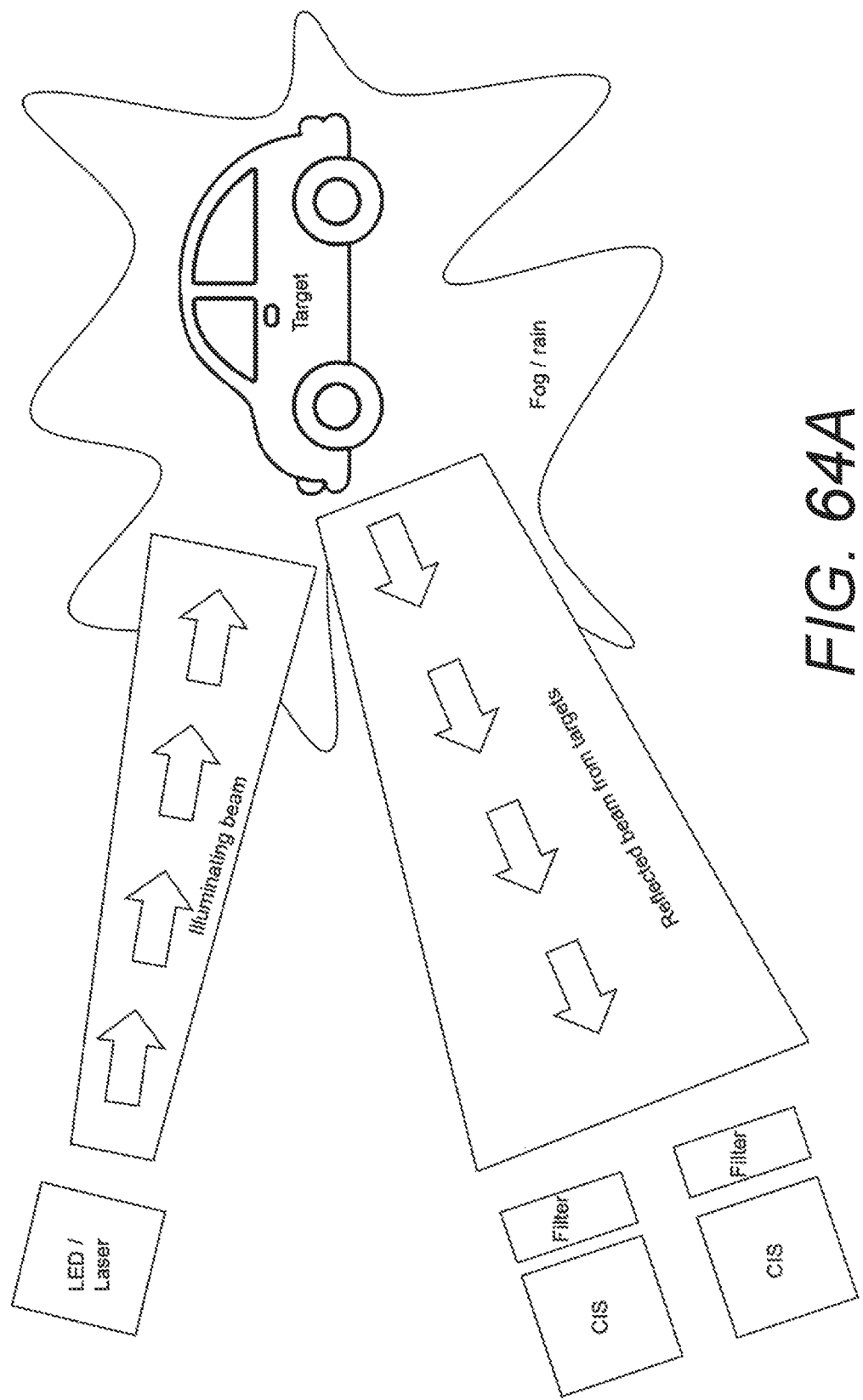
FIGS. 64A and 64B are diagrams illustrating aspects applications of BSICISs at NIR wavelengths and BSICISs with multiple arrays where each array can be a different type of photosensor, for example PD, APD, SPAD or phototransistors, according to some embodiments.
Figure 64B:
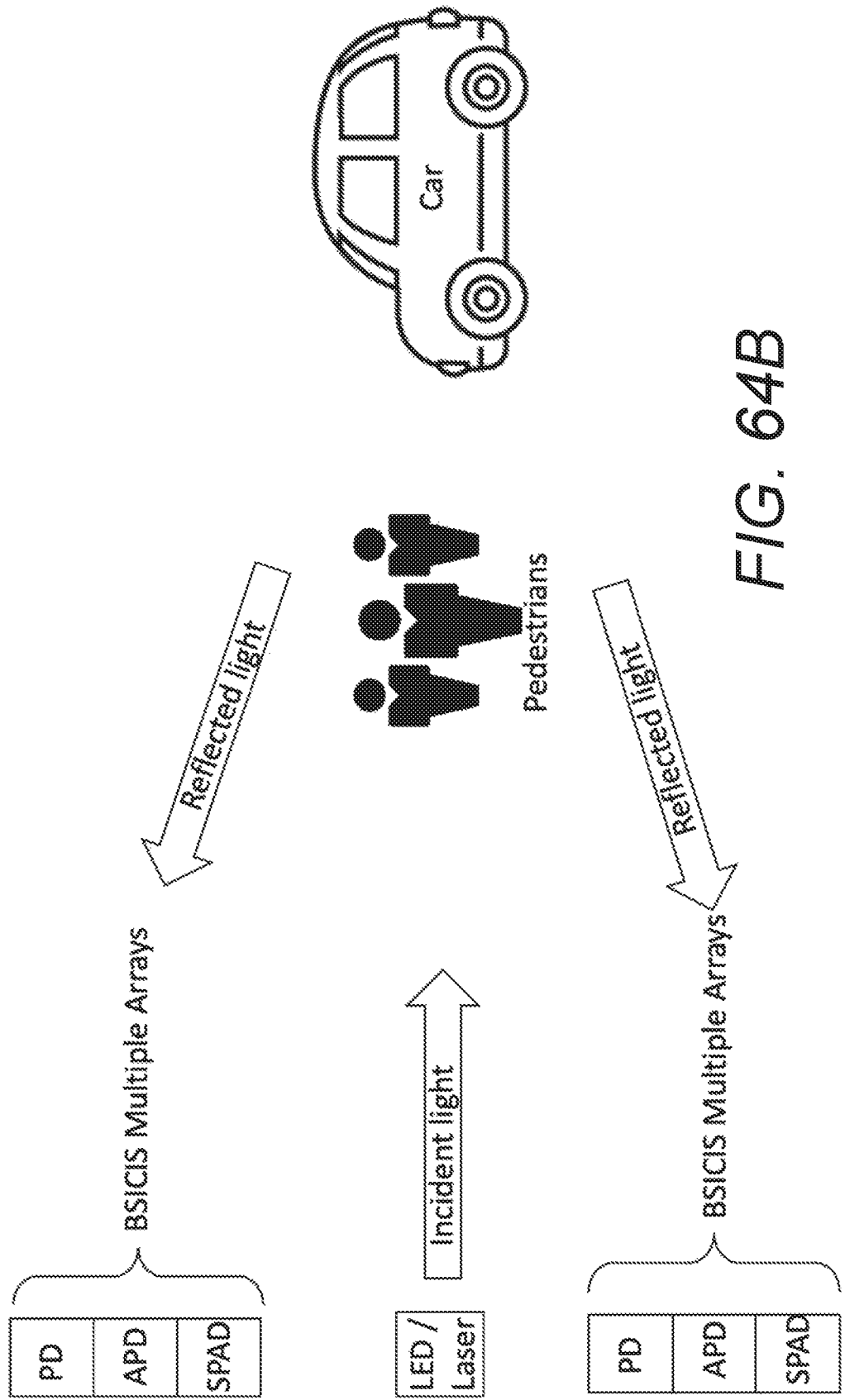

FIGS. 64A and 64B are diagrams illustrating aspects applications of BSICISs at NIR wavelengths and BSICISs with multiple arrays where each array can be a different type of photosensor, for example PD, APD, SPAD or phototransistors, according to some embodiments. 3D imaging can be accomplished either by parallax similar to the human eye and/or by Time-of-Flight which can be direct (pulsed laser) or indirect (continuous wave).

FIG. 64A shows a simple partial schematic of an ADAS system, and in some cases can be for security, avionics, robotics, drone, and/or any night vision and/or poor weather applications. The system can be for either imaging or 3D imaging using 2 or more CMOS image sensors (CIS) for parallax imaging to create 3D images and sense of depth, and in some cases time-of-flight 3D imaging can also be used.

In the case of parallax 3D imaging one or more illuminators that can be light emitting diodes (LED), and/or laser sources. The wavelength of the illuminator can range from 800 nm to 2000 nm. In particular IR wavelength or NIR wavelength in this range are better in penetrating fog or rain than for example visible wavelength in the range of 350-700 nm. In addition, in some cases with multiple illuminators different wavelengths can be used in the IR regions. For example as in the Sumi reference, three different IR wavelengths can be used to detect the color of the target in complete darkness in absence of any visible light. The IR light penetrating the fog/rain and reflected from the target, in this example a car, can be captured by one or more CMOS image sensors, in particular for parallax 3D imaging 2 CMOS image sensors are used. The image sensors are separated by approximately 10 cm (the distance between human eyeballs) or more. The greater the separation, the greater the parallax, and therefore the greater the 3D and special resolution. In some cases, more than two CMOS image sensors can be used in the parallax mode. Filters that are sensitive to wavelength can be used in front of the CIS such that visible light is blocked that can otherwise blind the CIS camera, for example IR wavelength of 850 nm, 905 nm, 940 nm, 980 nm, 1000 nm, 1300 nm, 1550 nm, 2000 nm to name a few can be used. In one example 905 and/or 940 nm can be used to illuminate the targets and silicon CIS with filters at 905 and 940 nm can be used. In some cases, one or more sets of CIS cameras with identical filters for each set, and each set can detect at a certain wavelength such that parallax 3D images can be created in different wavelengths for improved detectability in adverse weather conditions, and each set can comprise of 2 or more CMOS image sensors.

In the case of longer wavelengths, for example beyond the Si bandgap or near the Si bandgap of 1100 nm, 1300 nm, 1550 nm and 2000 nm, Ge or its alloys such as GeSi, GeSn, GeSiSn to name a few can be selective area grown on Si for example as in FIG. 63 to extend the CIS or BSICIS wavelength range.

In some cases, time-of-flight 3D imaging can be implemented in conjunction with 3D parallax imaging, and in some cases can be implemented by itself. The time-of-flight uses either pulsed laser for direct ToF measurements (DToF) and in some cases indirect ITOF where a laser source or sources with one or more wavelengths operate in a continuous wave mode. The reflected light from the target impinge on the CIS pixel array where each pixel can operate or configure in the PD or APD or SPAD mode. In addition one or more CIS can be used to detect ToF signals at different wavelengths where the wavelengths are selected with a filter.

In some cases multiple wavelengths can illuminate the target and the reflected light detected by separate CIS cameras or pairs of cameras for example both visible and IR wavelengths can be used to illuminate the target and the reflected visible and IR wavelengths detected by separate pairs of visible and IR cameras and the results can be used to analyze ranging by triangulation and also the results can be displayed as a heads up display on the windshield of the driver such that the driver can see the enhanced images of traffic in adverse weather conditions.

Back side illuminated CMOS image sensor where the pixels have microstructure hole/holes can have a higher EQE at certain wavelengths than a comparable BSICIS pixels without microstructure holes. The wavelength range for Si BSICIS pixels can range from 400 to 1100 nm. Pixels with microstructure holes can have an enhanced IR sensitivity for wavelength ranges, in Si pixels, from 800 to 1100 nm. In the case of Ge/GeSi or any of its alloys that are grown on Si, the wavelength range of BSICIS pixels can be extended to 2000 nm. For example experimentally for 1 micron thick Si device layer of an SOI wafer with microstructure holes the following external quantum efficiency has been observed; 85% at 850 nm, 67% at 905 nm, 33% at 940 nm, and 15% at 1000 nm in an MSM photodiode. These results are the highest known to have been reported to date for 1 micron thick Si with microstructure holes.

Indirect ToF can use CW laser that is modulated sinusoidally with a modulation frequency ranging from kilohertz to gigahertz, and in some cases 10s of gigahertz. For direct ToF the lasers are operated in a pulsed mode, where the width of the pulses can range from femtoseconds to picoseconds, and in some cases 10s of picoseconds, and in some cases longer than 10s of picoseconds.

FIG. 64B is a simple partial schematic of an ADAS comprising multiple BSICIS detectors where the BSICIS chip can have multiple arrays and at least two kinds of arrays can have at least two different types of photosensors from the sensor group PD, APD, SPAD and phototransistor. The BSICIS can operate either in 3D imaging using parallax and/or Time-of-Flight. In addition, in some cases the different photosensor arrays can operate at the same or different wavelength. In some cases, the BSICIS chip with multiple arrays can both have the same photosensor from the group PD, APD, SPAD, phototransistor but operate at different wavelengths, for example 1 array can operate at visible wavelengths, and another array on the same chip can operate at an NIR wavelength. Not shown are filters to select the desired wavelength range.

In Time-of-Flight which can be direct or indirect, the range can be short range, for example 10s of meters to detect pedestrians and/or bicyclists and/or any objects in close proximity. Parallax 3D imaging can be used to detect objects at a further range for example greater than 10 meters. In some cases, long distance ToF can be used concurrently with parallax and short range ToF to give greater overall depth information of obstacles in front of cars or robots or drones. One or more illuminator using LED and/or laser that can operate either in pulsed or continuous wave mode to illuminate targets, in some cases multiple wavelength illuminators can be used. Wavelengths can range from 400 to 700 nm for visible, and 700-2000 nm for NIR. NIR wavelengths are better in penetrating fog or rain and in addition the low energy photons are safer for the eye.

In some cases, the BSICIS chip can have Ge and/or GeSi and/or GeSn or any combination of Ge alloy, and in some cases multiple quantum wells of Ge alloys can be selective area grown on one of the arrays such that 1 photosensor array can respond to wavelengths beyond 1100 nm and another array on the same BSICIS chip that doesn't have Ge or its alloy can respond to wavelengths shorter than 1100 nm. In some cases, the BSICIS photosensor arrays can include Ge and its alloys such that the photosensor can respond in the range from 400 to 2000 nm and filters can be used to select wavelength ranges for each array. For example filters can be used such that 1 array can detect in the visible and the other array or arrays can detect in selected NIR wavelengths.

The photosensor arrays and the CMOS ASICs can be fabricated on separate wafers and stacked, or multiple stacked as discussed in stacking references. And in some cases, photosensor arrays and the CMOS ASICs can be fabricated monolithically integrated on a single chip.

Figure 65B:
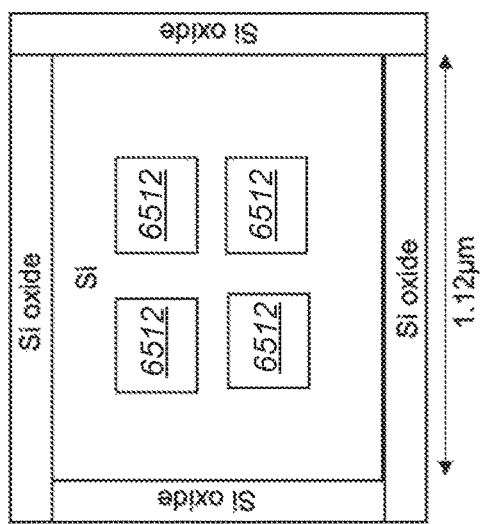
FIGS. 65A and 65B are simple partial schematic diagrams, cross section and top view, respectively, of a structure having 2×2 inverted pyramids wet etched into Si, according to some embodiments.
Figure 65D:
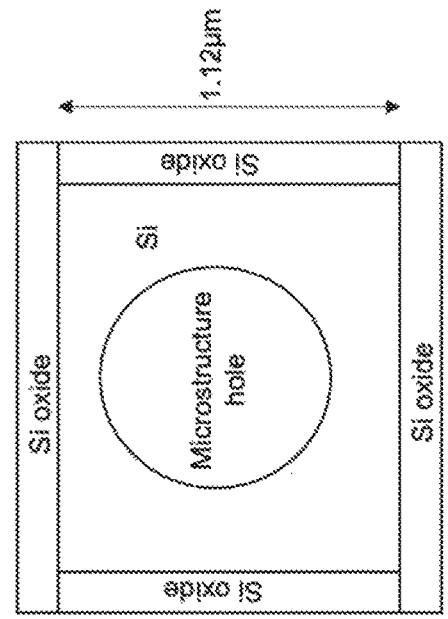
FIGS. 65C and 65D are simple partial schematic diagrams, cross section and top view, respectively, of a structure having a cylindrical hole for photon trapping to enhance the absorption efficiency, according to some embodiments.
Figure 65A:
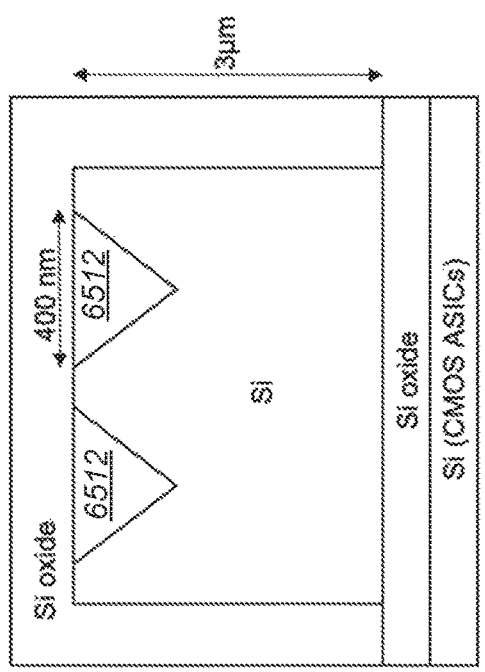

FIGS. 65A and 65B are simple partial schematic diagrams, cross section and top view, respectively, of a structure having 2×2 inverted pyramids wet etched into Si, according to some embodiments. The pixel can have 1.12 micron×1.12 micron size with an inverted pyramid array for photon trapping to enhance the absorption efficiency which is directly proportional to the external quantum efficiency. FIG. 65A shows a simple partial cross section schematic of 2×2 inverted pyramids 6512 wet etched into Si where the base of the inverted pyramid is 400 nm. The thickness of the Si layer is 3 microns and the width of the pixel is 1.12 microns. The entire pixel is encapsulated in Si dioxide. In some cases, the base of the inverted pyramids 6512 can be touching. FIG. 65B shows a simple partial top view schematic of FIG. 65A where the pixel is 1.12 micron×1.12 micron, and were the microstructure holes are inverted pyramids.

Figure 65C:
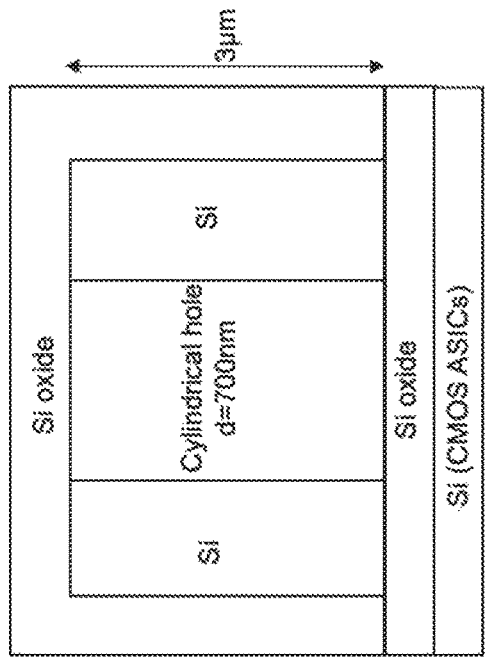
Figure 65E:
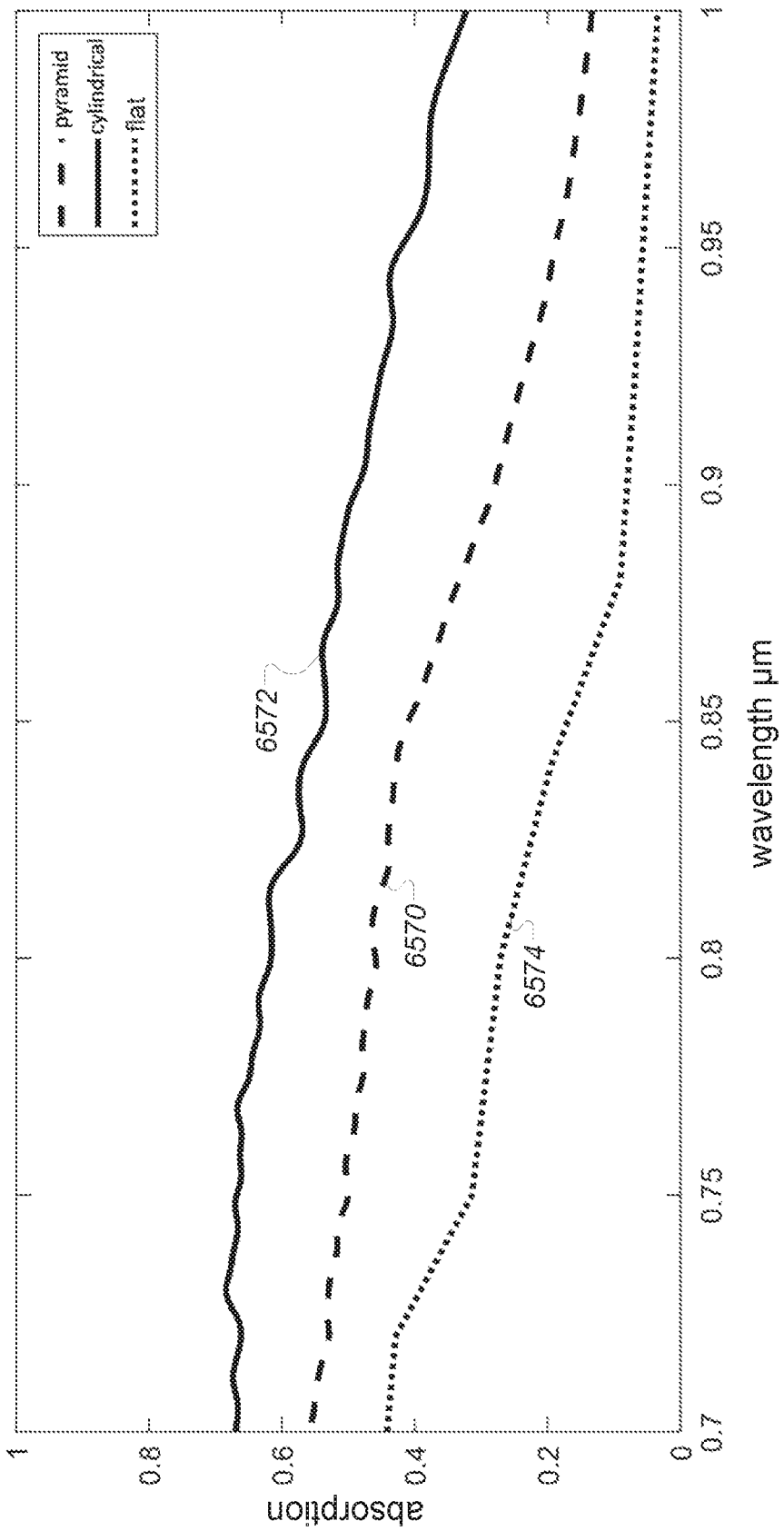
FIGS. 65E to 65G are plots showing FDTD simulations of the optical absorption vs wavelength for structures shown in FIGS. 65A to 65D, according to some embodiments.
Figure 65F:
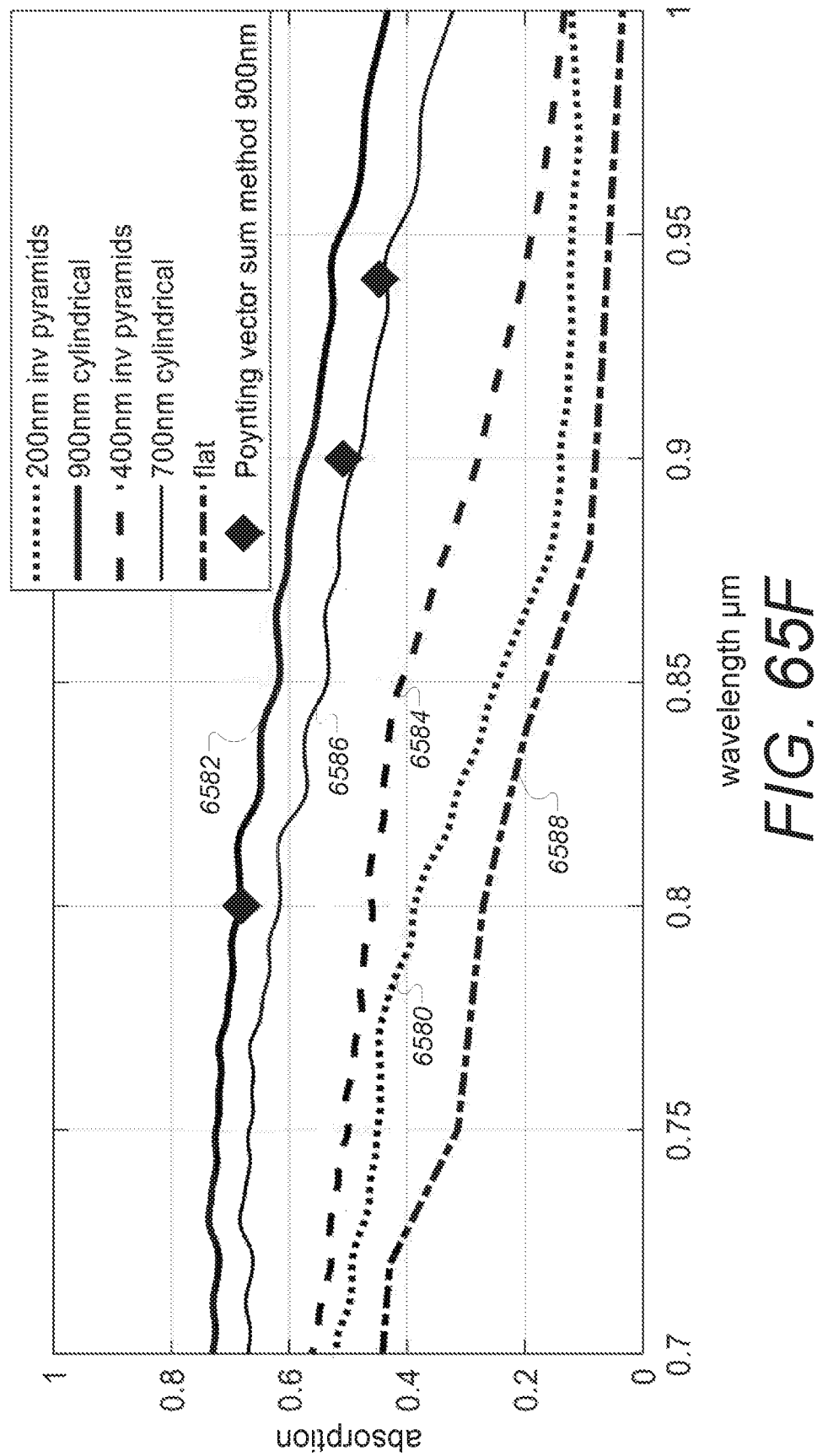
Figure 65G:
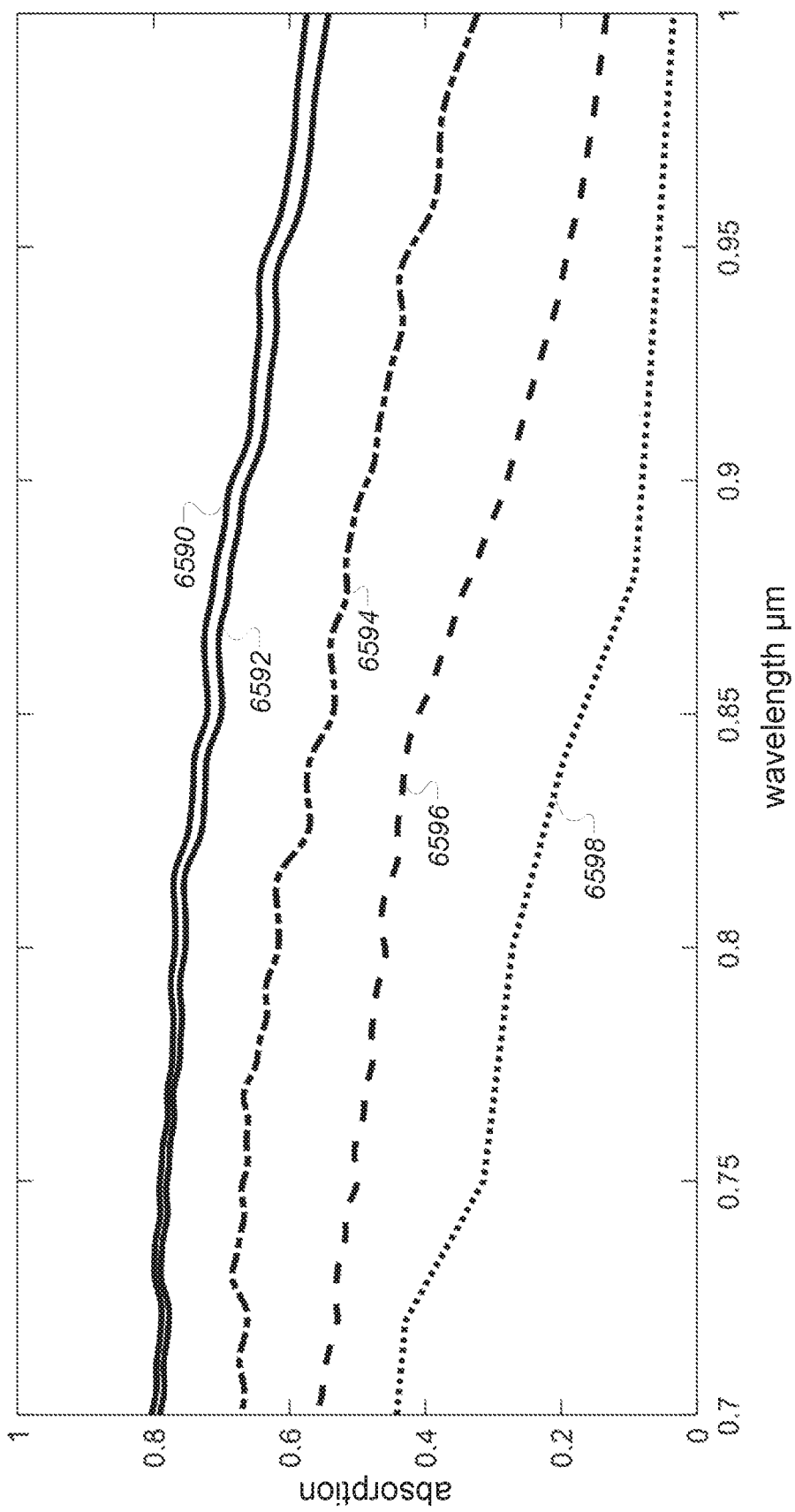

FIGS. 65C and 65D are simple partial schematic diagrams, cross section and top view, respectively, of a structure having a cylindrical hole for photon trapping to enhance the absorption efficiency, according to some embodiments. The single cylindrical hole can have a diameter of 700 nm and can be dry etched to the Si oxide layer and filled with Si oxide, and the Si oxide encapsulates the Si pixel. The Si layer thickness is 3 microns and the width of the Si pixel is 1.12 microns. FIG. 65D shows a simple partial top view schematic of FIG. 65C where a single cylindrical hole is etched into the pixel which has a lateral dimension of 1.12 micron×1.12 micron. In the simulation (results of which are shown in FIGS. 65E to 65G) the cylindrical hole is etched to the oxide layer and subsequently filled with Si dioxide. In some cases, the cylindrical hole can be etched partially into the Si for example to a depth of 1 micron, and in some cases to a depth of 1.5 microns, and in some cases a depth of 2 microns or more.

In some cases, the microhole can be partially etched into the Si, and in some cases can be fully etched to the oxide layer, and in some cases the microhole can have a funnel, conical, trapezoidal, parabolic and/or any combination thereof cross section. In addition, the microhole can be a composite of multiple shapes such as two intersecting ovals, clover leaf, amoebic, circular to name a few.

The lateral dimension or dimensions or the microstructure hole can range from 10 nm to 1000 nm, and in some cases 200 nm-1000 nm, and in some cases 200 nm-800 nm. In some cases, the lateral dimension or dimensions of a microstructure hole measured at its major axis or major characteristic lens can range from 200 nm to 800 nm, and in some cases 400 nm-800 nm.

Not shown are CMOS ASICs formed on the Si layer opposite to that of the Si layer forming the photodetectors/sensors. In some cases, the CMOS ASICs and the back side illuminated photodetectors/sensors can be monolithically integrated, and in some cases the photodetector/sensor can be formed on a separate wafer to that of the CMOS ASICs, and then using stacking technology can be bonded together with the CMOS sensor.

In some cases during the stacking process intermediate layer/layers such a Bragg reflectors, Si, silicide, metal may be inserted in one or more of the oxide layers, or on the oxide layer prior to the bonding process to combine two separate wafers into a single unit that includes both the photodetectors/sensor and the CMOS ASICs.

FIGS. 65E to 65G are plots showing FDTD simulations of the optical absorption vs wavelength for structures shown in FIGS. 65A to 65D, according to some embodiments. In the simulation shown in FIG. 65E the cylindrical hole is etched to the BOX layer (or bottom oxide layer of 2000 nm thickness) with a diameter of 700 nm and filled with Si dioxide. The pixel side walls are coated with Si oxide with a thickness of 250 nm, and the top surface of the pixel is also coated with Si oxide with 250 nm thickness. The inverted pyramids have a base dimension of 400 nm in a 2×2 array configuration and also filled with Si dioxide. The solid curve 6572 is for the single cylindrical microhole in a 1.12 micron×1.12 micron pixel with a Si thickness of 3 microns. The dashed curve 6570 is for the 2×2 inverted pyramid array also with a pixel size of 1.12 micron×1.12 micron with a Si thickness of 3 microns. The dotted curve 6574 is for pixel without microstructure holes and where the pixel dimension is 1.12 micron×1.12 micron with a Si thickness of 3 microns. As can be seen in this set of curves the absorption which is directly proportional to EQE for the pixel with a single cylindrical microstructure hole can be consistently higher than the pixel with inverted pyramid array and the pixel without any microstructure hole over the wavelength range of 700-1000 nm.

The microstructure hole without any dielectric filling the hole can have a lateral dimension of about 1000 nm and when the microstructure hole is filled with a dielectric such as Si dioxide the lateral dimension of the microstructure hole in this case the diameter can be divided by the refractive index of the Si dioxide which results in a lateral dimension of approximately 700 nm. In some cases Hf oxide can be used to fill the hole and therefore the hole lateral dimension can be divided by the refractive index of Hf oxide which is approximately 1.9 and in some cases ZnSe with a refractive index of 2.4 can be used to fill the hole that can further reduce the lateral dimension of the hole. In general, any microstructure hole/holes lateral dimension in air can be reduced by dividing the lateral dimension of the microstructure hole in air by the refractive index of the dielectric that will fill the hole. For example, for pixels of 0.7 microns×0.7 microns a single microstructure hole can be etched into the pixel with a lateral dimension of approximately 400 nm that is filled with ZnSe, and in some cases 500 nm or less when the microstructure hole is filled with Hf oxide. Pixel size can range from 0.4 micron×0.4 micron to 3 micron×3 micron or larger and microhole or holes can be formed in these pixels by filling them with high index of refraction dielectrics.

FIG. 65F is similar to FIG. 65E and shows a FDTD simulation of the optical field absorption vs wavelength for pixels and/or photodetectors shown in FIGS. 65A-65D where the microstructure holes are filled with Si dioxide and where the surfaces of the pixels are covered with 250 nm of oxide, and where the bottom Si dioxide layer has a thickness of 2000 nm. The simulation is of a single pixel without adjacent pixels. The wide solid curve 6582 is for a cylindrical hole with a diameter of 900 nm etched to a depth of 3000 nm (the entire thickness of the pixel). The narrow solid curve 6586 is for a cylindrical hole 700 nm in diameter etched to a depth of 3000 nm. The dashed curve 6584 is for a 400 nm base inverted pyramid 2×2, and the dotted curve 6580 is for inverted pyramids with a base of 200 nm 4×4 array, and the dash-dot curve 6588 is for a flat pixel which has no inverted pyramids nor cylindrical holes. As can be seen from the simulation the pixel with a single cylindrical hole has a higher absorption which is directly proportional to EQE than from pixels with multiple or array of inverted pyramids over the wavelength range 700-1000 nm.

The diamond shaped dots are calculations of the absorption vs wavelength of the 900 nm diameter cylinder microhole using the Poynting vector method where the energy flux is integrated throughout the pixel, whereas the curves calculate the absorption vs wavelength using the 1-R-T method and where in both cases FDTD of the Maxwell equations of the optical field are used for the calculations.

FIG. 65G similar to FIG. 65F and shows a FDTD simulation of the optical absorption in a pixel shown in FIGS. 65A-65D with a single microhole and also a 2×2 array of inverted pyramids and where in place of the sidewall oxide surrounding each pixel the oxide is replaced by air. Curve 6590 shows the absorption vs wavelength for a 900 nm diameter cylindrical microhole, filled with Si dioxide etched to a depth of 3000 nm and where the pixel isolation trench is also etched 3000 nm. Curve 6592 is similar to curve for an isolation trench etched 2000 nm deep. Curve 6594 similar a with the exception that the diameter of the microhole is 700 nm. Curve 6596 is for 2×2 array of inverted pyramids filled with Si dioxde where the isolation trench is etched to a depth of 3000 nm. Curve 6598 is for a flat pixel without inverted pyramids nor microholes and with isolation trench etched to a depth of 3000 nm.

As can be seen curves 6590 and 6592 for the 900 nm diameter microhole have the highest absorption which is proportional to EQE in the wavelength range of 700-1000 nm.

In some cases, instead of air which has a refractive index of 1 the isolation trench can be partially and/or fully filled with porous Si dioxide which can have a refractive index close to 1 or in the range of 1.05-1.1. Prior to filing the isolation trench with porous Si dioxide the side wall of the pixel and the surface and the side wall of the microhole can be passivated with a thin layer of Si dioxide to reduce the density of dangling bonds which can cause surface recombination. The thin layer of passivation can have a thickness ranging from 2 nm to 50 nm for example. In some cases, other materials can be used for passivation such as Al oxide, and/or Al nitride for example that can be deposited using atomic layer deposition. In addition dopant regions of N and P type can be applied to regions such as the sidewalls of the microhole, sidewalls of the pixels, top and bottom surface of the pixels to create PN, PIN, PIPN, PNP, NPN, NIN, PIP and/or any other combination of P and N junctions for PD/APD/SPAD/photo transistor/photo gating/photo conductor devices that can have 2 or 3 terminals where bias voltages can be applied.

In some cases for Si thicknesses of less than 3 um, microstructure hole or holes (hole/holes) can be formed or etched in photodetectors such as pixels photosensors operating in photodiodes, APD, SPAD, t, photoconductor, phototransistor modes in the wavelength range 400-700 nm and in some cases 400-1000 nm.

Figure 65I:
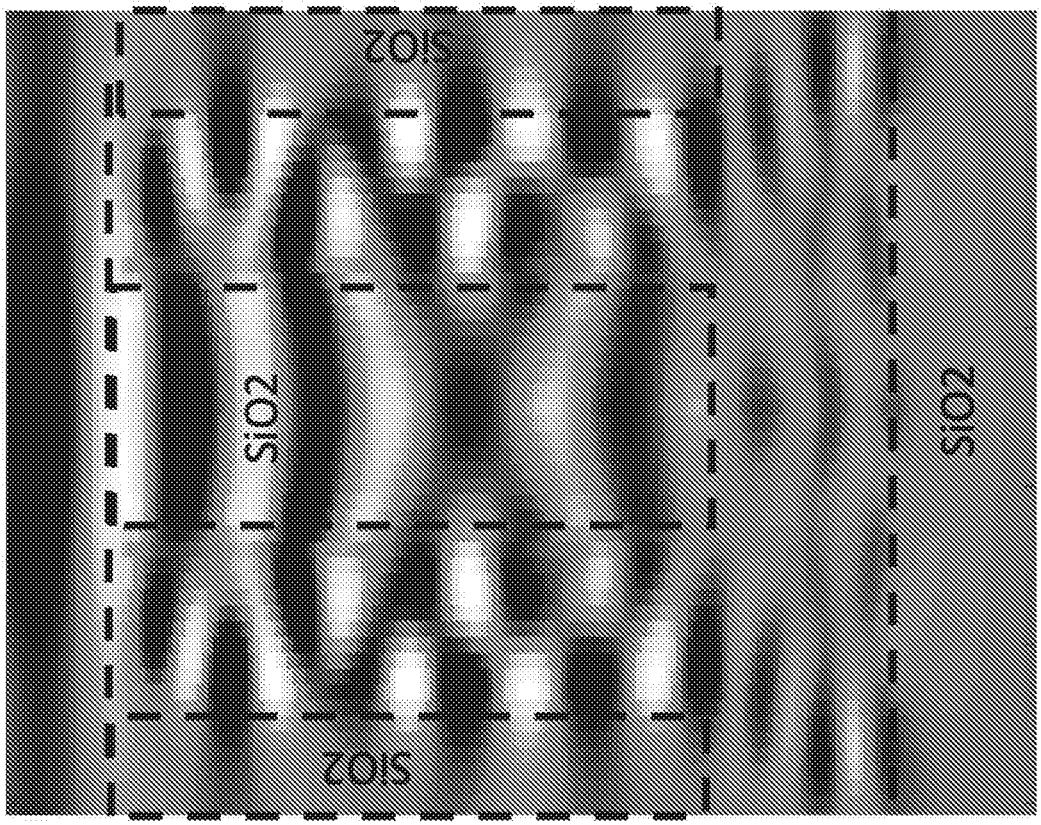
FIGS. 65H and 65I are diagrams of the FDTD simulation of the optical field distribution of the structures similar to those shown in FIGS. 65A-65D, according to some embodiments.
Figure 65H:
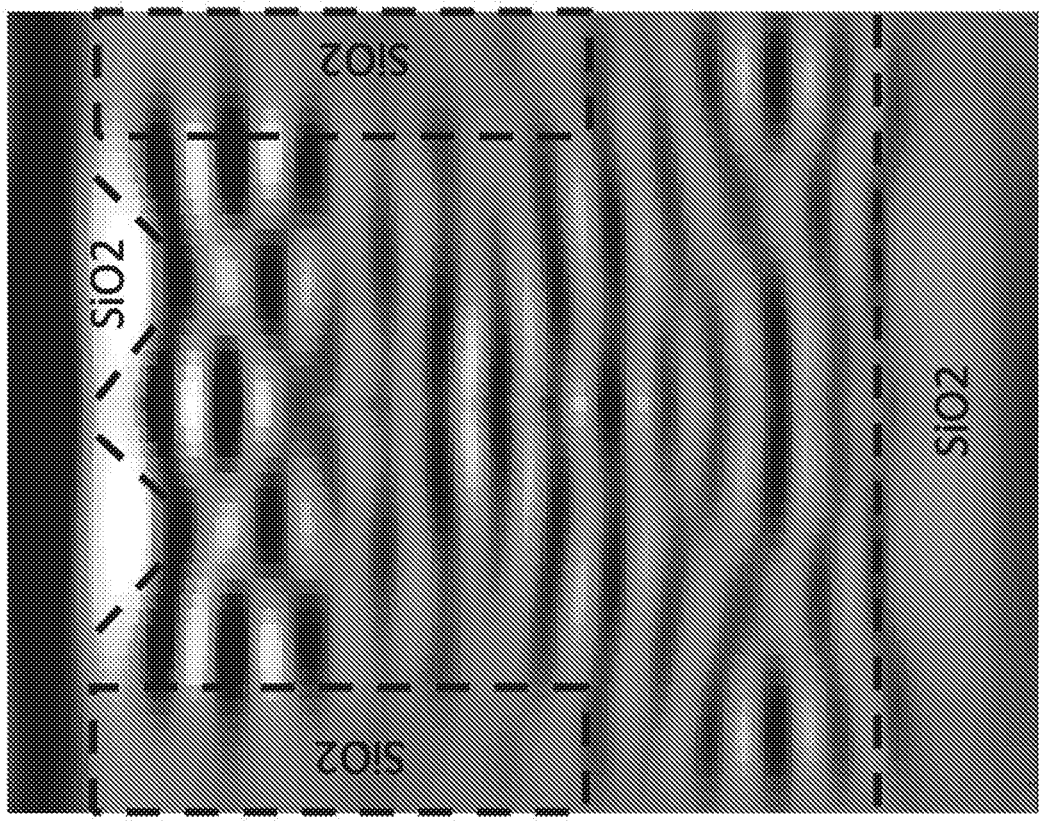

FIGS. 65H and 65I are diagrams of the FDTD simulation of the optical field distribution of the structures similar to those shown in FIGS. 65A-65D, according to some embodiments. FIG. 65H shows the optical field distribution for a pixel with a 2×2 array of inverted pyramids. FIG. 65I shows the optical field distribution for a pixel with a single microhole of 900 nm filled with Si dioxide. These pixels are similar to those shown in FIGS. 65A-65D where each pixel has Si dioxide sidewalls to a depth of 2000 nm.

As can be seen the field distribution for the inverted pyramid (65H) are mostly distributed near the surface whereas the field distribution for a cylindrical microhole (65I) are strongly distributed throughout the pixel.

Figure 66A:
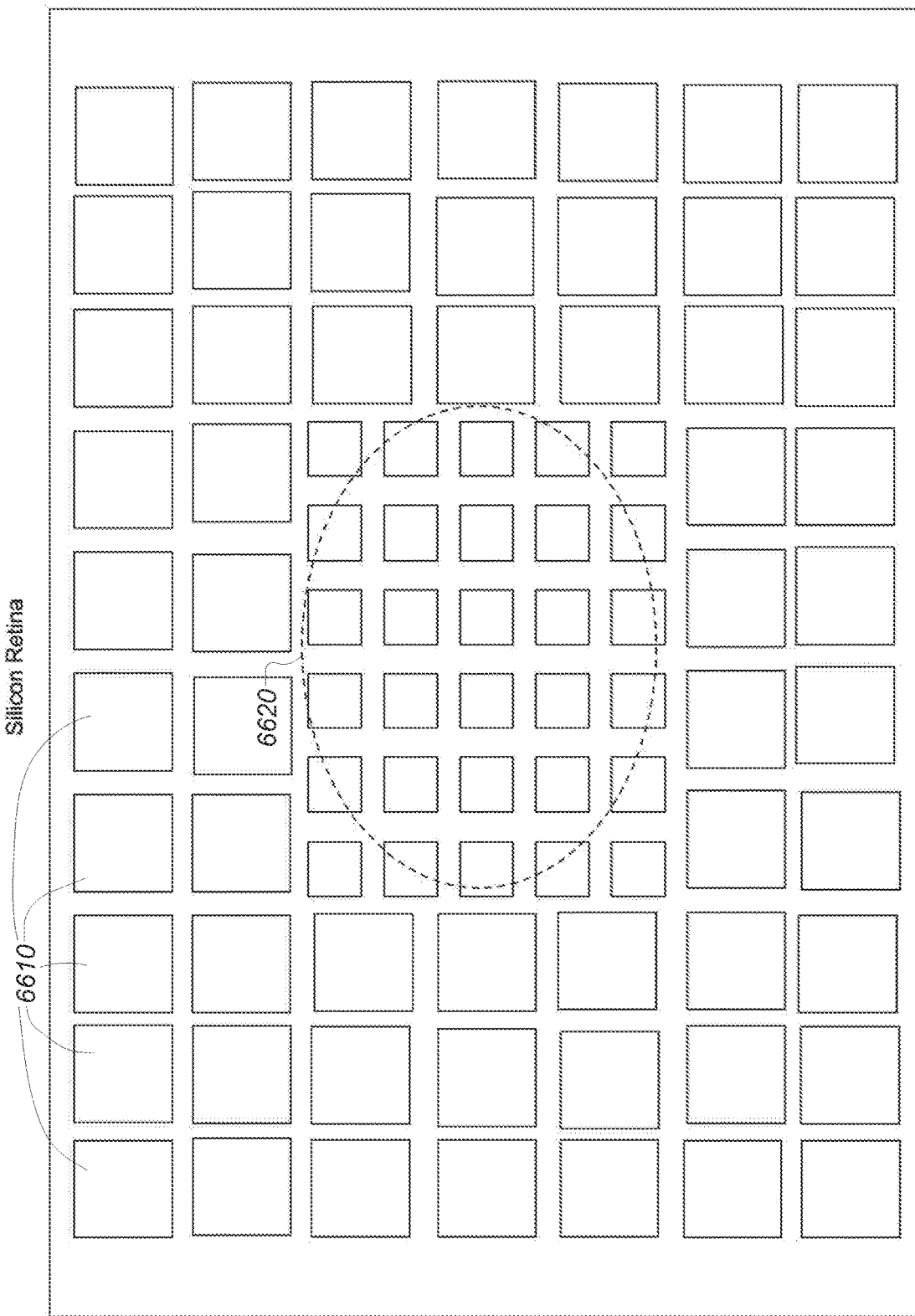
FIG. 66A is a partial simple schematic of a top view of pixel arrays, according to some embodiments.

FIG. 66A is a partial simple schematic of a top view of pixel arrays, according to some embodiments. The size of the pixels can be different, for example, near the center the pixel size can be small with lateral dimensions ranging from 0.5 to 1.5 microns for high spatial resolution and the pixels in the periphery of the CMOS image sensor chip can be larger with pixel size ranging from 1.6 to 3 microns and in some cases larger than 3 microns for a lower spatial resolution. In some cases, the pixel size can change gradually toward the periphery from smaller to larger. This allows to mimic the retina with high spatial resolution is at the center of the retina or close to the center of the retina, and lower spatial resolution at the periphery of the retina which allows image processing to dominate at the high spatial resolution part and less image processing at the periphery. This saves processing time for the CMOS ASICs electronics. This Si retina can be used in applications such as machine vision, automotive vision, augmented reality (AR)/virtual reality (VR) where rapid image processing time is of the upmost importance. Other applications can include robotics, drones, and/or any sensors or 3D sensors including time-of-flight sensors that require rapid image processing time.

For automotive time-of-flight or LiDAR imaging the high spatial pixels lateral dimension can range from 0.5 to 100 microns, and in some cases 30-300 microns, and for the lower spatial resolution pixels the lateral dimension of the pixel can range from 30 to 500 microns, and in some cases 100-500 microns, and in some cases greater than 500 microns.

Figure 66B:
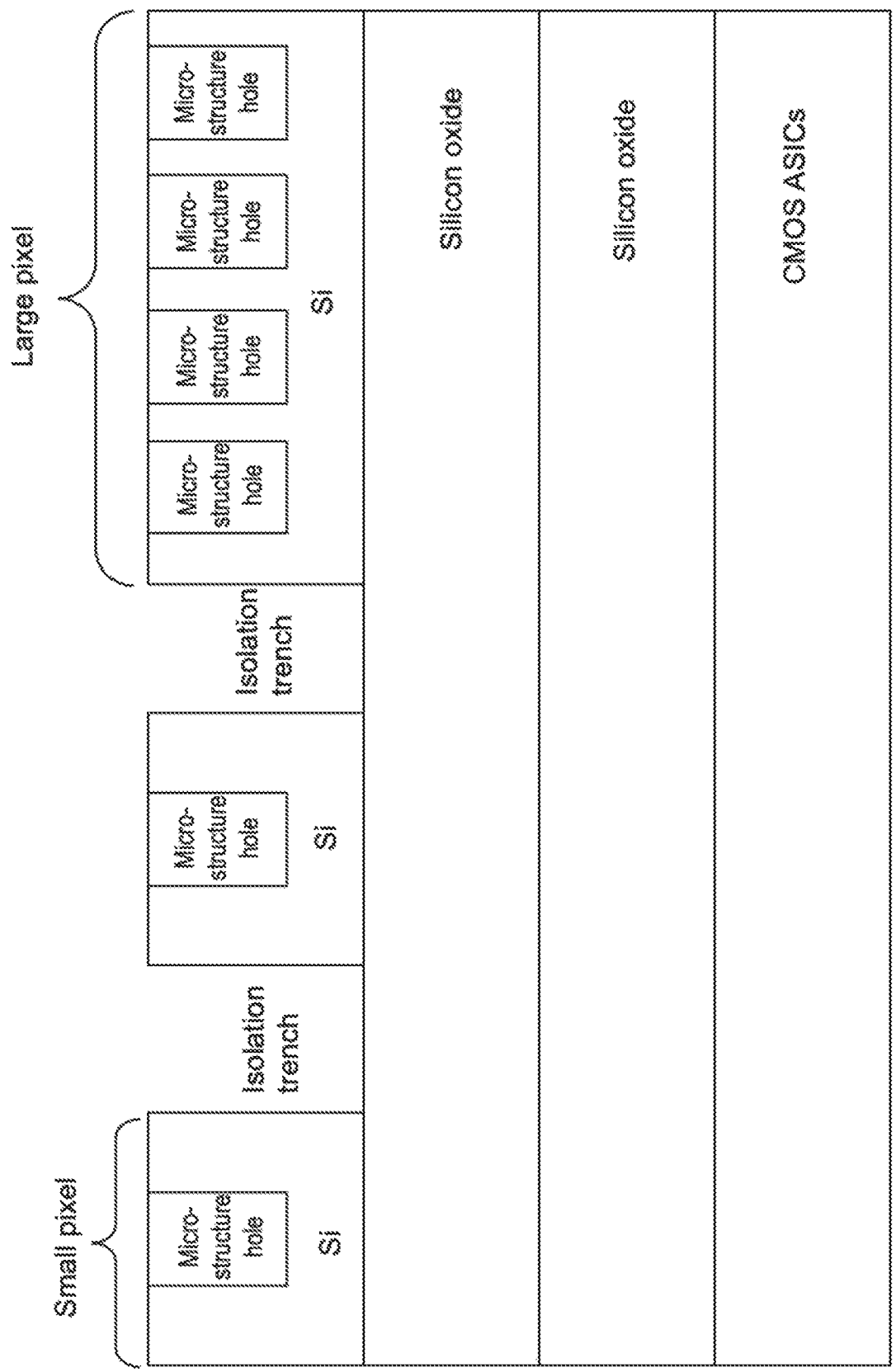
FIGS. 66B and 66C are simple partial cross sections of pixel arrays, according to some embodiments.
Figure 66C:
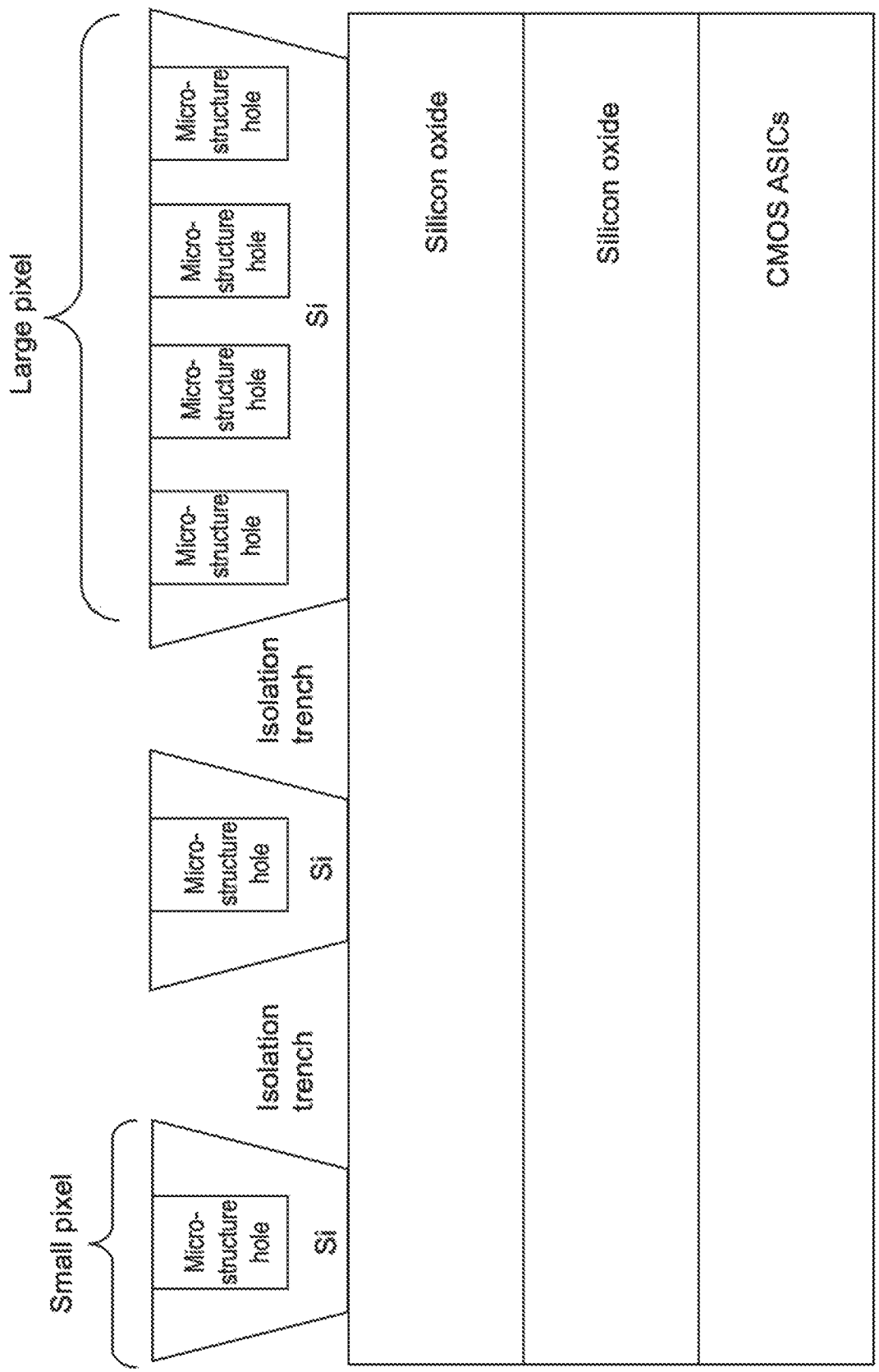

FIGS. 66B and 66C are simple partial cross sections of pixel arrays, according to some embodiments. In FIG. 66B, pixels of different lateral dimensions are included within a single image sensor chip, which can also include 3D image sensors. Not shown are wavelength filters, lenses, passivation, oxides that can fill the microstructure holes, and/or the isolation trenches, connecting electrodes, P and N regions that can include multiple P and N regions that can form PD/APD/SPAD/PC/photo transistor for example. In addition, in some cases the photodetectors/sensors can include Ge/GeSi/Ge alloy that can include multiple quantum wells grown on Si by selective area epitaxy similar to FIG. 63 for example.

FIG. 66C is similar to FIG. 66B with the exception that the pixels have negative sloped side walls which can be an inverted trapezoid. These negative side wall pixels can further minimize cross talk between the pixels and to further confine the trapped light within the pixel. In some cases, oxides and/or dielectrics with or without metal can be coated on the side walls of the pixel to further improve optical confinement within the pixel.

Figure 66D:
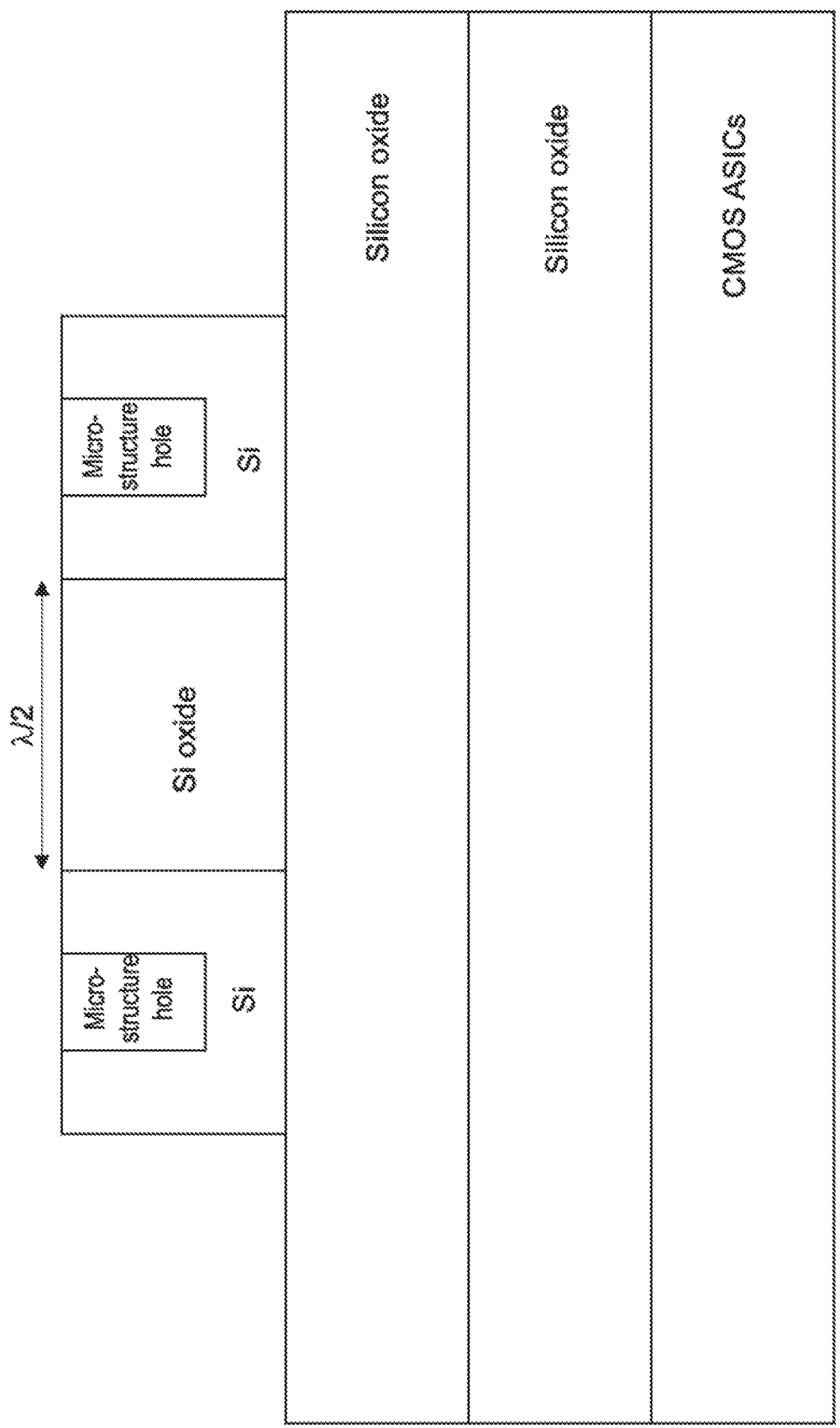
FIG. 66D is a simple partial cross section schematic of a pixel array where only two pixels are shown, according to some embodiments.

FIG. 66D is a simple partial cross section schematic of a pixel array where only two pixels are shown as an example, and where the separation between the pixels is such that destructive interference can occur to minimize cross talk between pixels. For example, the separation between the pixel can be a wavelength divided by 2 where the reflected light from one pixel to another can cancel out by destructive interference. If the space between the 2 pixels is filled with silicon dioxide and the detection wavelength 850 nm for example, and the refractive index of approximately 1.5, the spacing will be approximately 283 nm. As another example if the spacing between pixels is filled with Hf oxide with a refractive index with approximately 2 and the detecting wavelength is 850 nm, the spacing between the pixels can be approximately 213 nm. In the case where the photosensor detects multiple wavelengths and where each pixel has a wavelength selective filter the distance between adjacent pixels can be adjusted such that the spacing between pixels can be predominantly $\lambda/2$ between its adjacent neighbors.

Figure 67A:
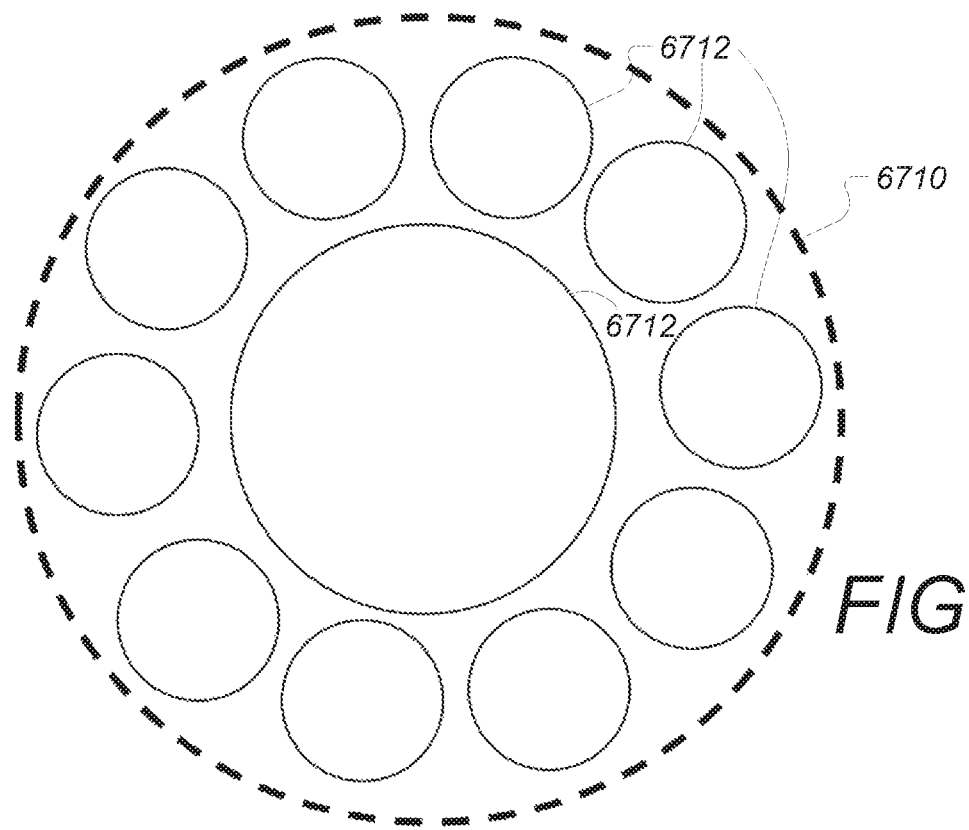
FIGS. 67A-67F are simple partial schematic top views of a composite microholes, according to some embodiments.
Figure 67B:
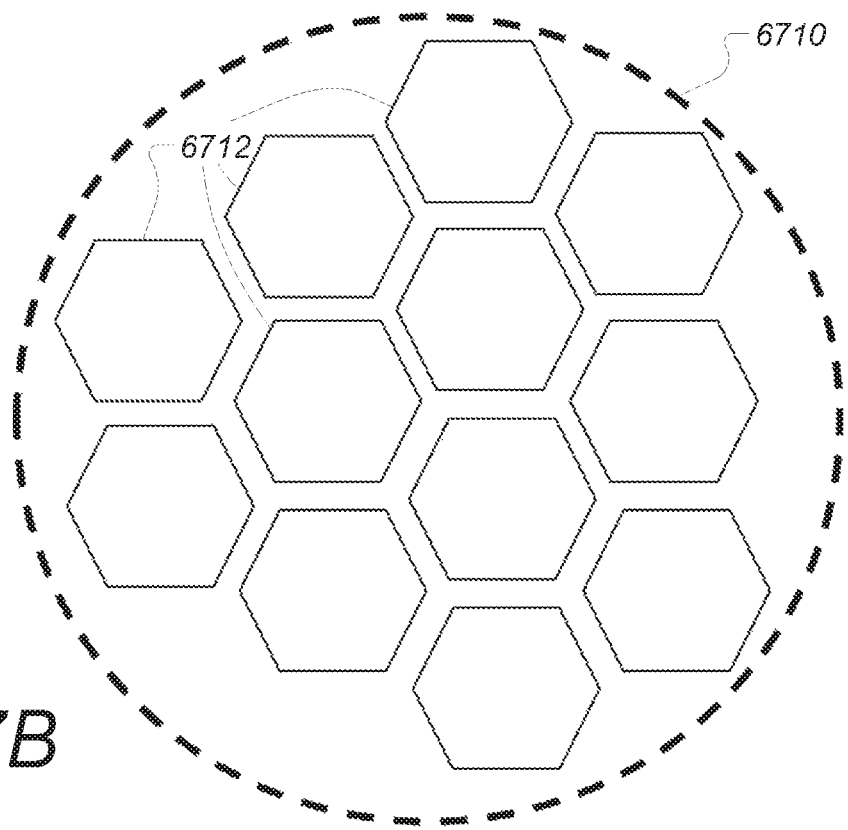
Figure 67C:
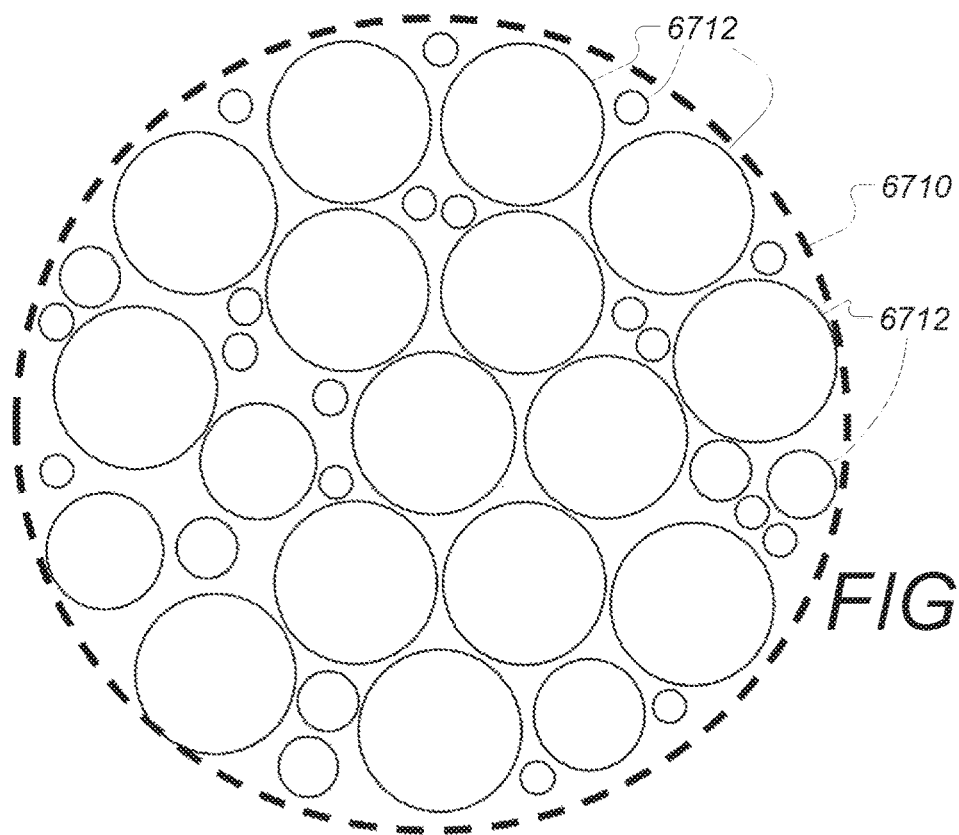

FIGS. 67A-67F are simple partial schematic top views of composite microholes 6710, according to some embodiments. A composite nanohole 6712 comprises two or more nanoholes with at least one lateral dimension less than the single microhole 6710 lateral dimension. FIGS. 67A and 67C where the single microhole 6710 is represented by the dotted line, in this case a dotted circular microhole but the microhole can be any shape such as circular, polygonal, clover leaf, cross, oval, amoebic to name a few as discussed above. The composite nanoholes 6712 of two or more nanoholes can be formed inside the dotted boundary 6710.

In FIG. 67B a cluster of hexagonal nanoholes 6712 are shown inside the dotted boundary that represent the dimension of a single microhole 6710. Such cluster of nanoholes can in some cases mimic a single microhole. Such clusters of nanoholes can be in a periodic array as in FIG. 67B and in some cases can be aperiodic as in FIGS. 67A and 67C and in some cases the nanoholes can have different dimensions as in FIGS. 67A and 67C. In addition, the cluster of nanoholes can be amoebic like pieces of jigsaw puzzle, FIG. 67D where the pieces can be interlocked and where each piece can have a different amoebic shape. The range of lateral dimensions for the nanoholes can be from 20 nm to 200 nm, and in some cases can be less than the dimensions of a single microhole which can have a dimension range of 300-2000 nm.

Often the cluster of nanoholes and/or microholes is formed on SOI wafer, and in some cases Si wafer with an oxide layer, and in some cases Ge on Si with an oxide or BOX layer and where the nanoholes are etched in the semiconductor region, and where the semiconductor region can have a thickness ranging from 100 nm to 3000 nm, and in some cases 100 nm-5000 nm. In some cases, the semiconductor thickness can range from 1000 to 3000 nm. In the case of Ge and/or GeSi and/or any alloys of Ge on Si can be selective area grown on a thin Si where the Si thickness can have a range of 20 nm-1000 nm and the Ge and/or Ge alloy can have a thickness ranging from 100 nm to 1000 nm, and in some cases 300 nm-2000 nm.

The etch depth of the nanoholes can be partially into the semiconductor for example 100-1500 nm or entirely through the semiconductor to the oxide layer.

In FIGS. 67A-67F, the dotted circles 6710 represent an imaginary microhole and is used just to show the boundary of a microhole, and the cluster of two or more nanoholes 6712 inside the single microhole boundary. As discussed earlier the microhole can be periodic, aperiodic, random array. Likewise, the cluster of nanoholes also called composite microhole can be arranged in a periodic, aperiodic, and/or random array. In addition, for small pixels with pixel lateral dimension ranging from 0.5×0.5 to 2×2 microns, a single cluster of nanoholes can be formed just as in the case of a single microhole as discussed earlier.

With composite and/or assembly of nanoholes with each nanohole lateral dimensions smaller than the wavelength and the spacing between the nanoholes also less than the wavelength, the lightwave essentially sees a region of lower effective optical refractive index which to the lightwave will be like a hole as compared to regions without an assembly of nanoholes.

In these examples the composite nanoholes 6712 are confined in a circular imaginary boundary 6710, where the diameter of the imaginary circle is 900 nm as represented by the dotted line; however the imaginary boundary can have any shape or form such as polygonal, amoebic, oval, clover leaf, cross, to name a few. The lateral dimension of the imaginary boundary can range from 400 nm to 2000 nm and in some cases 200 nm-2000 nm, and in some cases 600 nm-2000 nm, and in some cases greater than 2000 nm.

The composite nanoholes can be etched partially or fully in the Si layer, and in some cases ¼ the thickness of the Si layer, and in some cases ½ the thickness of the Si layer, and in some cases ⅔ the thickness of the Si layer, and in some cases can be the same depth as the deep trench isolation etch.

Figure 67D:
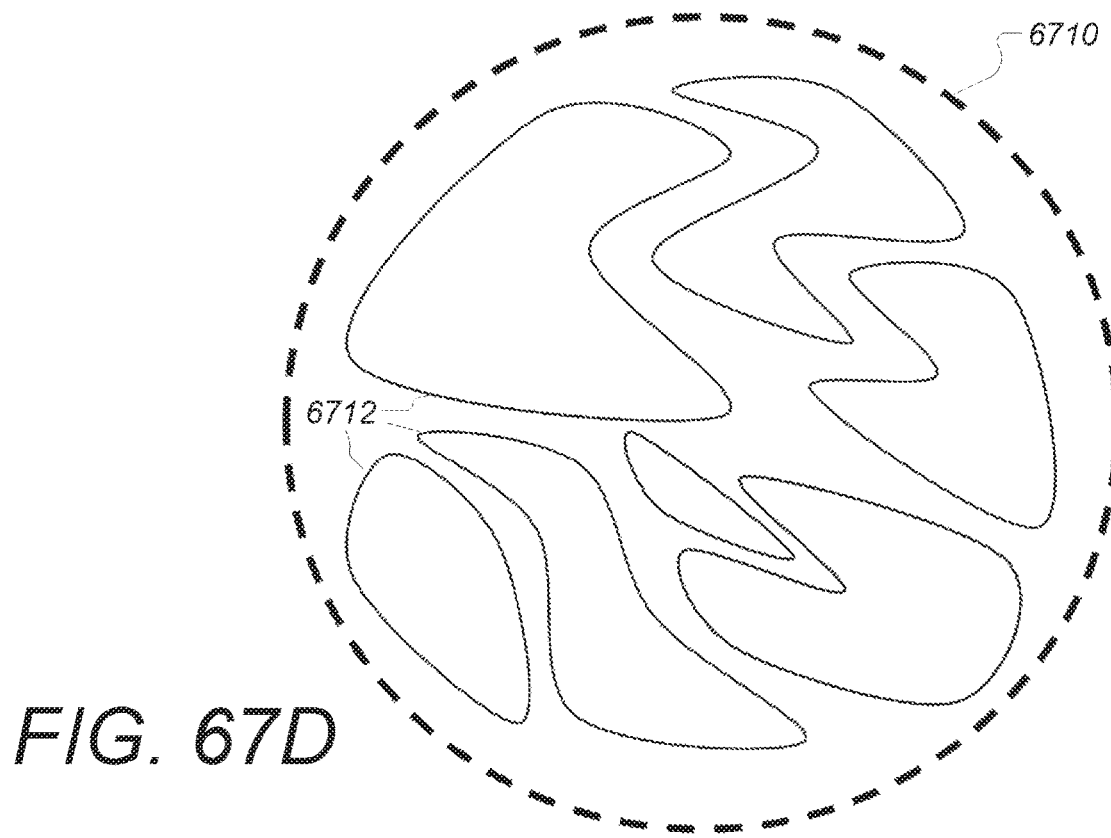
Figure 67E:
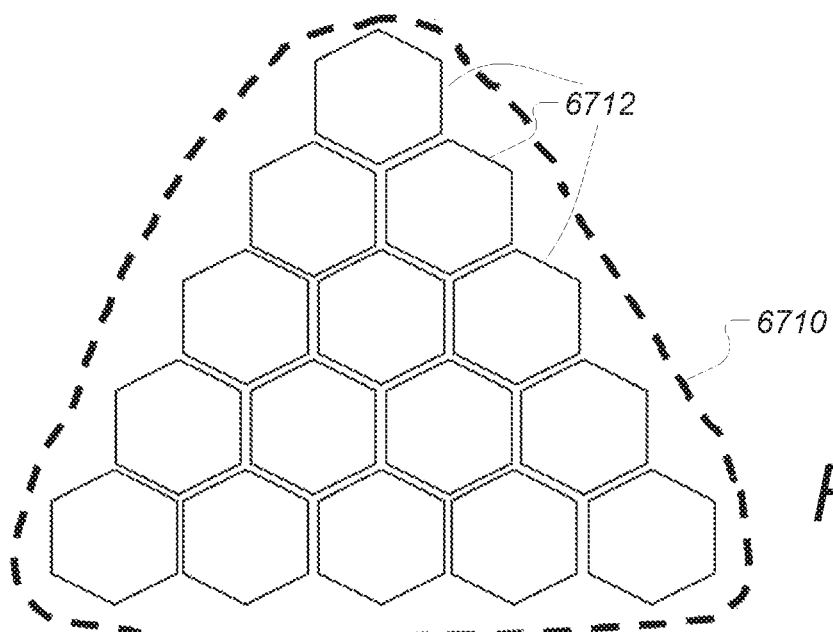
Figure 67F:
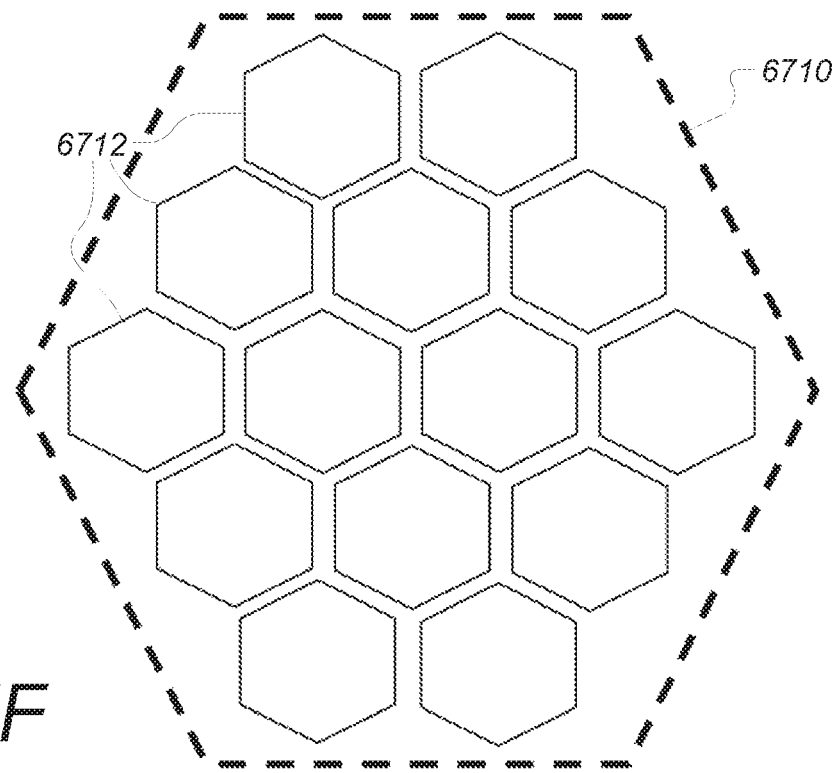

FIGS. 67E and 67F show further examples of a composite microstructure hole 6710 or a composite microhole comprising of close packed hexagonal holes 6712 such as in a honeycomb that have lateral dimensions that is a fraction of the composite microhole lateral dimension.

The composite microhole 6710 can have any shape or combination of shapes such as circular, oval, clover leaf, amoebic, polygonal, gourd, cross to name a few.

Ge, GeSi, GeSn, Ge-alloy to extend a wavelength to 2 microns can be epitaxially grown on the Si prior to micro/nanohole etch and in some cases can be grown inside the sidewalls of the micro/nanoholes which can include the nanoholes in the composite microhole.

Figure 68A:
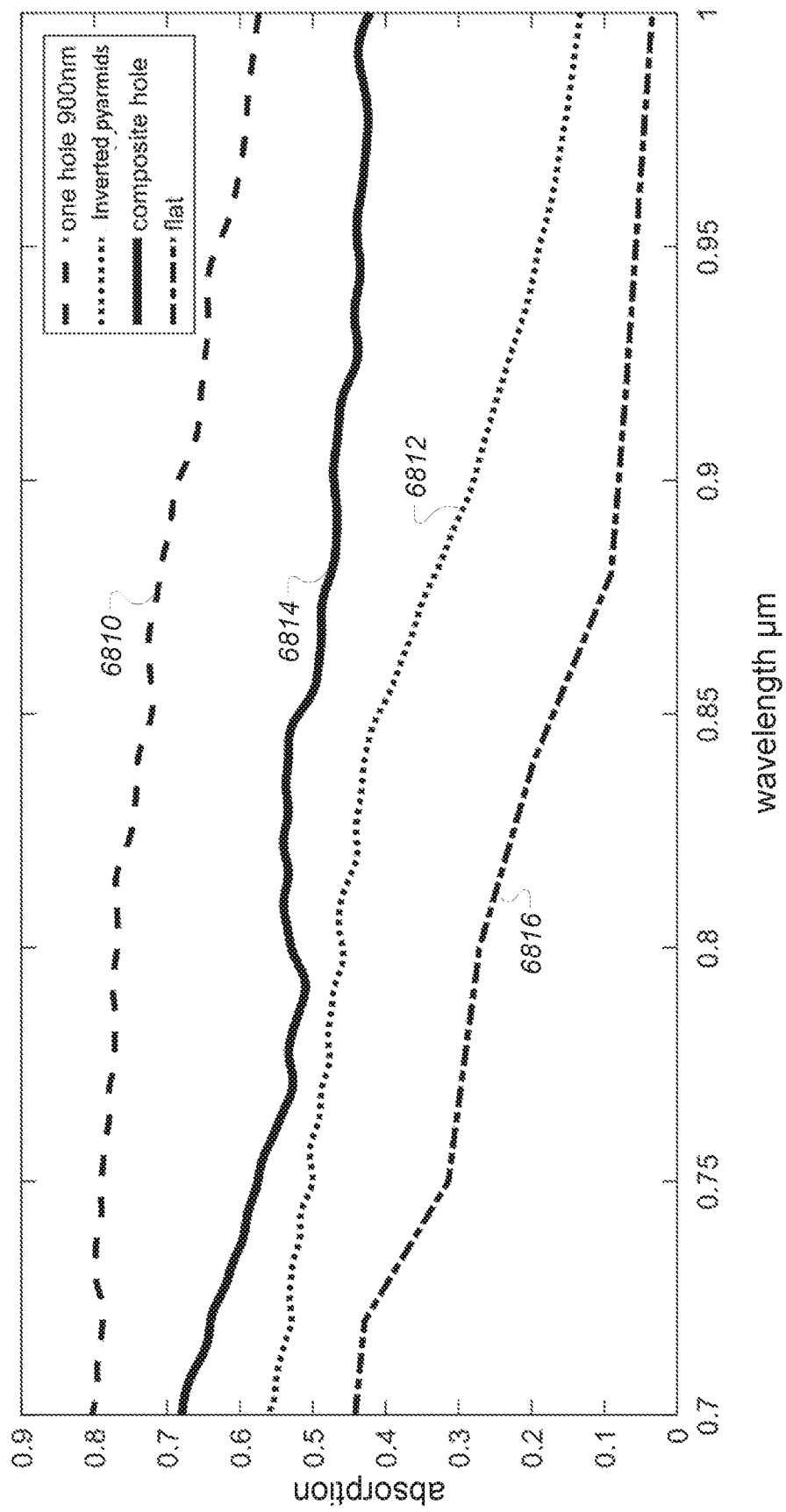
FIGS. 68A and 68B are plots showing FDTD simulations of the optical field absorption vs wavelength, according to some embodiments.
Figure 68B:
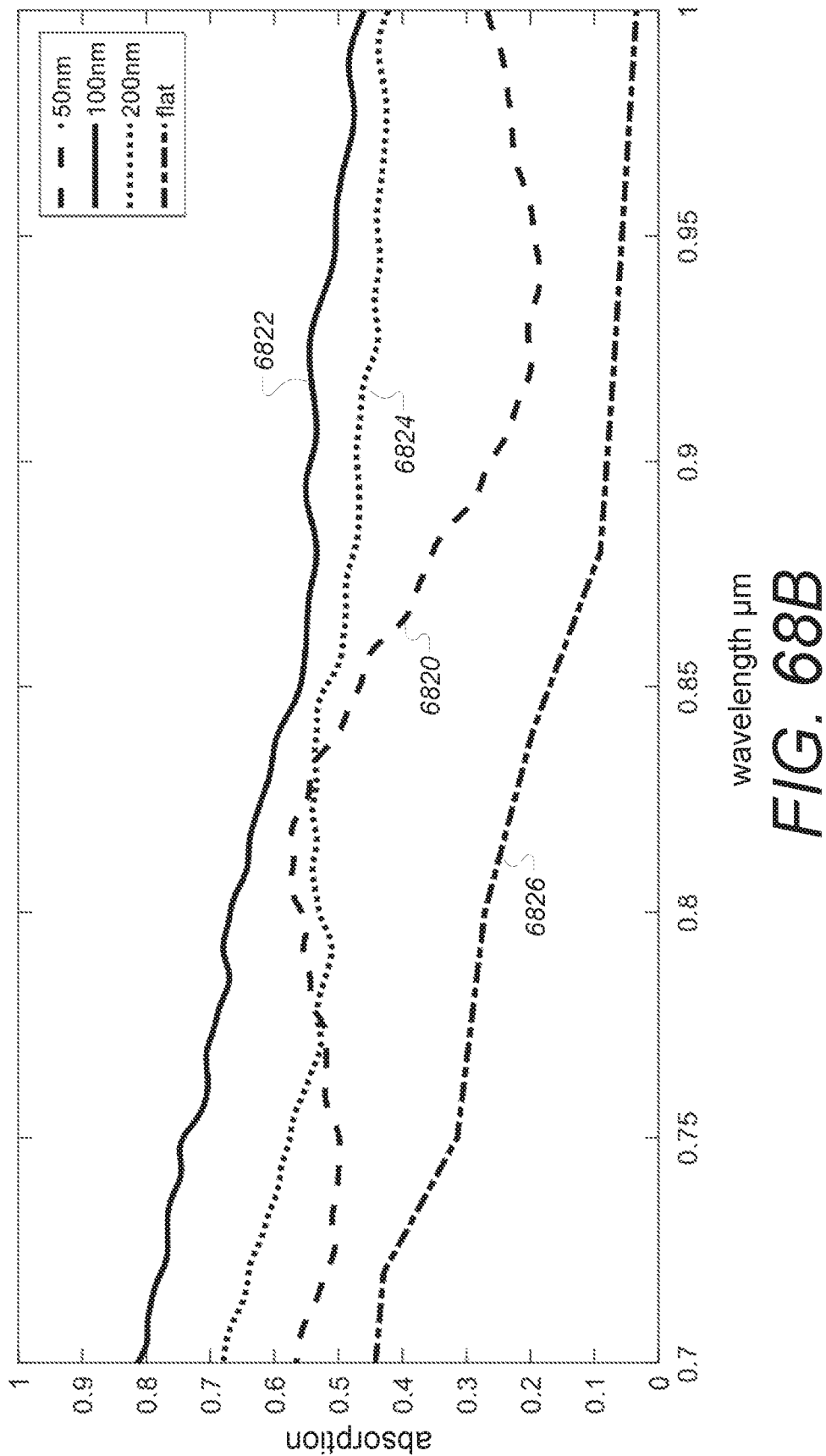

FIGS. 68A and 68B are plots showing FDTD simulations of the optical field absorption vs wavelength, according to some embodiments. Note that absorption is directly proportional to EQE. In FIG. 68A, the dashed curve 6810 shows the absorption vs wavelength for a structure shown in FIGS. 65C and 65D with a 900 nm single hole filled with Si dioxide. The solid curve 6814 is a composite of 200 nm diameter nanoholes in a hexagonal array with a period of 220 nm and the boundary of the composite nanoholes is 900 nm circular. The nanoholes are etched to a depth of 2 microns, and the Si thickness is 3 microns as in FIGS. 65A-65D. In addition, the isolation trench etch is to a depth of 2 microns and both the nanoholes and the isolation trench are filled with Si dioxide.

The dotted curve 6812 is for a structure shown in FIGS. 65A and 65B with an isolation trench etched to a depth of 2 microns, and both the inverted pyramid and isolation trench are filled with Si dioxide. Finally, the dash-dot curve 6816 is for a similar pixel as in FIGS. 65A and 65B without inverted pyramids nor a micro/nano hole, also with isolation trench etch to a depth of 2 microns and filled with Si dioxide.

As can be seen from these curves, the composite nanoholes have an absorption vs wavelength less than that of the single 900 nm cylindrical hole but greater than that of the 2×2 inverted pyramids over the wavelength range of 700-1000 nm.

In certain cases, as in FIG. 67D with a honeycomb composite nanoholes where the hexagonal nanoholes can be packed more densely than for example circular nanoholes, the absorption vs wavelength can approach that of the single microhole.

FIG. 68B is similar to FIG. 68A showing nanoholes with 100 nm diameter and 50 nm diameter in addition to the 200 nm diameter and a flat device which doesn't have any nanoholes. As can be seen from the set of curves 6822, 6824, 6820 and 6826, absorption vs. wavelength the 100 nm diameter nanoholes have the highest absorption vs. wavelength.

Figure 68C:
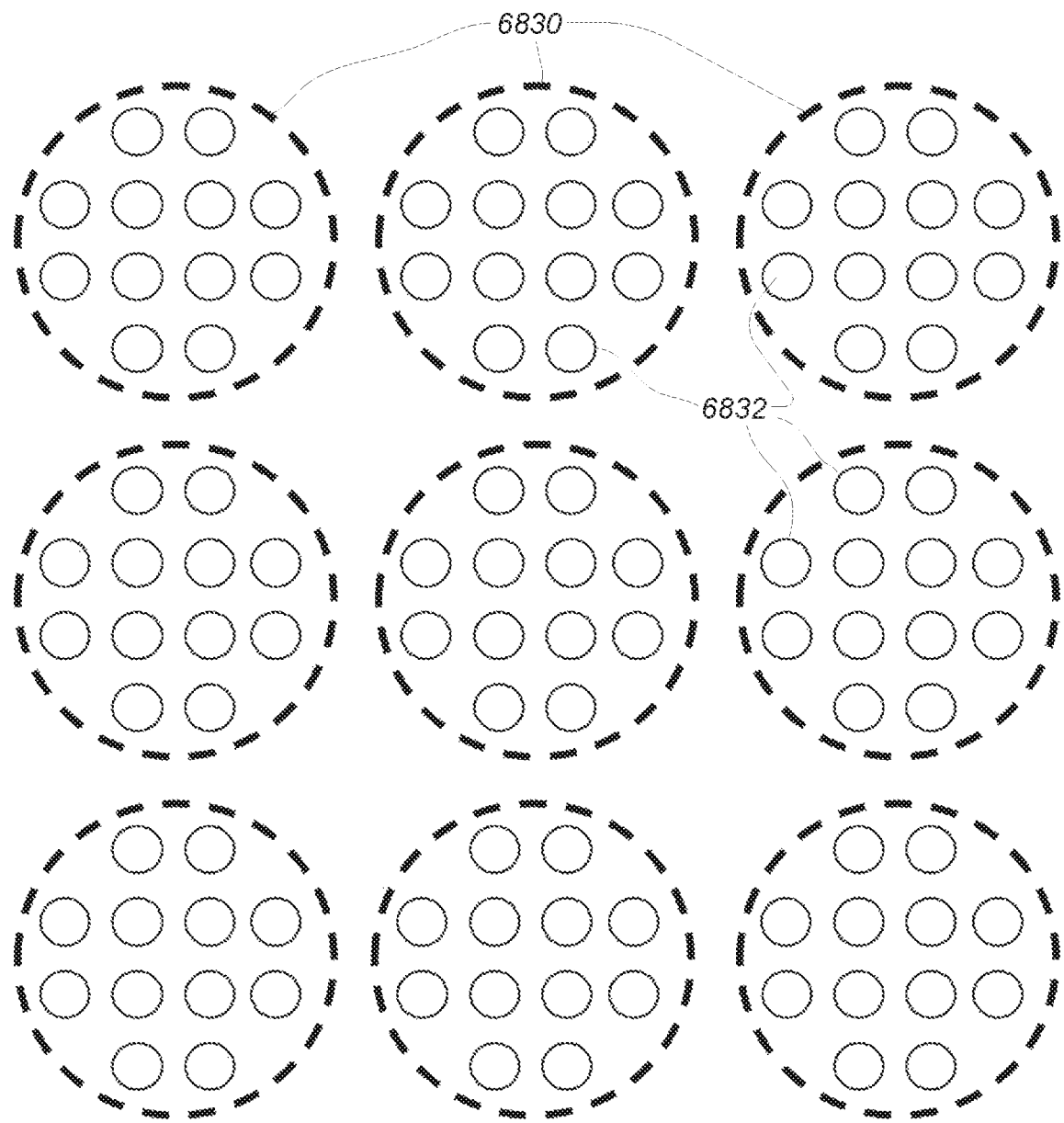
FIG. 68C is a partial simple top view schematic of an array of composite microstructure holes, according to some embodiments.

FIG. 68C is a partial simple top view schematic of an array of composite microstructure holes, according to some embodiments. Composite microstructure holes can also be referred to as composite microholes. The dotted circles 6830 show the imaginary boundaries of each microstructure hole that typically has a diameter of a wavelength, and the solid circles 6832 inside the dotted circles are nanoholes typically with a diameter that is a fraction of a wavelength. The composite microholes can be periodic, and/or aperiodic and/or randomly arranged and can have shapes that can include circular, oval, polygonal, amoebic, crescent, cross to name a few, and the nanoholes within the composite microhole can be also of any shape and can be arranged in a periodic and/or aperiodic, and/or random manner within the imaginary boundary of the microhole.

Composite microhole or holes in some cases relax CMOS fabrication processes where the holes need to be filled with a dielectric, and in certain cases where planarization processes require holes with smaller dimensions.

Figure 68D:
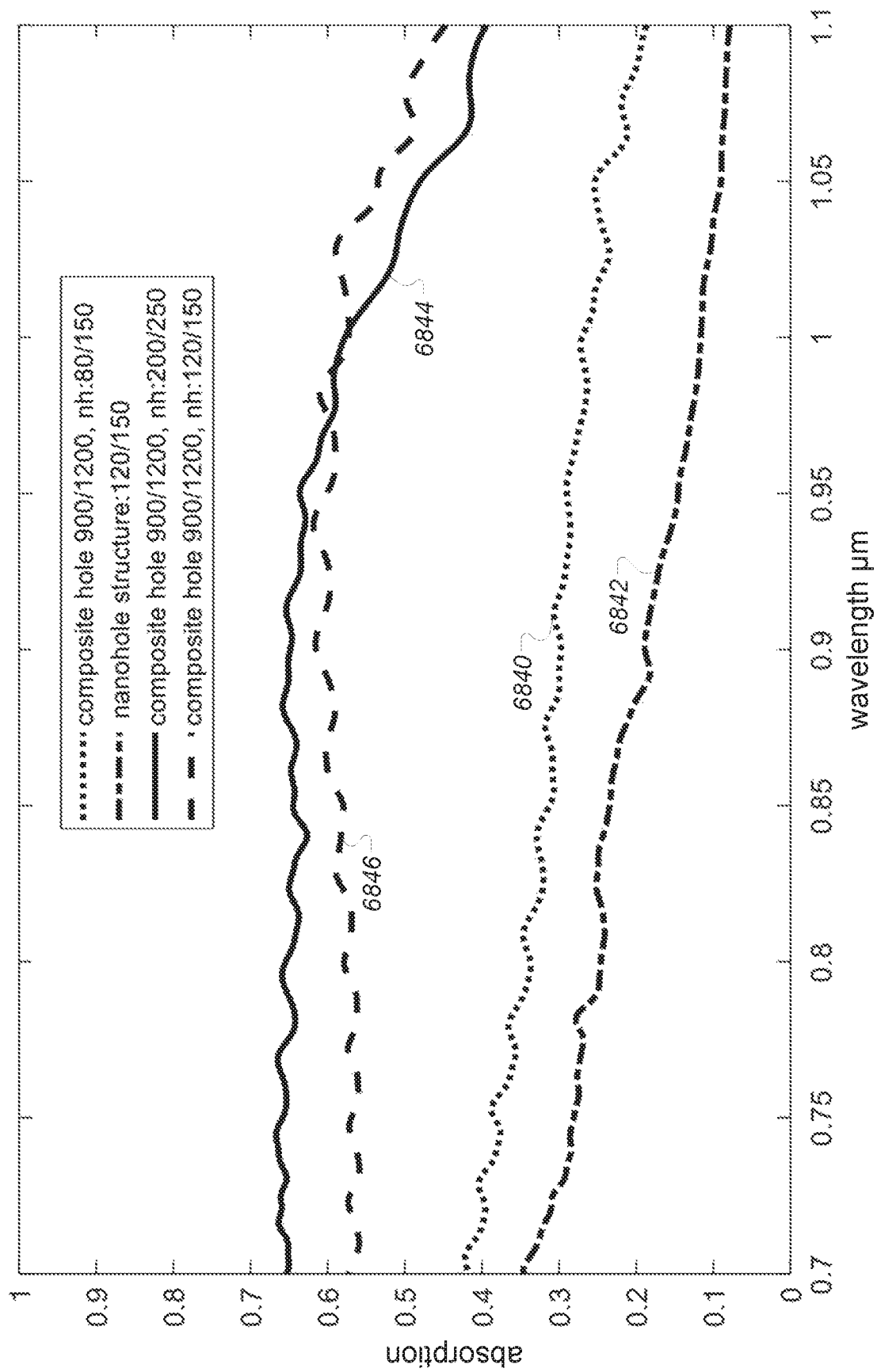
FIG. 68D is a plot showing a FDTD simulation of the optical absorption vs wavelength in the wavelength range 700-1100 nm of composite microholes, according to some embodiments.

FIG. 68D is a plot showing a FDTD simulation of the optical absorption vs wavelength in the wavelength range 700-1100 nm of composite microholes, according to some embodiments. The composite microholes have diameters of 900 nm and a period of 1200 nm in a square lattice. Within each composite microhole are nanoholes in a square lattice with a diameter of 200 nm and a period of 250 nm as shown in the solid curve 6844. The dashed curve 6846 shows a composite microhole array in a square lattice with 900 nm diameter and 1200 nm period, and where within the microhole are nanoholes with 120 nm diameter and 150 nm period in a square lattice. The dotted curve 6840 shows a composite microhole array with 900 nm diameter and 1200 nm period in a square lattice where within the microhole are nanoholes with a diameter of 80 nm and a period of 150 nm in a square lattice. The dash-dot curve 6842 shows an array of nanoholes with a diameter of 120 nm and a period of 150 nm in a square lattice.

The arrays of composite microholes and nanoholes are for a SOI wafer, with a device layer of 3 microns and a BOX layer of 1 micron on a handle Si wafer, where the nanoholes are etched to a depth of 2 microns.

As can be seen from these curves, the composite microhole array of clusters of nanoholes where each cluster of nanohole arrays represents a composite microhole can have an absorption where the EQE is directly proportional to absorption greater than the absorption of an array of nanoholes at certain wavelengths.

Figure 69A:
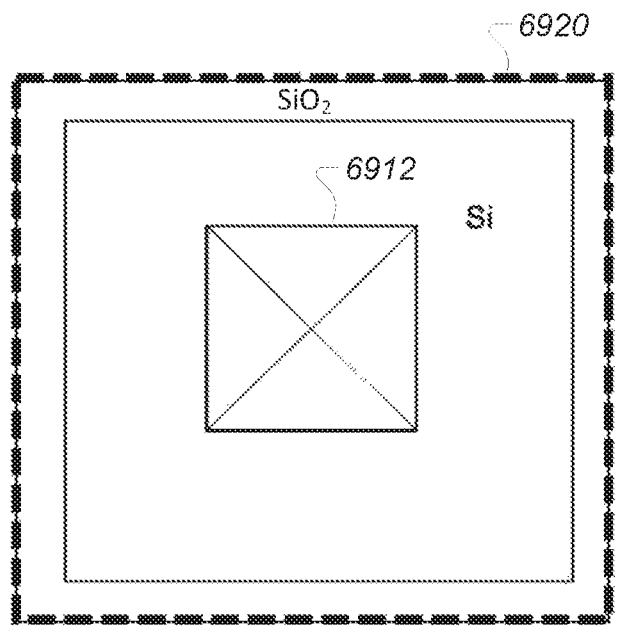
FIGS. 69A and 69B are simple partial top view schematic of a square Si pixel, according to some embodiments.
Figure 69B:
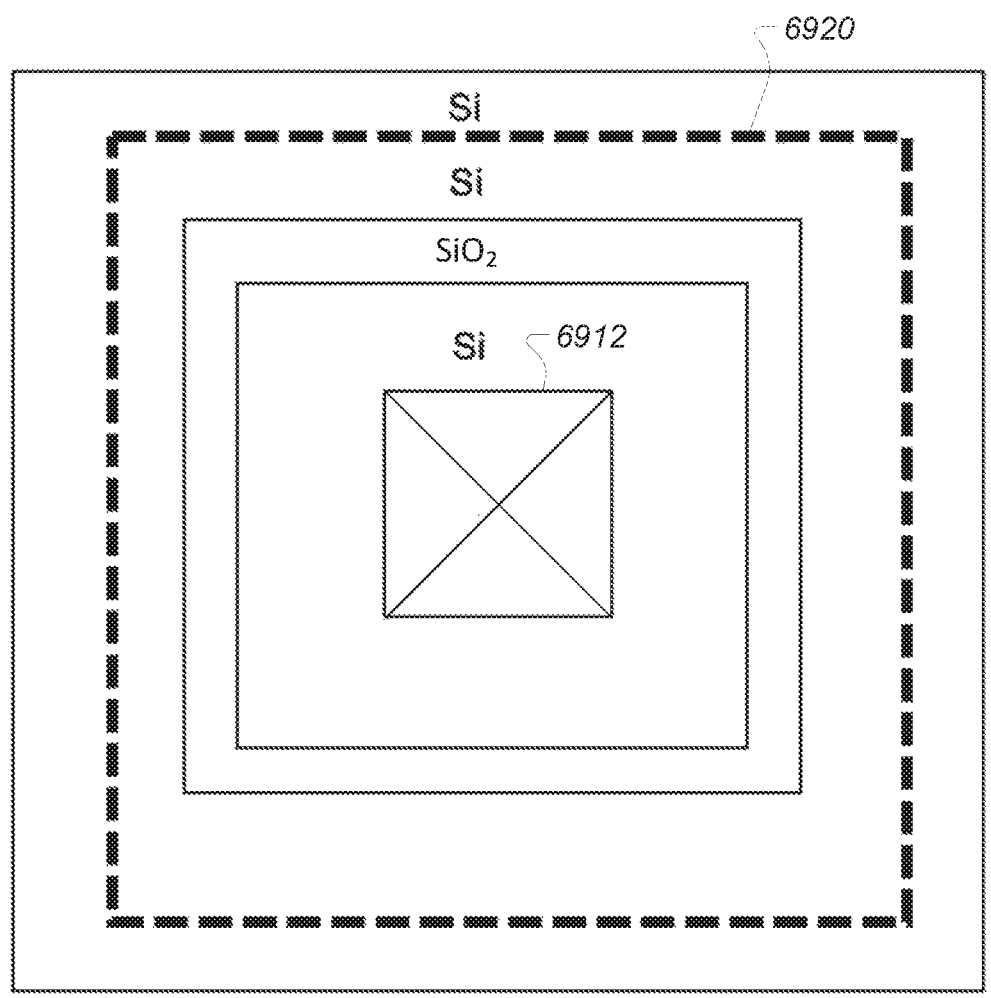

FIGS. 69A and 69B are simple partial top view schematic of a square Si pixel, according to some embodiments. In FIG. 69A, the square pixel has a 1.12 micron×1.12 micron dimension and a single 900 nm base inverted pyramid which is filled with $SiO_2$ and the surface is coated with 250 nm of $SiO_2$. The perfect match layer (PML) boundary 6920 is used in FDTD simulation of the optical Maxwell equations. In the case of side radiation/crosstalk PBC (Periodic boundary condition) are used in the FDTD simulation.

FIG. 69A has a similar structure and cross section shown in FIGS. 65C and 65D where the cylindrical hole is replaced by 900 nm square inverted pyramid 6912. The side walls of the Si pixel are coated with 250 nm Si dioxide and the height of the pixel is 3 microns on top of approximately 2 microns of Si dioxide. The PML boundary 6920 is taken at the perimeter of the Si dioxide coating the pixel side wall.

FIG. 69B is a similar Si pixel with 900 nm base inverted pyramid, where the pixel is 3 micron thick and where an isolation trench is etched to a depth of 2 microns with a width of 250 nm and is filled with Si dioxide forming a moat like structure around the pixel and where the adjacent region is Si as shown in FIG. 69B. The PML boundary 6920 is placed in the Si as shown.

FIG. 69B where the PML boundary 6920 is in Si can offer a more accurate depiction of a pixel array in CMOS image sensor, and can reflect a higher accuracy in the FDTD simulation. In a pixel array such as in a CMOS image sensor the pixels can be separated by 100-250 nm deep trench isolation and filled with Si dioxide.

Figure 70:
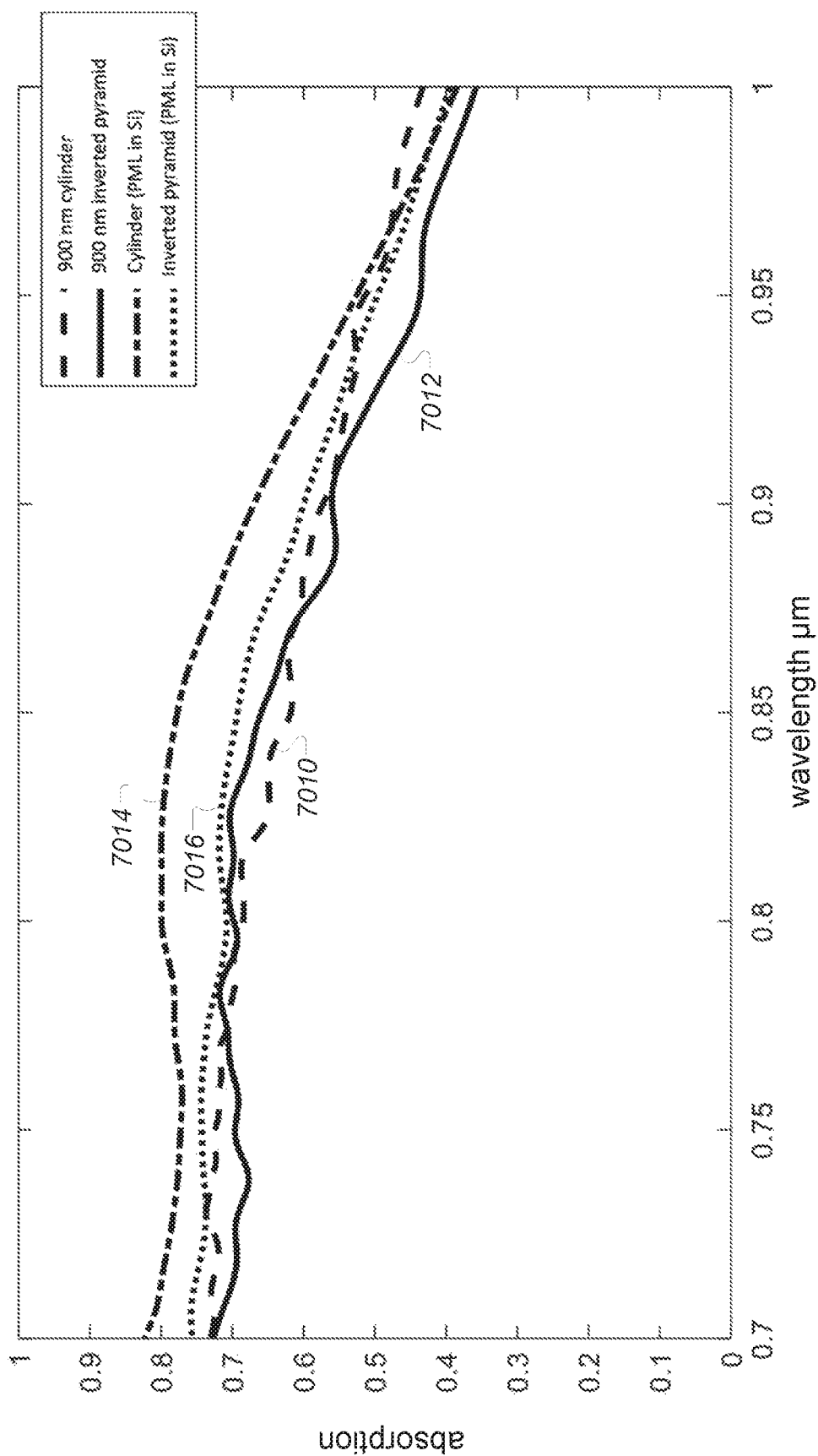
FIG. 70 is a plot of a FDTD simulation of the optical field of absorption vs wavelength for structures shown in FIGS. 69A and 69B, according to some embodiments.

FIG. 70 is a plot of a FDTD simulation of the optical field of absorption vs wavelength for structures shown in FIGS. 69A and 69B, according to some embodiments. The plot is for a 900 nm inverted pyramid and a 900 nm cylinder etched to a depth of 2 microns where the microholes are filled with Si dioxide and the surface of the pixel is coated with Si dioxide to a thickness of 250 nm, for the case where the PML boundary is at the perimeter of the Si dioxide as shown in FIG. 69A, and for the case of where the PML boundary is in Si as shown in FIG. 69B. The dash curve 7010 is for 900 nm cylinder with a PML boundary at the perimeter of the Si dioxide. The solid curve 7012 is for an inverted pyramid with a base of 900 nm, and with a PML boundary at the perimeter of the Si dioxide. The dash-dot-dash curve 7014 is for a 900 nm cylinder with a PML boundary in the Si. And the doted 7016 curve is for a 900 nm base inverted pyramid with the PML in the Si.

In general, the single microhole pixel with a PML in the Si has a slightly higher absorption over certain wavelengths than the corresponding microhole pixel with a PML boundary at the perimeter of the Si dioxide.

The EQE is proportional to absorption and in the case where all the photogenerated carries are collected by the anode and cathode the EQE can be equal to absorption.

Figure 71:
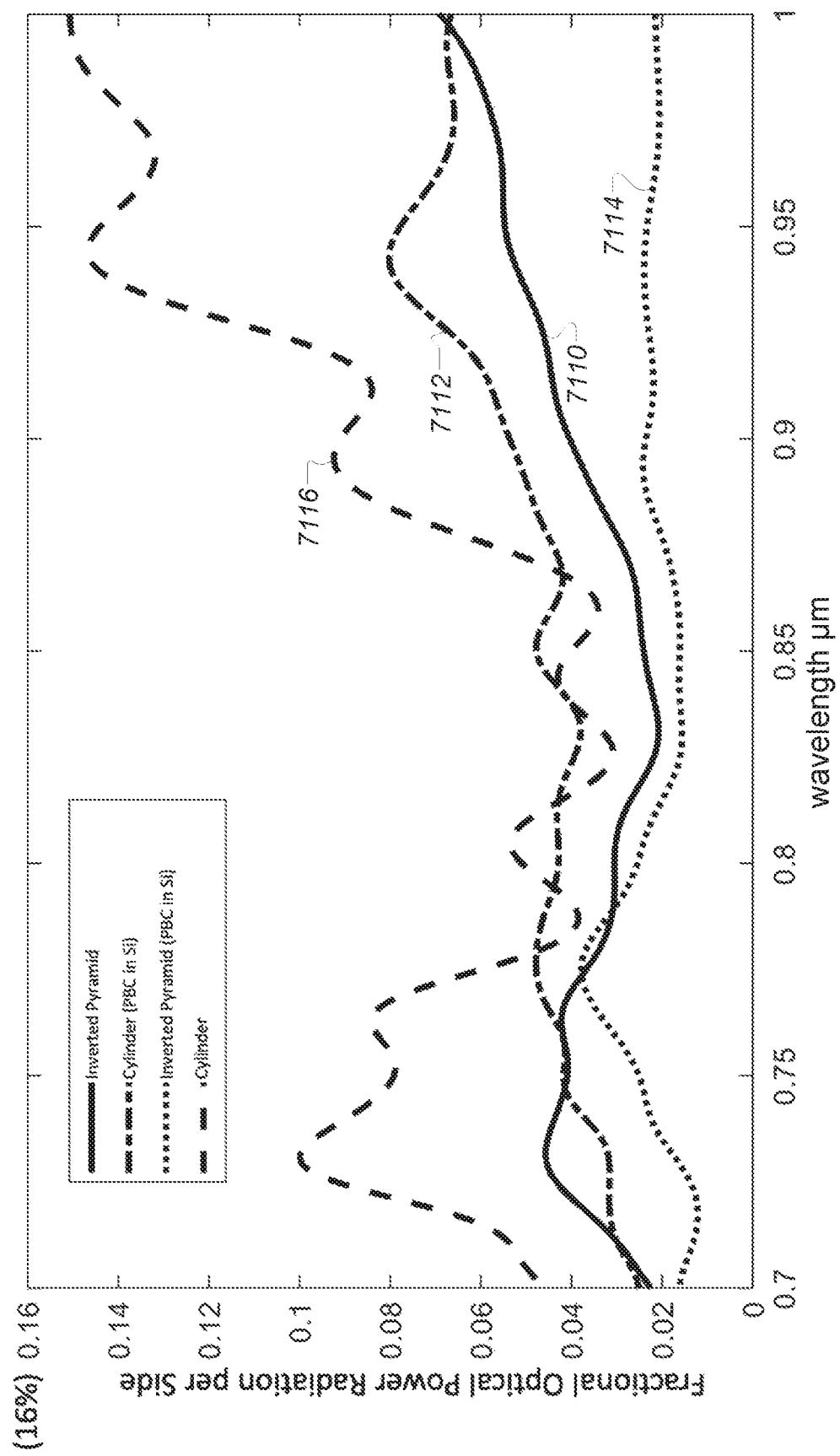
FIG. 71 is a plot showing a FDTD simulation of optical radiation trapped in the single microhole pixel and leaking out of the pixel sidewalls for structures shown in FIGS. 69A and 69B.

FIG. 71 is a plot showing a FDTD simulation of optical radiation trapped in the single microhole pixel and leaking out of the pixel sidewalls for structures shown in FIGS. 69A and 69B. The vertical axis is the fraction of the optical power in the pixel that leaked from a single sidewall for structures shown in FIGS. 69A and 69B.

The solid curve 7110 is for a 900 nm inverted pyramid with the PBC boundary (periodic boundary condition) at the perimeter of the Si dioxide. The dash-dot-dash 7112 curve is for a 900 nm diameter cylinder with the PBC boundary in Si, and the dot-dot-dot 7114 curve is for a 900 nm inverted pyramid microhole with PBC boundary in Si, and the dash-dash 7116 curve is for a 900 nm cylinder with the PBC boundary at the perimeter of the Si dioxide. The structures are shown in FIGS. 69A and 69B.

The lowest leakage per side from the pixel is the 900 nm inverted pyramid with the PBC in Si with leakages of less than 4% over the wavelength range of 700-1000 nm, and in some cases less than 3% power leakage per side at certain wavelength range, for example 850 nm, 905 nm, and 940 nm wavelengths.

Optical power leakage from pixel to adjacent pixel can increase cross talk and can degrade resolution and contrast. Low optical power leakage is preferred. Methods to further decrease the optical power leakage and/or reduce cross talk including metal shields, amorphous semiconductor, carbon, in the trench isolation have been described in this patent specification.

In this simulation, the 900 nm cylindrical microhole was etched to a depth of 2 microns which as can be seen in FIG. 71 resulted in higher radiation from the sidewall. The radiation is a fraction of the optical power in the pixel that radiated out of the side wall to an adjacent pixel, and this radiation can be reduced by etching the cylindrical microhole to a shallower depth, for example 0.5 microns-1.5 microns to reduce lateral radiation in the pixel. However, this can also reduce the absorption of the optical power in the pixel, where external quantum efficiency is directly proportional to absorption and where it can equal absorption if all the photocarriers are collected by the anode and cathode. A tradeoff between absorption efficiency and sidewall radiation which contributes to cross talk can be made to optimize performance of the CMOS image sensor.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

The invention claimed is:

1. A photosensor wafer of crystalline Si and a CMOS Logic Processor (CLP) wafer stacked on each other for electrical interaction and forming a structure comprising:
   an array of laterally spaced pixels formed in said photosensor wafer;
   respective lenses over said pixels;
   wherein said pixels comprise photosensors each including one or more microstructure holes extending into said photosensor wafer and further including plural N-doped and/or P-doped regions of the photosensor wafer configured to interact with light impinging on said pixels, including on said holes, through said lenses;
   wherein at least some of said holes are conformally lined with graphene and/or with h doped Si and hyperdoping over said doped Si;
   one or more active CMOS circuits formed in said CLP wafer; and
   electrical interconnects between said pixels and said one or more active CMOS circuits, wherein said interconnects are configured to convey electrical signals between said pixels and said one or more active CMOS circuits;
   wherein said CLP wafer is at a side of said photosensor wafer that is opposite said lenses.

2. The structure of claim 1, further including respective color filters between said lenses and pixels configured to select respective wavelength ranges.

3. The structure of claim 2, in which said pixels are configured in a Bayer array that includes at least one Near InfraRed (NIR) pixel and an NIR optical filter over said NIR pixel to select specific NIR wavelength ranges and each of at least several pixels in the Bayer array encompasses only a single hole in said photosensor wafer.

4. The structure of claim 2, in which said pixels include one or more Bayer arrays at least one of which comprises a Near InfraRed (NIR) pixel, and wherein the at least one NIR pixel in at least one of said one or more Bayer arrays is larger than other pixels therein.

5. The structure of claim 1, in which each of said at least some of said pixels has only a single one of said holes.

6. The structure of claim 1, in which said at least some of said holes in the photosensor wafer are generally cylindrical.

7. The structure of claim 1, in which said at least some of said holes in the photosensor wafer are inverted pyramids.

8. The structure of claim 1, in which said at least some of said holes in the photosensor wafer are funnel shaped.

9. The structure of claim 1, in which said hole of each of at least some of said pixels comprises a cluster of nanoholes into said photosensor wafer.

10. The structure of claim 1, further including light blockers between adjacent pixels to reduce crosstalk.

11. The structure of claim 1, further including light reflectors under said pixels.

12. The structure of claim 1, in which at least some of said pixels have only a single hole each and said single hole is an off-center hole.

13. The structure of claim 1, in which at least some of said holes differ in shape from one another.

14. The structure of claim 1, in which each of said pixels comprises laterally spaced doped regions.

15. The structure of claim 1, in which each of said pixels comprises vertically spaced doped regions.

16. The structure of claim 1, in which said pixels include Ge regions in said photosensor wafer, configured to extend a response of said pixels to light in a 2 micrometers wavelength range.

17. The structure of claim 1, in which said pixels have slanted sidewalls configured to reduce crosstalk between adjacent pixels and improve optical confinement.

18. The structure of claim 1, in which said holes are conformally lined with doped Si, and at least some adjacent holes are doped to opposite polarities.

19. The structure of claim 1, in which at least some of said holes are conformally lined with graphene.

20. The structure of claim 1, including doped Si conformally lining at least some of said holes and hyperdoping over said doped Si lining.

21. The structure of claim 1, in which said pixels are in an array in which centrally located pixels are smaller in size that other pixels.

22. The structure of claim 1, further including a first layer of electrically insulating material under said pixels and a second layer of an electrically insulating material over said active CMOS circuits.

23. The structure of claim 22, wherein the first and second layers of electrically insulating material are selected from a group consisting of Si Oxide and Si Nitride.

24. The structure of claim 22, wherein one or more additional layers of electrically insulating material are formed on said first and/or second layers of electrically insulating material.

25. A high-speed photodetector array (HSPA) wafer of crystalline Si and a CMOS Logic Processor (CLP) wafer stacked on each other for electrical interaction and forming a structure comprising:
an array of laterally spaced photodetectors formed in said HSPA wafer;
wherein each of said photodetectors includes at least one microstructure hole extending into said HSPA wafer and further includes plural N-doped and/or P-doped regions of the HSPA wafer configured to interact with light impinging on said photodetector from a first side of the HSPA wafer;
wherein at least some of said holes are conformally lined with graphene and/or with doped Si and hyperdoping over said doped Si;
one or more active CMOS circuits formed in said CLP wafer; and
electrical interconnects between said high speed photodetector array and said one or more active CMOS circuits, wherein said interconnects are configured to convey electrical signals between said HSPA and said one or more active CMOS circuits; and
wherein said CLP wafer is at a side of said HSPA wafer that is opposite said first side.

26. The structure of claim 25, further including an array of lenses formed over said photodetectors on said first side of the HSPA wafer.

27. The structure of claim 25, in which each of said lenses overlies plural holes in said HSPA wafer and wherein said photodetectors and said active CMOS circuits are configured to operate at 56 Gb/s or greater data rates that include 112 Gb/s.

28. The structure of claim 25, in which at least some of said holes in the HSPA wafer are generally cylindrical.

29. The structure of claim 25, in which at least some of said holes in the HSPA wafer are inverted pyramids.

30. The structure of claim 25, in which at least some of said holes in the HSPA wafer are funnel shaped.

31. The structure of claim 25, further including an array of optical filters formed at said first side of the HSPA wafer over said photodetectors.

32. The structure of claim 31, wherein said array of optical filters includes Near Infra Red (NIR) filters to select specific NIR wavelength ranges.

33. The structure of claim 32, wherein said array of photodetectors includes some that are larger than others, and said larger photodetectors are under said NIR filters.

34. The structure of claim 25, in which said photodetectors include Ge regions in said HSPA wafer, configured to enhance a response of said photodetectors to light in a wavelength range that includes 1350 nm and/or in a wavelength range that includes 1550 nm.

35. The structure of claim 25, in which each at least some of said lenses overlies a plurality of said holes and said photodetector array and said CMOS active circuits are configured to operate at data rates of 56 Gb/s or higher.

36. The structure of claim 25, in which said holes are conformally lined with doped Si, and adjacent holes are doped to opposite polarities.

37. The structure of claim 25, further including doped Si conformally lining said holes and hyperdoping over said doped Si lining the holes.

38. The structure of claim 25, in which said holes are conformally lined with graphene.

39. The structure of claim 25, in which said CLP wafer includes clock recovery circuits and transimpedance amplifiers, and wherein said HSPA and CLP wafers are configured to operate at aggregated data rates of 400-1000 Gb/s or more.

40. A monolithic wafer of crystalline Si having a first side and a second side, comprising:
an array of laterally spaced photosensor or photodetector pixels formed at said first side of the wafer;
wherein each of said pixels includes at least one hole formed into said first side of the wafer and further includes plural N-doped and/or P-doped regions of the wafer configured to interact with light impinging on said pixels, including on said holes;

wherein at least some of said holes are conformally lines with graphene and/or with doped Si and hyperdoping over said doped Si;

respective optical lenses over said pixels configured to direct to said pixels and said holes light impinging on said first side of the wafer;

CMOS logic processors formed at said second side of the wafer and comprising one or more active CMOS circuits; and electrical interconnects in said wafer configured to convey electrical signals between said pixels and said one or more active CMOS circuits.

41. The monolithic wafer of claim 40, in which each of at least some of said lenses overlies a plurality of said holes in the wafer.

42. The monolithic wafer of claim 40, in which said holes are lined with doped regions of said wafer, and adjacent holes are lined with doped regions of opposite polarity.

* * * * *